(12) United States Patent
Shinohara et al.

(10) Patent No.: US 9,135,108 B2
(45) Date of Patent: Sep. 15, 2015

(54) DATA PROCESSING DEVICE AND DATA PROCESSING METHOD

(75) Inventors: Yuji Shinohara, Kanagawa (JP); Makiko Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 132 days.

(21) Appl. No.: 14/116,231

(22) PCT Filed: Jun. 8, 2012

(86) PCT No.: PCT/JP2012/064807
§ 371 (c)(1),
(2), (4) Date: Nov. 7, 2013

(87) PCT Pub. No.: WO2012/173061
PCT Pub. Date: Dec. 20, 2012

(65) Prior Publication Data
US 2014/0082452 A1    Mar. 20, 2014

(30) Foreign Application Priority Data
Jun. 15, 2011 (JP) .................. 2011-132790

(51) Int. Cl.
*G06F 11/10* (2006.01)
*H03M 13/03* (2006.01)
(Continued)

(52) U.S. Cl.
CPC ............. *G06F 11/10* (2013.01); *H03M 13/036* (2013.01); *H03M 13/1165* (2013.01);
(Continued)

(58) Field of Classification Search
CPC . G06F 11/10; H03M 13/036; H03M 13/1165; H03M 13/255; H03M 13/271; H03M 13/2906; H03M 13/2945; H03M 13/356; H03M 13/6552; H03M 13/1168; H03M 13/152; H04L 27/36; H04L 27/38; H04L 1/0047; H04L 1/0057
USPC ................. 714/752, 776, 758, 763, 766, 755; 370/310, 312, 328
See application file for complete search history.

(56) References Cited

U.S. PATENT DOCUMENTS 8,837,618 B2 * 9/2014 Petrov ........................... 375/261
9,026,884 B2 * 5/2015 Shinohara et al. ............ 714/758
(Continued)

FOREIGN PATENT DOCUMENTS

JP 2009-225416 10/2009
WO WO-2009/104319 8/2009
(Continued)

OTHER PUBLICATIONS

International Search Report; Application No. PCT/2012/064807; Filed: Jun. 8, 2012. Completion of International Search Report: Jun. 19, 2012. (Form PCT/ISA/210).
(Continued)

*Primary Examiner* — John J Tabone, Jr.
(74) *Attorney, Agent, or Firm* — Fishman Stewart Yamaguchi PLLC

(57) ABSTRACT

The present technique relates to a data processing device and a data processing method that enable resistance to error of data to be improved.
In the case in which an LDPC code having a code length of 16200 bits and an encoding rate of 8/15 is mapped to 16 signal points, if (#i+1)-th bits from most significant bits of sign bits of 4×2 bits and symbol bits of 4×2 bits of two consecutive symbols are set to bits b#i and y#i, respectively, a demultiplexer performs interchanging to allocate b0, b1, b2, b3, b4, b5, b6, and b7 to y0, y4, y3, y1, y2, y5, y6, and y7, respectively. The present technique can be applied to a transmission system or the like transmitting an LDPC code.

12 Claims, 71 Drawing Sheets

(51) Int. Cl.
*H03M 13/11* (2006.01)
*H03M 13/25* (2006.01)
*H03M 13/27* (2006.01)
*H03M 13/29* (2006.01)
*H03M 13/15* (2006.01)
*H04L 1/00* (2006.01)
*H04L 27/36* (2006.01)
*H04L 27/38* (2006.01)
*H03M 13/35* (2006.01)
*H03M 13/00* (2006.01)

(52) U.S. Cl.
CPC ....... *H03M 13/1168* (2013.01); *H03M 13/152* (2013.01); *H03M 13/255* (2013.01); *H03M 13/271* (2013.01); *H03M 13/2906* (2013.01); *H03M 13/2945* (2013.01); *H03M 13/356* (2013.01); *H03M 13/6552* (2013.01); *H04L 1/0047* (2013.01); *H04L 1/0057* (2013.01); *H04L 27/36* (2013.01); *H04L 27/38* (2013.01)

(56) References Cited

U.S. PATENT DOCUMENTS

| | | | |
|---|---|---|---|
| 2009/0217129 A1 | 8/2009 | Myung et al. | |
| 2009/0217130 A1* | 8/2009 | Myung et al. | 714/752 |
| 2013/0216001 A1* | 8/2013 | Petrov | 375/298 |
| 2013/0290816 A1* | 10/2013 | Shinohara et al. | 714/776 |
| 2013/0297992 A1* | 11/2013 | Yamamoto et al. | 714/776 |
| 2013/0305113 A1* | 11/2013 | Shinohara et al. | 714/752 |
| 2013/0311850 A1* | 11/2013 | Shinohara et al. | 714/758 |
| 2014/0040707 A1* | 2/2014 | Shinohara et al. | 714/776 |
| 2014/0047295 A1* | 2/2014 | Shinohara et al. | 714/752 |
| 2014/0126672 A1* | 5/2014 | Petrov | 375/298 |
| 2014/0153625 A1* | 6/2014 | Vojcic et al. | 375/224 |
| 2015/0082118 A1* | 3/2015 | Jeong et al. | 714/758 |
| 2015/0095744 A1* | 4/2015 | Jeong et al. | 714/776 |

FOREIGN PATENT DOCUMENTS

| | | |
|---|---|---|
| WO | WO-2009/107990 | 9/2009 |
| WO | WO-2009/116204 | 9/2009 |

OTHER PUBLICATIONS

Written Opinion of the International Searching Authority; Application No. PCT/2012/064807; Filed: Jun. 8, 2012. Report Dated: Jun. 26, 2012. (Forms PCT/ISA/220 and PCT/ISA/237).

DVB-S2: ETSI EN 302 307 V1.1.2, Digital Video Broadcasting (DVB); Second generation framing structure, channel coding and modulation systems for Broadcasting, Interactive Services, News Gathering and other broadband satellite applications (DVB-S2).

DVB-C2: Digital Video Broadcasting (DVB); Implementation Guidelines for a second generation digital cable transmission system (DVB-C2).

DVB-T2: Digital Video Broadcasting (DVB); Frame structure channel coding and modulation for a second generation digital terrestrial television broadcasting system (DVB-T2).

\* cited by examiner

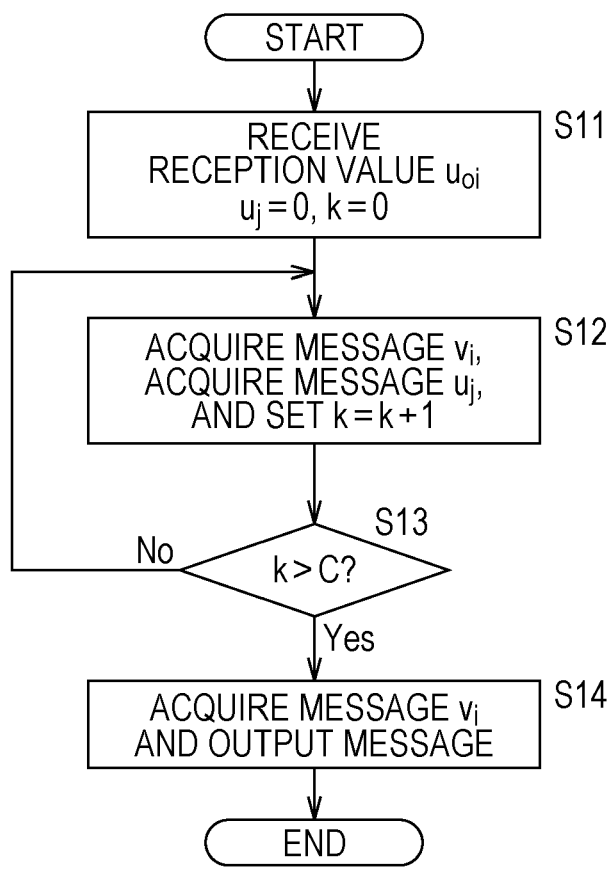

*FIG. 3*

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

PARITY MATRIX H$_T$

FIG. 13

| Nominal ENCODING RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | — | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

COLUMN NUMBER OF EACH COLUMN WEIGHT

FIG. 25

| NECESSARY MEMORY COLUMN NUMBER mb | b=1 (FIRST TO THIRD INTERCHANGE METHODS) | b=2 (FOURTH INTERCHANGE METHOD) | WRITE START POSITION OF EACH OF mb COLUMNS ||||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 2 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 28 | 32 | | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG. 26

| NECESSARY MEMORY COLUMN NUMBER mb | b=1 (FIRST TO THIRD INTERCHANGE METHODS) | b=2 (FOURTH INTERCHANGE METHOD) | WRITE START POSITION OF EACH OF mb COLUMNS ||||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 7 | 8 | 10 | | | | |
| 24 | | 4096QAM | 0 | 0 | 0 | 0 | 2 | 2 | 2 | 2 | 2 | 2 | 2 | 2 | 3 | 7 | 7 | 9 | 9 | 9 | 10 | 10 | 10 | 10 | 10 | 11 |

FIG. 28

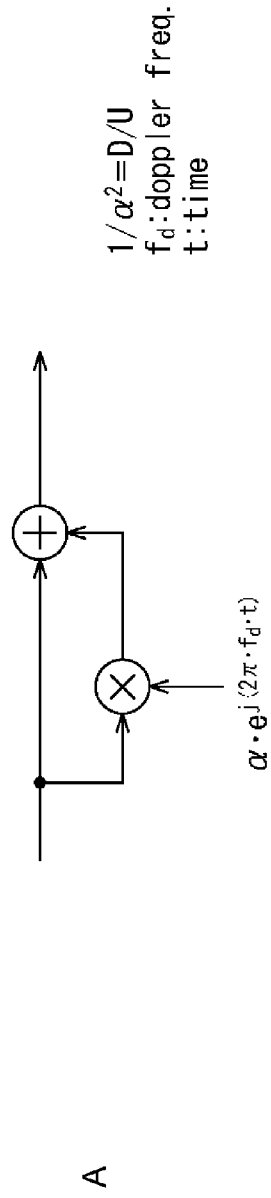

A EQUIVALENT REDUCTION MODEL OF Flutter $1/\alpha^2 = D/U$
$f_d$: doppler freq.
$t$: time $\alpha \cdot e^{j(2\pi \cdot f_d \cdot t)}$ OFDM SYMBOL IS TRANSMITTED BY CHANNEL AND simulation IS PERFORMED BY MODEL EXTRACTED BY ONE carrier AFTER FFT AT RECEPTION SIDE.

B 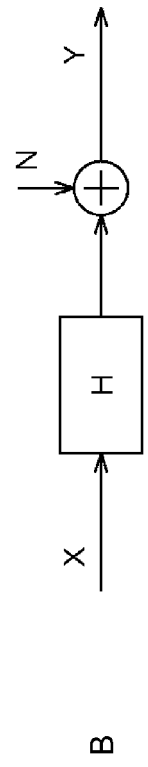

$$Y = \underbrace{\left[1 + \alpha \cdot \exp\left(j2\pi \cdot m \cdot f_d \cdot Ts + j2\pi \cdot \frac{(Nu-1) \cdot f_d \cdot Tu}{Nu}\right) \cdot \frac{\text{sinc}(\pi \cdot f_d \cdot Tu)}{\text{sinc}(\pi \cdot f_d \cdot Tu/Nu)}\right]}_{H} \cdot X + N$$

$$E[N^2] = \alpha^2 \cdot \underbrace{\left\{1 - \left|\frac{\text{sinc}(\pi \cdot f_d \cdot Tu)}{\text{sinc}(\pi \cdot f_d \cdot Tu/Nu)}\right|^2\right\}}_{\text{POWER OF }|C|: \text{APPROXIMATED IN AWGN}}$$

m: symbol number
Ts: symbol length (sec)
Tu: effective symbol length (sec)
Nu: number of OFDM carriers

DISPLAY ROW NUMBER OF PARITY CHECK MATRIX
(INFORMATION MATRIX H$_A$) FOR EVERY 360 COLUMNS, FROM FIRST COLUMN
ROW NUMBER OF PARITY CHECK MATRIX

FIRST COLUMN OF H$_A$ →
361ST COLUMN OF H$_A$ →
721ST COLUMN OF H$_A$ →
1081ST COLUMN OF H$_A$ →

```
0  2084 1613 1548 1286 1460 3196 4297 2481 3369 3451 4620 2622
1  122  1516 3448 2880 1407 1847 3799 3529 373  971  4358 3108
2  259  3399 929  2650 864  3996 3833 107  5287 164  3125 2350    ← h₃,₅
3  342  3529
4  4198 2147
5  1880 4836
6  3864 4910
7  243  1542
8  3011 1436
9  2167 2512
10 4606 1003
11 2835 705
12 3426 2365
13 3848 2474
14 1360 1743
0  163  2536
1  2583 1180
2  1542 509
3  4418 1005
4  5212 5117
5  2155 2922
6  347  2696
7  226  4296
8  1560 487
9  3926 1640
10 149  2928
11 2364 563
12 635  688
13 231  1684
14 1129 3894
```

PARITY CHECK MATRIX INITIAL VALUE TABLE

PARITY CHECK MATRIX →

FIG. 35

PARITY CHECK MATRIX INITIAL VALUE TABLE OF N=16200 AND r=1/5

PARITY CHECK MATRIX INITIAL VALUE TABLE OF N=16200 AND r=4/15

PARITY CHECK MATRIX INITIAL VALUE TABLE OF N=16200 AND r=1/3

PARITY CHECK MATRIX INITIAL VALUE TABLE OF N=16200 AND r=2/5

PARITY CHECK MATRIX INITIAL VALUE TABLE OF N=16200 AND r=4/9

PARITY CHECK MATRIX INITIAL VALUE TABLE OF N =16200 AND r=7/15

PARITY CHECK MATRIX INITIAL VALUE TABLE OF N=16200 AND r=8/15

```
┌ PARITY CHECK MATRIX INITIAL VALUE TABLE OF N=16200 AND r=3/5 ─────────┐
│                                                                        │
│  41  588 1367 1831 1964 3424 3732 4590 4677 5455 5542 5627 6415        │
│ 904 1706 2800 3732 3783 4217 4507 4999 6010 6218 6282 6363 6456        │
│ 356 1871 2216 2629 2994 3719 5194 5585 6012 6273 6393 6457 6474        │
│ 1676 2419 2604 3939 4186 5080 5400 5552 5971 6023 6324 6442 6445       │
│   3  770 2770 3457 3815 4253 4512 4671 5390 5393 5818 5978 6441        │
│ 491  548 1033 1042 1187 3816 4378 4956 5049 5649 5684 6177 6475        │
│ 1489 2817 3377 3716 4229 4512 4664 5065 5257 5477 5550 5950 6447       │
│ 1546 2444 4684                                                         │
│  15 3546 6220                                                          │
│ 1427 6199 6430                                                         │
│ 103 3629 5526                                                          │
│ 1330 6150 6255                                                         │
│ 363 5660 6422                                                          │
│ 4069 5586 5885                                                         │
│ 722  820 2823                                                          │
│ 204 2820 6181                                                          │
│ 3710 6077 6106                                                         │
│ 2655 5428 6264                                                         │
│ 1850 5989 6245                                                         │
│ 2701 5315 6477                                                         │
│ 1286 4462 6159                                                         │
│ 3356 4359 4805                                                         │
│  13 4416 4800                                                          │
│ 3103 4357 4685                                                         │
│ 1163 5127 6435                                                         │
│ 164 3202 3934                                                          │
│  36  230 3514                                                          │
│                                                                        │
└────────────────────────────────────────────────────────────────────────┘
```

FIG. 43

PARITY CHECK MATRIX INITIAL VALUE TABLE OF N=16200 AND r=2/3

```
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742
```

| ENCODING RATE | MINIMUM CYCLE LENGTH | PERFORMANCE THRESHOLD (Eb/No) |
|---|---|---|
| 1/5 | 8 | 0.15 |
| 4/15 | 8 | −0.21 |
| 1/3 | 6 | −0.01 |
| 2/5 | 6 | 0.01 |
| 4/9 | 6 | 0.17 |
| 7/15 | 6 | 0.36 |
| 8/15 | 6 | 0.64 |
| 3/5 | 8 | 1.00 |
| 2/3 | 6 | 1.35 |

FIG. 48

| rate | X | KX | Y1 | KY1 | Y2 | KY2 | M |
|---|---|---|---|---|---|---|---|
| 1/5 | 36 | 720 | 5 | 360 | 4 | 2160 | 12960 |
| 4/15 | 21 | 1080 | 4 | 2160 | 3 | 1080 | 11880 |
| 1/3 | 30 | 1080 | 4 | 2880 | 3 | 1440 | 10800 |
| 2/5 | 32 | 1080 | 4 | 3240 | 3 | 2160 | 9720 |
| 4/9 | 25 | 1440 | 4 | 1440 | 3 | 4320 | 9000 |
| 7/15 | 24 | 1440 | 4 | 2880 | 3 | 3240 | 8640 |
| 8/15 | 21 | 1800 | 4 | 1800 | 3 | 5040 | 7560 |
| 3/5 | 13 | 2520 | 3 | 7200 | — | 0 | 6480 |
| 2/3 | 18 | 1440 | 4 | 5400 | 3 | 3960 | 5400 |

FIG. 54
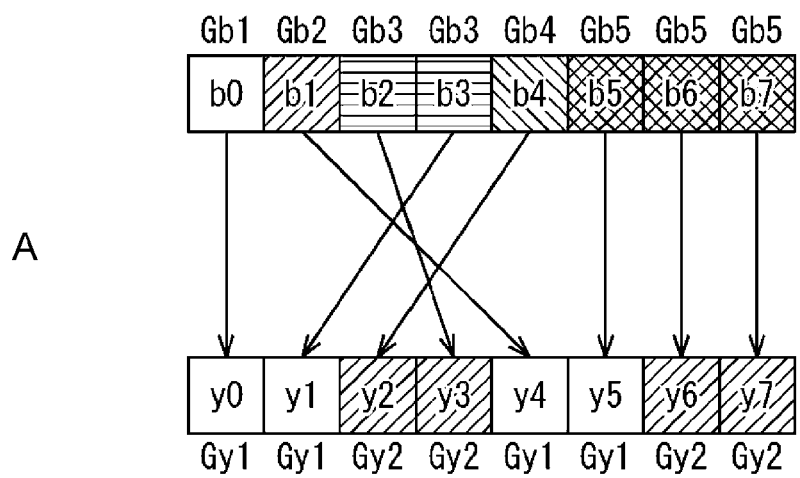
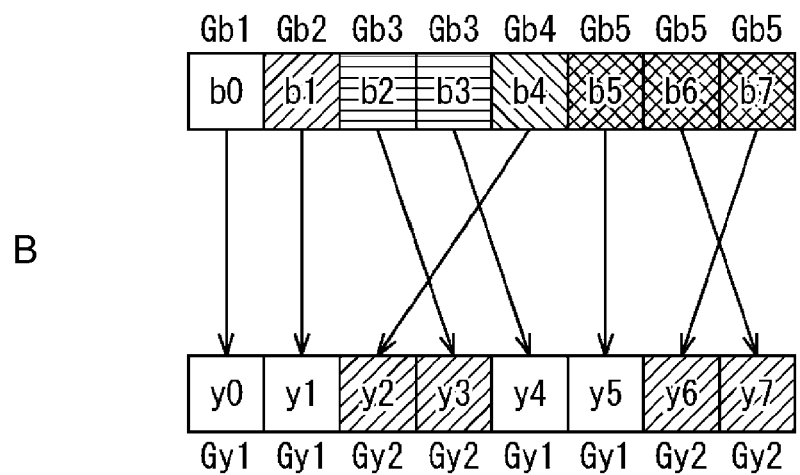

FIG. 55
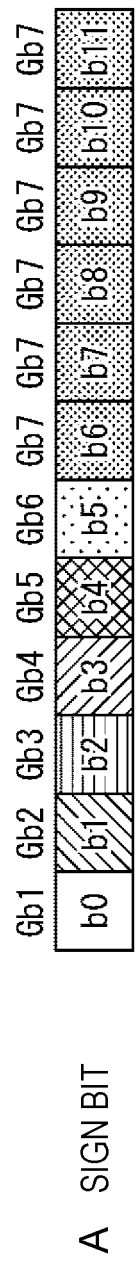
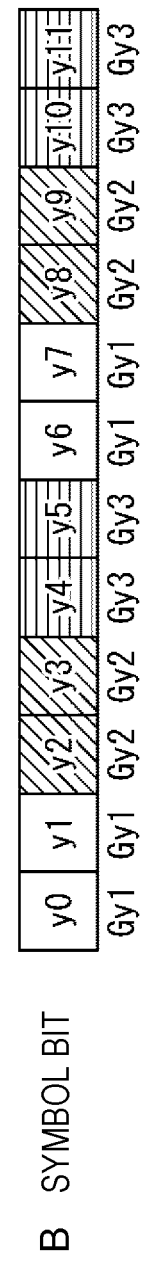

FIG. 58

64QAM r8/15 16k

A SIGN BIT

Gb1 Gb2 Gb3 Gb4 Gb4 Gb4 Gb5 Gb6 Gb6 Gb6 Gb6 Gb6
b0 | b1 | b2 | b3 | b4 | b5 | b6 | b7 | b8 | b9 | b10 | b11

B SYMBOL BIT y0 | y1 | y2 | y3 | y4 | y5 | y6 | y7 | y8 | y9 | y10 | y11
Gy1 Gy1 Gy2 Gy2 Gy3 Gy3 Gy1 Gy1 Gy2 Gy2 Gy3 Gy3

FIG. 61
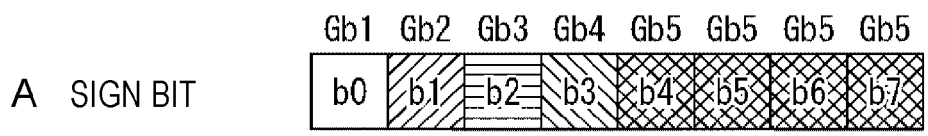

FIG. 63
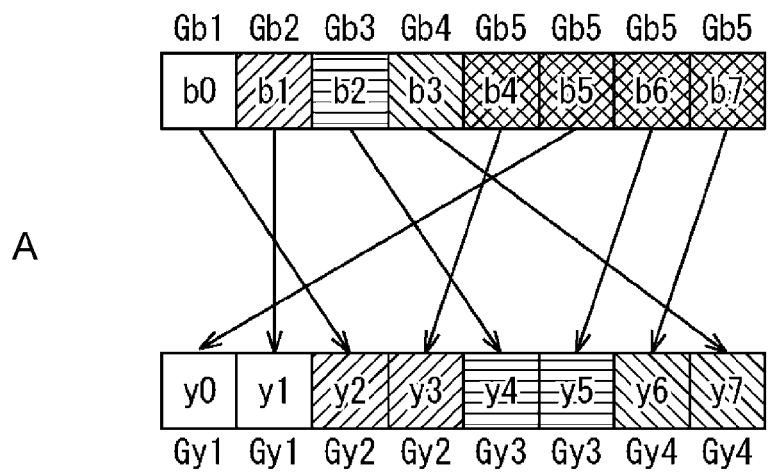
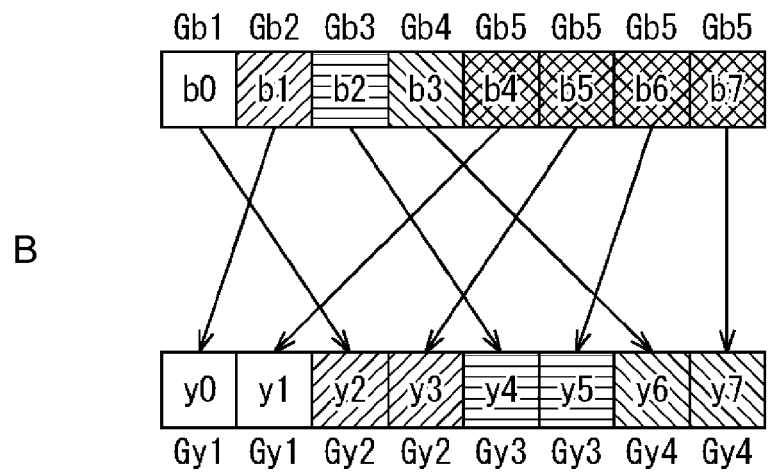

FIG. 67

DATA PROCESSING DEVICE AND DATA PROCESSING METHOD

TECHNICAL FIELD

The present technique relates to a data processing device and a data processing method and particularly, to a data processing device and a data processing method that enable resistance to error of data to be improved.

BACKGROUND ART

A Low Density Parity Check (LDPC) code has the high error correction capability and has been recently adopted widely to a transmission system including satellite digital broadcasting such as Digital Video Broadcasting (DVB)-S.2 performed in Europe (for example, refer to Non-Patent Document 1). In addition, adopting of the LDPC code to next-generation terrestrial digital broadcasting has been examined.

From a recent study, it is known that performance near a Shannon limit is obtained from the LDPC code when a code length increases, similar to a turbo code. In addition, because the LDPC code has a property that a shortest distance is proportional to the code length, the LDPC code has advantages of a block error probability characteristic being high and a so-called error floor phenomenon observed in a decoding characteristic of the turbo code or the like being rarely generated, as characteristics thereof.

Hereinafter, the LDPC code will be specifically described. The LDPC code is a linear code and it is not necessary for the LDPC code to be a binary code. However, here, it is assumed that the LDPC code is the binary code.

A maximum characteristic of the LDPC code is that a parity check matrix defining the LDPC code is sparse. Here, the sparse matrix is a matrix in which the number of "1" of elements of the matrix is very small (a matrix in which most elements are 0).

FIG. 1 illustrates an example of a parity check matrix H of the LDPC code.

In the parity check matrix H of FIG. 1, a weight of each column (the column weight) (the number of "1") becomes "3" and a weight of each row (the row weight) becomes "6".

In encoding using the LDPC code (LDPC encoding), for example, a generation matrix G is generated on the basis of the parity check matrix H and the generation matrix G is multiplied with binary information bits, so that a code word (LDPC code) is generated.

Specifically, an encoding device that performs the LDPC encoding first calculates the generation matrix G in which an expression $GH^T=0$ is realized, between a transposed matrix $H^T$ of the parity check matrix H and the generation matrix G. Here, when the generation matrix G is a K×N matrix, the encoding device multiplies the generation matrix G with a bit string (vector u) of information bits consisting of K bits and generates a code word c (=uG) consisting of N bits. The code word (LDPC code) that is generated by the encoding device is received at a reception side through a predetermined communication channel.

The LDPC code can be decoded by an algorithm called probabilistic decoding suggested by Gallager, that is, a message passing algorithm using belief propagation on a so-called Tanner graph, consisting of a variable node (also referred to as a message node) and a check node. Here, the variable node and the check node are appropriately referred to as nodes simply hereinafter.

FIG. 2 illustrates a sequence of decoding of the LDPC code.

Hereinafter, a real value (reception LLR) that is obtained by representing the likelihood of "0" of a value of an i-th sign bit of the LDPC code (one code word) received by the reception side by a log likelihood ratio is appropriately referred to as a reception value $u_{0i}$. In addition, a message output from the check node is referred to as $u_j$ and a message output from the variable node is referred to as $v_i$.

First, in decoding of the LDPC code, as illustrated in FIG. 2, in step S11, the LDPC code is received, the message (check node message) $u_j$ is initialized to "0", and a variable k taking an integer as a counter of repetition processing is initialized to "0", and the processing proceeds to step S12. In step S12, the message (variable node message) $v_i$ is acquired by performing an operation (variable node operation) represented by an expression (1), on the basis of the reception value $u_{0i}$ obtained by receiving the LDPC code, and the message $u_j$ is acquired by performing an operation (check node operation) represented by an expression (2), on the basis of the message $v_i$.

[Formula 1]

$$v_i = u_{0i} + \sum_{i=1}^{d_v-1} u_j \quad (1)$$

[Formula 2]

$$\tanh\left(\frac{u_j}{2}\right) = \prod_{i=1}^{d_c-1} \tanh\left(\frac{v_i}{2}\right) \quad (2)$$

Here, $d_v$ and $d_c$ in the expressions (1) and (2) represent parameters that show numbers of "1" of the parity check matrix H in a vertical direction (column) and a horizontal direction (row), respectively, and can be arbitrarily set, respectively. For example, in the case of a (3, 6) code, $d_v=3$ and $d_c=6$.

In the variable node operation of the expression (1) and the check node operation of the expression (2), because a message input from an edge (line connecting the variable node and the check node) for outputting the message is not an operation target, an operation range becomes 1 to $d_v-1$ or 1 to $d_c-1$. The check node operation of the expression (2) is performed actually by previously making a table of a function R ($v_1$, $v_2$) represented by an expression (3) defined by one output with respect to two inputs $v_1$ and $v_2$ and using the table consecutively (recursively), as represented by an expression (4).

[Formula 3]

$$X=-2\tan^{-1}[\tan h(v_1/2)\tan h(v_2/2)]=R(v_1,v_2) \quad (3)$$

[Formula 4]

$$u_j=R(v_1,R(v_2,R(v_3,\ldots R(v_{d_0-2},V_{d_0-1})))) \quad (4)$$

In step S12, the variable k is incremented by "1" and the processing proceeds to step S13. In step S13, it is determined whether the variable k is more than the predetermined repeat decoding count C. When it is determined in step S13 that the variable k is not more than C, the processing returns to step S12 and the same processing is repeated hereinafter.

When it is determined in step S13 that the variable k is more than C, the processing proceeds to step S14, the message $v_i$ that corresponds to a decoding result to be finally output is acquired by performing an operation represented by an expression (5) and is output, and the decoding processing of the LDPC code ends.

[Formula 5]

$$v_i = u_{0i} + \sum_{j=1}^{d_y} u_j \quad (5)$$

Here, the operation of the expression (5) is performed using messages $u_j$ from all edges connected to the variable node, different from the variable node operation of the expression (1).

FIG. 3 illustrates an example of the parity check matrix H of the (3, 6) LDPC code (an encoding rate of 1/2 and a code length of 12).

In the parity check matrix H of FIG. 3, a weight of a column is set to 3 and a weight of a row is set to 6, similar to FIG. 1.

FIG. 4 illustrates a Tanner graph of the parity check matrix H of FIG. 3.

In FIG. 4, the check node is represented by plus "+" and the variable node is represented by equal "=". The check node and the variable node correspond to the row and the column of the parity check matrix H. A line that connects the check node and the variable node is the edge and corresponds to "1" of elements of the parity check matrix.

That is, when an element of a j-th row and an i-th column of the parity check matrix is 1, in FIG. 4, an i-th variable node (node of "=") from the upper side and a j-th check node (node of "+") from the upper side are connected by the edge. The edge shows that a sign bit corresponding to the variable node has a restriction condition corresponding to the check node.

In a Sum Product Algorithm that is a decoding method of the LDPC code, the variable node operation and the check node operation are repetitively performed.

FIG. 5 illustrates the variable node operation that is performed by the variable node.

In the variable node, the message $v_i$ that corresponds to the edge for calculation is acquired by the variable node operation of the expression (1) using messages $u_1$ and $u_2$ from the remaining edges connected to the variable node and the reception value $u_{0i}$. The messages that correspond to the other edges are also acquired by the same method.

FIG. 6 illustrates the check node operation that is performed by the check node.

Here, the check node operation of the expression (2) can be rewritten by an expression (6) using a relation of an expression $a \times b = \exp\{\ln(|a|) + \ln(|b|)\} \times \text{sign}(a) \times \text{sign}(b)$. However, $\text{sign}(x)$ is 1 in the case of $x \geq 0$ and is $-1$ in the case of $x < 0$.

[Formula 6]

$$\begin{aligned} u_j &= 2\tanh^{-1}\left(\prod_{i=1}^{d_c-1} \tanh\left(\frac{v_i}{2}\right)\right) \\ &= 2\tanh^{-1}\left[\exp\left\{\sum_{i=1}^{d_0-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\ &= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right] \end{aligned} \quad (6)$$

In $x \geq 0$, if a function $\phi(x)$ is defined as an expression $\phi(x) = \ln(\tan h(x/2))$, an expression $\phi^{-1}(x) = 2 \tan h^{-1}(e^{-x})$ is realized. For this reason, the expression (6) can be transformed into an expression (7).

[Formula 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

In the check node, the check node operation of the expression (2) is performed according to the expression (7).

That is, in the check node, as illustrated in FIG. 6, the message $u_j$ that corresponds to the edge for calculation is acquired by the check node operation of the expression (7) using messages $v_1$, $v_2$, $v_3$, $v_4$, and $v_5$ from the remaining edges connected to the check node. The messages that correspond to the other edges are also acquired by the same method.

The function $\phi(x)$ of the expression (7) can be represented as an expression $\phi(x) = \ln((e^x+1)/(e^x-1))$ and $\phi(x) = \phi^{-1}(x)$ is satisfied in $x > 0$. When the functions $\phi(x)$ and $\phi^{-1}(x)$ are mounted to hardware, the functions $\phi(x)$ and $\phi^{-1}(x)$ may be mounted using an Look Up Table (LUT). However, both the functions $\phi(x)$ and $\phi^{-1}(x)$ become the same LUT.

CITATION LIST

Non-Patent Document

Non-Patent Document 1: DVB-S.2: ETSI EN 302 307 V1.1.2 (2006 June)

SUMMARY OF THE INVENTION

Problems to be Solved by the Invention

The LDPC code is adopted in DVB-S.2 to be a standard of satellite digital broadcasting or DVB-T.2 to be a standard of next-generation territorial digital broadcasting. In addition, adoption of the LDPC code in DVB-C.2 to be a standard of next-generation Cable Television (CATV) digital broadcasting is scheduled.

In digital broadcasting based on a DVB standard such as the DVB-S.2, the LDPC code becomes a symbol (symbolized) of orthogonal modulation (digital modulation) such as Quadrature Phase Shift Keying (QPSK) and the symbol is mapped to a signal point and is transmitted.

In the symbolization of the LDPC code, interchanging of sign bits of the LDPC code is performed in a unit of sign bits of two bits or more and the sign bits after the interchanging become bits of the symbol.

As a method of interchanging the sign bits to symbolize the LDPC code, various methods are suggested. For example, the interchange method is also defined in the DVB-T.2.

Meanwhile, the DVB-T.2 is a standard of digital broadcasting exclusively used for a fixed terminal such as a television receiver installed in the home or the like and may not be appropriate in digital broadcasting exclusively used for a mobile terminal.

That is, as compared with the fixed terminal, in the mobile terminal, it is necessary to decrease a circuit scale and decrease consumption power. Therefore, in the digital broadcasting exclusively used for the mobile terminal, in order to alleviate load necessary for processing such as decoding of the LDPC code in the mobile terminal, the repeat count (repeat decoding count C) of decoding of the LDPC code or the code length of the LDPC code may be restricted more than the case of the digital broadcasting exclusively used for the fixed terminal.

However, it is necessary to maintain resistance to error to some extent, under the restriction.

The present technique has been made in view of the above circumstances and enables resistance to error of data such as an LDPC code to be improved.

Solutions to Problems

A data processing device/data processing method according to a first aspect of the present technique is a data processing device/data processing method including an encoding unit/step that performs LDPC encoding in which a code length is 16200 bits and an encoding rate is 8/15, on the basis of a parity check matrix of an LDPC code, and an interchanging unit/step that interchanges sign bits of the LDPC code with symbol bits of a symbol corresponding to any one of 16 signal points determined by 16QAM. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464. When sign bits of 8 bits stored in 8 storage units having storage capacities of 16200/8 bits and read from the respective storage units one bit at a time are allocated to two consecutive symbols, the interchanging unit/step sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y0, y4, y3, y1, y2, y5, y6, and y7, respectively.

In the first aspect described above, the LDPC encoding in which the code length is 16200 bits and the encoding rate is 8/15 is performed on the basis of the parity check matrix of the LDPC code and the sign bits of the LDPC code are interchanged with the symbol bits of the symbol corresponding to any one of the 16 signal points determined by the 16QAM. The LDPC code includes the information bits and the parity bits, the parity check matrix includes the information matrix portion corresponding to the information bits and the parity matrix portion corresponding to the parity bits, the information matrix portion is represented by the parity check matrix initial value table, and the parity check matrix initial value table is the table that represents the positions of the elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
25 272 1015 7464. When the sign bits of the 8 bits stored in the 8 storage units having the storage capacities of 16200/8 bits and read from the respective storage units one bit at a time are allocated to the two consecutive symbols, the (#i+1)-th bit from the most significant bit of the sign bits of the 8 bits is set as the bit b#i, the (#i+1)-th bit from the most significant bit of the symbol bits of the 8 bits of the two symbols is set as the bit y#i, and the bits b0, b1, b2, b3, b4, b5, b6, and b7 are interchanged with bits y0, y4, y3, y1, y2, y5, y6, and y7, respectively.

A data processing device/data processing method according to a second aspect of the present technique is a data processing device/data processing method including an encoding unit/step that performs LDPC encoding in which a code length is 16200 bits and an encoding rate is 7/15, on the basis of a parity check matrix of an LDPC code, and an interchanging unit/step that interchanges sign bits of the LDPC code with symbol bits of a symbol corresponding to any one of 64 signal points determined by 64QAM. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
5961 7484
3144 4636 5282
5708 5875 8390
3322 5223 7975
197 4653 8283
598 5393 8624
906 7249 7542
1223 2148 8195
976 2001 5005. When sign bits of 12 bits stored in 12 storage units having storage capacities of 16200/12 bits and read from the respective storage units one bit at a time are allocated to two consecutive symbols, the interchanging unit/step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y8, y7, y1, y6, y4, y3, y10, y9, y5, and y11, respectively.

In the second aspect described above, the LDPC encoding in which the code length is the 16200 bits and the encoding rate is 7/15 is performed on the basis of the parity check matrix of the LDPC code and the sign bits of the LDPC code are interchanged with the symbol bits of the symbol corresponding to any one of the 64 signal points determined by the 64QAM. The LDPC code includes the information bits and the parity bits, the parity check matrix includes the information matrix portion corresponding to the information bits and the parity matrix portion corresponding to the parity bits, the information matrix portion is represented by the parity check matrix initial value table, and the parity check matrix initial value table is the table that represents the positions of the elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005. When the sign bits of the 12 bits stored in the 12 storage units having the storage capacities of 16200/12 bits and read from the respective storage units one bit at a time are allocated to the two consecutive symbols, the (#i+1)-th bit from the most significant bit of the sign bits of the 12 bits is set as the bit b#i, the (#i+1)-th bit from the most significant bit of the symbol bits of the 12 bits of the two symbols is set as the bit y#i, and the bits b0, b1, b2, b3, b4, b5, b6, b7, b8, b9, b10, and b11 are interchanged with the bits y2, y0, y8, y7, y1, y6, y4, y3, y10, y9, y5, and y11, respectively.

A data processing device/data processing method according to a third aspect of the present technique is a data processing device/data processing method including an encoding unit/step that performs LDPC encoding in which a code length is 16200 bits and an encoding rate is 8/15, on the basis of a parity check matrix of an LDPC code, and an interchanging unit/step that interchanges sign bits of the LDPC code with symbol bits of a symbol corresponding to any one of 64 signal points determined by 64QAM. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543

2121 6838 7054
1948 3109 5046
272 1015 7464, and when sign bits of 12 bits stored in 12 storage units having storage capacities of 16200/12 bits and read from the respective storage units one bit at a time are allocated to two consecutive symbols, the interchanging unit/step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y4, y1, y6, y7, y8, y5, y10, y3, y9, and y11, respectively.

In the third aspect described above, the LDPC encoding in which the code length is the 16200 bits and the encoding rate is 8/15 is performed on the basis of the parity check matrix of the LDPC code and the sign bits of the LDPC code are interchanged with the symbol bits of the symbol corresponding to any one of the 64 signal points determined by the 64QAM. The LDPC code includes the information bits and the parity bits, the parity check matrix includes the information matrix portion corresponding to the information bits and the parity matrix portion corresponding to the parity bits, the information matrix portion is represented by the parity check matrix initial value table, and the parity check matrix initial value table is the table that represents the positions of the elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464. When the sign bits of the 12 bits stored in the 12 storage units having the storage capacities of the 16200/12 bits and read from the respective storage units one bit at a time are allocated to the two consecutive symbols, the (#i+1)-th bit from the most significant bit of the sign bits of the 12 bits is set as the bit b#i, the (#i+1)-th bit from the most significant bit of the symbol bits of the 12 bits of the two symbols is set as the bit y#i, and the bits b0, b1, b2, b3, b4, b5, b6, b7, b8, b9, b10, and b11 are interchanged with the bits y2, y0, y4, y1, y6, y7, y8, y5, y10, y3, y9, and y11, respectively.

A data processing device/data processing method according to a fourth aspect of the present technique is a data processing device/data processing method including a reverse interchanging unit/step that interchanges symbol bits of a symbol corresponding to any one of 16 signal points determined by 16QAM with sign bits of an LDPC code in which a code length is 16200 bits and an encoding rate is 8/15, and a decoding unit/step that decodes the LDPC code interchanged by the reverse interchanging unit/step, on the basis of a parity check matrix of the LDPC code. When sign bits of 8 bits stored in 8 storage units having storage capacities of 16200/8 bits and read from the respective storage units one bit at a time are allocated to two consecutive symbols, the reverse interchanging unit/step sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits y0, y4, y3, y1, y2, y5, y6, and y7 with bits b0, b1, b2, b3, b4, b5, b6, and b7, respectively. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

In the fourth aspect described above, the symbol bits of the symbol corresponding to any one of the 16 signal points determined by the 16QAM is interchanged with the sign bits of the LDPC code in which the code length is the 16200 bits and the encoding rate is 8/15 and the interchanged LDPC code is decoded on the basis of the parity check matrix of the LDPC code. When the sign bits of the 8 bits stored in the 8 storage units having the storage capacities of the 16200/8 bits and read from the respective storage units one bit at a time are allocated to the two consecutive symbols, the (#i+1)-th bit from the most significant bit of the sign bits of the 8 bits is set as the bit b#i, the (#i+1)-th bit from the most significant bit of the symbol bits of the 8 bits of the two symbols is set as the bit y#i, and the bits y0, y4, y3, y1, y2, y5, y6, and y7 are interchanged with the bits b0, b1, b2, b3, b4, b5, b6, and b7, respectively. The LDPC code includes the information bits and the parity bits, the parity check matrix includes the information matrix portion corresponding to the information bits and the parity matrix portion corresponding to the parity bits, the information matrix portion is represented by the parity check matrix initial value table, and the parity check matrix initial value table is the table that represents the positions of the elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553

5145 6018 7148 7507

3198 4858 6983 7033

3170 5126 5625 6901

2839 6093 7071 7450

11 3735 5413

2497 5400 7238

2067 5172 5714

1889 7173 7329

1795 2773 3499

2695 2944 6735

3221 4625 5897

1690 6122 6816

5013 6839 7358

1601 6849 7415

2180 7389 7543

2121 6838 7054

1948 3109 5046

272 1015 7464.

A data processing device/data processing method according to a fifth aspect of the present technique is a data processing device/data processing method including a reverse interchanging unit/step that interchanges symbol bits of a symbol corresponding to any one of 64 signal points determined by 64QAM with sign bits of an LDPC code in which a code length is 16200 bits and an encoding rate is 7/15, and a decoding unit/step that decodes the LDPC code interchanged by the reverse interchanging unit/step, on the basis of a parity check matrix of the LDPC code. When sign bits of 12 bits stored in 12 storage units having storage capacities of 16200/12 bits and read from the respective storage units one bit at a time are allocated to two consecutive symbols, the reverse interchanging unit/step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y8, y7, y1, y6, y4, y3, y10, y9, y5, and y11 with bits b0, b1, b2, b3, b4, b5, b6, b7, b8, b9, b10, and b11, respectively. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623

56 1955 3000 8242

1809 4094 7991 8489

2220 6455 7849 8548

1006 2576 3247 6976

2177 6048 7795 8295

1413 2595 7446 8594

2101 3714 7541 8531

10 5961 7484

3144 4636 5282

5708 5875 8390

3322 5223 7975

197 4653 8283

598 5393 8624

906 7249 7542

1223 2148 8195

976 2001 5005

In the fifth aspect described above, the symbol bits of the symbol corresponding to any one of the 64 signal points determined by the 64QAM are interchanged with the sign bits of the LDPC code in which the code length is the 16200 bits and the encoding rate is 7/15 and the interchanged LDPC code is decoded on the basis of the parity check matrix of the LDPC code. When the sign bits of the 12 bits stored in the 12 storage units having the storage capacities of the 16200/12 bits and read from the respective storage units one bit at a time are allocated to the two consecutive symbols, the (#i+1)-th bit from the most significant bit of the sign bits of the 12 bits is set as the bit b#i, the (#i+1)-th bit from the most significant bit of the symbol bits of the 12 bits of the two symbols is set as the bit y#i, and the bits y2, y0, y8, y7, y1, y6, y4, y3, y10, y9, y5, and y11 are interchanged with bits b0, b1, b2, b3, b4, b5, b6, b7, b8, b9, b10, and b11, respectively. The LDPC code includes the information bits and the parity bits, the parity check matrix includes the information matrix portion corresponding to the information bits and the parity matrix portion corresponding to the parity bits, the information matrix portion is represented by the parity check matrix initial value table, and the parity check matrix initial value table is the table that represents the positions of the elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559
   3452 7935 8092 8623
   56 1955 3000 8242
   1809 4094 7991 8489
   2220 6455 7849 8548
   1006 2576 3247 6976
   2177 6048 7795 8295
   1413 2595 7446 8594
   2101 3714 7541 8531
   10 5961 7484
   3144 4636 5282
   5708 5875 8390
   3322 5223 7975
   197 4653 8283
   598 5393 8624
   906 7249 7542
   1223 2148 8195
   976 2001 5005.

A data processing device/data processing method according to a sixth aspect of the present technique is a data processing device/data processing method including a reverse interchanging unit/step that interchanges symbol bits of a symbol corresponding to any one of 64 signal points determined by 64QAM with sign bits of an LDPC code in which a code length is 16200 bits and an encoding rate is 8/15, and a decoding unit/step that decodes the LDPC code interchanged by the reverse interchanging unit/step, on the basis of a parity check matrix of the LDPC code. When sign bits of 12 bits stored in 12 storage units having storage capacities of 16200/12 bits and read from the respective storage units one bit at a time are allocated to two consecutive symbols, the reverse interchanging unit/step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y4, y1, y6, y7, y8, y5, y10, y3, y9, and y11 with bits b0, b1, b2, b3, b4, b5, b6, b7, b8, b9, b10, and b11, respectively. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
   1788 1881 1910 2724 4504 4928 4973 5616 5686 5718 5846 6523 6893 6994 7074 7100 7277 7399 7476 7480 7537
   2791 2824 2927 4196 4298 4800 4948 5361 5401 5688 5818 5862 5969 6029 6244 6645 6962 7203 7302 7454 7534
   574 1461 1826 2056 2069 2387 2794 3349 3366 4951 5826 5834 5903 6640 6762 6786 6859 7043 7418 7431 7554
   14 178 675 823 890 930 1209 1311 2898 4339 4600 5203 6485 6549 6970 7208 7218 7298 7454 7457 7462
   4075 4188 7313 7553
   5145 6018 7148 7507
   3198 4858 6983 7033
   3170 5126 5625 6901
   2839 6093 7071 7450
   11 3735 5413
   2497 5400 7238
   2067 5172 5714
   1889 7173 7329
   1795 2773 3499
   2695 2944 6735
   3221 4625 5897
   1690 6122 6816
   5013 6839 7358
   1601 6849 7415
   2180 7389 7543
   2121 6838 7054
   1948 3109 5046
   272 1015 7464.

In the sixth aspect described above, the symbol bits of the symbol corresponding to anyone of the 64 signal points determined by the 64QAM are interchanged with the sign bits of the LDPC code in which the code length is the 16200 bits and the encoding rate is 8/15 and the interchanged LDPC code is decoded on the basis of the parity check matrix of the LDPC code. When the sign bits of the 12 bits stored in the 12 storage units having the storage capacities of the 16200/12 bits and read from the respective storage units one bit at a time are allocated to the two consecutive symbols, the (#i+1)-th bit from the most significant bit of the sign bits of the 12 bits is set as the bit b#i, the (#i+1)-th bit from the most significant bit of the symbol bits of the 12 bits of the two symbols is set as the bit y#i, and the bits y2, y0, y4, y1, y6, y7, y8, y5, y10, y3, y9, and y11 are interchanged with the bits b0, b1, b2, b3, b4, b5, b6, b7, b8, b9, b10, and b11, respectively. The LDPC code includes the information bits and the parity bits, the parity check matrix includes the information matrix portion corresponding to the information bits and the parity matrix portion corresponding to the parity bits, the information matrix portion is represented by the parity check matrix initial value table, and the parity check matrix initial value table is the table that represents the positions of the elements of 1 of the information matrix portion for every 360 columns and is configured as follows:

32 384 430 591 1296 1976 1999 2137 2175 3638 4214 4304 4486 4662 4999 5174 5700 6969 7115 7138 7189
   1788 1881 1910 2724 4504 4928 4973 5616 5686 5718 5846 6523 6893 6994 7074 7100 7277 7399 7476 7480 7537
   2791 2824 2927 4196 4298 4800 4948 5361 5401 5688 5818 5862 5969 6029 6244 6645 6962 7203 7302 7454 7534
   574 1461 1826 2056 2069 2387 2794 3349 3366 4951 5826 5834 5903 6640 6762 6786 6859 7043 7418 7431 7554
   14 178 675 823 890 930 1209 1311 2898 4339 4600 5203 6485 6549 6970 7208 7218 7298 7454 7457 7462
   4075 4188 7313 7553
   5145 6018 7148 7507
   3198 4858 6983 7033
   3170 5126 5625 6901
   2839 6093 7071 7450
   11 3735 5413
   2497 5400 7238
   2067 5172 5714
   1889 7173 7329
   1795 2773 3499
   2695 2944 6735
   3221 4625 5897
   1690 6122 6816
   5013 6839 7358
   1601 6849 7415
   2180 7389 7543
   2121 6838 7054
   1948 3109 5046
   272 1015 7464.

The data processing device may be an independent device and may be an internal block constituting one device.

Effects of the Invention

According to the present technique, resistance to error can be improved.

BRIEF DESCRIPTION OF DRAWINGS

FIG. 1 is a diagram illustrating a parity check matrix H of an LDPC code.

FIG. 2 is a flowchart illustrating a decoding sequence of an LDPC code.

FIG. 3 is a diagram illustrating an example of a parity check matrix of an LDPC code.

FIG. 13 is a diagram illustrating a parity check matrix of an LDPC code defined in a standard of DVB-S.2.

FIG. 25 is a diagram illustrating a column number of a memory 31 necessary for column twist interleave and an address of a write start position.

FIG. 26 is a diagram illustrating a column number of a memory 31 necessary for column twist interleave and an address of a write start position.

FIG. 28 is a diagram illustrating a model of a communication channel adopted by a simulation.

FIG. 34 is a diagram illustrating a method of acquiring a parity check matrix H from a parity check matrix initial value table.

FIG. 35 is a diagram illustrating an example of a parity check matrix initial value table in which an encoding rate is 1/5 and a code length is 16200.

FIG. 36 is a diagram illustrating an example of a parity check matrix initial value table in which an encoding rate is 4/15 and a code length is 16200.

FIG. 37 is a diagram illustrating an example of a parity check matrix initial value table in which an encoding rate is 1/3 and a code length is 16200.

FIG. 38 is a diagram illustrating an example of a parity check matrix initial value table in which an encoding rate is 2/5 and a code length is 16200.

FIG. 39 is a diagram illustrating an example of a parity check matrix initial value table in which an encoding rate is 4/9 and a code length is 16200.

FIG. 40 is a diagram illustrating an example of a parity check matrix initial value table in which an encoding rate is 7/15 and a code length is 16200.

FIG. 41 is a diagram illustrating an example of a parity check matrix initial value table in which an encoding rate is 8/15 and a code length is 16200.

FIG. 42 is a diagram illustrating an example of a parity check matrix initial value table in which an encoding rate is 3/5 and a code length is 16200.

FIG. 43 is a diagram illustrating an example of a parity check matrix initial value table in which an encoding rate is 2/3 and a code length is 16200.

FIG. 48 is a diagram illustrating a parity check matrix of an LDPC code having a code length of 16200.

FIG. 54 is a diagram illustrating interchanging of sign bits according to an allocation rule, when an LDPC code having a code length of 16200 and an encoding rate of 8/15 is modulated by 16QAM and a multiple b is 2.

FIG. 55 is a diagram illustrating a sign bit group and a symbol bit group when an LDPC code having a code length of 16200 and an encoding rate of 7/15 is modulated by 64QAM and a multiple b is 2.

FIG. 58 is a diagram illustrating a sign bit group and a symbol bit group when an LDPC code having a code length of 16200 and an encoding rate of 8/15 is modulated by 64QAM and a multiple b is 2.

FIG. 61 is a diagram illustrating a sign bit group and a symbol bit group when an LDPC code having a code length of 16200 and an encoding rate of 7/15 is modulated by 256QAM and a multiple b is 1.

FIG. 63 is a diagram illustrating interchanging of sign bits according to an allocation rule, when an LDPC code having a code length of 16200 and an encoding rate of 7/15 is modulated by 256QAM and a multiple b is 1.

FIG. 67 is a diagram illustrating an example of a parity check matrix of an LDPC code.

MODE FOR CARRYING OUT THE INVENTION

[Configuration Example of Transmission System to Present Technique is Applied]

Figure 7:
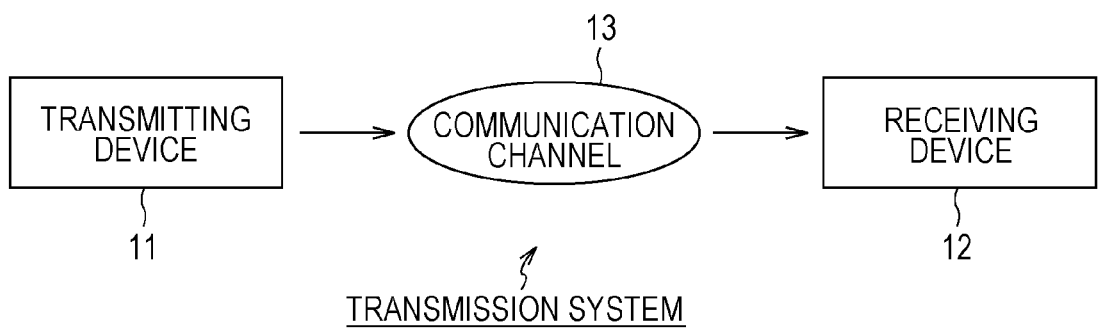
FIG. 7 is a diagram illustrating a configuration example of an embodiment of a transmission system to which the present technique is applied.

FIG. 7 illustrates a configuration example of an embodiment of a transmission system (a system means a logical gathering of a plurality of devices and a device of each configuration may be arranged or may not be arranged in the same casing) to which the present technique is applied.

In FIG. 7, the transmission system consists of a transmitting device 11 and a receiving device 12.

The transmitting device 11 transmits (broadcasts) a program that is exclusively used for a fixed terminal or a mobile terminal. That is, the transmitting device 11 encodes target data to be a transmission target such as image data or sound data corresponding to the program exclusively used for the fixed terminal or the mobile terminal with an LDPC code and transmits the LDPC code through, for example, a communication channel 13 to be a ground wave.

The receiving device 12 is, for example, a mobile terminal and receives the LDPC code transmitted from the transmitting device 11 through the communication channel 13, decodes the LDPC code to obtain the target data, and outputs the target data.

Here, it is known that the LDPC code used by the transmission system of FIG. 7 shows the very high capability in an Additive White Gaussian Noise (AWGN) communication channel.

However, in the communication channel 13 such as the ground wave, burst error or erasure may be generated. For example, in an Orthogonal Frequency Division Multiplexing (OFDM) system, power of a specific symbol may become 0 (erasure) according to delay of an echo (paths other than a main path), under a multi-path environment in which D/U (Desired to Undesired Ratio) is 0 dB (power of Undesired=echo is equal to power of Desired=main path).

In addition, in the flutter (communication channel in which delay is 0 and an echo having a Doppler frequency is added), when D/U is 0 dB, entire power of an OFDM symbol at a specific time may become 0 (erasure) by the Doppler frequency.

Furthermore, the burst error may be generated due to a situation of a wiring line from a receiving unit (not illustrated) of the side of the receiving device 12 such as an antenna receiving a signal from the transmitting device 11 to the receiving device 12 or instability of a power supply of the receiving device 12.

Figure 4:
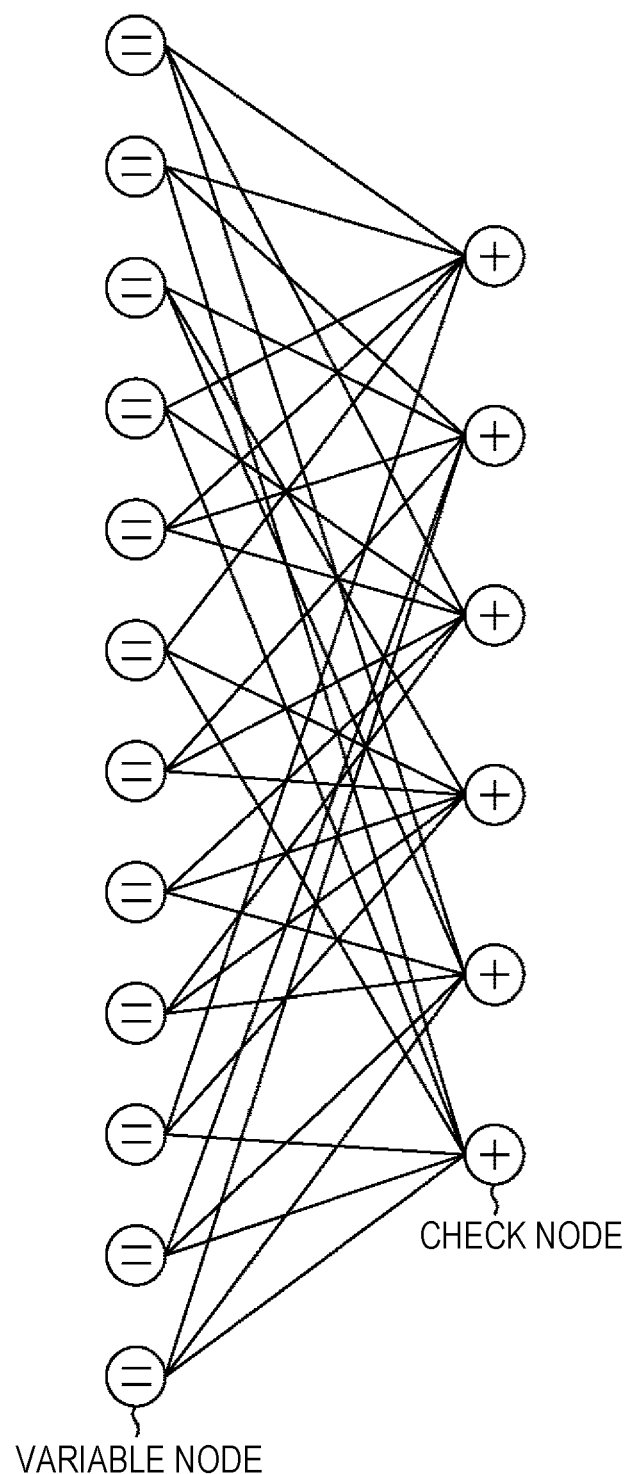
FIG. 4 is a diagram illustrating a Tanner graph of a parity check matrix.
Figure 5:
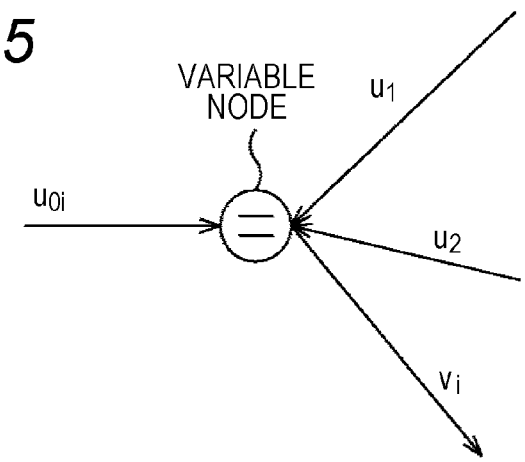
FIG. 5 is a diagram illustrating a variable node.
Figure 6:
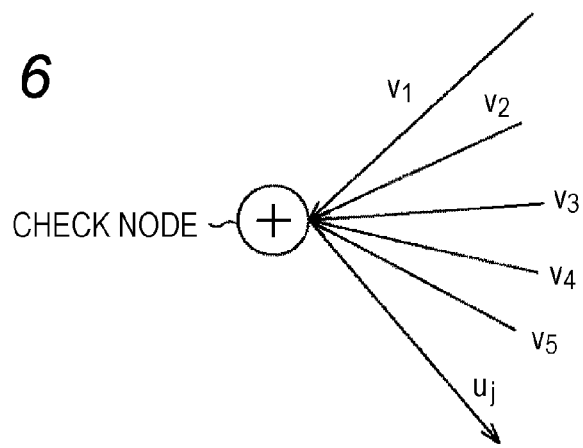
FIG. 6 is a diagram illustrating a check node.

Meanwhile, in decoding of the LDPC code, in the variable node corresponding to the column of the parity check matrix H and the sign bit of the LDPC code, as illustrated in FIG. 5 described above, the variable node operation of the expression (1) with the addition of (the reception value $u_{0i}$ of) the sign bit of the LDPC code is performed. For this reason, if error is generated in the sign bits used for the variable node operation, precision of the acquired message is deteriorated.

In addition, in the decoding of the LDPC code, in the check node, the check node operation of the expression (7) is performed using the message acquired by the variable node connected to the check node. For this reason, if the number of check nodes in which error (including erasure) is generated simultaneously in (the sign bits of the LDPC codes corresponding to) the plurality of connected variable nodes increases, decoding performance is deteriorated.

That is, if the two or more variable nodes of the variable nodes connected to the check node become simultaneously erasure, the check node returns a message in which the probability of a value being 0 and the probability of a value being 1 are equal to each other, to all the variable nodes. Here, the check node that returns the message of the equal probabilities does not contribute to one decoding processing (one set of the variable node operation and the check node operation). As a result, it is necessary to increase the repeat count of the decoding processing. For this reason, the decoding performance is deteriorated and consumption power of the receiving device 12 that performs decoding of the LDPC code increases.

Therefore, in the transmission system of FIG. 7, resistance to the burst error or the erasure is improved while performance in the AWGN communication channel is maintained.

[Configuration Example of Transmitting Device 11]

Figure 8:
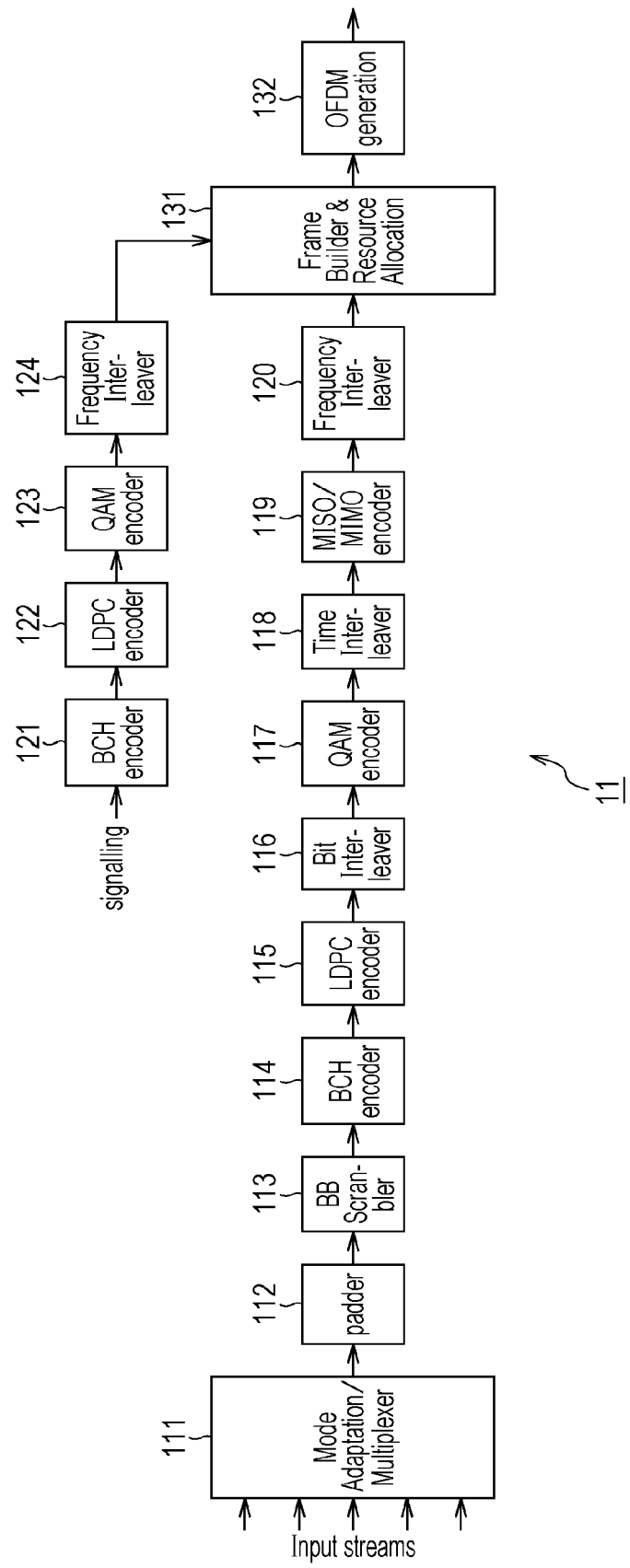
FIG. 8 is a block diagram illustrating a configuration example of a transmitting device 11.

FIG. 8 is a block diagram illustrating a configuration example of the transmitting device 11 of FIG. 7.

In the transmitting device 11, one or more input streams as target data are supplied to a mode adaptation/multiplexer 111.

The mode adaptation/multiplexer 111 performs mode selection and multiplexing of one or more input streams supplied thereto and supplies data obtained as a result thereof to a padder 112.

The padder 112 performs necessary zero padding (insertion of Null) with respect to the data supplied from the mode adaptation/multiplexer 111 and supplies data obtained as a result thereof to a BB scrambler 113.

The BB scrambler 113 performs energy diffusion processing with respect to the data supplied from the padder 112 and supplies data obtained as a result thereof to a BCH encoder 114.

The BCH encoder 114 performs BCH encoding with respect to the data supplied from the BB scrambler 113 and supplies data obtained as a result thereof as LDPC target data to be an LDPC encoding target to an LDPC encoder 115.

The LDPC encoder 115 performs LDPC encoding according to a parity check matrix in which a parity matrix to be a portion corresponding to a parity bit of an LDPC code becomes a staircase structure, with respect to the LDPC target data supplied from the BCH encoder 114, and outputs an LDPC code in which the LDPC target data is information bits.

That is, the LDPC encoder 115 performs the LDPC encoding to encode the LDPC target data with an LDPC code such as the LDPC code defined in the standard of the DVB-T.2 and outputs the LDPC code obtained as a result thereof.

Here, in the standard of the DVB-T.2, the LDPC code defined in the standard of the DVB-S.2 is adopted, except for the case in which a code length is 16200 bits and an encoding ratio is 3/5. The LDPC code defined in the standard of the DVB-T.2 is an Irregular Repeat Accumulate (IRA) code and a parity matrix of the parity check matrix of the LDPC code becomes a staircase structure. The parity matrix and the staircase structure will be described later. The IRA code is described in "Irregular Repeat-Accumulate Codes", H. Jin, A. Khandekar, and R. J. McEliece, in Proceedings of 2nd International Symposium on Turbo codes and Related Topics, pp. 1-8, September 2000, for example.

The LDPC code that is output by the LDPC encoder 115 is supplied to the bit interleaver 116.

The bit interleaver 116 performs bit interleave to be described later with respect to the LDPC code supplied from the LDPC encoder 115 and supplies the LDPC code after the bit interleave to a QAM encoder 117.

The QAM encoder 117 maps the LDPC code supplied from the bit interleaver 116 to a signal point representing one symbol of orthogonal modulation in a unit (symbol unit) of sign bits of one or more bits of the LDPC code, and performs the orthogonal modulation (multi-level modulation).

That is, the QAM encoder 117 maps the LDPC code supplied from the bit interleaver 116 to a signal point determined by a modulation method performing the orthogonal modulation of the LDPC code, on an IQ plane (IQ constellation) defined by an I axis representing an I component of the same phase as a carrier wave and a Q axis representing a Q component orthogonal to the carrier wave, and performs the orthogonal modulation.

Here, as the modulation method of the orthogonal modulation performed by the QAM encoder 117, for example, modulation methods including the modulation method defined in the standard of the DVB-T, that is, QPSK (Quadrature Phase Shift Keying), 16 QAM (Quadrature Amplitude Modulation), 64QAM, 256QAM, 1024QAM, and 4096QAM are known. In the QAM encoder 117, to perform the orthogonal modulation based on which modulation method is previously set according to an operation of an operator of the transmitting device 11. In the QAM encoder 117, for example, 4 PAM (Pulse Amplitude Modulation) and other orthogonal modulations can be performed.

Data that is obtained by processing in the QAM encoder 117 (symbol mapped to the signal point) is supplied to a time interleaver 118.

The time interleaver 118 performs time interleave (interleave of a time direction) in a symbol unit with respect to the data (symbols) supplied from the QAM encoder 117 and supplies data obtained as a result thereof to an MISO/MIMO encoder 119.

The MISO/MIMO encoder 119 performs spatiotemporal encoding with respect to the data (symbol) supplied from the time interleaver 118 and supplies the data to a frequency interleaver 120.

The frequency interleaver 120 performs frequency interleave (interleave of a frequency direction) in a symbol unit with respect to the data (symbol) supplied from the MISO/MIMO encoder 119 and supplies the data to a frame builder & resource allocation unit 131.

Meanwhile, control data (signaling) for transmission control such as a preamble called L1 and the like is supplied to the BCH encoder 121.

The BCH encoder 121 performs the BCH encoding with respect to the control data supplied thereto, similar to the BCH encoder 114, and supplies data obtained as a result thereof to an LDPC encoder 122.

The LDPC encoder 122 sets the data supplied from the BCH encoder 121 as LDPC target data, performs the LDPC encoding with respect to the data, similar to the LDPC encoder 115, and supplies an LDPC code obtained as a result thereof to a QAM encoder 123.

The QAM encoder 123 maps the LDPC code supplied from the LDPC encoder 122 to a signal point representing one symbol of orthogonal modulation in a unit (symbol unit) of sign bits of one or more bits of the LDPC code, and performs the orthogonal modulation, similar to the QAM encoder 117, and supplies data (symbol) obtained as a result thereof to a frequency interleaver 124.

The frequency interleaver 124 performs the frequency interleave in a symbol unit with respect to the data (symbol) supplied from the QAM encoder 123 and supplies the data to the frame builder & resource allocation unit 131, similar to the frequency interleaver 120.

The frame builder & resource allocation unit 131 inserts symbols of pilots into necessary positions of the data (symbols) supplied from the frequency interleavers 120 and 124, configures a frame consisting of symbols of a predetermined number from data (symbols) obtained as a result thereof, and supplies the frame to an OFDM generation unit 132.

The OFDM generation unit 132 generates an OFDM signal corresponding to the frame from the frame supplied from the frame builder & resource allocation unit 131 and transmits the OFDM signal through the communication channel 13 (FIG. 7).

Figure 9:
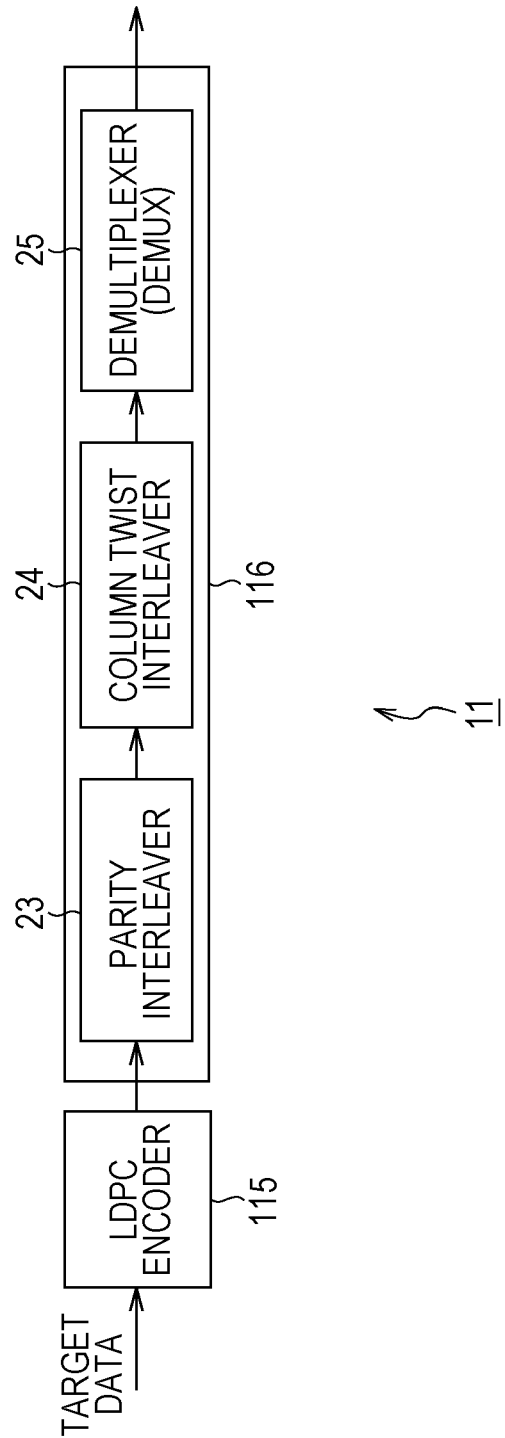
FIG. 9 is a block diagram illustrating a configuration example of a bit interleaver 116.

FIG. 9 illustrates a configuration example of the bit interleaver 116 of FIG. 8.

The bit interleaver 116 is a data processing device that interleaves data and consists of a parity interleaver 23, a column twist interleaver 24, and a demultiplexer (DEMUX) 25.

The parity interleaver 23 performs parity interleave for interleaving the parity bits of the LDPC code supplied from the LDPC encoder 115 into positions of other parity bits and supplies the LDPC code after the parity interleave to the column twist interleaver 24.

The column twist interleaver 24 performs the column twist interleave with respect to the LDPC code supplied from the parity interleaver 23 and supplies the LDPC code after the column twist interleave to the demultiplexer 25.

That is, in the QAM encoder 117 of FIG. 8, the sign bits of one or more bits of the LDPC code are mapped to the signal point representing one symbol of the orthogonal modulation and are transmitted.

In the column twist interleaver 24, the column twist interleave to be described later is performed as rearrangement processing for rearranging the sign bits of the LDPC code supplied from the parity interleaver 23, such that a plurality of sign bits of the LDPC code corresponding to 1 in any one row of the parity check matrix used by the LDPC encoder 115 are not included in one symbol.

The demultiplexer 25 executes interchange processing for interchanging positions of two or more sign bits of the LDPC code becoming the symbol, with respect to the LDPC code supplied from the column twist interleaver 24, and obtains an LDPC code in which resistance to the AWGN is reinforced. In addition, the demultiplexer 25 supplies two or more sign bits of the LDPC code obtained by the interchange processing as the symbol to the QAM encoder 117 (FIG. 8).

Figure 10:
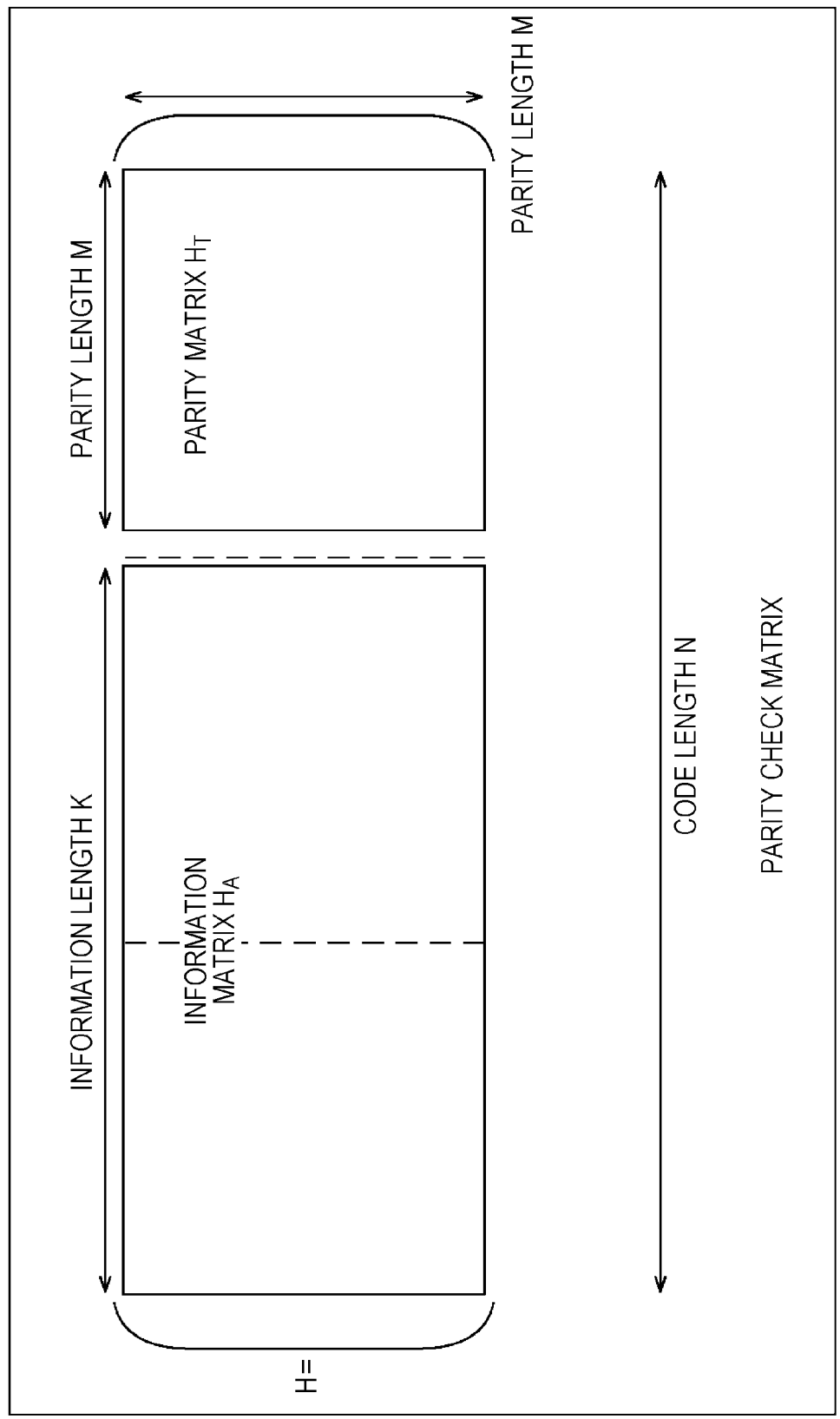
FIG. 10 is a diagram illustrating a parity check matrix.

Next, FIG. 10 illustrates the parity check matrix H that is used for LDPC encoding by the LDPC encoder 115 of FIG. 8.

The parity check matrix H becomes an Low-Density Generation Matrix (LDGM) structure and can be represented by an expression $H=[H_A|H_T]$ (a matrix in which elements of the information matrix $H_A$ are set to left elements and elements of the parity matrix $H_T$ are set to right elements), using an information matrix $H_A$ of a portion corresponding to information bits among the sign bits of the LDPC code and a parity matrix $H_T$ corresponding to the parity bits.

Here, a bit number of the information bits among the sign bits of one LDPC code (one code word) and a bit number of the parity bits are referred to as an information length K and a parity length M, respectively, and a bit number of the sign bits of one LDPC code is referred to as a code length N (=K+M).

The information length K and the parity length M of the LDPC code having the certain code length N are determined by an encoding rate. The parity check matrix H becomes a matrix in which row×column is M×N. In addition, the information matrix $H_A$ becomes a matrix of M×K and the parity matrix $H_T$ becomes a matrix of M×M.

Figure 11:
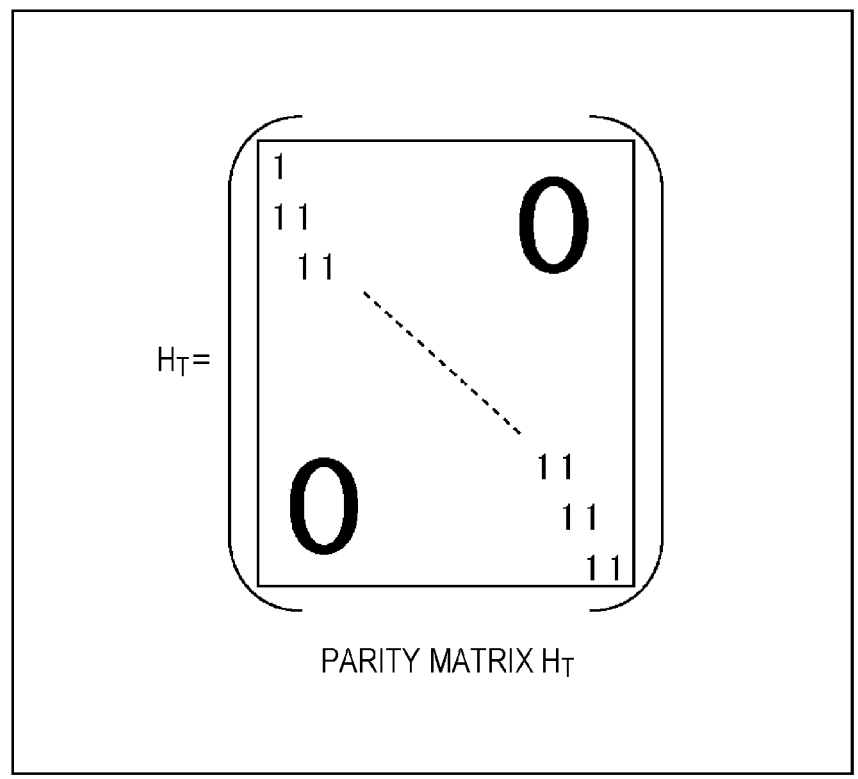
FIG. 11 is a diagram illustrating a parity matrix.

FIG. 11 illustrates the parity matrix $H_T$ of the parity check matrix H of the LDPC code that is defined in the standard of the DVB-T.2 (and the DVB-S.2).

The parity matrix $H_T$ of the parity check matrix H of the LDPC code that is defined in the standard of the DVB-T.2 becomes a staircase structure in which elements of 1 are arranged in a staircase shape, as illustrated in FIG. 11. The row weight of the parity matrix $H_T$ becomes 1 with respect to the first row and becomes 2 with respect to the all remaining rows. In addition, the column weight becomes 1 with respect to the final column and becomes 2 with respect to the remaining columns.

As described above, the LDPC code of the parity check matrix H in which the parity matrix $H_T$ becomes the staircase structure can be easily generated using the parity check matrix H.

That is, the LDPC code (one code word) is represented by a row vector c and a column vector obtained by transposing the row vector is represented by $c^T$. In addition, a portion of information bits of the row vector c to be the LDPC code is represented by a row vector A and a portion of the parity bits is represented by a row vector T.

In this case, the row vector c can be represented by an expression c=[A|T] (a row vector in which elements of the row vector A are set to left elements and elements of the row vector T are set to right elements), using the row vector A corresponding to the information bits and the row vector T corresponding to the parity bits.

In the parity check matrix H and the row vector c=[A|T] corresponding to the LDPC code, it is necessary to satisfy an expression $Hc^T=0$. The row vector T that corresponds to the parity bits constituting the row vector c=[A|T] satisfying the expression $Hc^T=0$ can be acquired sequentially (in turns) by setting elements of each row to 0, sequentially from elements of a first row of the column vector $Hc^T$ in the expression $Hc^T=0$, when the parity matrix $H_T$ of the parity check matrix $H=[H_A|H_T]$ becomes the staircase structure illustrated in FIG. 11.

Figure 12:
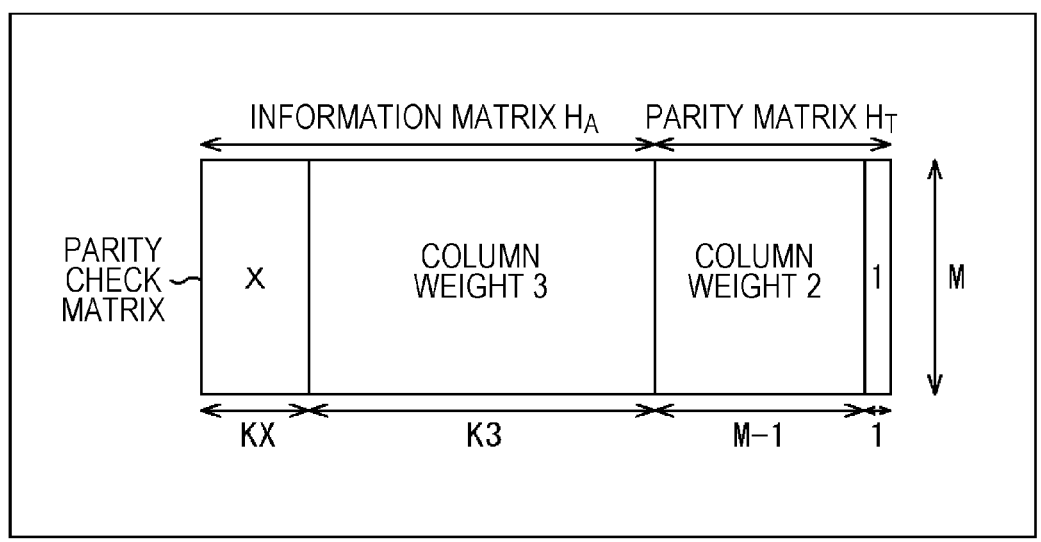
FIG. 12 is a diagram illustrating a parity check matrix of an LDPC code defined in a standard of DVB-S.2.

FIG. 12 is a diagram illustrating the parity check matrix H of the LDPC code that is defined in the standard of the DVB-T 0.2.

The column weight becomes X with respect KX columns from a first column of the parity check matrix H of the LDPC code defined in the standard of the DVB-T.2, becomes 3 with respect to the following K3 columns, becomes 2 with respect to the following (M−1) columns, and becomes 1 with respect to a final column.

Here, KX+K3+M−1+1 is equal to the code length N.

FIG. 13 is a diagram illustrating column numbers KX, K3, and M and a column weight X, with respect to each encoding rate r of the LDPC code defined in the standard of the DVB-T.2.

In the standard of the DVB-T.2, LDPC codes that have code lengths N of 64800 bits and 16200 bits are defined.

With respect to the LDPC code having the code length N of 64800 bits, 11 encoding rates (nominal rates) of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined.

Hereinafter, the code length N of the 64800 bits is referred to as 64 kbits and the code length N of the 16200 bits is referred to as 16 kbits.

With respect to the LDPC code, it is known that an error rate is low in a sign bit corresponding to a column of which a column weight of the parity check matrix H is large.

In the parity check matrix H that is illustrated in FIGS. 12 and 13 and is defined in the standard of the DVB-T.2, a column weight of a column of a head side (left side) tends to be large. Therefore, with respect to the LDPC code corresponding to the parity check matrix H, a sign bit of a head side tends to be strong for error (there is resistance to the error) and a sign bit of an ending side tends to be weak for the error.

Figure 14:
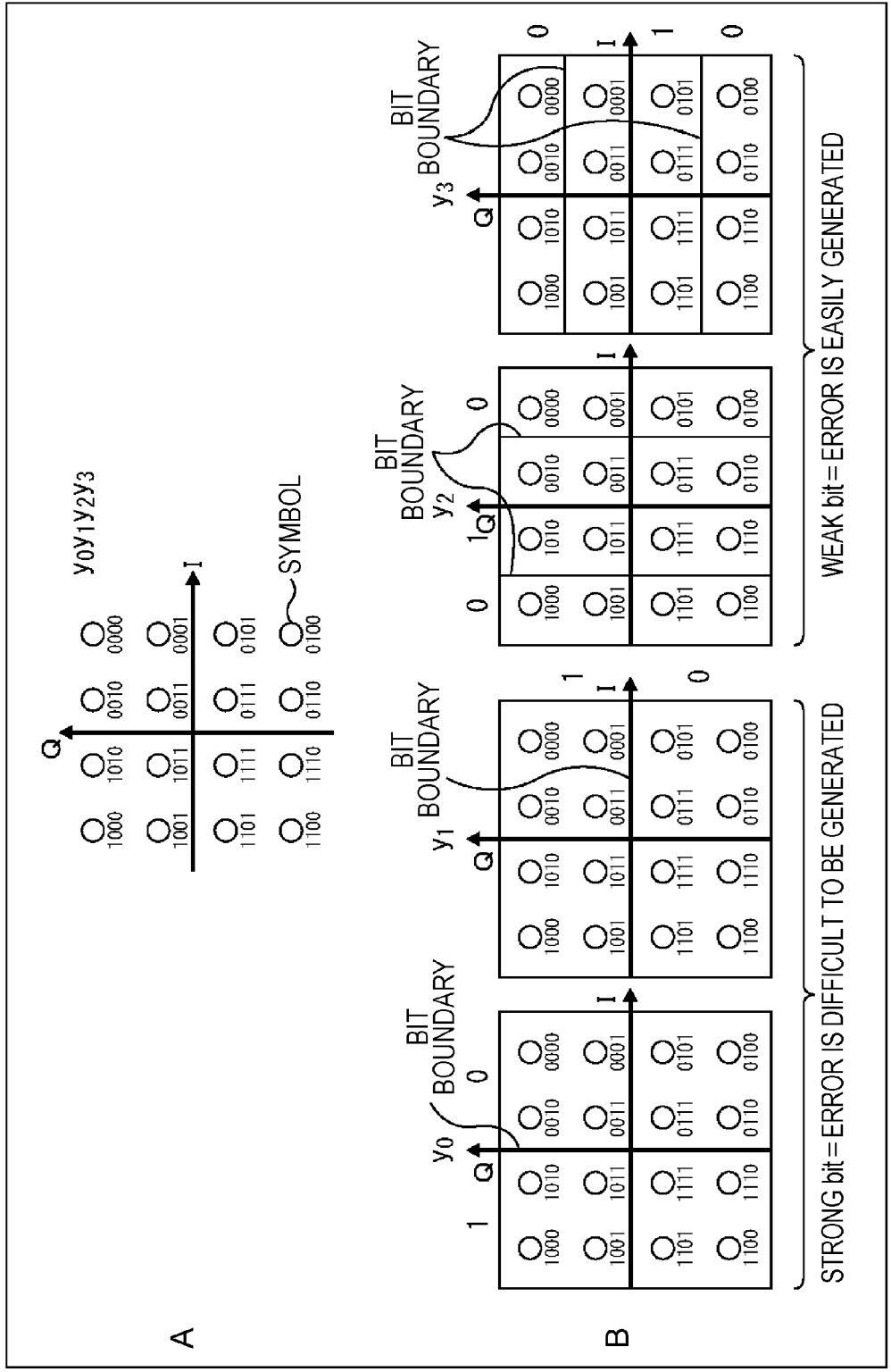
FIG. 14 is a diagram illustrating a signal point arrangement of 16QAM.

Next, FIG. 14 illustrates an arrangement of (signal points corresponding to) 16 symbols on an IQ plane, when 16QAM is performed by the QAM encoder 117 of FIG. 8.

That is, A of FIG. 14 illustrates symbols of the 16QAM of the DVB-T.2.

In the 16QAM, one symbol is represented by 4 bits and 16 ($=2^4$) symbols exist. The 16 symbols are arranged such that an I direction×a Q direction becomes a 4×4 square shape, on the basis of an origin of the IQ plane.

If an (i+1)-th bit from a most significant bit of a bit string represented by one symbol is represented as a bit $y_i$, the 4 bits represented by one symbol of the 16QAM are can be represented as bits $y_0$, $y_1$, $y_2$, and $y_3$, respectively, sequentially from the most significant bit. When a modulation method is the 16QAM, 4 bits of sign bits of the LDPC code become a symbol (symbol value) of 4 bits $y_0$ to $y_3$ (symbolized).

B of FIG. 14 illustrates a bit boundary with respect to each of the 4 bits (hereinafter, also referred to as symbol bits) $y_0$ to $y_3$ represented by the symbol of the 16QAM.

Here, a bit boundary with respect to the symbol bit $y_i$ (in FIG. 14, i=0, 1, 2, and 3) means a boundary of a symbol of which a symbol bit $y_i$ becomes 0 and a symbol of which a symbol bit $y_i$ becomes 1.

As illustrated by B of FIG. 14, only one place of the Q axis of the IQ plane becomes a bit boundary with respect to the most significant symbol bit $y_0$ of the 4 symbol bits $y_0$ to $y_3$ represented by the symbol of the 16QAM and only one place of the I axis of the IQ plane becomes a bit boundary with respect to the second (second from the most significant bit) symbol bit $y_1$.

With respect to the third symbol bit $y_2$, two places of a place between first and second columns from the left side and a place between third and fourth columns, among the 4×4 symbols, become bit boundaries.

With respect to the fourth symbol bit $y_3$, two places of a place between first and second rows from the upper side and a place between third and fourth rows, among the 4×4 symbols, become bit boundaries.

In the symbol bits $y_i$ that are represented by the symbols, when the number of symbols apart from the bit boundaries is large, the error is difficult to be generated (the error probability is low) and when the number of symbols close to the bit boundaries is large, the error is easily generated (the error probability is high).

If the bits (strong for the error) in which the error is difficult to be generated are referred to as "strong bits" and the bits (weak for the error) in which the error is easily generated are referred to as "weak bits", with respect to the 4 symbol bits $y_0$ to $y_3$ of the symbol of the 16QAM, the most significant symbol bit $y_0$ and the second symbol bit $y_1$ become the strong bits and the third symbol bit $y_2$ and the fourth symbol bit $y_3$ become the weak bits.

Figure 15:
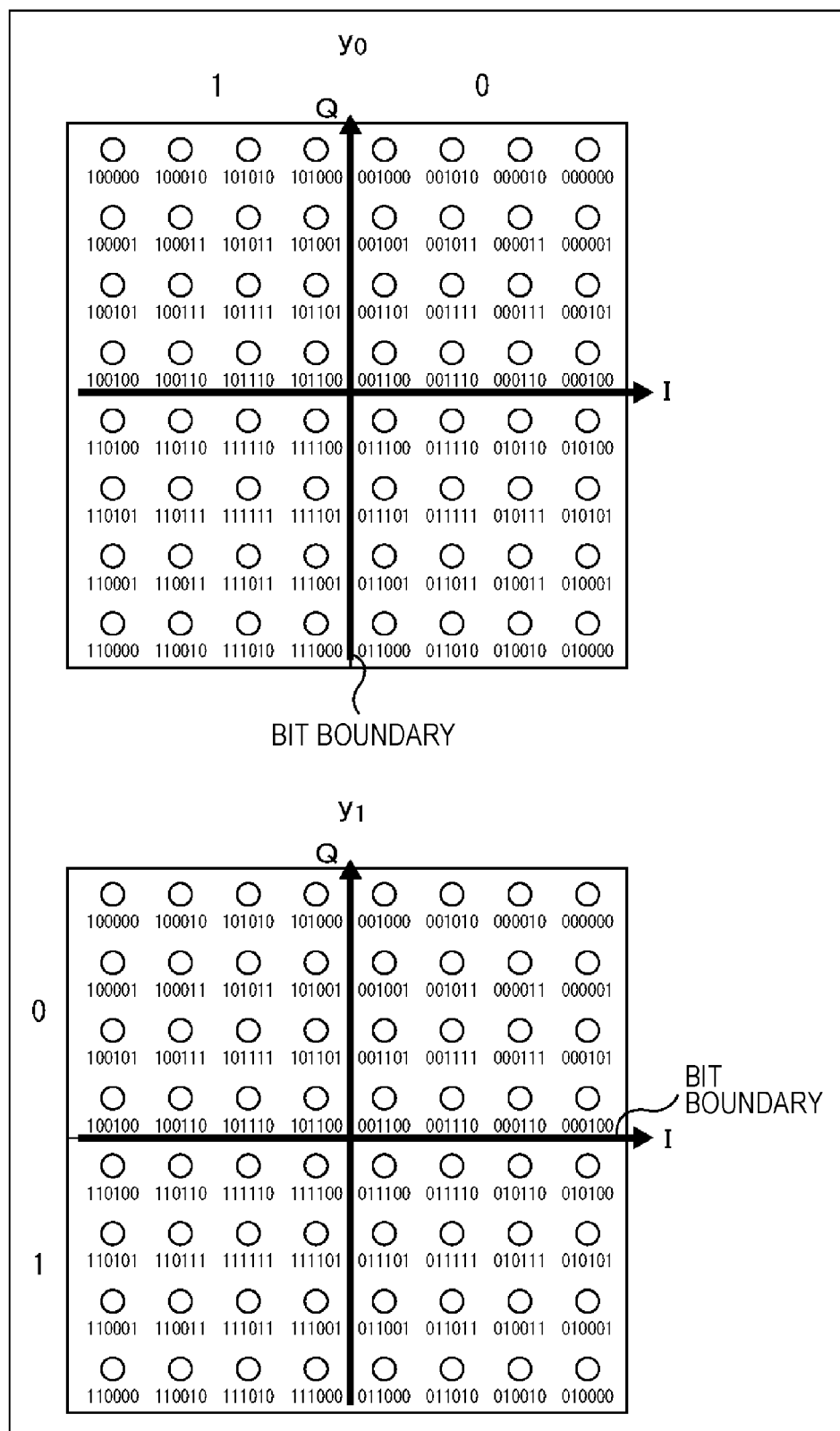
FIG. 15 is a diagram illustrating a signal point arrangement of 64QAM.
Figure 16:
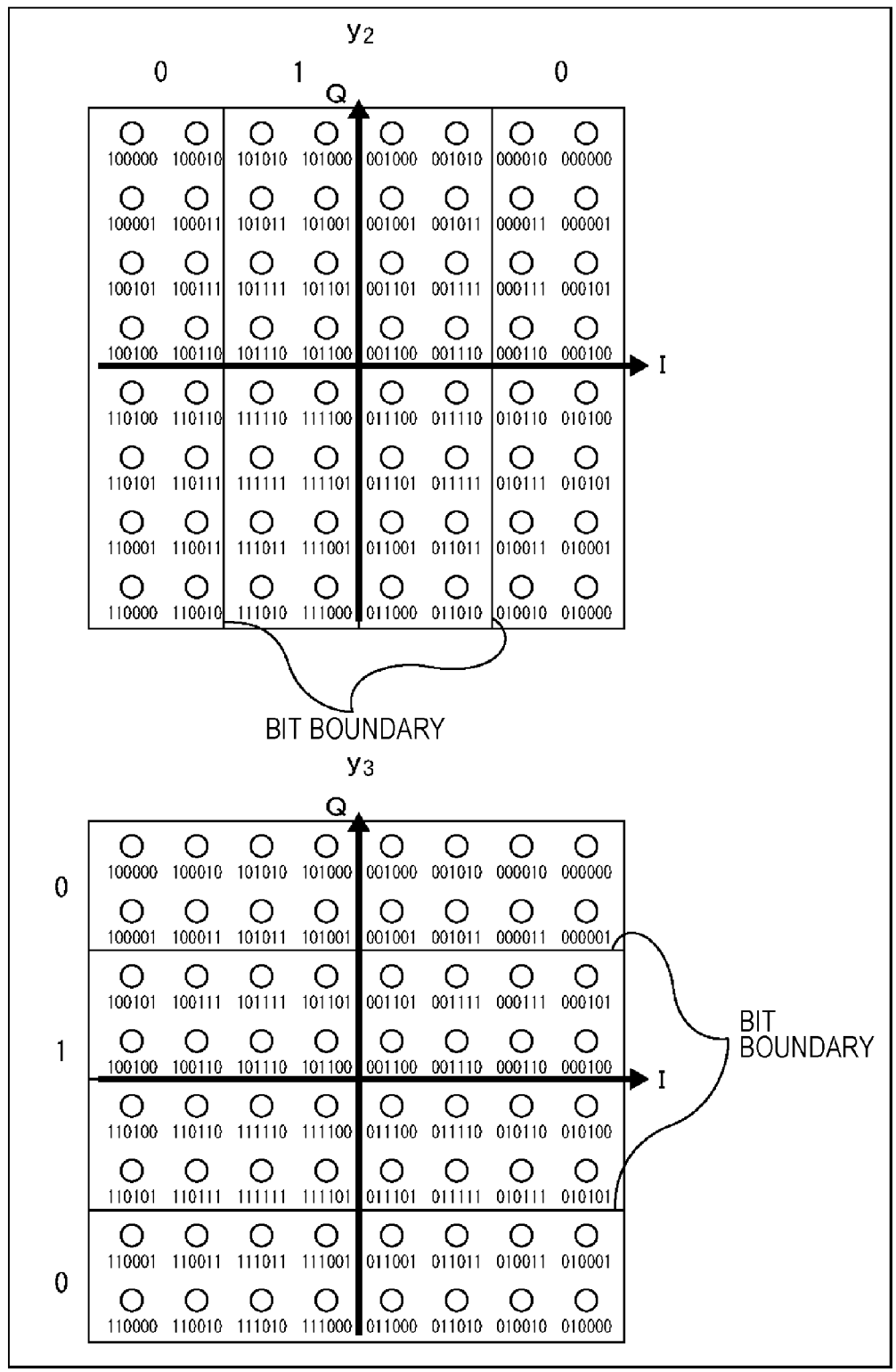
FIG. 16 is a diagram illustrating a signal point arrangement of 64QAM.
Figure 17:
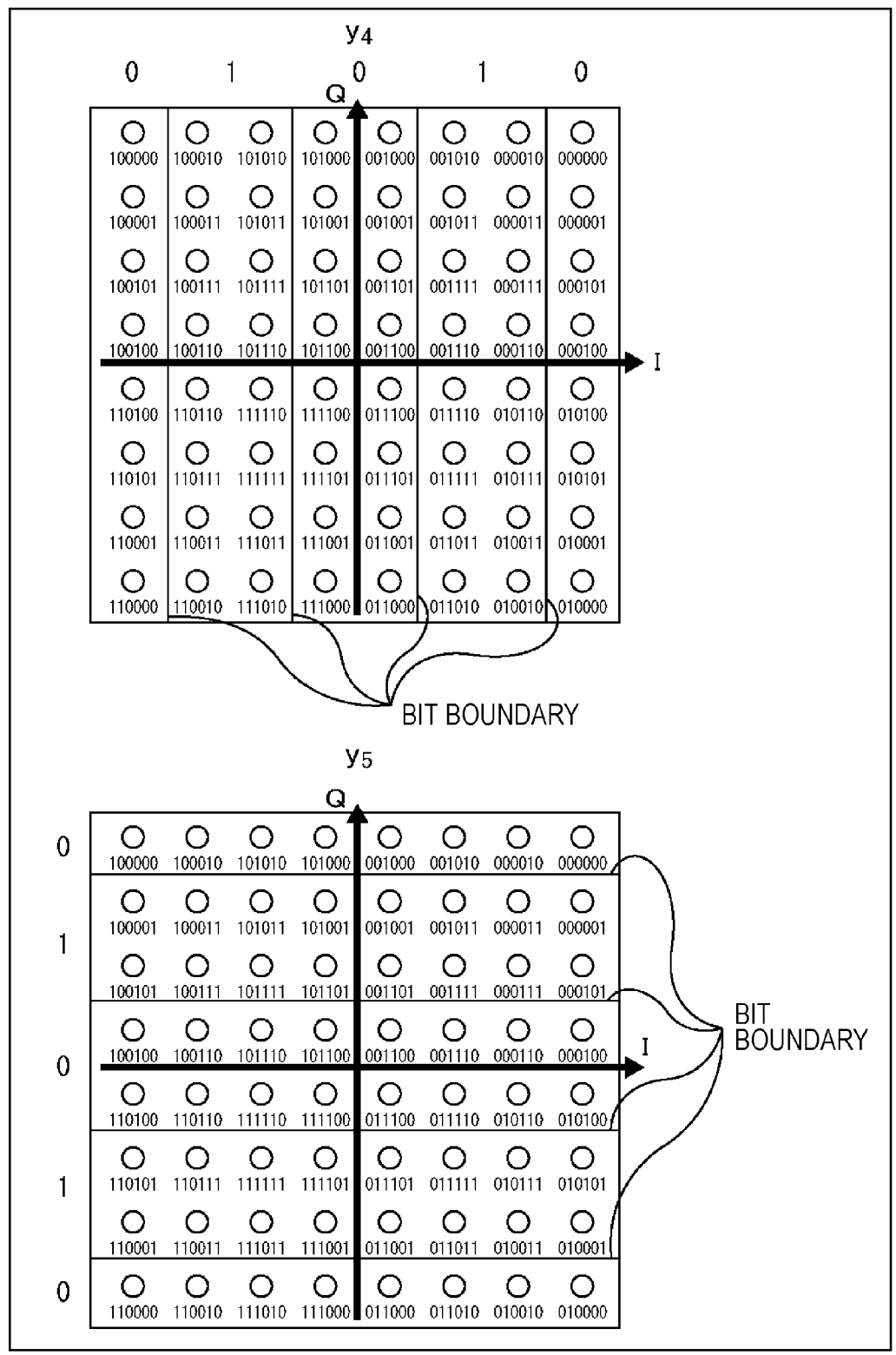
FIG. 17 is a diagram illustrating a signal point arrangement of 64QAM.

FIGS. 15 to 17 illustrate an arrangement of (signal points corresponding to) 64 symbols on an IQ plane, that is, symbols of the 16QAM of the DVB-T.2, when the 64QAM is performed by the QAM encoder 117 of FIG. 8.

In the 64QAM, one symbol represents 6 bits and 64 ($=2^6$) symbols exist. The 64 symbols are arranged such that an I direction×a Q direction becomes an 8×8 square shape, on the basis of an origin of the IQ plane.

The symbol bits of one symbol of the 64QAM can be represented as bits $y_0$, $y_4$, $y_2$, $y_3$, $y_4$, and $y_5$, sequentially from the most significant bit. When the modulation method is the 64QAM, 6 bits of sign bits of the LDPC code become a symbol of symbol bits $y_0$ to $y_5$ of 6 bits.

Here, FIG. 15 illustrates a bit boundary with respect to each of the most significant symbol bit $y_0$ and the second symbol bit $y_1$ among the symbol bits $y_0$ to $y_5$ of the symbol of the 64QAM, FIG. 16 illustrates a bit boundary with respect to each of the third symbol bit $y_2$ and the fourth symbol bit $y_3$, and FIG. 17 illustrates a bit boundary with respect to each of the fifth symbol bit $y_4$ and the sixth symbol bit $y_5$.

As illustrated in FIG. 15, the bit boundary with respect to each of the most significant symbol bit $y_0$ and the second symbol bit $y_1$ becomes one place. As illustrated in FIG. 16, the bit boundaries with respect to each of the third symbol bit $y_2$ and the fourth symbol bit $y_3$ become two places. As illustrated in FIG. 17, the bit boundaries with respect to each of the fifth symbol bit $y_4$ and the sixth symbol bit $y_5$ become four places.

Therefore, with respect to the symbol bits $y_0$ to $y_5$ of the symbol of the 64QAM, the most significant symbol bit $y_0$ and the second symbol bit $y_1$ become strong bits and the third symbol bit $y_2$ and the fourth symbol bit $y_3$ become next strong bits. In addition, the fifth symbol bit $y_4$ and the sixth symbol bit $y_5$ become weak bits.

From FIGS. 14 and 15 to 17, it can be known that, with respect to the symbol bits of the symbol of the orthogonal modulation, the high-order bits tend to become the strong bits and the low-order bits tend to become the weak bits.

Here, as described in FIGS. 12 and 13, with respect to the LDPC code output by the LDPC encoder 115 (FIG. 8), sign bits strong for the error and sign bits weak for the error exist.

As described in FIGS. 14 to 17, with respect to the symbol bits of the symbol of the orthogonal modulation performed by the QAM encoder 117, the strong bits and the weak bits exist.

Therefore, if the sign bits of the LDPC code weak for the error are allocated to the weak symbol bits of the symbol of the orthogonal modulation, resistance to the error is lowered as a whole.

Therefore, an interleaver that interleaves the sign bits of the LDPC code in such a manner that the sign bits of the LDPC code weak for the error are allocated to the strong bits (symbol bits) of the symbol of the orthogonal modulation is suggested.

The demultiplexer 25 of FIG. 9 can execute processing of the interleaver.

Figure 18:
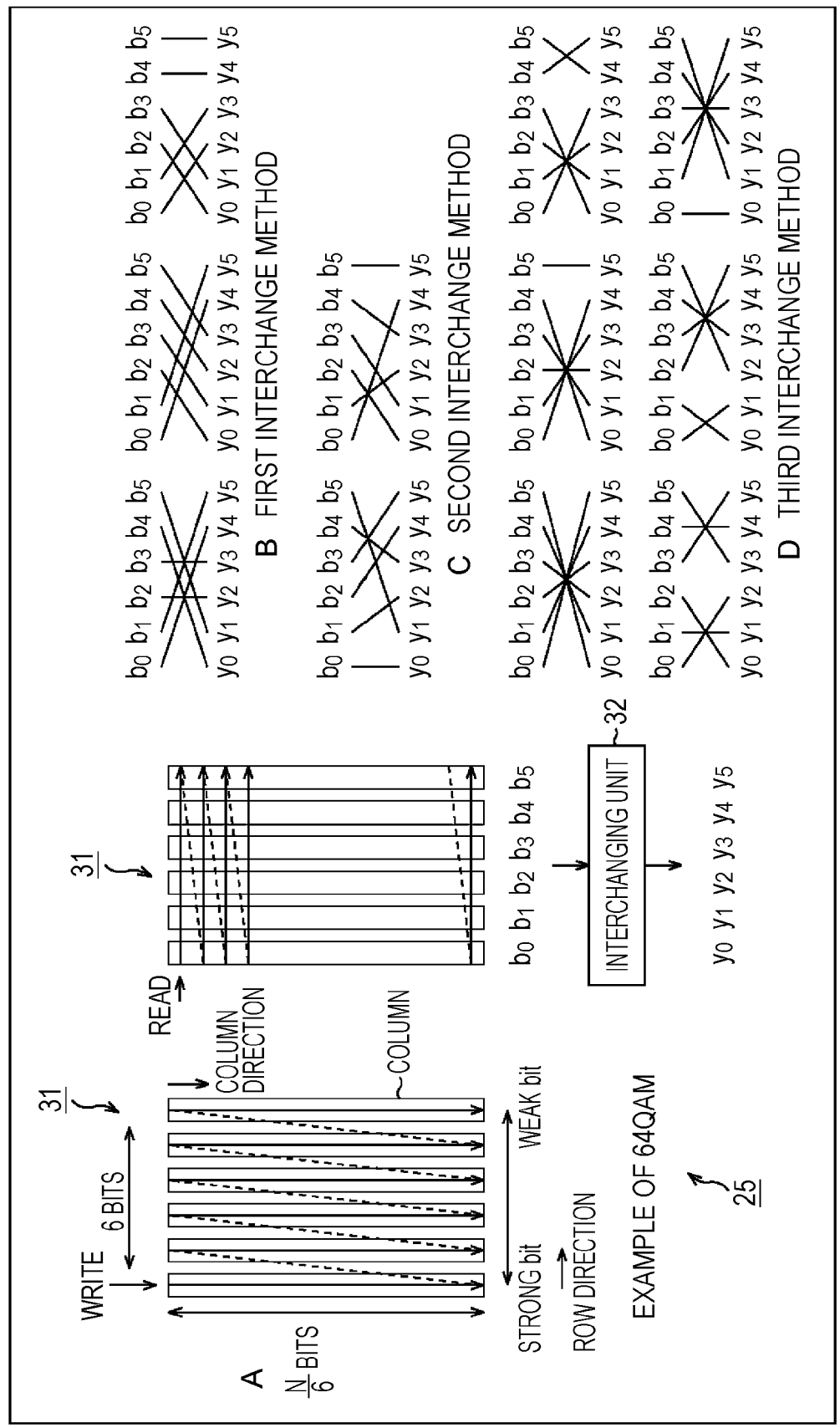
FIG. 18 is a diagram illustrating processing of a demultiplexer 25.

FIG. 18 is a diagram illustrating processing of the demultiplexer 25 of FIG. 9.

That is, A of FIG. 18 illustrates a functional configuration example of the demultiplexer 25.

The demultiplexer 25 consists of a memory 31 and an interchanging unit 32.

An LDPC code is supplied from the LDPC encoder 115 to the memory 31.

The memory 31 has a storage capacity to store mb bits in a row (horizontal) direction and store N/(mb) bits in a column (vertical) direction. The memory 31 writes sign bits of the LDPC code supplied thereto in the column direction, reads the sign bits in the row direction, and supplies the sign bits to the interchanging unit 32.

Here, N (=information length K+parity length M) represents a code length of the LDPC code, as described above.

In addition, m represents a bit number of the sign bits of the LDPC code that becomes one symbol and b represents a multiple that is a predetermined positive integer and is used to perform integral multiplication of m. As described above, the demultiplexer 25 symbolizes the sign bits of the LDPC code. However, the multiple b represents the number of symbols obtained by one-time symbolization of the demultiplexer 25.

A of FIG. 18 illustrates a configuration example of the demultiplexer 25 when the modulation method is the 64QAM. Therefore, a bit number m of the sign bits of the LDPC code becoming one symbol is 6 bits.

In addition, in A of FIG. 18, the multiple b becomes 1. Therefore, the memory 31 has a storage capacity in which a column direction×a row direction is N/(6×1)×(6×1) bits.

Here, a storage region of the memory 31 in which the row direction is 1 bit and which extends in the column direction is appropriately referred to as a column hereinafter. In A of FIG. 18, the memory 31 consists of 6 (=6×1) columns.

In the demultiplexer 25, writing of the sign bits of the LDPC code in a downward direction (column direction) from the upper side of the columns constituting the memory 31 is performed toward the columns of a rightward direction from the left side.

In addition, if writing of the sign bits ends to the bottom of the rightmost column, the sign bits are read in a unit of 6 bits (mb bits) in the row direction from a first row of all the columns constituting the memory 31 and are supplied to the interchanging unit 32.

The interchanging unit 32 executes interchange processing for interchanging positions of the sign bits of the 6 bits from the memory 31 and outputs 6 bits obtained as a result thereof as 6 symbol bits representing one symbol of the 64QAM, $y_0$, $y_1$, $y_2$, $y_3$, $y_4$, and $y_5$.

That is, the sign bits of the mb bits (in this case, 6 bits) are read from the memory 31 in the row direction. However, if the i-th (i=0, 1, ..., and mb−1) bit from the most significant bit, of the sign bits of the mb bits read from the memory 31, is represented as a bit $b_i$, the sign bits of the 6 bits that are read from the memory 31 in the row direction can be represented as bits $b_0$, $b_1$, $b_2$, $b_3$, $b_4$, and $b_5$, sequentially from the most significant bit.

With the relation of the column weights described in FIGS. 12 and 13, the sign bit in a direction of the bit $b_0$ becomes a sign bit strong for the error and the sign bit in a direction of the bit $b_5$ becomes a sign bit weak for the error.

The interchanging unit 32 can execute interchange processing for interchanging the positions of the sign bits $b_0$ to $b_5$ of the 6 bits from the memory 31, such that the sign bits weak for the error among the sign bits $b_0$ to $b_5$ of the 6 bits from the memory 31 are allocated to the strong bits among the symbol bits $y_0$ to $y_5$ of one symbol of the 64QAM.

Here, as interchange methods for interchanging the sign bits $b_0$ to $b_5$ of the 6 bits from the memory 31 and allocating the sign bits $b_0$ to $b_5$ of the 6 bits to the 6 symbol bits $y_0$ to $y_5$ representing one symbol of the 64QAM, various methods are suggested from individual companies.

B of FIG. 18 illustrates a first interchange method, C of FIG. 18 illustrates a second interchange method, and D of FIG. 18 illustrates a third interchange method, respectively.

In B of FIG. 18 to D of FIG. 18 (and FIG. 19 to be described later), a line segment connecting the bits $b_i$ and $y_j$ means that the sign bit $b_i$ is allocated to the symbol bit $y_j$ of the symbol (interchanged with a position of the symbol bit $y_j$).

As the first interchange method of B of FIG. 18, to adopt any one of three kinds of interchange methods is suggested. As the second interchange method of C of FIG. 18, to adopt any one of two kinds of interchange methods is suggested.

As the third interchange method of D of FIG. 18, to sequentially select six kinds of interchange methods and use the interchange methods is suggested.

Figure 19:
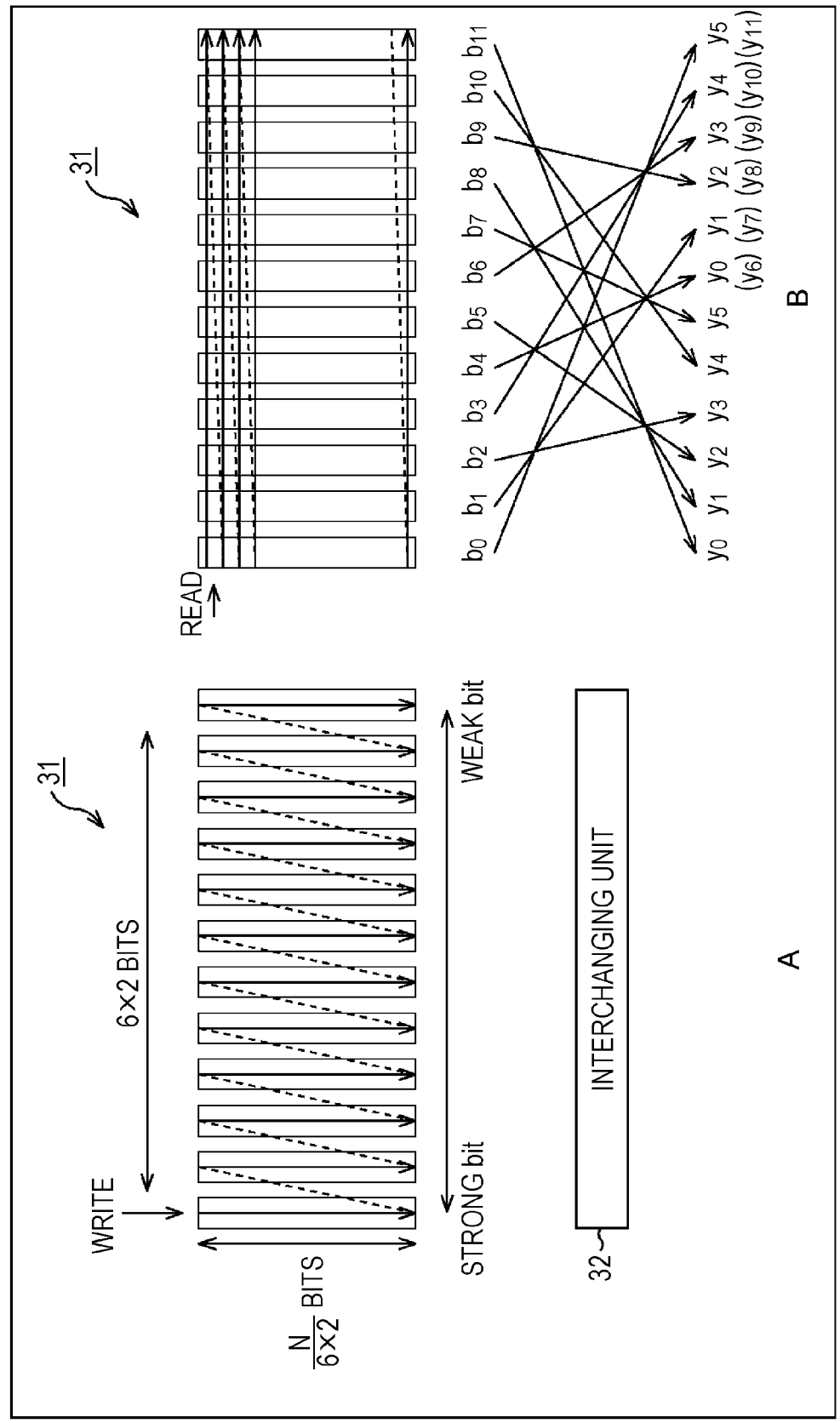
FIG. 19 is a diagram illustrating processing of a demultiplexer 25.

FIG. 19 illustrates a configuration example of the demultiplexer 25 when the modulation method is the 64QAM (therefore, a bit number m of the sign bits of the LDPC code mapped to one symbol is 6 bits, similar to FIG. 18) and the multiple b is 2 and a fourth interchange method.

When the multiple b is 2, the memory 31 has a storage capacity in which a column direction×a row direction is N/(6×2)×(6×2) bits and consists of 12 (=6×2) columns.

A of FIG. 19 illustrates a sequence of writing the LDPC code to the memory 31.

In the demultiplexer 25, as described in FIG. 18, writing of the sign bits of the LDPC code in a downward direction (column direction) from the upper side of the columns constituting the memory 31 is performed toward the columns of a rightward direction from the left side.

In addition, if writing of the sign bits ends to the bottom of the rightmost column, the sign bits are read in a unit of 12 bits (mb bits) in the row direction from a first row of all the columns constituting the memory 31 and are supplied to the interchanging unit 32.

The interchanging unit 32 executes interchange processing for interchanging positions of the sign bits of the 12 bits from the memory 31 using the fourth interchange method and outputs 12 bits obtained as a result thereof as 12 bits representing two symbols (b symbols) of the 64QAM, that is, six symbol bits $y_0$, $y_1$, $y_2$, $y_3$, $y_4$, and $y_5$ representing one symbol of the 64QAM and six symbol bits representing a next one symbol, $y_0$, $y_1$, $y_2$, $y_3$, $y_4$, and $y_5$.

Here, B of FIG. 19 illustrates the fourth interchange method of the interchange processing by the interchanging unit 32 of A of FIG. 19.

When the multiple b is 2 (or 3 or more), in the interchange processing, the sign bits of the mb bits are allocated to the symbol bits of the mb bits of the b consecutive symbols. In the following description including the description of FIG. 19, the (i+1)-th bit from the most significant bit of the symbol bits of the mb bits of the b consecutive symbols is represented as a bit (symbol bit) $y_i$, for the convenience of description.

The appropriate interchange method, that is, the improvement of the error rate in the AWGN communication channel is different according to the encoding rate or the code length of the LDPC code and the modulation method or the like.

[Parity Interleave]

Next, the parity interleave by the parity interleaver 23 of FIG. 9 will be described with reference to FIGS. 20 to 22.

Figure 20:
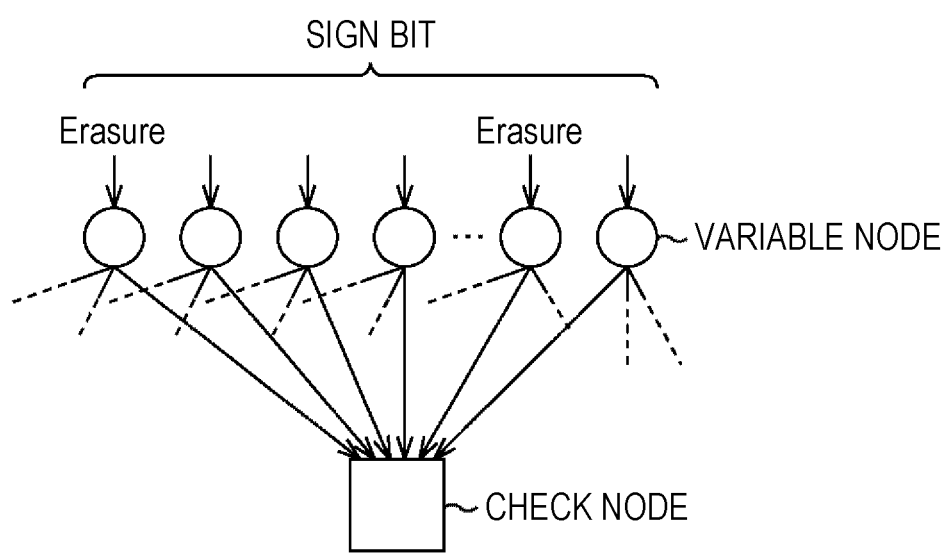
FIG. 20 is a diagram illustrating a Tanner graph for decoding of an LDPC code.

FIG. 20 illustrates (a part of) a Tanner graph of the parity check matrix of the LDPC code.

As illustrated in FIG. 20, if a plurality of, such as two variable nodes among (the sign bits corresponding to) the variable nodes connected to the check node simultaneously become the error such as the erasure, the check node returns a message in which the probability of a value being 0 and the probability of a value being 1 are equal to each other, to all the variable nodes connected to the check node. For this reason, if the plurality of variable nodes connected to the same check node simultaneously becomes the erasure and the like, decoding performance is deteriorated.

Meanwhile, the LDPC code that is output by the LDPC encoder 115 of FIG. 8 and is defined in the standard of the DVB-T.2 is an IRA code and the parity matrix $H_T$ of the parity check matrix H becomes a staircase structure, as illustrated in FIG. 11.

Figure 21:
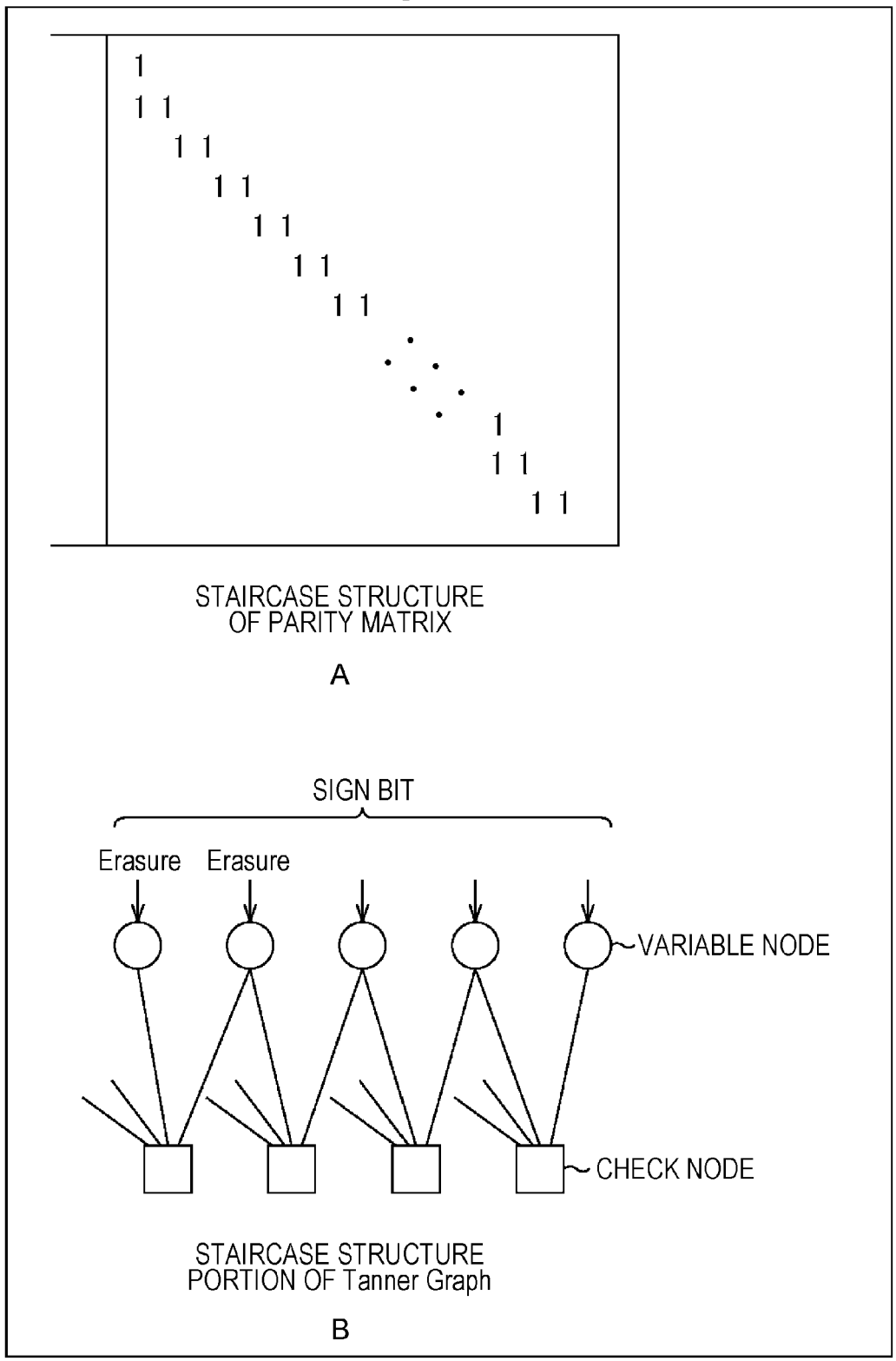
FIG. 21 is a diagram illustrating a parity matrix $H_T$ becoming a staircase structure and a Tanner graph corresponding to the parity matrix $H_T$.

FIG. 21 illustrates the parity matrix $H_T$ becoming the staircase structure and a Tanner graph corresponding to the parity matrix $H_T$.

That is, A of FIG. 21 illustrates the parity matrix $H_T$ becoming the staircase structure and B of FIG. 21 illustrates the Tanner graph corresponding to the parity matrix $H_T$ of A of FIG. 21.

In the parity matrix $H_T$ having the staircase structure, in each row, elements of 1 are adjacent to each other (except for the first row). For this reason, in the Tanner graph of the parity matrix $H_T$, two adjacent variable nodes that correspond to columns of two adjacent elements of which the values of the parity matrix $H_T$ become 1 are connected to the same check node.

Therefore, if the parity bits corresponding to the two adjacent variable nodes described above simultaneously become the error due to the burst error or the erasure and the like, the check node that is connected to the two variable nodes (variable nodes from which the messages are acquired using the parity bits) corresponding to the two parity bits becoming the error returns a message in which the probability of a value being 0 and the probability of a value being 1 are equal to each other, to the variable nodes connected to the check node. For this reason, the decoding performance is deteriorated. When the burst length (the number of parity bits that become the error consecutively) is large, the number of check nodes returning the messages of the equal probability increases and the decoding performance is further deteriorated.

Therefore, the parity interleaver 23 (FIG. 9) performs the parity interleave for interleaving the parity bits of the LDPC code from the LDPC encoder 115 into positions of other parity bits, to prevent the decoding performance from being deteriorated.

Figure 22:
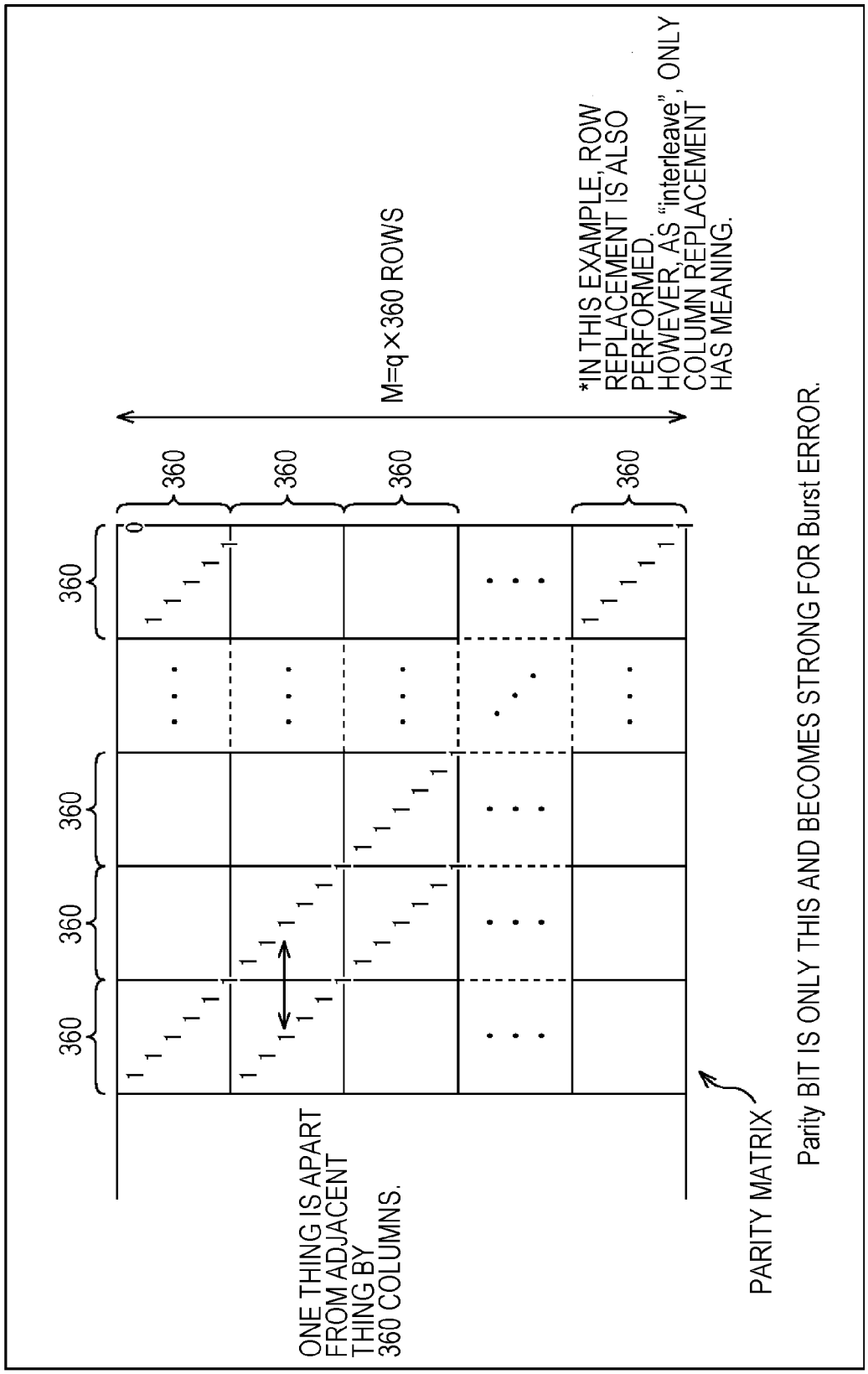
FIG. 22 is a diagram illustrating a parity matrix $H_T$ of a parity check matrix H corresponding to an LDPC code after parity interleave.

FIG. 22 illustrates the parity matrix $H_T$ of the parity check matrix H corresponding to the LDPC code after the parity interleave performed by the parity interleaver 23 of FIG. 9.

Here, the information matrix $H_A$ of the parity check matrix H corresponding to the LDPC code that is output by the LDPC encoder 115 and is defined in the standard of the DVB-T.2 becomes a cyclic structure.

The cyclic structure means a structure in which a certain column is matched with a column obtained by cyclically shifting another column. For example, the cyclic structure includes a structure in which a position of 1 of each row of P columns becomes a position obtained by cyclically shifting a first column of the P columns in a column direction by a value proportional to a value q obtained by dividing a parity length M, for every P columns. Hereinafter, the P columns in the cyclic structure are appropriately referred to as a column number of a unit of the cyclic structure.

As the LDPC code that is defined in the standard of the DVB-T.2, the two kinds of LDPC codes that have the code lengths N of 64800 bits and 16200 bits exist, as illustrated in FIGS. 12 and 13. In both the two kinds of LDPC codes, a column number P of a unit of the cyclic structure is defined as 360 to be one of divisors of the parity length M other than 1 and M.

In addition, the parity length M becomes a value other than primes represented by an expression $M = q \times P = q \times 360$, using a value q different according to the encoding rate. Therefore, similar to the column number P of the unit of the cyclic structure, the value q is one other than 1 and M among the divisors of the parity length M and is obtained by dividing the parity length M by the column number P of the unit of the cyclic structure (the product of P and q to be the divisors of the parity length M becomes the parity length M).

As described above, if the information length is set to K, an integer equal to or more than 0 and less than P is set to x, and an integer equal to or more than 0 and less than q is set to y, the parity interleaver 23 interleaves a (K+qx+y+1)-th sign bit among the sign bits of the LDPC code of the N bits into a position of a (K+Py+x+1)-th sign bit, as the parity interleave.

Because both the (K+qx+y+1)-th sign bit and the (K+Py+x+1)-th sign bit are sign bits after the (K+1)-th sign bit, both the (K+qx+y+1)-th sign bit and the (K+Py+x+1)-th sign bit are parity bits. Therefore, according to the parity interleave, the position of the parity bit of the LDPC code is moved.

According to the parity interleave, (the parity bits corresponding to) the variable nodes connected to the same check node are separated by the column number P of the unit of the cyclic structure, that is, 360 bits in this case. For this reason, when the burst length is less than 360 bits, the plurality of variable nodes connected to the same check node can be prevented from simultaneously becoming the error. As a result, resistance to the burst error can be improved.

The LDPC code after the parity interleave for interleaving the (K+qx+y+1)-th sign bit into the position of the (K+Py+x+1)-th sign bit is matched with an LDPC code of a parity check matrix (hereinafter, also referred to as a transformation parity check matrix) obtained by performing column replacement for replacing the (K+qx+y+1)-th column of the original parity check matrix H with the (K+Py+x+1)-th column.

In addition, in the parity matrix of the transformation parity check matrix, as illustrated in FIG. 22, a pseudo cyclic structure that uses the P columns (in FIG. 22, 360 columns) as a unit appears.

Here, the pseudo cyclic structure means a structure in which a cyclic structure is formed except for a part thereof. The transformation parity check matrix that is obtained by performing the column replacement corresponding to the parity interleave with respect to the parity check matrix of the LDPC code defined in the standard of the DVB-T.2 becomes the pseudo cyclic structure, not the (perfect) cyclic structure, because the number of elements of 1 is short by one (elements of 0 exist) in a portion (shift matrix to be described later) of 360 rows×360 columns of a right corner portion thereof.

The transformation parity check matrix of FIG. 22 becomes a matrix that is obtained by performing the column replacement corresponding to the parity interleave and replacement (row replacement) of a row to configure the transformation parity check matrix with a constitutive matrix to be described later, with respect to the original parity check matrix H.

[Column Twist Interleave]

Next, column twist interleave corresponding to rearrangement processing by the column twist interleaver 24 of FIG. 9 will be described with reference to FIGS. 23 to 26.

In the transmitting device 11 of FIG. 8, one or more bits of the sign bits of the LDPC code are transmitted as one symbol. That is, when two bits of the sign bits are set as one symbol, the QPSK is used as the modulation method and when four bits of the sign bits are set as one symbol, the 16QAM is used as the modulation method.

When the two or more bits of the sign bits are transmitted as one symbol, if the erasure and the like is generated in a certain symbol, all of the sign bits of the symbol become the error (erasure).

Therefore, it is necessary to prevent the variable nodes corresponding to the sign bits of one symbol from being connected to the same check node, in order to decrease the probability of (the sign bits corresponding to) the plurality of variable nodes connected to the same check node simultaneously becoming the erasure to improve the decoding performance.

Meanwhile, as described above, in the parity check matrix H of the LDPC code that is output by the LDPC encoder 115 and is defined in the standard of the DVB-T.2, the information matrix $H_A$ has the cyclic structure and the parity matrix $H_T$ has the staircase structure. As described in FIG. 22, in the transformation parity check matrix to be the parity check matrix of the LDPC code after the parity interleave, the cyclic structure (accurately, the pseudo cyclic structure as described above) appears in the parity matrix.

Figure 23:
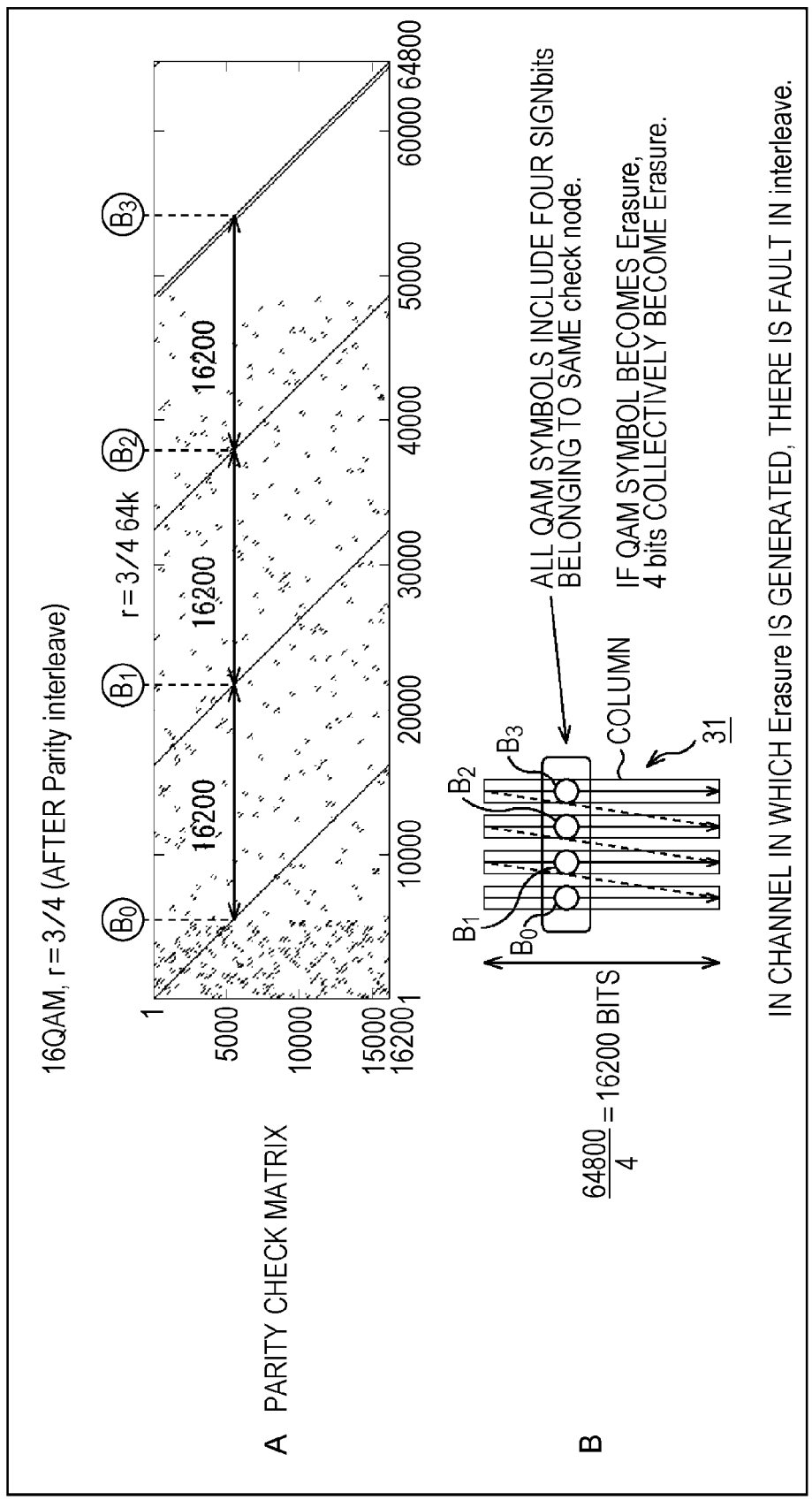
FIG. 23 is a diagram illustrating a transformation parity check matrix.

FIG. 23 illustrates a transformation parity check matrix.

That is, A of FIG. 23 illustrates a transformation parity check matrix of a parity check matrix H of an LDPC code in which a code length N is 64800 bits and an encoding rate (r) is 3/4.

In A of FIG. 23, in the transformation parity check matrix, a position of an element of which a value becomes 1 is shown by a point (•).

B of FIG. 23 illustrates processing executed by the demultiplexer 25 (FIG. 9), with respect to the LDPC code of the transformation parity check matrix of A of FIG. 23, that is, the LDPC code after the parity interleave.

In B of FIG. 23, the modulation method is set to the 16QAM and the sign bits of the LDPC code after the parity interleave are written in the column direction in the four columns constituting the memory 31 of the demultiplexer 25.

The sign bits that are written in the column direction in the four columns constituting the memory 31 are read in a unit of four bits in the row direction and become one symbol.

In this case, sign bits $B_0$, $B_1$, $B_2$, and $B_3$ of the four bits that become one symbol may become sign bits corresponding to 1 in any one row of the transformation parity check matrix of A of FIG. 23 and the variable nodes that correspond to the sign bits $B_0$, $B_1$, $B_2$, and $B_3$ are connected to the same check node.

Therefore, when the sign bits $B_0$, $B_1$, $B_2$, and $B_3$ of the four bits of one symbol become the sign bits corresponding to 1 in any one row of the transformation parity check matrix, if the erasure is generated in the symbol, an appropriate message may not be acquired in the same check node to which the variable nodes corresponding to the sign bits $B_0$, $B_1$, $B_2$, and $B_3$ are connected. As a result, the decoding performance is deteriorated.

With respect to the encoding rates other than 3/4, the plurality of sign bits corresponding to the plurality of variable nodes connected to the same check node may become one symbol of the 16QAM, similar to the above case.

Therefore, the column twist interleaver 24 performs the column twist interleave for interleaving the sign bits of the LDPC code after the parity interleave from the parity interleaver 23, such that the plurality of sign bits corresponding to 1 in any one row of the transformation parity check matrix are not included in one symbol.

Figure 24:
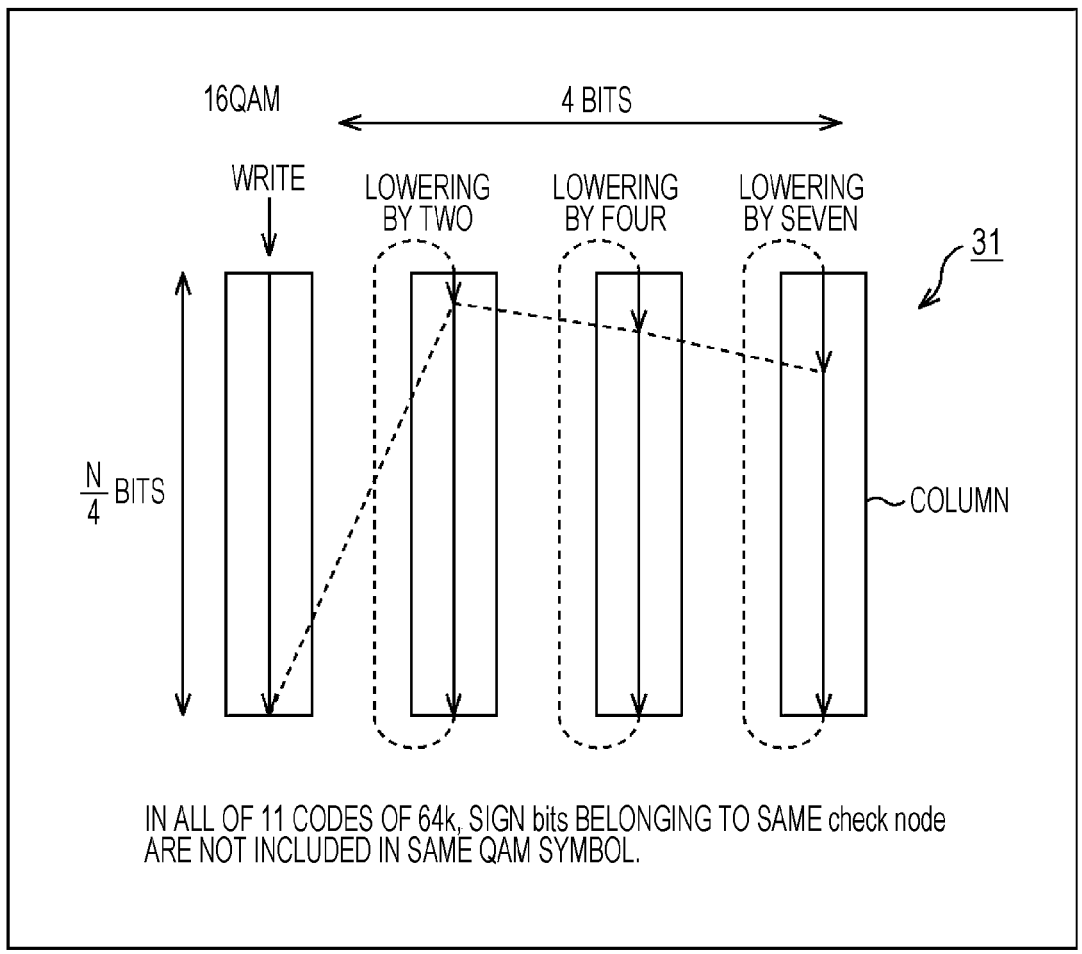
FIG. 24 is a diagram illustrating processing of a column twist interleaver 24.

FIG. 24 is a diagram illustrating the column twist interleave.

That is, FIG. 24 illustrates the memory 31 (FIGS. 18 and 19) of the demultiplexer 25.

As described in FIG. 18, the memory 31 has a storage capacity to store mb bits in the column (vertical) direction and store N/(mb) bits in the row (horizontal) direction and consists of mb columns. In addition, the column twist interleaver 24 writes the sign bits of the LDPC code in the column direction with respect to the memory 31, controls a write start position when the sign bits are read in the row direction, and performs the column twist interleave.

That is, in the column twist interleaver 24, the write start position to start writing of the sign bits is appropriately changed with respect to each of the plurality of columns, such that the plurality of sign bits read in the row direction and becoming one symbol do not become the sign bits corresponding to 1 in any one row of the transformation parity check matrix (the sign bits of the LDPC code are rearranged such that the plurality of sign bits corresponding to 1 in any one row of the parity check matrix are not included in the same symbol).

Here, FIG. 24 illustrates a configuration example of the memory 31 when the modulation method is the 16QAM and the multiple b described in FIG. 18 is 1. Therefore, the bit number m of the sign bits of the LDPC code becoming one symbol is 4 bits and the memory 31 consists of 4 (=mb) columns.

The column twist interleaver 24 performs writing of the sign bits of the LDPC code (instead of the demultiplexer 25 of FIG. 18) in the downward direction (column direction) from the upper side of the four columns constituting the memory 31, toward the columns of the rightward direction from the left side.

In addition, if writing of the sign bits ends to the rightmost column, the column twist interleaver 24 reads the sign bits in a unit of four bits (mb bits) in the row direction from the first row of all the columns constituting the memory 31 and outputs the sign bits as the LDPC code after the column twist interleave to the interchanging unit 32 (FIGS. 18 and 19) of the demultiplexer 25.

However, in the column twist interleaver 24, if an address of a position of a head (top) of each column is set to 0 and an address of each position of the column direction is represented by an ascending integer, a write start position is set to a position of which an address is 0, with respect to a leftmost column. A write start position is set to a position of which an address is 2, with respect to a second (from the left side) column. A write start position is set to a position of which an address is 4, with respect to a third column. A write start position is set to a position of which an address is 7, with respect to a fourth column.

With respect to the columns in which the write start positions are the positions other than the position of which the address is 0, after the sign bits are written to a lowermost position, the position returns to the head (the position of which the address is 0) and writing is performed to the position immediately before the write start position. Then, writing with respect to a next (right) column is performed.

By performing the column twist interleave described above, with respect to the LDPC codes that are defined in the standard of the DVB-T.2, the plurality of sign bits corresponding to the plurality of variable nodes connected to the same check node can be prevented from becoming one symbol of the 16QAM (being included in the same symbol). As a result, decoding performance in a communication channel in which the erasure exists can be improved.

FIG. 25 illustrates a column number of the memory 31 necessary for the column twist interleave and an address of a write start position for each modulation method, with respect to LDPC codes of 11 encoding rates defined in the standard of the DVB-T.2 and having a code length N of 64800.

When the multiple b is 1, the QPSK is adopted as the modulation method, and a bit number m of one symbol is 2 bits, according to FIG. 25, the memory 31 has two columns to store 2×1 (=mb) bits in the row direction and stores 64800/(2×1) bits in the column direction.

In addition, a write start position of a first column of the two columns of the memory 31 becomes a position of which an address is 0 and a write start position of a second column becomes a position of which an address is 2, respectively.

For example, when any one of the first to third interchange methods of FIG. 18 is adopted as the interchange method of the interchange processing of the demultiplexer 25 (FIG. 9), the multiple b becomes 1.

When the multiple b is 2, the QPSK is adopted as the modulation method, and a bit number m of one symbol is 2 bits, according to FIG. 25, the memory 31 has four columns to store 2×2 bits in the row direction and stores 64800/(2×2) bits in the column direction.

In addition, the write start position of the first column among the four columns of the memory 31 becomes a position of which an address is 0, the write start position of the second column becomes a position of which an address is 2, the write start position of the third column becomes a position of which an address is 4, and the write start position of the fourth column becomes a position of which an address is 7.

For example, when the fourth interchange method of FIG. 19 is adopted as the interchange method of the interchange processing of the demultiplexer 25 (FIG. 9), the multiple b becomes 2.

When the multiple b is 1, the 16QAM is adopted as the modulation method, and a bit number m of one symbol is 4 bits, according to FIG. 25, the memory 31 has four columns to store 4×1 bits in the row direction and stores 64800/(4×1) bits in the column direction.

In addition, the write start position of the first column among the four columns of the memory 31 becomes a position of which an address is 0, the write start position of the second column becomes a position of which an address is 2, the write start position of the third column becomes a position of which an address is 4, and the write start position of the fourth column becomes a position of which an address is 7, respectively.

When the multiple b is 2, the 16QAM is adopted as the modulation method, and a bit number m of one symbol is 4 bits, according to FIG. 25, the memory 31 has eight columns to store 4×2 bits in the row direction and stores 64800/(4×2) bits in the column direction.

In addition, the write start position of the first column among the eight columns of the memory 31 becomes a position of which an address is 0, the write start position of the second column becomes a position of which an address is 0, the write start position of the third column becomes a position of which an address is 2, the write start position of the fourth column becomes a position of which an address is 4, the write start position of the fifth column becomes a position of which an address is 4, the write start position of the sixth column becomes a position of which an address is 5, the write start position of the seventh column becomes a position of which an address is 7, and the write start position of the eighth column becomes a position of which an address is 7.

When the multiple b is 1, the 64QAM is adopted as the modulation method, and a bit number m of one symbol is 6 bits, according to FIG. 25, the memory 31 has six columns to store 6×1 bits in the row direction and stores 64800/(6×1) bits in the column direction.

In addition, the write start position of the first column among the six columns of the memory 31 becomes a position of which an address is 0, the write start position of the second column becomes a position of which an address is 2, the write start position of the third column becomes a position of which an address is 5, the write start position of the fourth column becomes a position of which an address is 9, the write start position of the fifth column becomes a position of which an address is 10, and the write start position of the sixth column becomes a position of which an address is 13, respectively.

When the multiple b is 2, the 64QAM is adopted as the modulation method, and a bit number m of one symbol is 6 bits, according to FIG. 25, the memory 31 has twelve columns to store 6×2 bits in the row direction and stores 64800/(6×2) bits in the column direction.

In addition, the write start position of the first column among the twelve columns of the memory 31 becomes a position of which an address is 0, the write start position of the second column becomes a position of which an address is 0, the write start position of the third column becomes a position of which an address is 2, the write start position of the fourth column becomes a position of which an address is 2, the write start position of the fifth column becomes a position of which an address is 3, the write start position of the sixth column becomes a position of which an address is 4, the write start position of the seventh column becomes a position of which an address is 4, the write start position of the eighth column becomes a position of which an address is 5, the write start position of the ninth column becomes a position of which an address is 5, the write start position of the tenth column becomes a position of which an address is 7, the write start position of the eleventh column becomes a position of which an address is 8, and the write start position of the twelfth column becomes a position of which an address is 9, respectively.

When the multiple b is 1, the 256QAM is adopted as the modulation method, and a bit number m of one symbol is 8 bits, according to FIG. 25, the memory 31 has eight columns to store 8×1 bits in the row direction and stores 64800/(8×1) bits in the column direction.

In addition, the write start position of the first column among the eight columns of the memory 31 becomes a position of which an address is 0, the write start position of the second column becomes a position of which an address is 0, the write start position of the third column becomes a position of which an address is 2, the write start position of the fourth column becomes a position of which an address is 4, the write start position of the fifth column becomes a position of which an address is 4, the write start position of the sixth column becomes a position of which an address is 5, the write start position of the seventh column becomes a position of which an address is 7, and the write start position of the eighth column becomes a position of which an address is 7, respectively.

When the multiple b is 2, the 256QAM is adopted as the modulation method, and a bit number m of one symbol is 8 bits, according to FIG. 25, the memory 31 has sixteen columns to store 8×2 bits in the row direction and stores 64800/(8×2) bits in the column direction.

In addition, the write start position of the first column among the sixteen columns of the memory 31 becomes a position of which an address is 0, the write start position of the second column becomes a position of which an address is 2, the write start position of the third column becomes a position of which an address is 2, the write start position of the fourth column becomes a position of which an address is 2, the write start position of the fifth column becomes a position of which an address is 2, the write start position of the sixth column becomes a position of which an address is 3, the write start position of the seventh column becomes a position of which an address is 7, the write start position of the eighth column becomes a position of which an address is 15, the write start position of the ninth column becomes a position of which an address is 16, the write start position of the tenth column becomes a position of which an address is 20, the write start position of the eleventh column becomes a position of which an address is 22, the write start position of the twelfth column becomes a position of which an address is 22, the write start position of the thirteenth column becomes a position of which an address is 27, the write start position of the fourteenth column becomes a position of which an address is 27, the write start position of the fifteenth column becomes a position of which an address is 28, and the write start position of the sixteenth column becomes a position of which an address is 32, respectively.

When the multiple b is 1, the 1024QAM is adopted as the modulation method, and a bit number m of one symbol is 10 bits, according to FIG. 25, the memory 31 has ten columns to store 10×1 bits in the row direction and stores 64800/(10×1) bits in the column direction.

In addition, the write start position of the first column among the ten columns of the memory 31 becomes a position of which an address is 0, the write start position of the second column becomes a position of which an address is 3, the write start position of the third column becomes a position of which an address is 6, the write start position of the fourth column becomes a position of which an address is 8, the write start position of the fifth column becomes a position of which an address is 11, the write start position of the sixth column becomes a position of which an address is 13, the write start position of the seventh column becomes a position of which an address is 15, the write start position of the eighth column becomes a position of which an address is 17, the write start position of the ninth column becomes a position of which an address is 18, and the write start position of the tenth column becomes a position of which an address is 20, respectively.

When the multiple b is 2, the 1024QAM is adopted as the modulation method, and a bit number m of one symbol is 10 bits, according to FIG. 25, the memory 31 has twenty columns to store 10×2 bits in the row direction and stores 64800/(10×2) bits in the column direction.

In addition, the write start position of the first column among the twenty columns of the memory 31 becomes a position of which an address is 0, the write start position of the second column becomes a position of which an address is 1, the write start position of the third column becomes a position of which an address is 3, the write start position of the fourth column becomes a position of which an address is 4, the write start position of the fifth column becomes a position of which an address is 5, the write start position of the sixth column becomes a position of which an address is 6, the write start position of the seventh column becomes a position of which an address is 6, the write start position of the eighth column becomes a position of which an address is 9, the write start position of the ninth column becomes a position of which an address is 13, the write start position of the tenth column becomes a position of which an address is 14, the write start position of the eleventh column becomes a position of which an address is 14, the write start position of the twelfth column becomes a position of which an address is 16, the write start position of the thirteenth column becomes a position of which an address is 21, the write start position of the fourteenth column becomes a position of which an address is 21, the write start position of the fifteenth column becomes a position of which an address is 23, the write start position of the sixteenth column becomes a position of which an address is 25, the write start position of the seventeenth column becomes a position of which an address is 25, the write start position of the eighteenth column becomes a position of which an address is 26, the write start position of the nineteenth column becomes a position of which an address is 28, and the write start position of the twentieth column becomes a position of which an address is 30, respectively.

When the multiple b is 1, the 4096QAM is adopted as the modulation method, and a bit number m of one symbol is 12 bits, according to FIG. 25, the memory 31 has twelve columns to store 12×1 bits in the row direction and stores 64800/(12×1) bits in the column direction.

In addition, the write start position of the first column among the twelve columns of the memory 31 becomes a position of which an address is 0, the write start position of the second column becomes a position of which an address is 0, the write start position of the third column becomes a position of which an address is 2, the write start position of the fourth column becomes a position of which an address is 2, the write start position of the fifth column becomes a position of which an address is 3, the write start position of the sixth column becomes a position of which an address is 4, the write start position of the seventh column becomes a position of which an address is 4, the write start position of the eighth column becomes a position of which an address is 5, the write start position of the ninth column becomes a position of which an address is 5, the write start position of the tenth column becomes a position of which an address is 7, the write start position of the eleventh column becomes a position of which an address is 8, and the write start position of the twelfth column becomes a position of which an address is 9, respectively.

When the multiple b is 2, the 4096QAM is adopted as the modulation method, and a bit number m of one symbol is 12 bits, according to FIG. 25, the memory 31 has twenty-four columns to store 12×2 bits in the row direction and stores 64800/(12×2) bits in the column direction.

In addition, the write start position of the first column among the twenty-four columns of the memory 31 becomes a position of which an address is 0, the write start position of the second column becomes a position of which an address is 5, the write start position of the third column becomes a position of which an address is 8, the write start position of the fourth column becomes a position of which an address is 8, the write start position of the fifth column becomes a position of which an address is 8, the write start position of the sixth column becomes a position of which an address is 8, the write start position of the seventh column becomes a position of which an address is 10, the write start position of the eighth column becomes a position of which an address is 10, the write start position of the ninth column becomes a position of which an address is 10, the write start position of the tenth column becomes a position of which an address is 12, the write start position of the eleventh column becomes a position of which an address is 13, the write start position of the twelfth column becomes a position of which an address is 16, the write start position of the thirteenth column becomes a position of which an address is 17, the write start position of the fourteenth column becomes a position of which an address is 19, the write start position of the fifteenth column becomes a position of which an address is 21, the write start position of the sixteenth column becomes a position of which an address is 22, the write start position of the seventeenth column becomes a position of which an address is 23, the write start position of the eighteenth column becomes a position of which an address is 26, the write start position of the nineteenth column becomes a position of which an address is 37, the write start position of the twentieth column becomes a position of which an address is 39, the write start position of the twenty-first column becomes a position of which an address is 40, the write start position of the twenty-second column becomes a position of which an address is 41, the write start position of the twenty-third column becomes a position of which an address is 41, and the write start position of the twenty-fourth column becomes a position of which an address is 41, respectively.

FIG. 26 illustrates a column number of the memory 31 necessary for the column twist interleave and an address of a write start position for each modulation method, with respect to LDPC codes of 10 encoding rates defined in the standard of the DVB-T.2 and having a code length N of 16200.

When the multiple b is 1, the QPSK is adopted as the modulation method, and a bit number m of one symbol is 2 bits, according to FIG. 26, the memory 31 has two columns to store 2×1 bits in the row direction and stores 16200/(2×1) bits in the column direction.

In addition, the write start position of the first column of the two columns of the memory 31 becomes a position of which an address is 0 and the write start position of the second column becomes a position of which an address is 0, respectively.

When the multiple b is 2, the QPSK is adopted as the modulation method, and a bit number m of one symbol is 2 bits, according to FIG. 26, the memory 31 has four columns to store 2×2 bits in the row direction and stores 16200/(2×2) bits in the column direction.

In addition, the write start position of the first column among the four columns of the memory 31 becomes a position of which an address is 0, the write start position of the second column becomes a position of which an address is 2, the write start position of the third column becomes a position of which an address is 3, and the write start position of the fourth column becomes a position of which an address is 3, respectively.

When the multiple b is 1, the 16QAM is adopted as the modulation method, and a bit number m of one symbol is 4 bits, according to FIG. 26, the memory 31 has four columns to store 4×1 bits in the row direction and stores 16200/(4×1) bits in the column direction.

In addition, the write start position of the first column among the four columns of the memory 31 becomes a position of which an address is 0, the write start position of the second column becomes a position of which an address is 2, the write start position of the third column becomes a position of which an address is 3, and the write start position of the fourth column becomes a position of which an address is 3, respectively.

When the multiple b is 2, the 16QAM is adopted as the modulation method, and a bit number m of one symbol is 4 bits, according to FIG. 26, the memory 31 has eight columns to store 4×2 bits in the row direction and stores 16200/(4×2) bits in the column direction.

In addition, the write start position of the first column among the eight columns of the memory 31 becomes a position of which an address is 0, the write start position of the second column becomes a position of which an address is 0, the write start position of the third column becomes a position of which an address is 0, the write start position of the fourth column becomes a position of which an address is 1, the write start position of the fifth column becomes a position of which an address is 7, the write start position of the sixth column becomes a position of which an address is 20, the write start position of the seventh column becomes a position of which an address is 20, and the write start position of the eighth column becomes a position of which an address is 21, respectively.

When the multiple b is 1, the 64QAM is adopted as the modulation method, and a bit number m of one symbol is 6 bits, according to FIG. 26, the memory 31 has six columns to store 6×1 bits in the row direction and stores 16200/(6×1) bits in the column direction.

In addition, the write start position of the first column among the six columns of the memory 31 becomes a position of which an address is 0, the write start position of the second column becomes a position of which an address is 0, the write start position of the third column becomes a position of which an address is 2, the write start position of the fourth column becomes a position of which an address is 3, the write start position of the fifth column becomes a position of which an address is 7, and the write start position of the sixth column becomes a position of which an address is 7, respectively.

When the multiple b is 2, the 64QAM is adopted as the modulation method, and a bit number m of one symbol is 6 bits, according to FIG. 26, the memory 31 has twelve columns to store 6×2 bits in the row direction and stores 16200/(6×2) bits in the column direction.

In addition, the write start position of the first column among the twelve columns of the memory 31 becomes a position of which an address is 0, the write start position of the second column becomes a position of which an address is 0, the write start position of the third column becomes a position of which an address is 0, the write start position of the fourth column becomes a position of which an address is 2, the write start position of the fifth column becomes a position of which an address is 2, the write start position of the sixth column becomes a position of which an address is 2, the write start position of the seventh column becomes a position of which an address is 3, the write start position of the eighth column becomes a position of which an address is 3, the write start position of the ninth column becomes a position of which an address is 3, the write start position of the tenth column becomes a position of which an address is 6, the write start position of the eleventh column becomes a position of which an address is 7, and the write start position of the twelfth column becomes a position of which an address is 7, respectively.

When the multiple b is 1, the 256QAM is adopted as the modulation method, and a bit number m of one symbol is 8 bits, according to FIG. 26, the memory 31 has eight columns to store 8×1 bits in the row direction and stores 16200/(8×1) bits in the column direction.

In addition, the write start position of the first column among the eight columns of the memory 31 becomes a position of which an address is 0, the write start position of the second column becomes a position of which an address is 0, the write start position of the third column becomes a position of which an address is 0, the write start position of the fourth column becomes a position of which an address is 1, the write start position of the fifth column becomes a position of which an address is 7, the write start position of the sixth column becomes a position of which an address is 20, the write start position of the seventh column becomes a position of which an address is 20, and the write start position of the eighth column becomes a position of which an address is 21, respectively.

When the multiple b is 1, the 1024QAM is adopted as the modulation method, and a bit number m of one symbol is 10 bits, according to FIG. 26, the memory 31 has ten columns to store 10×1 bits in the row direction and stores 16200/(10×1) bits in the column direction.

In addition, the write start position of the first column among the ten columns of the memory 31 becomes a position of which an address is 0, the write start position of the second column becomes a position of which an address is 1, the write start position of the third column becomes a position of which an address is 2, the write start position of the fourth column becomes a position of which an address is 2, the write start position of the fifth column becomes a position of which an address is 3, the write start position of the sixth column becomes a position of which an address is 3, the write start position of the seventh column becomes a position of which an address is 4, the write start position of the eighth column becomes a position of which an address is 4, the write start position of the ninth column becomes a position of which an address is 5, and the write start position of the tenth column becomes a position of which an address is 7, respectively.

When the multiple b is 2, the 1024QAM is adopted as the modulation method, and a bit number m of one symbol is 10 bits, according to FIG. 26, the memory 31 has twenty columns to store 10×2 bits in the row direction and stores 16200/(10×2) bits in the column direction.

In addition, the write start position of the first column among the twenty columns of the memory 31 becomes a position of which an address is 0, the write start position of the second column becomes a position of which an address is 0, the write start position of the third column becomes a position of which an address is 0, the write start position of the fourth column becomes a position of which an address is 2, the write start position of the fifth column becomes a position of which an address is 2, the write start position of the sixth column becomes a position of which an address is 2, the write start position of the seventh column becomes a position of which an address is 2, the write start position of the eighth column becomes a position of which an address is 2, the write start position of the ninth column becomes a position of which an address is 5, the write start position of the tenth column becomes a position of which an address is 5, the write start position of the eleventh column becomes a position of which an address is 5, the write start position of the twelfth column becomes a position of which an address is 5, the write start position of the thirteenth column becomes a position of which an address is 5, the write start position of the fourteenth column becomes a position of which an address is 7, the write start position of the fifteenth column becomes a position of which an address is 7, the write start position of the sixteenth column becomes a position of which an address is 7, the write start position of the seventeenth column becomes a position of which an address is 7, the write start position of the eighteenth column becomes a position of which an address is 8, the write start position of the nineteenth column becomes a position of which an address is 8, and the write start position of the twentieth column becomes a position of which an address is 10, respectively.

When the multiple b is 1, the 4096QAM is adopted as the modulation method, and a bit number m of one symbol is 12 bits, according to FIG. 26, the memory 31 has twelve columns to store 12×1 bits in the row direction and stores 16200/(12×1) bits in the column direction.

In addition, the write start position of the first column among the twelve columns of the memory 31 becomes a position of which an address is 0, the write start position of the second column becomes a position of which an address is 0, the write start position of the third column becomes a position of which an address is 0, the write start position of the fourth column becomes a position of which an address is 2, the write start position of the fifth column becomes a position of which an address is 2, the write start position of the sixth column becomes a position of which an address is 2, the write start position of the seventh column becomes a position of which an address is 3, the write start position of the eighth column becomes a position of which an address is 3, the write start position of the ninth column becomes a position of which an address is 3, the write start position of the tenth column becomes a position of which an address is 6, the write start position of the eleventh column becomes a position of which an address is 7, and the write start position of the twelfth column becomes a position of which an address is 7, respectively.

When the multiple b is 2, the 4096QAM is adopted as the modulation method, and a bit number m of one symbol is 12 bits, according to FIG. 26, the memory 31 has twenty-four columns to store 12×2 bits in the row direction and stores 16200/(12×2) bits in the column direction.

In addition, the write start position of the first column among the twenty-four columns of the memory 31 becomes a position of which an address is 0, the write start position of the second column becomes a position of which an address is 0, the write start position of the third column becomes a position of which an address is 0, the write start position of the fourth column becomes a position of which an address is 0, the write start position of the fifth column becomes a position of which an address is 0, the write start position of the sixth column becomes a position of which an address is 0, the write start position of the seventh column becomes a position of which an address is 0, the write start position of the eighth column becomes a position of which an address is 1, the write start position of the ninth column becomes a position of which an address is 1, the write start position of the tenth column becomes a position of which an address is 1, the write start position of the eleventh column becomes a position of which an address is 2, the write start position of the twelfth column becomes a position of which an address is 2, the write start position of the thirteenth column becomes a position of which an address is 2, the write start position of the fourteenth column becomes a position of which an address is 3, the write start position of the fifteenth column becomes a position of which an address is 7, the write start position of the sixteenth column becomes a position of which an address is 9, the write start position of the seventeenth column becomes a position of which an address is 9, the write start position of the eighteenth column becomes a position of which an address is 9, the write start position of the nineteenth column becomes a position of which an address is 10, the write start position of the twentieth column becomes a position of which an address is 10, the write start position of the twenty-first column becomes a position of which an address is 10, the write start position of the twenty-second column becomes a position of which an address is 10, the write start position of the twenty-third column becomes a position of which an address is 10, and the write start position of the twenty-fourth column becomes a position of which an address is 11, respectively.

Figure 27:
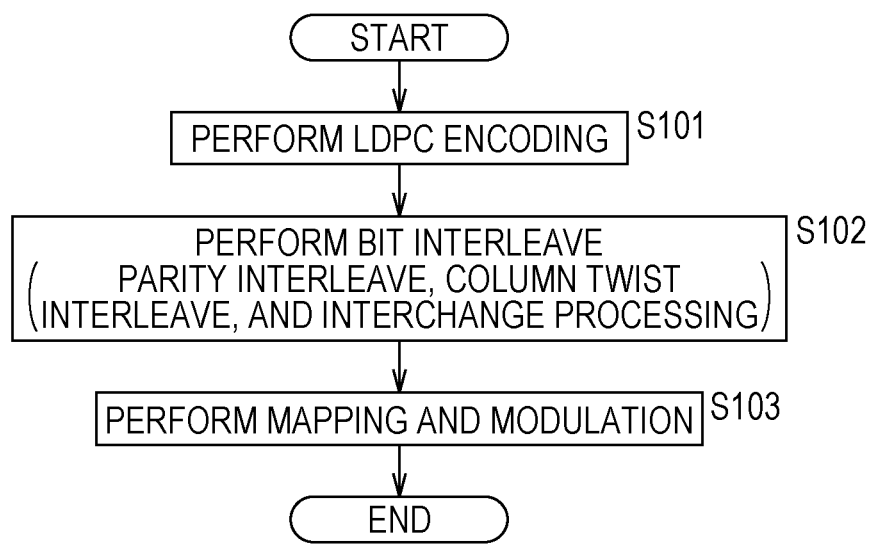
FIG. 27 is a flowchart illustrating processing executed by the bit interleaver 116 and a QAM encoder 117.

FIG. 27 is a flowchart illustrating processing executed by the LDPC encoder 115, the bit interleaver 116, and the QAM encoder 117 of FIG. 8.

The LDPC encoder 115 waits for supplying of the LDPC target data from the BCH encoder 114. In step S101, the LDPC encoder 115 encodes the LDPC target data with the LDPC code and supplies the LDPC code to the bit interleaver 116. The processing proceeds to step S102.

In step S102, the bit interleaver 116 performs bit interleave with respect to the LDPC code from the LDPC encoder 115 and supplies a symbol obtained by symbolizing the LDPC code after the bit interleave to the QAM encoder 117. The processing proceeds to step S103.

That is, in step S102, in the bit interleaver 116 (FIG. 9), the parity interleaver 23 performs parity interleave with respect to the LDPC code from the LDPC encoder 115 and supplies the LDPC code after the parity interleave to the column twist interleaver 24.

The column twist interleaver 24 performs column twist interleave with respect to the LDPC code from the parity interleaver 23 and supplies the LDPC code to the demultiplexer 25.

The demultiplexer 25 executes interchange processing for interchanging the sign bits of the LDPC code after the column twist interleave by the column twist interleaver 24 and making the sign bits after the interchange become symbol bits (bits representing a symbol) of the symbol.

Here, the interchange processing by the demultiplexer 25 can be executed according to the first to fourth interchange methods illustrated in FIGS. 18 and 19 and can be executed according to an allocation rule. The allocation rule is a rule to allocate the sign bits of the LDPC code to the symbol bits representing the symbol and is described in detail later.

The symbol that is obtained by the interchange processing by the demultiplexer 25 is supplied from the demultiplexer 25 to the QAM encoder 117.

In step S103, the QAM encoder 117 maps the symbol supplied from the demultiplexer 25 to a signal point determined by the modulation method of the orthogonal modulation performed by the QAM encoder 117, performs the orthogonal modulation, and supplies data obtained as a result thereof to the time interleaver 118.

As described above, the parity interleave or the column twist interleave is performed, so that resistance to the erasure or the burst error when the plurality of sign bits of the LDPC code are transmitted as one symbol can be improved.

Here, in FIG. 9, the parity interleaver 23 to be a block to perform the parity interleave and the column twist interleaver 24 to be a block to perform the column twist interleave are individually configured for the convenience of description. However, the parity interleaver 23 and the column twist interleaver 24 can be integrally configured.

That is, both the parity interleave and the column twist interleave can be performed by writing and reading of the sign bits with respect to the memory and can be represented by a matrix to convert an address to perform writing of the sign bits (write address) into an address to perform reading of the sign bits (read address).

Therefore, if a matrix obtained by multiplying a matrix representing the parity interleave and a matrix representing the column twist interleave is acquired, the sign bits are converted by the matrix, the parity interleave is performed, and a column twist interleave result of the LDPC code after the parity interleave can be obtained.

In addition to the parity interleaver 23 and the column twist interleaver 24, the demultiplexer 25 can be integrally configured.

That is, the interchange processing executed by the demultiplexer 25 can be represented by the matrix to convert the write address of the memory 31 storing the LDPC code into the read address.

Therefore, if a matrix obtained by multiplying the matrix representing the parity interleave, the matrix representing the column twist interleave, and the matrix representing the interchange processing is acquired, by the acquired matrix, the parity interleave, the column twist interleave, and the interchange processing can be collectively executed.

Only one of the parity interleave and the column twist interleave may be performed or both the parity interleave and the column twist interleave may not be performed.

Next, a simulation to measure an error rate (bit error rate) that is performed with respect to the transmitting device 11 of FIG. 8 will be described with reference to FIGS. 28 to 30.

The simulation is performed by adopting a communication channel in which a flutter having D/U of 0 dB exists.

FIG. 28 illustrates a model of a communication channel that is adopted by the simulation.

That is, A of FIG. 28 illustrates a model of a flutter that is adopted by the simulation.

In addition, B of FIG. 28 illustrates a model of a communication channel in which the flutter represented by the model of A of FIG. 28 exists.

In B of FIG. 28, H represents the model of the flutter of A of FIG. 28. In addition, in B of FIG. 28, N represents Inter Carrier Interference (ICI). In the simulation, an expectation value $E[N^2]$ of power is approximated in the AWGN.

Figure 29:
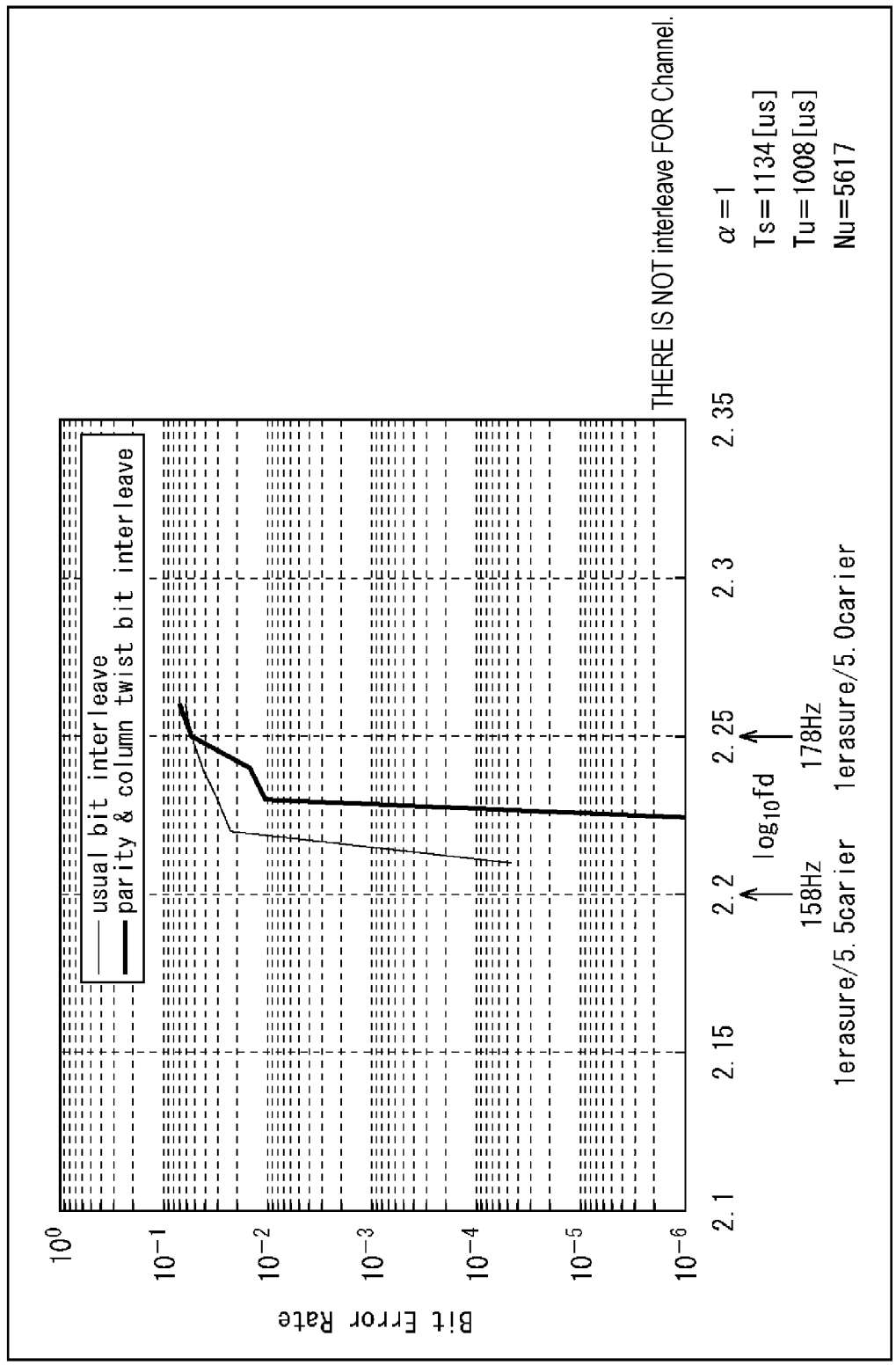
FIG. 29 is a diagram illustrating a relation of an error rate obtained by a simulation and a Doppler frequency $f_d$ of a flutter.
Figure 30:
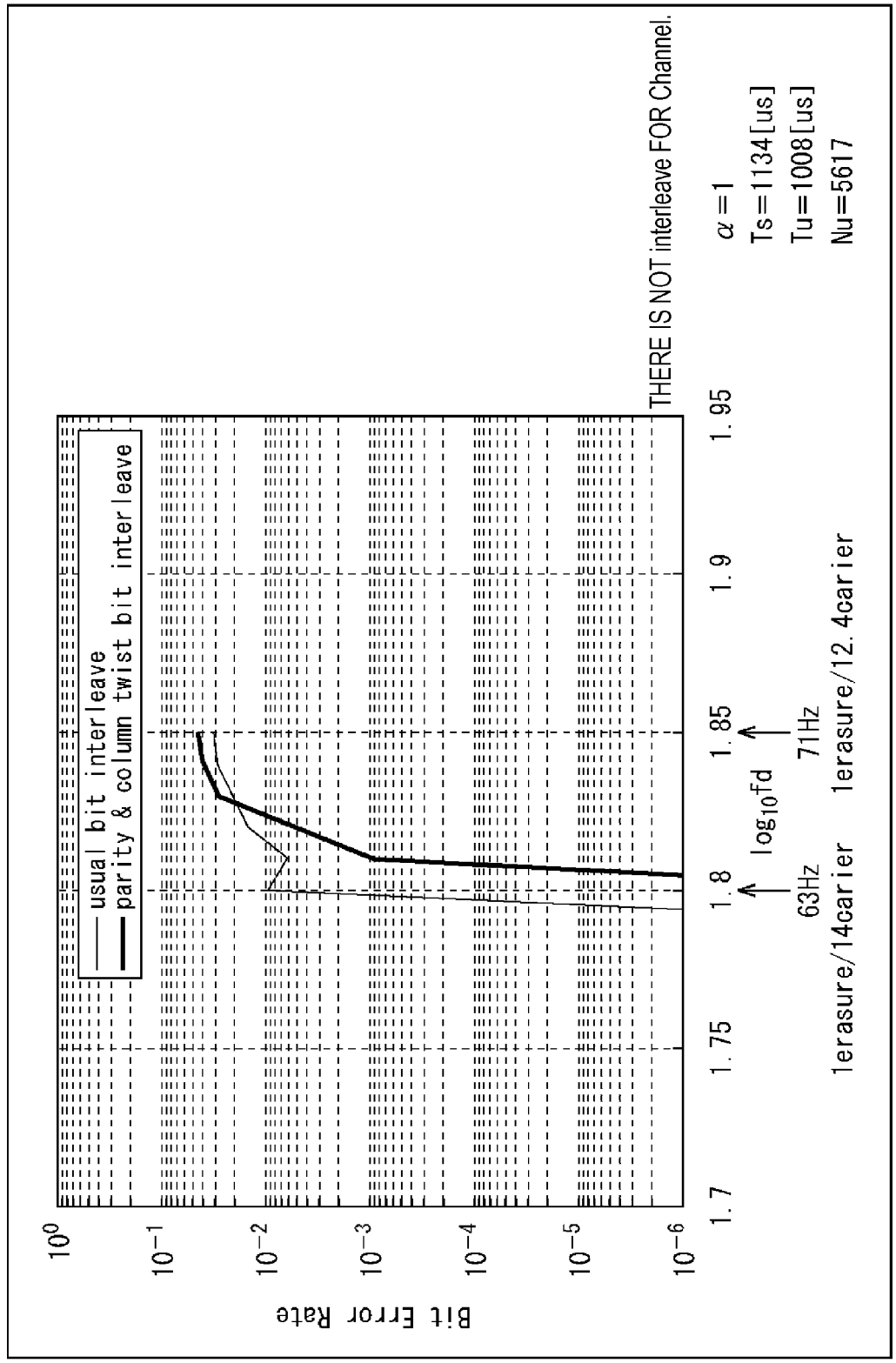
FIG. 30 is a diagram illustrating a relation of an error rate obtained by a simulation and a Doppler frequency $f_d$ of a flutter.

FIGS. 29 and 30 illustrate a relation of an error rate obtained by the simulation and a Doppler frequency $f_d$ of the flutter.

FIG. 29 illustrates a relation of the error rate and the Doppler frequency $f_d$ when a modulation method is the 16QAM, an encoding rate (r) is (3/4), and an interchange method is the first interchange method. In addition, FIG. 30 illustrates a relation of the error rate and the Doppler frequency $f_d$ when the modulation method is the 64QAM, the encoding rate (r) is (5/6), and the interchange method is the first interchange method.

In FIGS. 29 and 30, a thick line shows a relation of the error rate and the Doppler frequency $f_d$ when all of the parity interleave, the column twist interleave, and the interchange processing are performed and a thin line shows a relation of the error rate and the Doppler frequency $f_d$ when only the interchange processing among the parity interleave, the column twist interleave, and the interchange processing is performed.

In both FIGS. 29 and 30, it can be known that the error rate is further improved (decreased) when all of the parity interleave, the column twist interleave, and the interchange processing are performed, as compared with when only the interchange processing is executed.

[Configuration Example of LDPC Encoder 115]

Figure 31:
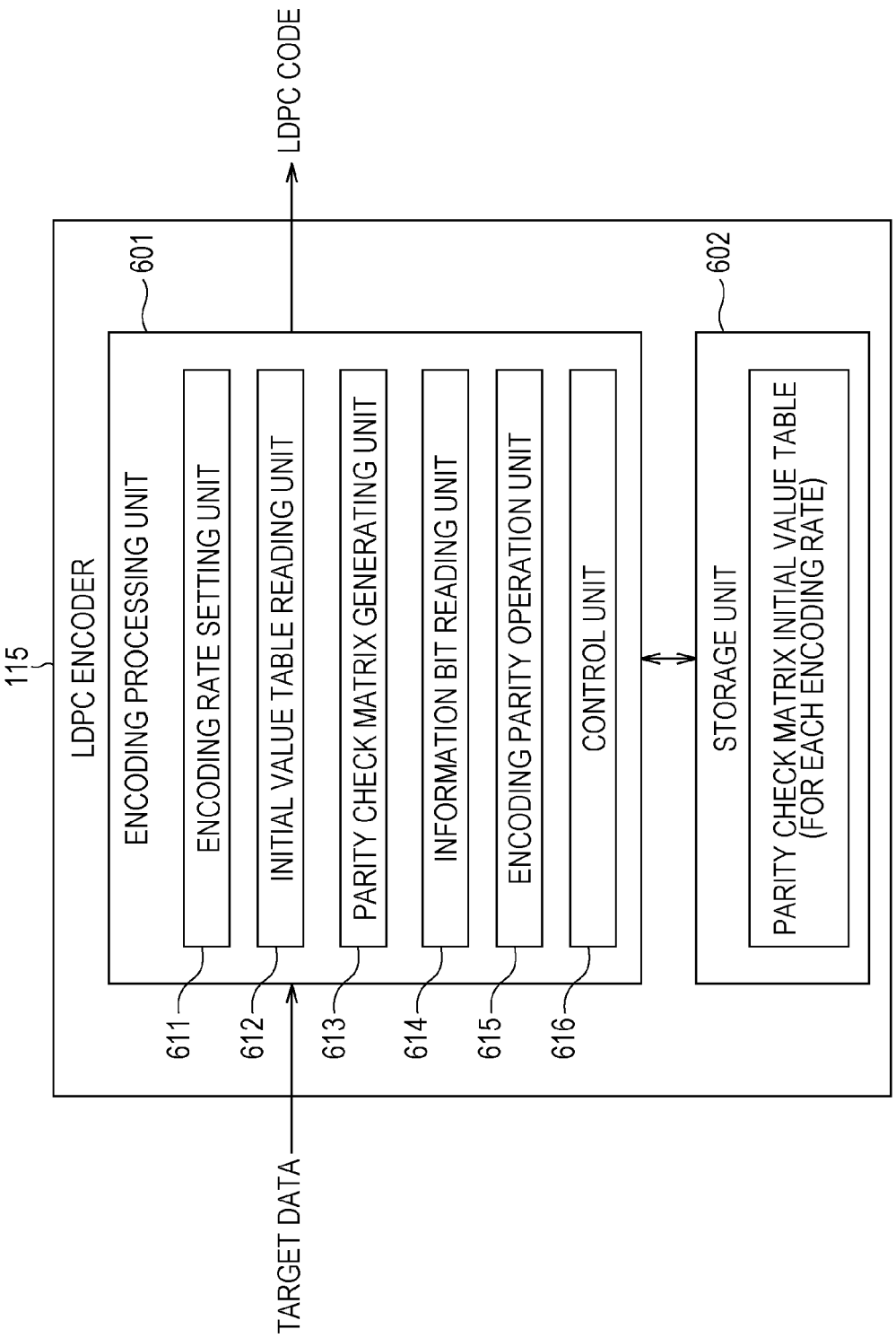
FIG. 31 is a block diagram illustrating a configuration example of an LDPC encoder 115.

FIG. 31 is a block diagram illustrating a configuration example of the LDPC encoder 115 of FIG. 8.

The LDPC encoder 122 of FIG. 8 is also configured in the same manner.

As described in FIGS. 12 and 13, in the standard of the DVB-T.2, the LDPC codes that have the two code lengths N of 64800 bits and 16200 bits are defined.

With respect to the LDPC code having the code length N of 64800 bits, 11 encoding rates of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined (FIGS. 12 and 13).

For example, the LDPC encoder 115 can perform encoding (error correction encoding) using the LDPC code of each encoding rate having the code length N of 64800 bits or 16200 bits, according to the parity check matrix H prepared for each code length N and each encoding rate.

The LDPC encoder 115 consists of an encoding processing unit 601 and a storage unit 602.

The encoding processing unit 601 consists of an encoding rate setting unit 611, an initial value table reading unit 612, a parity check matrix generating unit 613, an information bit reading unit 614, an encoding parity operation unit 615, a control unit 616. The encoding processing unit 601 performs the LDPC encoding of LDPC target data supplied to the LDPC encoder 115 and supplies an LDPC code obtained as a result thereof to the bit interleaver 116 (FIG. 8).

That is, the encoding rate setting unit 611 sets the code length N and the encoding rate of the LDPC code, according to an operation of an operator and the like.

The initial value table reading unit 612 reads a parity check matrix initial value table to be described later, which corresponds to the code length N and the encoding rate set by the encoding rate setting unit 611, from the storage unit 602.

The parity check matrix generating unit 613 generates a parity check matrix H by arranging elements of 1 of an information matrix $H_A$ corresponding to an information length K (=information length N−parity length M) according to the code length N and the encoding rate set by the encoding rate setting unit 611 in the column direction with a period of 360 columns (column number P of a unit of the cyclic structure), on the basis of the parity check matrix initial value table read by the initial value table reading unit 612, and stores the parity check matrix H in the storage unit 602.

The information bit reading unit 614 reads (extracts) information bits corresponding to the information length K, from the LDPC target data supplied to the LDPC encoder 115.

The encoding parity operation unit 615 reads the parity check matrix H generated by the parity check matrix generating unit 613 from the storage unit 602, using the parity check matrix H, calculates parity bits with respect to the information bits read by the information bit reading unit 614 on the basis of a predetermined expression, and generates a code word (LDPC code).

The control unit 616 controls each block constituting the encoding processing unit 601.

In the storage unit 602, a plurality of parity check matrix initial value tables corresponding to the plurality of encoding rates and the like illustrated in FIGS. 12 and 13, with respect to the code lengths N such as the 64800 bits and 16200 bits, are stored. In addition, the storage unit 602 temporarily stores data that is necessary for processing of the encoding processing unit 601.

Figures 32, 33:
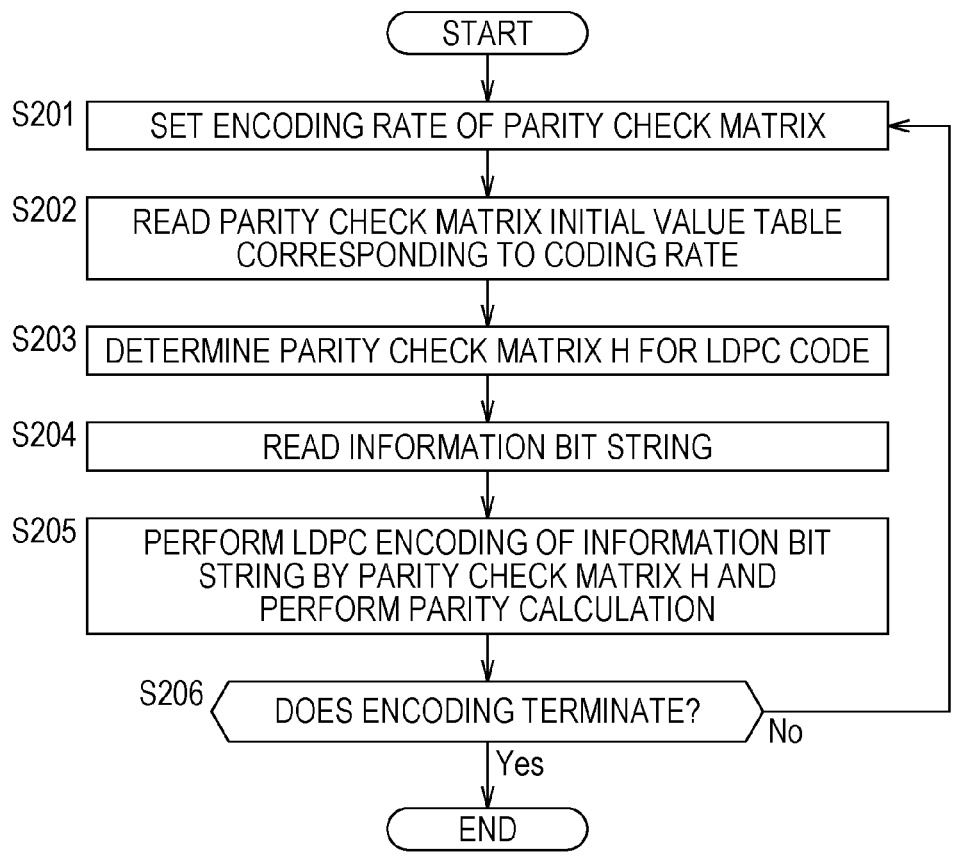
FIG. 32 is a flowchart illustrating processing of the LDPC encoder 115.
FIG. 33 is a diagram illustrating an example of a parity check matrix initial value table in which an encoding rate is 1/4 and a code length is 16200.

FIG. 32 is a flowchart illustrating processing of the LDPC encoder 115 of FIG. 31.

In step S201, the encoding rate setting unit 611 determines (sets) the code length N and the encoding rate r to perform the LDPC encoding.

In step S202, the initial value table reading unit 612 reads the previously determined parity check matrix initial value table corresponding to the code length N and the encoding rate r determined by the encoding rate setting unit 611, from the storage unit 602.

In step S203, the parity check matrix generating unit 613 acquires (generates) the parity check matrix H of the LDPC code of the code length N and the encoding rate r determined by the encoding rate setting unit 611, using the parity check matrix initial value table read from the storage unit 602 by the initial value table reading unit 612, supplies the parity check matrix to the storage unit 602, and stores the parity check matrix in the storage unit 602.

In step S204, the information bit reading unit 614 reads the information bits of the information length K (=N×r) corresponding to the code length N and the encoding rate r determined by the encoding rate setting unit 611, from the LDPC target data supplied to the LDPC encoder 115, reads the parity check matrix H acquired by the parity check matrix generating unit 613 from the storage unit 602, and supplies the information bits and the parity check matrix to the encoding parity operation unit 615.

In step S205, the encoding parity operation unit 615 sequentially operates parity bits of a code word c that satisfies an expression (8).

$$Hc^T = 0 \quad (8)$$

In the expression (8), c represents a row vector as the code word (LDPC code) and $c^T$ represents transposition of the row vector c.

As described above, when a portion of the information bits of the row vector c as the LDPC code (one code word) is represented by a row vector A and a portion of the parity bits is represented by a row vector T, the row vector c can be represented by an expression c=[A|T], using the row vector A as the information bits and the row vector T as the parity bits.

In the parity check matrix H and the row vector c=[A|T] corresponding to the LDPC code, it is necessary to satisfy an expression $Hc^T=0$. The row vector T that corresponds to the parity bits constituting the row vector c=[A|T] satisfying the expression $Hc^T=0$ can be sequentially acquired by setting elements of each row to 0, sequentially from elements of a first row of the column vector $Hc^T$ in the expression $Hc^T=0$, when the parity matrix $H_T$ of the parity check matrix $H=[H_A|H_T]$ becomes the staircase structure illustrated in FIG. 11.

If the encoding parity operation unit 615 acquires the parity bits T with respect to the information bits A, the encoding parity operation unit 615 outputs the code word c=[A|T] represented by the information bits A and the parity bits T as an LDPC encoding result of the information bits A.

Then, in step S206, the control unit 616 determines whether the LDPC encoding terminates. When it is determined in step S206 that the LDPC encoding does not terminate, that is, when there is LDPC target data to perform the LDPC encoding, the processing returns to step S201 (or step S204). Hereinafter, the processing of steps S201 (or S204) to S206 is repeated.

When it is determined in step S206 that the LDPC encoding ends, that is, for example, when there is no LDPC target data to perform the LDPC encoding, the LDPC encoder 115 terminates the processing.

As described above, the parity check matrix initial value table corresponding to each code length N and each encoding rate r is prepared and the LDPC encoder 115 performs the LDPC encoding of the predetermined code length N and the predetermined encoding rate r, using the parity check matrix H generated from the parity check matrix initial value table corresponding to the predetermined code length N and the predetermined encoding rate r.

[Example of Parity Check Matrix Initial Value Table]

The parity check matrix initial value table is a table that represents positions of elements of 1 of the information matrix $H_A$ (FIG. 10) of the parity check matrix H corresponding to the information length K according to the code length N and the encoding rate r of the LDPC code (LDPC code defined by the parity check matrix H) for every 360 columns (column number P of a unit of the cyclic structure) and is previously made for each parity check matrix H of each code length N and each encoding rate r.

FIG. 33 is a diagram illustrating an example of the parity check matrix initial value table.

That is, FIG. 33 illustrates a parity check matrix initial value table with respect to the parity check matrix H that is defined in the standard of the DVB-T.2 and has the code length N of 16200 bits and the encoding rate (encoding rate in the notation of the DVB-T.2) r of 1/4.

The parity check matrix generating unit 613 (FIG. 31) acquires the parity check matrix H using the parity check matrix initial value table, as follows.

That is, FIG. 34 illustrates a method of acquiring the parity check matrix H from the parity check matrix initial value table.

The parity check matrix initial value table of FIG. 34 is a parity check matrix initial value table with respect to the parity check matrix H that is defined in the standard of the DVB-T.2 and has the code length N of 16200 bits and the encoding rate r of 2/3.

As described above, the parity check matrix initial value table is the table that represents the positions of the elements of 1 of the information matrix $H_A$ (FIG. 10) corresponding to the information length K according to the code length N and the encoding rate r of the LDPC code for every 360 columns (column number P of a unit of the cyclic structure) and in the i-th row thereof, row numbers (row numbers when a row number of a first row of the parity check matrix H is set to 0) of elements of 1 of a (1+360×(i−1)-th column of the parity check matrix H are arranged by the number of column weights of the (1+360×(i−1)-th column.

Here, because the parity matrix $H_T$ (FIG. 10) of the parity check matrix H corresponding to the parity length M is determined as illustrated in FIG. 21, according to the parity check matrix initial value table, the information matrix $H_A$ (FIG. 10) of the parity check matrix H corresponding to the information length K is acquired.

A row number k+1 of the parity check matrix initial value table is different according to the information length K.

A relation of an expression (9) is realized between the information length K and the row number k+1 of the parity check matrix initial value table.

$$K=(k+1)\times 360 \qquad (9)$$

Here, 360 of the expression (9) is the column number P of the unit of the cyclic structure described in FIG. 22.

In the parity check matrix initial value table of FIG. 34, 13 numerical values are arranged from the first row to the third row and 3 numerical values are arranged from the fourth row to the (k+1)-th row (in FIG. 34, the 30th row).

Therefore, the column weights of the parity check matrix H acquired from the parity check matrix initial value table of FIG. 34 are 13 from the first column to the (1+360×(3−1)−1)-th column and are 3 from the (1+360×(3−1))-th column to the K-th column.

The first row of the parity check matrix initial value table of FIG. 34 becomes 0, 2084, 1613, 1548, 1286, 1460, 3196, 4297, 2481, 3369, 3451, 4620, and 2622, which shows that elements of rows having row numbers of 0, 2084, 1613, 1548, 1286, 1460, 3196, 4297, 2481, 3369, 3451, 4620, and 2622 are 1 (and the other elements are 0), in the first column of the parity check matrix H.

In addition, the second row of the parity check matrix initial value table of FIG. 34 becomes 1, 122, 1516, 3448, 2880, 1407, 1847, 3799, 3529, 373, 971, 4358, and 3108, which shows that elements of rows having row numbers of 1, 122, 1516, 3448, 2880, 1407, 1847, 3799, 3529, 373, 971, 4358, and 3108 are 1, in the 361 (=1+360×(2−1))-th column of the parity check matrix H.

As described above, the parity check matrix initial value table represents positions of elements of 1 of the information matrix $H_A$ of the parity check matrix H for every 360 columns.

The columns other than the (1+360×(i−1))-th column of the parity check matrix H, that is, the individual columns from the (2+360×(i−1))-th column to the (360×i)-th column are arranged by cyclically shifting elements of 1 of the (1+360×(i−1))-th column determined by the parity check matrix initial value table periodically in a downward direction (downward direction of the columns) according to the parity length M.

That is, the (2+360×(i−1))-th column is obtained by cyclically shifting (1+360×(i−1))-th column in the downward direction by M/360 (=q) and the next (3+360×(i−1))-th column is obtained by cyclically shifting (1+360×(i−1))-th column in the downward direction by 2×M/360 (=2×q) (obtained by cyclically shifting (2+360×(i−1))-th column in the downward direction by M/360 (=q)).

If a numerical value of a j-th column (j-th column from the left side) of an i-th row (i-th row from the upper side) of the parity check matrix initial value table is represented as $h_{i,j}$ and a row number of the j-th element of 1 of the w-th column of the parity check matrix H is represented as $H_{w-j}$, the row number $H_{w-j}$ of the element of 1 of the w-th column to be a column other than the (1+360×(i−1))-th column of the parity check matrix H can be acquired by an expression (10).

$$H_{w-j}=\mathrm{mod}\{h_{i,j}+\mathrm{mod}((w-1),P)\times q, M\} \qquad (10)$$

Here, mod(x, y) means a remainder that is obtained by dividing x by y.

In addition, P is a column number of a unit of the cyclic structure described above. For example, in the standard of the DVB-T.2, P is 360 as described above. Furthermore, q is a value M/360 that is obtained by dividing the parity length M by the column number P (=360) of the unit of the cyclic structure.

The parity check matrix generating unit 613 (FIG. 31) specifies the row numbers of the elements of 1 of the (1+360×(i−1))-th column of the parity check matrix H by the parity check matrix initial value table.

In addition, the parity check matrix generating unit 613 (FIG. 31) acquires the row number $H_{w-j}$ of the element of 1 of the w-th column to be the column other than the (1+360×(i−1))-th column of the parity check matrix H, according to the expression (10), and generates the parity check matrix H in which the element of the obtained row number is set to 1.

[Appropriate LDPC Code Exclusively Used for Mobile Terminal]

Meanwhile, if the digital broadcasting exclusively used for the mobile terminal can be performed with the minimum change of the specifications of the transmitting device and the receiving device based on the DVB-T.2 to be the standard of the digital broadcasting exclusively used for the fixed terminal, the digital broadcasting is advantageous in terms of a cost.

Here, in the DVB-T.2, the LDPC codes that have the two code lengths N of 64 kbits and 16 kbits are defined.

If the LDPC code defined in the DVB-T.2 is adopted in the digital broadcasting exclusively used for the mobile terminal, it is possible to decrease the memory or the delay necessary for decoding the LDPC code in more the LDPC code having the short code length than the LDPC code having the long code length. For this reason, in the digital broadcasting exclusively used for the mobile terminal, it is appropriate to adopt the LDPC code of 16 kbits to be the short code length in the LDPC codes having the two code lengths defined in the DVB-T.2.

However, in the mobile terminal, in order to alleviate load necessary for the processing such as the decoding of the LDPC code, for example, the repeat count of decoding (repeat decoding count C) of the LDPC code may be restricted as compared with the case of the fixed terminal. With respect to the digital broadcasting exclusively used for the mobile terminal, in the LDPC code of 16 kbits defined in the DVB-T.2, resistance to the error may be insufficient.

Therefore, the transmitting device 11 (FIG. 7) can perform the digital broadcasting exclusively used for the mobile terminal by using a new LDPC code of 16 kbits having higher resistance to the error than the LDPC code of 16 kbits defined in the DVB-T.2 as an LDPC code (hereinafter, also referred to as a mobile LDPC code) appropriate for the digital broadcasting exclusively used for the mobile terminal.

In the mobile LDPC code, from the view point of maintaining the compatibility with the DVB-T.2 as high as possible, similar to the LDPC code defined in the DVB-T.2, the parity matrix $H_T$ of the parity check matrix H has a staircase structure (FIG. 11).

In addition, in the mobile LDPC code, similar to the LDPC code defined in the DVB-T.2, the information matrix $H_A$ of the parity check matrix H has a cyclic structure and the column number P of the unit of the cyclic structure is also defined as 360.

FIGS. 35 to 43 are diagrams illustrating examples of the parity check matrix initial value table of the (mobile) LDPC code having the code length N of 16 kbits as described above.

Figure 35:
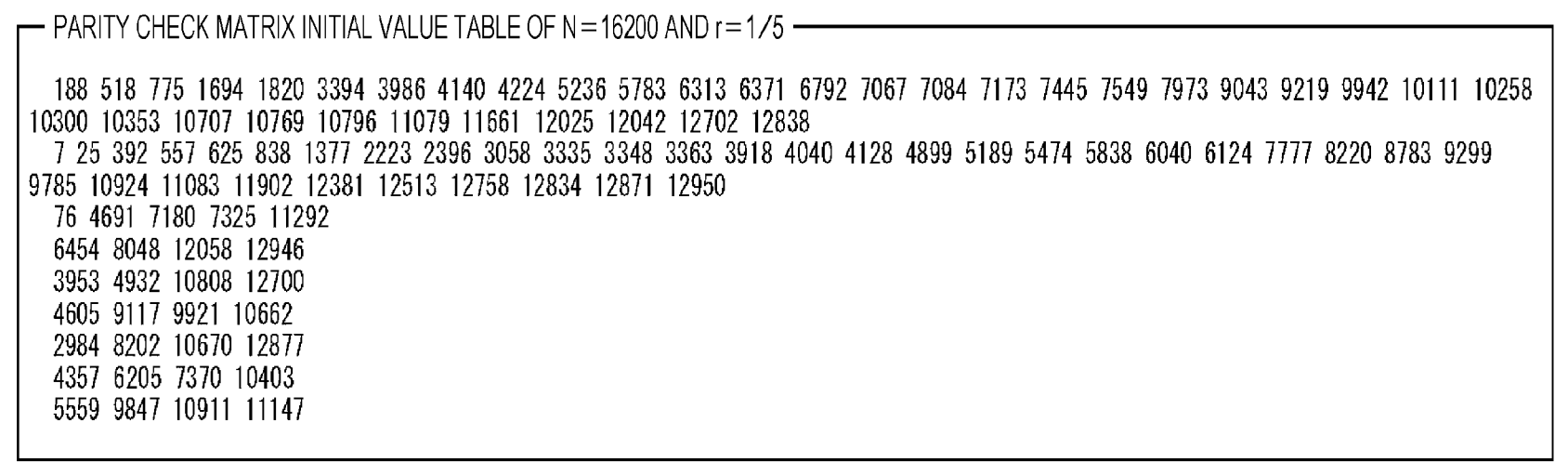

That is, FIG. 35 illustrates a parity check matrix initial value table with respect to a parity check matrix H having a code length N of 16 kbits and an encoding rate r of 1/5.

Figure 36:
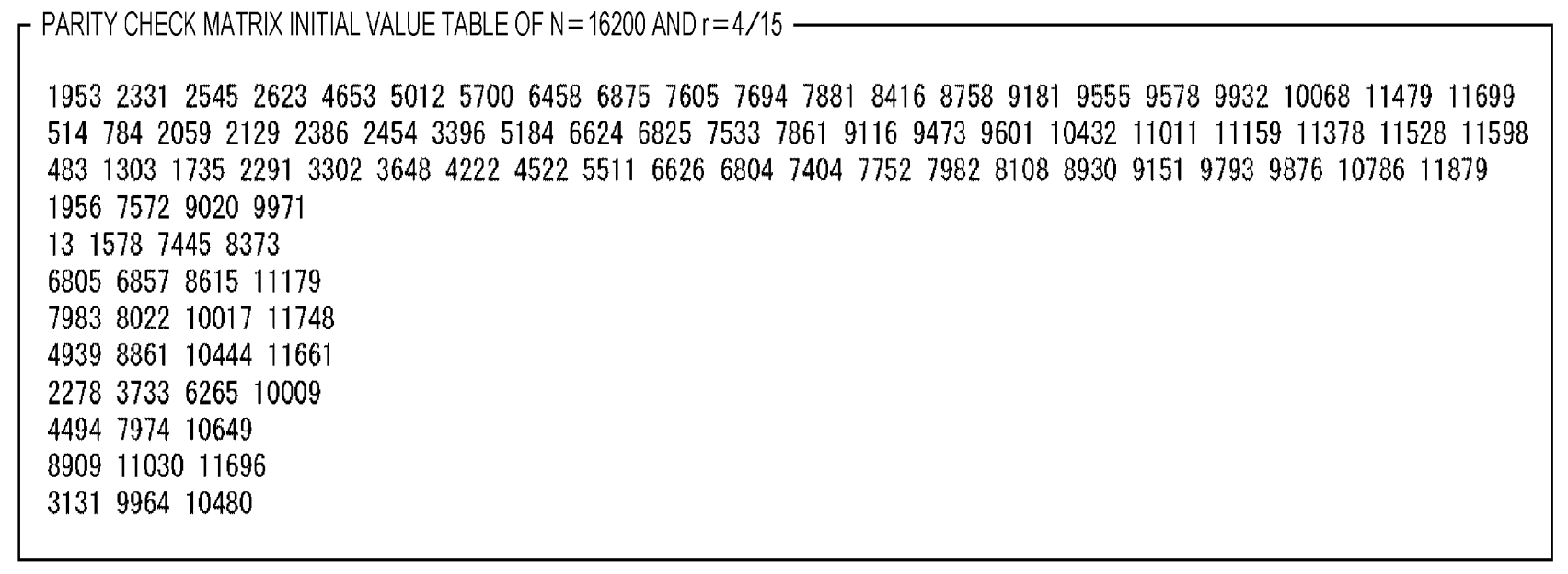

FIG. 36 illustrates a parity check matrix initial value table with respect to a parity check matrix H having a code length N of 16 kbits and an encoding rate r of 4/15.

Figure 37:
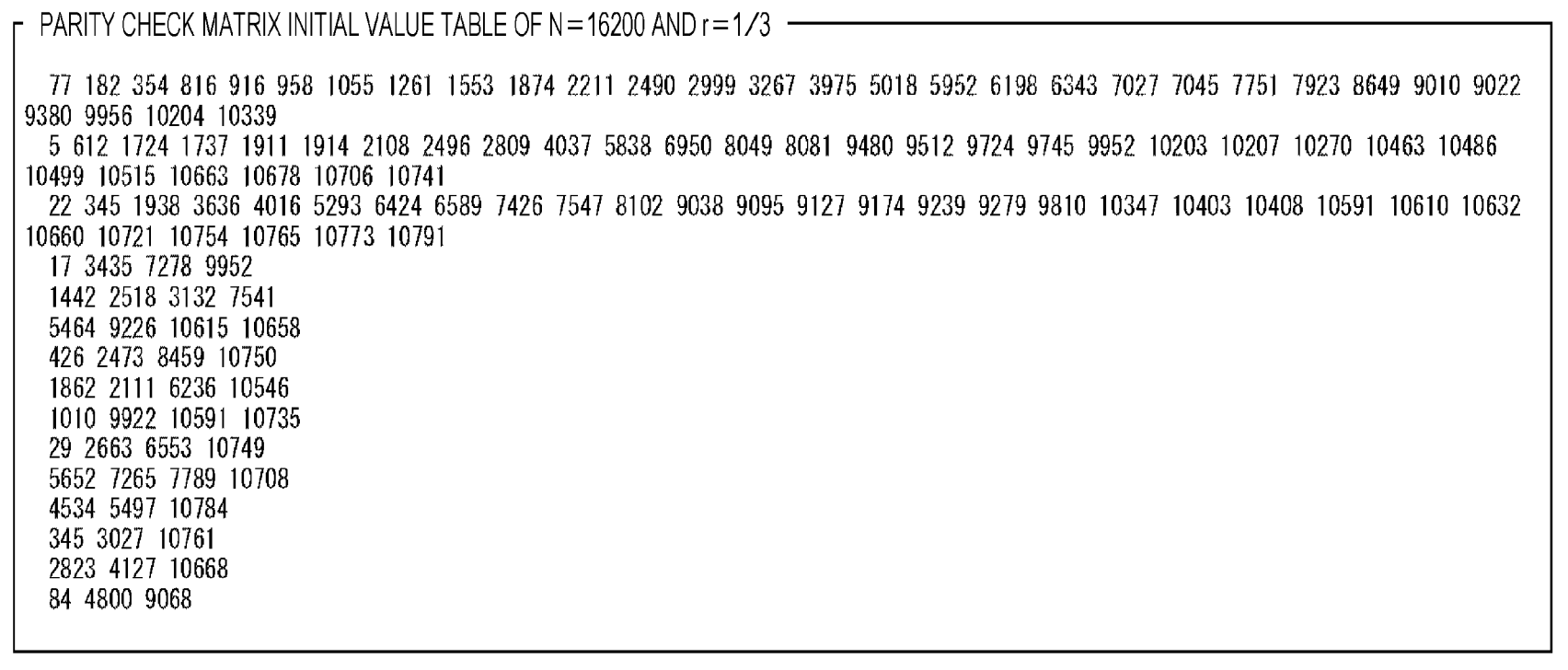

FIG. 37 illustrates a parity check matrix initial value table with respect to a parity check matrix H having a code length N of 16 kbits and an encoding rate r of 1/3.

Figure 38:
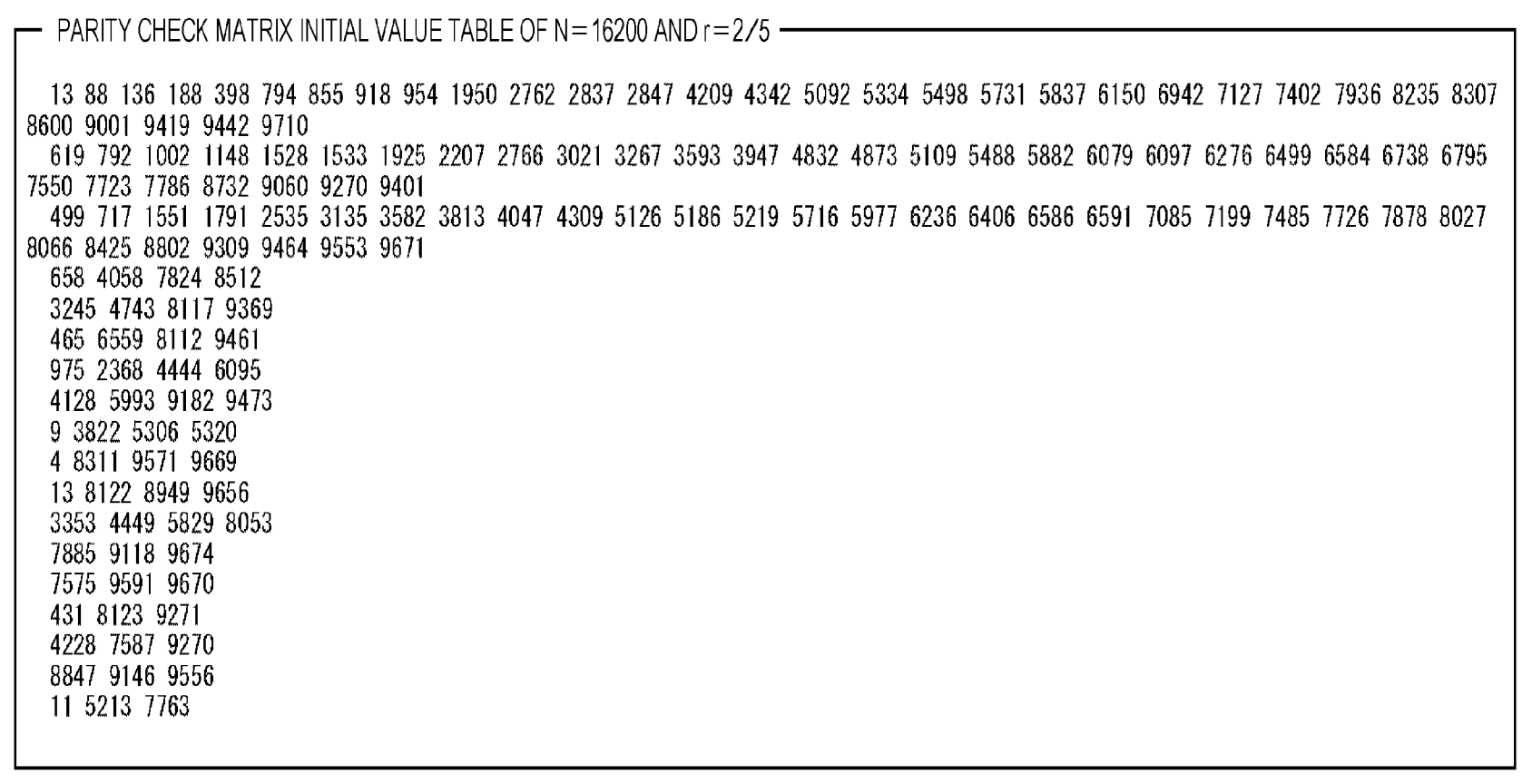

FIG. 38 illustrates a parity check matrix initial value table with respect to a parity check matrix H having a code length N of 16 kbits and an encoding rate r of 2/5.

Figure 39:
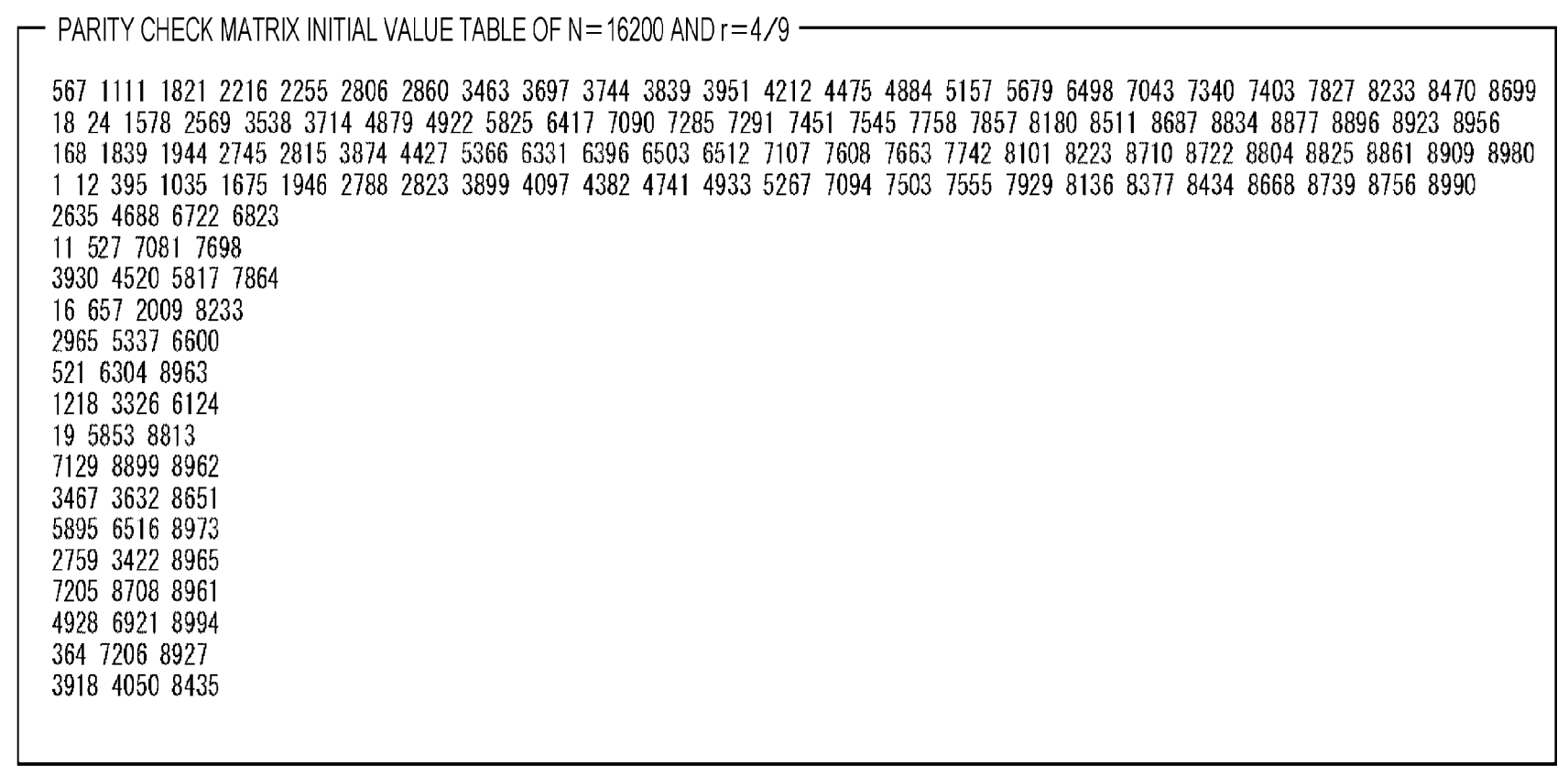

FIG. 39 illustrates a parity check matrix initial value table with respect to a parity check matrix H having a code length N of 16 kbits and an encoding rate r of 4/9.

FIG. 40 illustrates a parity check matrix initial value table with respect to a parity check matrix H having a code length N of 16 kbits and an encoding rate r of 7/15.

FIG. 41 illustrates a parity check matrix initial value table with respect to a parity check matrix H having a code length N of 16 kbits and an encoding rate r of 8/15.

FIG. 42 illustrates a parity check matrix initial value table with respect to a parity check matrix H having a code length N of 16 kbits and an encoding rate r of 3/5.

FIG. 43 illustrates a parity check matrix initial value table with respect to a parity check matrix H having a code length N of 16 kbits and an encoding rate r of 2/3.

For the digital broadcasting exclusively used for the mobile terminal, the LDPC encoder 115 (FIGS. 8 and 31) performs encoding to an LDPC code having a code length N of 16 kbits and any one of nine kinds of encoding rates r of 1/5, 4/15, 1/3, 2/5, 4/9, 7/15, 8/15, 3/5, and 2/3, using the parity check matrix H acquired from the parity check matrix initial value table illustrated in FIGS. 35 to 43.

LDPC codes obtained using the parity check matrix H acquired from the parity check matrix initial value table illustrated in FIGS. 35 to 43 become LDPC codes having high performance.

Here, the LDPC code having the high performance is an LDPC code that is obtained from an appropriate parity check matrix H.

In addition, the appropriate parity check matrix H is a parity check matrix satisfying a predetermined condition in which the Bit Error Rate (BER) is decreased, when the LDPC code obtained from the parity check matrix H is transmitted at a low $E_s/N_0$ (ratio of signal power to noise power for each symbol) or a low $E_b/N_0$ (ratio of signal power to noise power for each bit).

The appropriate parity check matrix H can be acquired, for example, by performing a simulation to measure the BER when LDPC codes obtained from various parity check matrixes satisfying the predetermined condition are transmitted at the low $E_s/N_o$.

As the predetermined condition to be satisfied by the appropriate parity check matrix H, for example, there are a condition in which an analysis result obtained by using a method of analyzing the performance of a code called density evolution is good, a condition in which a loop of elements of 1 called cycle-4 does not exist, and the like.

Here, it is known that the decoding performance of the LDPC code is deteriorated, when elements of 1 densely exist in the information matrix $H_A$, like the cycle-4. For this reason, as the predetermined condition to be satisfied by the appropriate parity check matrix H, it is required that the cycle-4 does not exist.

The predetermined condition to be satisfied by the appropriate parity check matrix H can be appropriately determined from the viewpoint of the improvement of the decoding performance of the LDPC code, easiness (simplification) of the decoding processing of the LDPC code, and the like.

Figure 44:
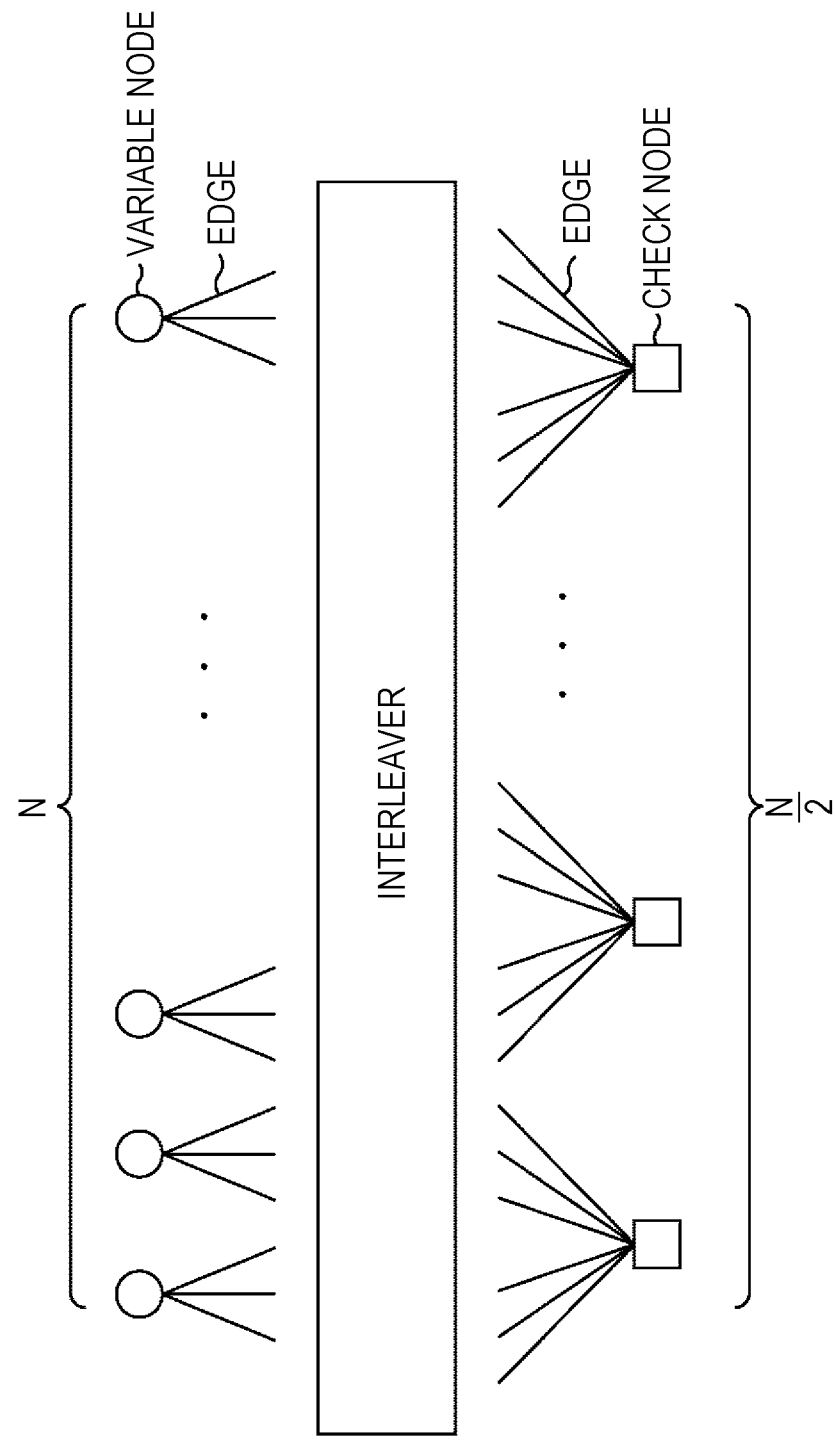
FIG. 44 is a diagram illustrating an example of a Tanner graph of an ensemble of a degree sequence having a column weight of 3 and a row weight of 6.
Figure 45:
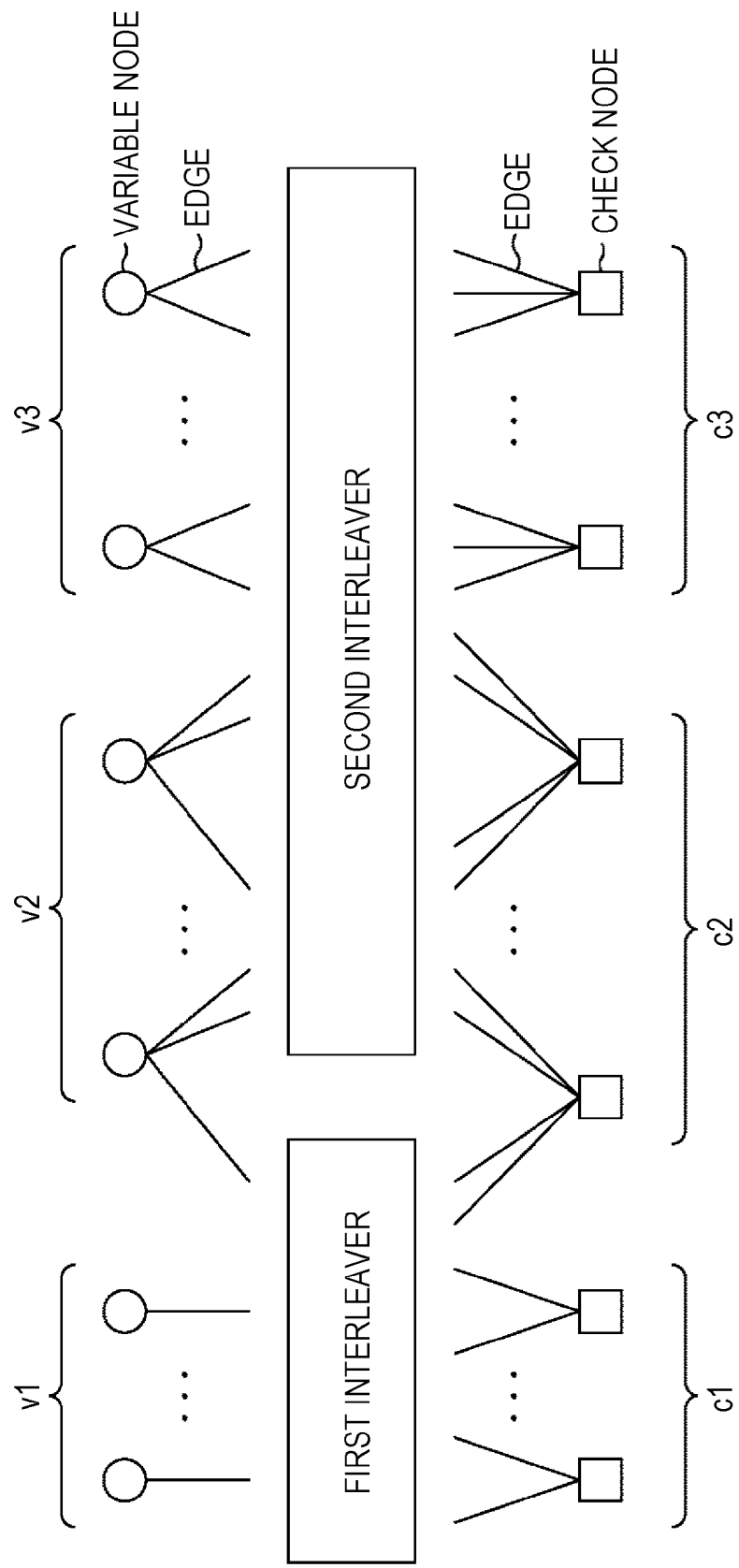
FIG. 45 is a diagram illustrating an example of a Tanner Graph of an ensemble of a multi-edge type.

FIGS. 44 and 45 are diagrams illustrating the density evolution, by which the analysis result is obtained, as the predetermined condition to be satisfied by the appropriate parity check matrix H.

The density evolution is a code analysis method for calculating an expectation value of an error probability with respect to all LDPC codes (ensemble) having a code length N of ∞ that is specified by a degree sequence to be described later.

For example, if the variance value of noise increases from zero on an AWGN channel, an expectation value of the error probability of a certain ensemble is first zero. However, if the variance value of the noise becomes equal to or more than a certain threshold, the expectation value is not zero.

According to the density evolution, by comparing the thresholds (hereinafter, also referred to as performance thresholds) of the variance value of the noise for which the expectation value of the error probability is not zero, the performance of an ensemble (the degree of appropriateness of a parity check matrix) can be determined.

In addition, for a specific LDPC code, by determining an ensemble to which the LDPC code belongs and performing the density evolution with respect to the ensemble, rough performance of the LDPC code can be estimated.

Therefore, when an ensemble having high performance is found, an LDPC code having high performance can be found from LDPC codes belonging to the ensemble.

Here, the degree sequence described above represents a ratio of variable nodes or check nodes having the weight of each value, with respect to a code length N of an LDPC code.

For example, a regular (3,6) LDPC code having an encoding rate of 1/2 belongs to an ensemble that is specified by a degree sequence in which the weight (column weight) of all the variable nodes is 3 and the weight (row weight) of all the check nodes is 6.

FIG. 44 illustrates a Tanner graph of such an ensemble.

In the Tanner graph illustrated in FIG. 44, variable nodes each shown by a circle (○ mark) in the drawing exist by N that is the same as the code length N and check nodes each shown by a square (□ mark) in the drawing exist by N/2 that is the same as a value obtained by multiplying the code length N by an encoding rate 1/2.

Three edges of which the number is the same as the column weight are connected to each variable node. Therefore, a total of 3N edges connected to N variable nodes exist.

In addition, six edges of which the number is the same as the row weight are connected to each check node. Therefore, a total of 3N edges connected to N/2 check nodes exist.

Furthermore, in the Tanner graph illustrated in FIG. 44, one interleaver exists.

The interleaver randomly rearranges the 3N edges connected to the N variable nodes and connects each edge after the rearrangement to any one of the 3N edges connected to the N/2 check nodes.

In the interleaver, there are only (3N)!(=(3N)× (3N−1)× . . . ×1) rearrangement patterns for rearranging 3N edges connected to the N variable nodes. Therefore, an ensemble specified by a degree sequence in which the weight of all the variable nodes is 3 and the weight of all the check nodes is 6 becomes a set of (3N)! LDPC codes.

In a simulation for acquiring an LDPC code having high performance (appropriate parity check matrix), a multi-edge type ensemble is used in the density evolution.

In the multi-edge type, the interleaver through which the edges connected to the variable nodes and the edges connected to the check nodes pass is divided into multi edges. Thereby, the specifying of the ensemble is performed more accurately.

FIG. 45 illustrates an example of a Tanner Graph of an ensemble of a multi-edge type.

In the Tanner graph illustrated in FIG. 45, there are two interleavers including a first interleaver and a second interleaver.

In addition, in the Tanner graph illustrated in FIG. 45, only v1 variable nodes each having one edge connected to the first interleaver and zero edge connected to the second interleaver, only v2 variable nodes each having one edge connected to the first interleaver and two edges connected to the second interleaver, and only v3 variable nodes each having zero edge connected to the first interleaver and two edges connected to the second interleaver exist, respectively.

Furthermore, in the Tanner graph illustrated in FIG. 45, only c1 check nodes each having two edges connected to the first interleaver and zero branch connected to the second interleaver, only c2 check nodes each having two edges connected to the first interleaver and two edges connected to the second interleaver, and only c3 check nodes each having zero edge connected to the first interleaver and three edges connected to the second interleaver exist, respectively.

Here, the density evolution and the implementation thereof are described, for example, in "On the Design of Low-Density Parity-Check Codes within 0.0045 dB of the Shannon Limit", S. Y. Chung, G. D. Formey, T. J. Richardson, R. Urbanke, IEEE Communications Leggers, VOL. 5, NO. 2, February 2001.

In a simulation for acquiring (a parity check matrix initial value table of) a mobile LDPC code illustrated in FIGS. 35 to 43, an ensemble of which the performance threshold to be $E_b/N_0$ at which the BER starts to fall (decrease) in accordance with the density evolution of the multi-edge type becomes a predetermined value or less is found. From the LDPC codes belonging to the ensemble, an LDPC code decreasing the BER in a plurality of modulation methods used for the digital broadcasting exclusively used for the mobile terminal, such as the 16QAM or the 64QAM, is selected as an LDPC code having high performance.

Here, resistance to the error in the mobile terminal is lowered than resistance to the error in the fixed terminal. For this reason, in the digital broadcasting exclusively used for the mobile terminal, a modulation method such as the QPSK, the 16QAM, or the 64QAM in which the number of signal points is relatively small is adopted to improve the resistance to the error.

The parity check matrix initial value tables illustrated in FIGS. 35 to 43 described above are the parity check matrix initial value tables of the LDPC code having the code length N of 16 kbits, which are acquired by the simulation as described above.

Figures 46, 47:
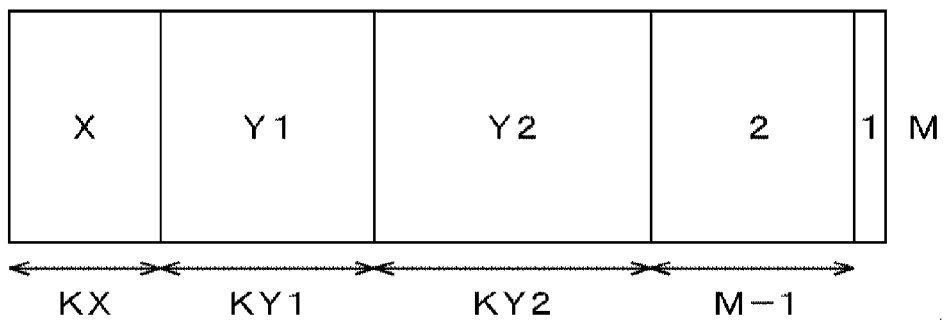
FIG. 46 is a diagram illustrating a minimum cycle length and a performance threshold of a parity check matrix of an LDPC code having a code length of 16200.
FIG. 47 is a diagram illustrating a parity check matrix of an LDPC code having a code length of 16200.

FIG. 46 is a diagram illustrating minimum cycle lengths and performance thresholds of the parity check matrixes H acquired from the parity check matrix initial value tables of the nine kinds of LDPC codes having the code length N of 16 kbits and the encoding rates of 1/5, 4/15, 1/3, 2/5, 4/9, 7/15, 8/15, 3/5, and 2/3, illustrated in FIGS. 35 to 43.

In the parity check matrixes H acquired from the parity check matrix initial value tables illustrated in FIGS. 35 to 43, the minimum cycle lengths of the parity check matrixes H having the encoding rates r of 1/5, 4/15, and 3/5 become 8 cycles and the minimum cycle lengths of the parity check matrixes H having the encoding rates r of 1/3, 2/5, 4/9, 7/15, 8/15, and 2/3 become 6 cycles.

Accordingly, in the parity check matrixes H acquired from the parity check matrix initial value tables illustrated in FIGS. 35 to 43, the cycle-4 does not exist.

In addition, if the encoding rate r decreases, the redundancy of the LDPC code increases. For this reason, the performance threshold tends to be improved (decreases), as the encoding rate r decreases.

FIG. 47 is a diagram illustrating the parity check matrix H (hereinafter, also referred to as a parity check matrix H of a mobile LDPC code) (acquired from the parity check matrix initial value tables) of FIGS. 35 to 43.

In the parity check matrix H of the mobile LDPC code, a column weight is set to X for KX columns from the first column, a column weight is set to Y1 for the subsequent KY1 columns, a column weight is set to Y2 for the subsequent KY2 columns, a column weight is set to 2 for the subsequent (M−1) columns, and a column weight is set to 1 for the last column.

Here, KX+KY1+KY2+M−1+1 is the same as the code length N=16200 bits.

FIG. 48 is a diagram illustrating the column numbers KX, KY1, KY2, and M and the column weights X, Y1, and Y2 of FIG. 47, with respect to each encoding rate r (=1/5, 4/15, 1/3, 2/5, 4/9, 7/15, 8/15, 3/5, and 2/3) of the mobile LDPC code.

For a parity check matrix H of a mobile LDPC code having a code length N of 16 k, similarly to the parity check matrix defined in the DVB-T.2 described with reference to FIGS. 12 and 13, a column weight of a column of ahead side (left side) tends to be large. Therefore, a sign bit of a head side of the mobile LDPC code tends to be strong for error (there is resistance to the error) and a sign bit of an ending side tends to be weak for the error.

Figure 49:
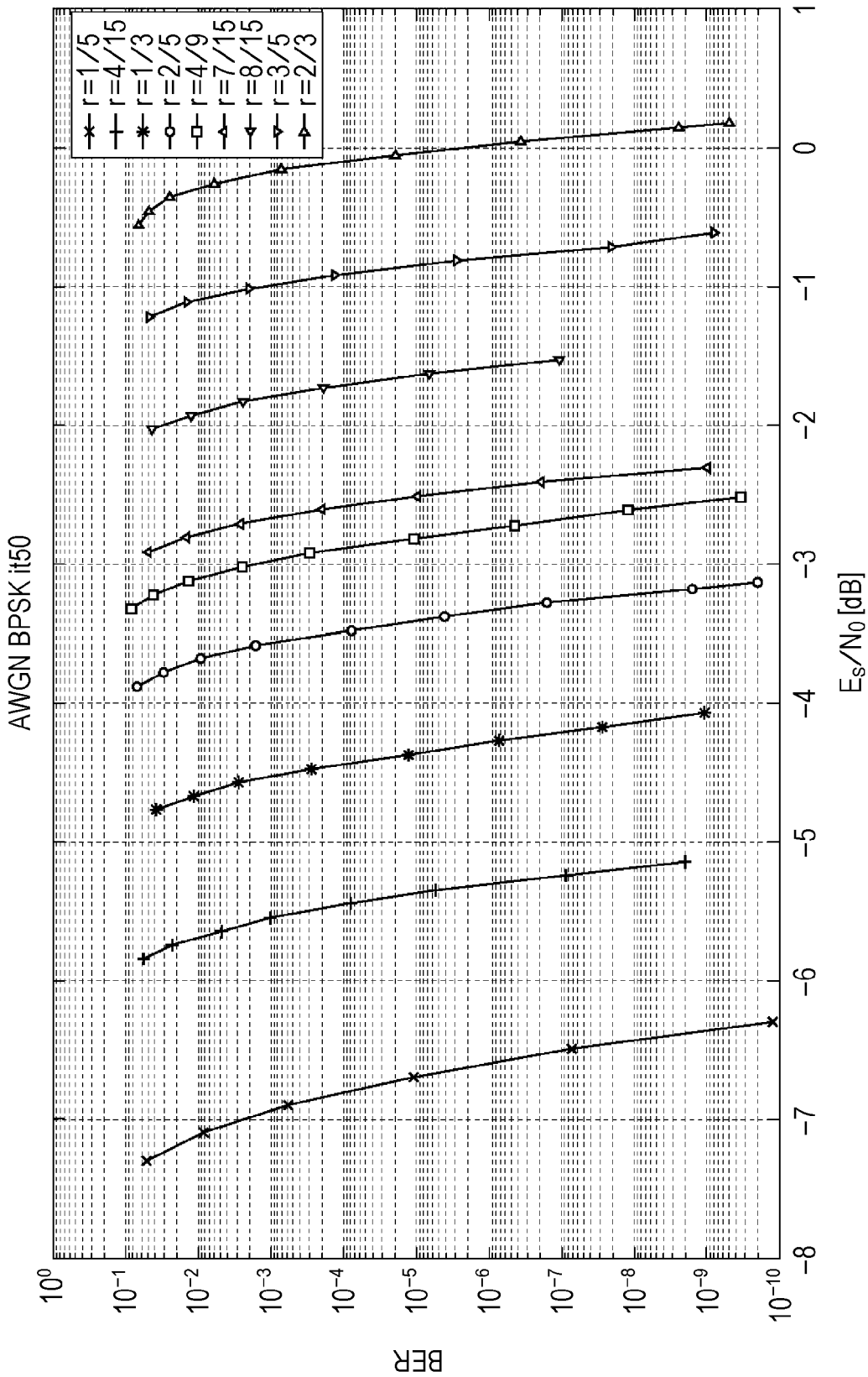
FIG. 49 is a diagram illustrating a simulation result of a BER of an LDPC code having a code length of 16200.

FIG. 49 is a diagram illustrating a simulation result of the BER of the mobile LDPC code of FIGS. 35 to 43.

In the simulation, a communication channel (channel) of the AWGN is assumed, the BPSK is adopted as a modulation method, and 50 is adopted as the repeat decoding count C.

In FIG. 49, a horizontal axis represents $E_s/N_0$ (ratio of signal power to noise power for each symbol) and a vertical axis represents the BER.

Here, in the encoding rates r=1/5, 4/15, 1/3, 2/5, 4/9, 7/15, 8/15, 3/5, and 2/3 of the mobile LDPC codes, with respect to 1/5, 1/3, 2/5, 4/9, 3/5, and 2/3, the LDPC codes (hereinafter, also referred to as standard 16 k codes) having the same encoding rate and the code length N of 16 k are defined in the DVB-T.2.

In the simulation, it is confirmed that performance in the case of the BER of the mobile LDPC code having any encoding rate r is improved as compared with performance in the case of the BER of the standard 16 k code having the same encoding rate defined in the DVB-T.2, with respect to the mobile LDPC codes having the encoding rates r of 1/5, 1/3, 2/5, 4/9, 3/5, and 2/3. Therefore, according to the mobile LDPC code, resistance to the error can be improved.

Here, the same encoding rates as 4/15, 7/15, and 8/15 among 1/5, 4/15, 1/3, 2/5, 4/9, 7/15, 8/15, 3/5, and 2/3 to be the encoding rates r of the mobile LDPC codes do not exist in the standard 16 k codes.

Conversely, the LDPC codes of the encoding rates r=4/15, 7/15, and 8/15 not existing in the standard 16 k codes exist in the mobile LDPC codes.

As described above, the LDPC codes of the encoding rates r=4/15, 7/15, and 8/15 not existing in the standard 16 k codes exist in the mobile LDPC codes. As a result, the BERs with respect to the encoding rates r (=1/5, 4/15, 1/3, 2/5, 4/9, 7/15, 8/15, 3/5, and 2/3) of the mobile LDPC codes are arranged at a relatively equal interval at a small interval where an interval of a direction of $E_s/N_0$ is a predetermined interval or less of about 1 dB, as illustrated in FIG. 49.

Meanwhile, for the standard 16 k codes, because 4/15, 7/15, and 8/15 do not exist in the encoding rates r of the standard 16 k codes, a relatively large gap of about 2 dB is generated in the direction of $E_s/N_0$ between the BER with respect to the encoding rate r of 1/5 (represented as 1/4 in the DVB-T.2) and the BER with respect to the encoding rate r of 1/3 or between the BER with respect to the encoding rate r of 4/9 (represented as 1/2 in the DVB-T.2) and the BER with respect to the encoding rate r of 3/5. Due to the generation of the large gap, the arrangement of the BERs of the standard 16 k codes becomes irregular.

For the broadcaster broadcasting a program by the transmitting device 11, it is easy to select the encoding rate used for the broadcasting, according to a situation of the channel (communication channel 13) or the like, in the mobile LDPC codes in which the BERs are arranged at a relatively equal interval at a small interval of about 1 db or less as compared with the standard 16 k codes in which a portion of the large gap of about 2 db is generated in the arrangement of the BERs and the arrangement of the BERs becomes irregular.

[Interchange Processing of LDPC Code Having Code Length N of 16200 Bits]

In the digital broadcasting exclusively used for the mobile terminal, when the mobile LDPC code described above, that is, the LDPC code having the code length N of 16200 bits is adopted, resistance to the error in the communication channel 13 (FIG. 7) is lowered as compared with the LDPC code of 64800 bits having the long code length N defined in the DVB-T.2.

Therefore, in the digital broadcasting exclusively used for the mobile terminal, it is preferable to take a measure to improve the resistance to the error.

As the measure to improve the resistance to the error, for example, there is interchange processing executed by the demultiplexer 25 (FIG. 9), in addition a method adopting the modulation method such as the 16QAM or the 64QAM in which the number of signal points is relatively small, as described above.

In the interchange processing, as an interchange method of interchanging the sign bits of the LDPC code defined by the standard of the DVB-T.2, there are the first to fourth interchange methods described above or the interchange method defined by the standard of the DVB-T.2 and the like.

However, when the digital broadcasting exclusively used for the mobile terminal is performed by the mobile LDPC code having the code length N of 16200 bits, it is preferable to adopt interchange processing suitable for the mobile LDPC code.

That is, it is preferable to adopt interchange processing of a method of improving the resistance to the error more as the interchange processing adopted with respect to the mobile LDPC code.

Therefore, in the demultiplexer 25 (FIG. 9), the interchange processing can be executed according to the allocation rule, as described in FIG. 27.

Hereinafter, the interchange processing according to the allocation rule will be described. Before describing the interchange processing, the interchange processing using the previously suggested interchange method (hereinafter, also referred to as a current method) will be described.

The interchange processing when the interchange processing using the current method is executed with respect to the LDPC CODE (hereinafter, also referred to as a defined code) defined in the DVB-T 0.2 and the like by the demultiplexer 25 will be described with reference to FIGS. 50 and 51.

Figure 50:
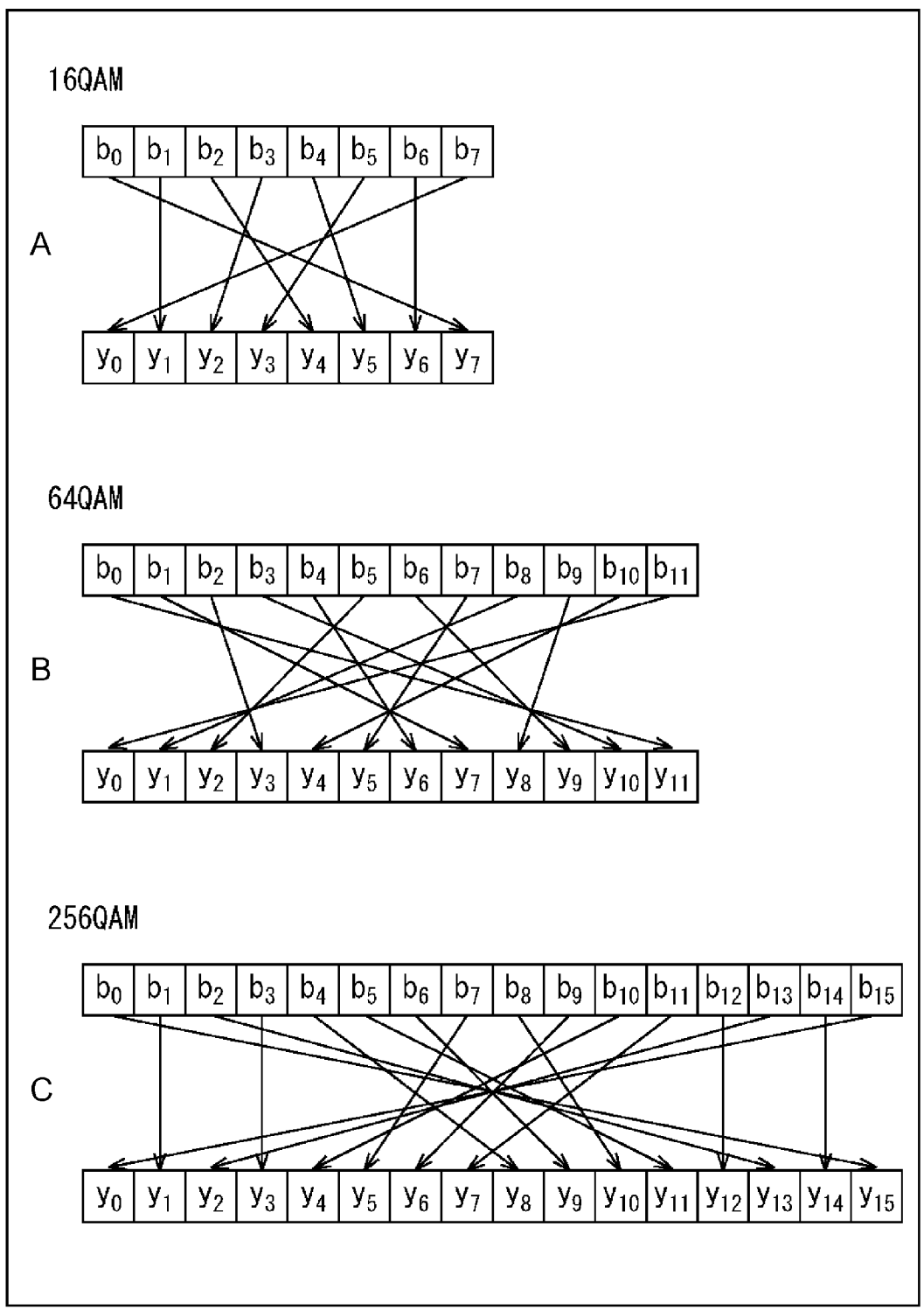
FIG. 50 is a diagram illustrating interchange processing according to a current method.

FIG. 50 illustrates an example of the interchange processing according to the current method, when the LDPC code is an LDPC code having the code length N of 64800 bits and the encoding rate of 3/5, which is defined in the DVB-T.2.

That is, A of FIG. 50 illustrates an example of the interchange processing according to the current method, when the LDPC code is a defined code having the code length N of 64800 bits and the encoding rate of 3/5, the modulation method is the 16QAM, and the multiple b is 2.

When the modulation method is the 16QAM, 4 (=m) bits of the sign bits are mapped as one symbol to any one of 16 signal points determined by the 16QAM.

When the code length N is 64800 bits and the multiple b is 2, the memory 31 (FIGS. 18 and 19) of the demultiplexer 25 has eight columns to store 4×2 (=mb) bits in the row direction and stores 64800/(4×2) bits in the column direction.

In the demultiplexer 25, if the sign bits of the LDPC code are written in the column direction of the memory 31 and writing of the sign bits (one code word) of 64800 bits ends, the sign bits written to the memory 31 are read in a unit of 4×2 (=mb) bits in the row direction and are supplied to the interchanging unit 32 (FIGS. 18 and 19).

The interchanging unit 32 interchanges the sign bits $b_0$ to $b_7$ of the 4×2 (=mb) bits, such that the sign bits $b_0$, $b_1$, $b_2$, $b_3$, $b_4$, $b_5$, $b_6$, and $b_7$ of the 4×2 (=mb) bits read from the memory 31 are allocated to symbol bits $y_0$, $y_1$, $y_2$, $y_3$, $y_4$, $y_5$, $y_6$, and $y_7$ of 4×2 (=mb) bits of two (=b) consecutive symbols, as illustrated by A of FIG. 50.

That is, the interchanging unit 32 performs interchanging to allocate the sign bits $b_0$, $b_1$, $b_2$, $b_3$, $b_4$, $b_5$, $b_6$, and $b_7$ to the symbol bits $y_7$, $y_1$, $y_4$, $y_2$, $y_5$, $y_3$, $y_6$, and $y_0$, respectively.

B of FIG. 50 illustrates an example of the interchange processing according to the current method, when the LDPC code is a defined code having the code length N of 64800 bits and the encoding rate of 3/5, the modulation method is the 64QAM, and the multiple b is 2.

When the modulation method is the 64QAM, 6 (=m) bits of the sign bits are mapped as one symbol to any one of 64 signal points determined by the 64QAM.

When the code length N is 64800 bits and the multiple b is 2, the memory 31 (FIGS. 18 and 19) of the demultiplexer 25 has twelve columns to store 6×2 (=mb) bits in the row direction and stores 64800/(6×2) bits in the column direction.

In the demultiplexer 25, if the sign bits of the LDPC code are written in the column direction of the memory 31 and writing of the sign bits (one code word) of 64800 bits ends, the sign bits written to the memory 31 are read in a unit of 6×2 (=mb) bits in the row direction and are supplied to the interchanging unit 32 (FIGS. 18 and 19).

The interchanging unit 32 interchanges the sign bits $b_0$ to $b_{11}$ of the 6×2 (=mb) bits, such that the sign bits $b_0$, $b_1$, $b_2$, $b_3$, $b_4$, $b_5$, $b_6$, $b_7$, $b_8$, $b_9$, $b_{10}$, and $b_{11}$ of the 6×2 (=mb) bits read from the memory 31 are allocated to symbol bits $y_0$, $y_1$, $y_2$, $y_3$, $y_4$, $y_5$, $y_6$, $y_7$, $y_8$, $y_9$, $y_{10}$, and $y_{11}$ of 6×2 (=mb) bits of two (=b) consecutive symbols, as illustrated by B of FIG. 50.

That is, the interchanging unit 32 performs interchanging to allocate the sign bits $b_0$, $b_1$, $b_2$, $b_3$, $b_4$, $b_5$, $b_6$, $b_7$, $b_8$, $b_9$, $b_{10}$, and $b_{11}$ to the symbol bits $y_{11}$, $y_7$, $y_3$, $y_{10}$, $y_6$, $y_2$, $y_9$, $y_5$, $y_1$, $y_8$, $y_4$, and $y_0$, respectively.

C of FIG. 50 illustrates an example of the interchange processing according to the current method, when the LDPC code is a defined code having the code length N of 64800 bits and the encoding rate of 3/5, the modulation method is the 256QAM, and the multiple b is 2.

When the modulation method is the 256QAM, 8 (=m) bits of the sign bits are mapped as one symbol to any one of 256 signal points determined by the 256QAM.

When the code length N is 64800 bits and the multiple b is 2, the memory 31 (FIGS. 18 and 19) of the demultiplexer 25 has sixteen columns to store 8×2 (=mb) bits in the row direction and stores 64800/(8×2) bits in the column direction.

In the demultiplexer 25, if the sign bits of the LDPC code are written in the column direction of the memory 31 and writing of the sign bits (one code word) of 64800 bits ends, the sign bits written to the memory 31 are read in a unit of 8×2 (=mb) bits in the row direction and are supplied to the interchanging unit 32 (FIGS. 18 and 19).

The interchanging unit 32 interchanges the sign bits $b_0$ to $b_{15}$ of the 8×2 (=mb) bits, such that the sign bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ of the 8×2 (=mb) bits read from the memory 31 are allocated to symbol bits $y_0$, $y_1$, $y_2$, $y_3$, $y_4$, $y_5$, $y_6$, $y_7$, $y_8$, $y_9$, $y_{10}$, $y_{11}$, $y_{12}$, $y_{13}$, $y_{14}$, and $y_{15}$ of 8×2 (=mb) bits of two (=b) consecutive symbols, as illustrated by C of FIG. 50.

That is, the interchanging unit 32 performs interchanging to allocate the sign bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ to the symbol bits $y_{15}$, $y_1$, $y_{13}$, $y_3$, $y_8$, $y_{11}$, $y_9$, $y_5$, $y_{10}$, $y_6$, $y_4$, $y_7$, $y_{12}$, $y_2$, $y_{14}$, and $y_0$, respectively.

Figure 51:
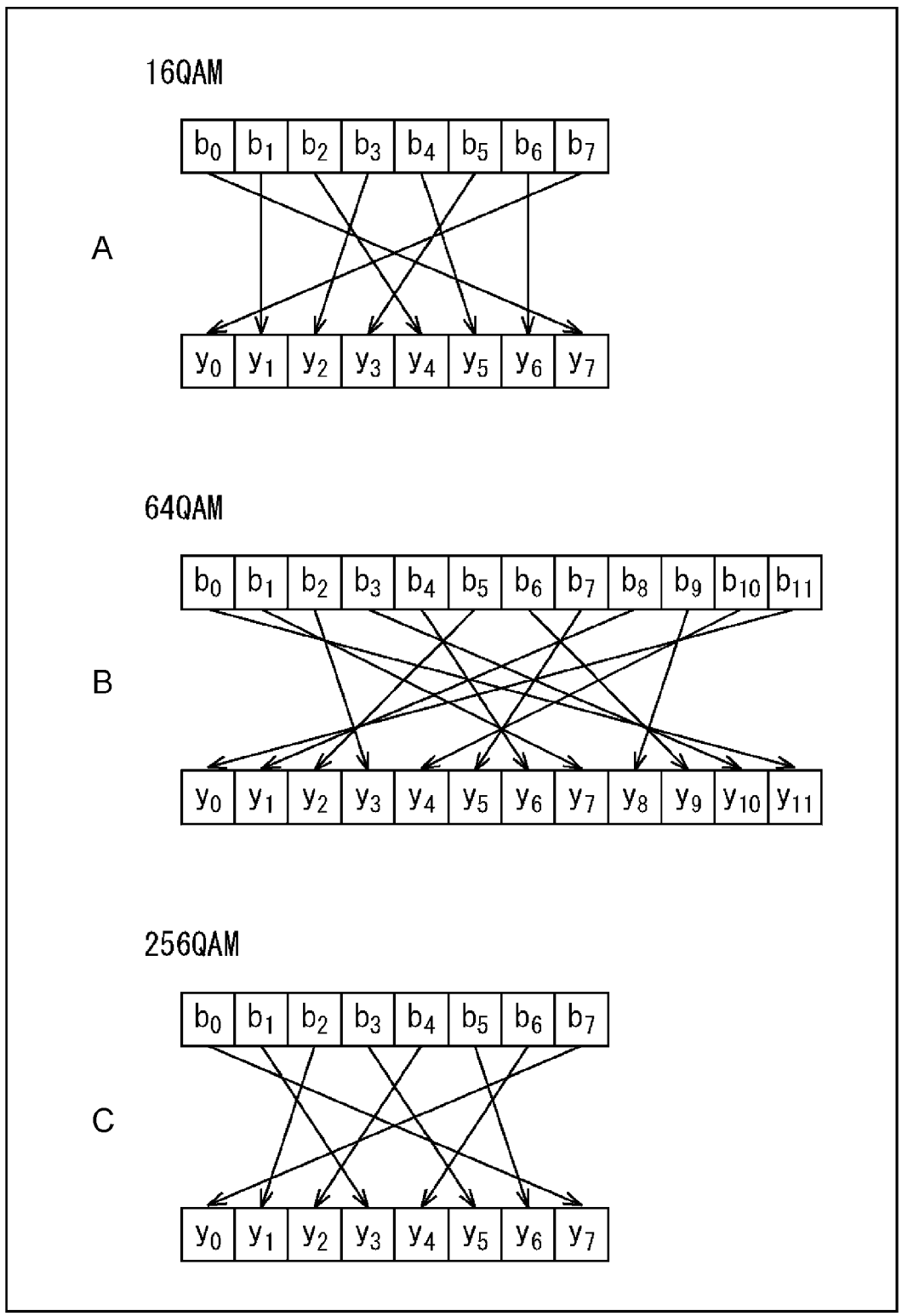
FIG. 51 is a diagram illustrating interchange processing according to a current method.

FIG. 51 illustrates an example of the interchange processing according to the current method, when the LDPC code is a defined code having the code length N of 16200 bits and the encoding rate of 3/5.

That is, A of FIG. 51 illustrates an example of the interchange processing according to the current method, when the LDPC code is an LDPC code having the code length N of 16200 bits and the encoding rate of 3/5, the modulation method is the 16QAM, and the multiple b is 2.

When the modulation method is the 16QAM, 4 (=m) bits of the sign bits are mapped as one symbol to any one of 16 signal points determined by the 16QAM.

When the code length N is 16200 bits and the multiple b is 2, the memory 31 (FIGS. 18 and 19) of the demultiplexer 25 has eight columns to store 4×2 (=mb) bits in the row direction and stores 16200/(4×2) bits in the column direction.

In the demultiplexer 25, if the sign bits of the LDPC code are written in the column direction of the memory 31 and writing of the sign bits (one code word) of 16200 bits ends, the sign bits written to the memory 31 are read in a unit of 4×2 (=mb) bits in the row direction and are supplied to the interchanging unit 32 (FIGS. 18 and 19).

The interchanging unit 32 interchanges the sign bits $b_0$ to $b_7$ of the 4×2 (=mb) bits, such that the sign bits $b_0$, $b_1$, $b_2$, $b_3$, $b_4$, $b_5$, $b_6$, and $b_7$ of the 4×2 (=mb) bits read from the memory 31 are allocated to symbol bits $y_0$, $y_1$, $y_2$, $y_3$, $y_4$, $y_5$, $y_6$, and $y_7$ of 4×2 (=mb) bits of two (=b) consecutive symbols, as illustrated by A of FIG. 51.

That is, the interchanging unit 32 performs interchanging to allocate the sign bits $b_0$ to $b_7$ to the symbol bits $y_0$ to $y_7$, similar to the case of A of FIG. 50 described above.

B of FIG. 51 illustrates an example of the interchange processing according to the current method, when the LDPC code is a defined code having the code length N of 16200 bits and the encoding rate of 3/5, the modulation method is the 64QAM, and the multiple b is 2.

When the modulation method is the 64QAM, 6 (=m) bits of the sign bits are mapped as one symbol to any one of 64 signal points determined by the 64QAM.

When the code length N is 16200 bits and the multiple b is 2, the memory 31 (FIGS. 18 and 19) of the demultiplexer 25 has twelve columns to store 6×2 (=mb) bits in the row direction and stores 16200/(6×2) bits in the column direction.

In the demultiplexer 25, if the sign bits of the LDPC code are written in the column direction of the memory 31 and writing of the sign bits (one code word) of 16200 bits ends, the sign bits written to the memory 31 are read in a unit of 6×2 (=mb) bits in the row direction and are supplied to the interchanging unit 32 (FIGS. 18 and 19).

The interchanging unit 32 interchanges the sign bits $b_0$ to $b_{11}$ of the 6×2 (=mb) bits, such that the sign bits $b_0$, $b_1$, $b_2$, $b_3$, $b_4$, $b_5$, $b_6$, $b_7$, $b_8$, $b_9$, $b_{10}$, and $b_{11}$ of the 6×2 (=mb) bits read from the memory 31 are allocated to symbol bits $y_0$, $y_1$, $y_2$, $y_3$, $y_4$, $y_5$, $y_6$, $y_7$, $y_8$, $y_9$, $y_{10}$, and $y_{11}$ of 6×2 (=mb) bits of two (=b) consecutive symbols, as illustrated by B of FIG. 51.

That is, the interchanging unit 32 performs interchanging to allocate the sign bits $b_0$ to $b_{11}$ to the symbol bits $y_0$ to $y_{11}$, similar to the case of B of FIG. 50 described above.

C of FIG. 51 illustrates an example of the interchange processing according to the current method, when the LDPC code is a defined code having the code length N of 16200 bits and the encoding rate of 3/5, the modulation method is the 256QAM, and the multiple b is 1.

When the modulation method is the 256QAM, 8 (=m) bits of the sign bits are mapped as one symbol to any one of 256 signal points determined by the 256QAM.

When the code length N is 16200 bits and the multiple b is 1, the memory 31 (FIGS. 18 and 19) of the demultiplexer 25 has eight columns to store 8×1 (=mb) bits in the row direction and stores 16200/(8×1) bits in the column direction.

In the demultiplexer 25, if the sign bits of the LDPC code are written in the column direction of the memory 31 and writing of the sign bits (one code word) of 16200 bits ends, the sign bits written to the memory 31 are read in a unit of 8×1 (=mb) bits in the row direction and are supplied to the interchanging unit 32 (FIGS. 18 and 19).

The interchanging unit 32 interchanges the sign bits $b_0$ to $b_7$ of the 8×1 (=mb) bits, such that the sign bits $b_0$, $b_1$, $b_2$, $b_3$, $b_4$, $b_5$, $b_6$, and $b_7$ of the 8×1 (=mb) bits read from the memory 31 are allocated to symbol bits $y_0$, $y_1$, $y_2$, $y_3$, $y_4$, $y_5$, $y_6$, and $y_7$ of 8×1 (=mb) bits of one (=b) symbol, as illustrated by C of FIG. 51.

That is, the interchanging unit 32 performs interchanging to allocate the sign bits $b_0$, $b_1$, $b_2$, $b_3$, $b_4$, $b_5$, $b_6$, and $b_7$ to the symbol bits $y_7$, $y_3$, $y_1$, $y_5$, $y_2$, $y_6$, $y_4$, and $y_0$, respectively.

Next, the interchange processing (hereinafter, also referred to as interchange processing in a new interchange method) according to the allocation rule will be described.

In the digital broadcasting exclusively used for the mobile terminal, the modulation method such as the QPSK, the 16QAM, the 64QAM, or the 256QAM having the small signal points is adopted. Here, the new interchange method will be described with respect to each of when the modulation method is the 16QAM, when the modulation method is 64QAM, and when the modulation method is 256QAM.

Here, when the modulation method is the QPSK, with respect to the symbol bits $y_0$ and $y_1$ of the two bits representing the four symbols (signal points) of the QPSK, there is not the superiority and inferiority of the strength for the error described in FIGS. 14 to 17, it is not necessary to execute the interchange processing (resistance to the error does not change, even though the interchange processing is executed).

Figure 52:
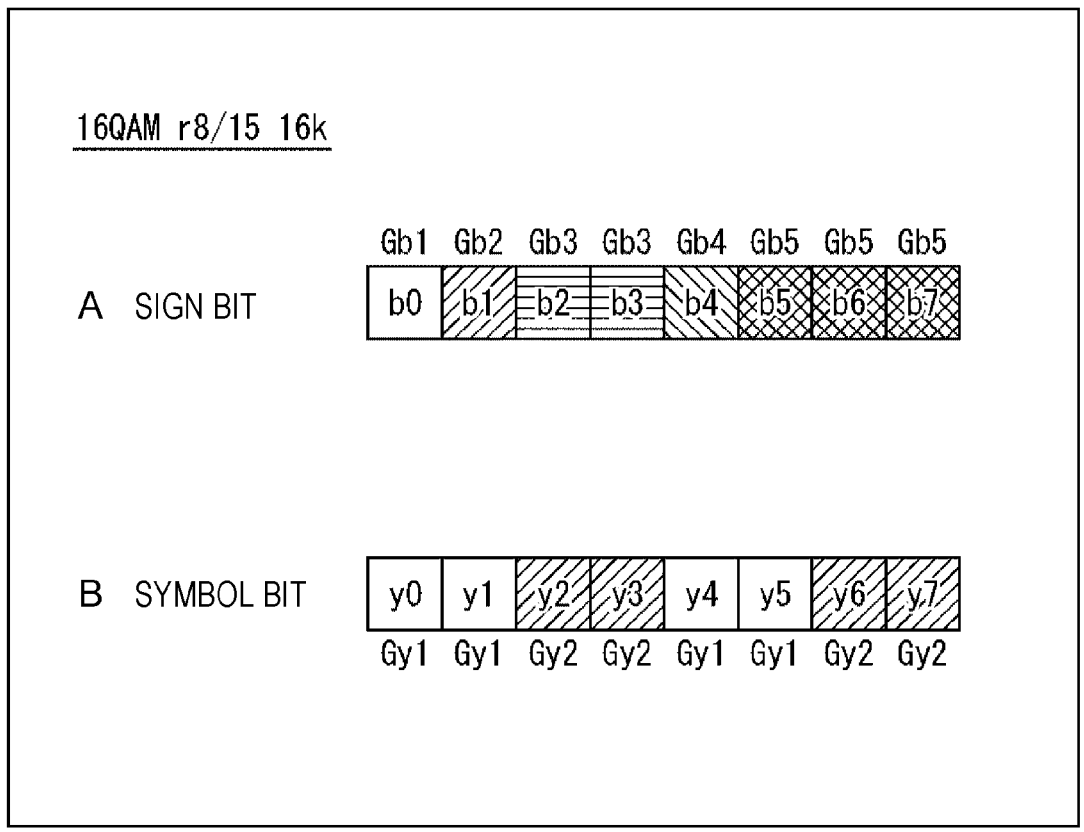
FIG. 52 is a diagram illustrating a sign bit group and a symbol bit group when an LDPC code having a code length of 16200 and an encoding rate of 8/15 is modulated by 16QAM and a multiple b is 2.
Figure 53:
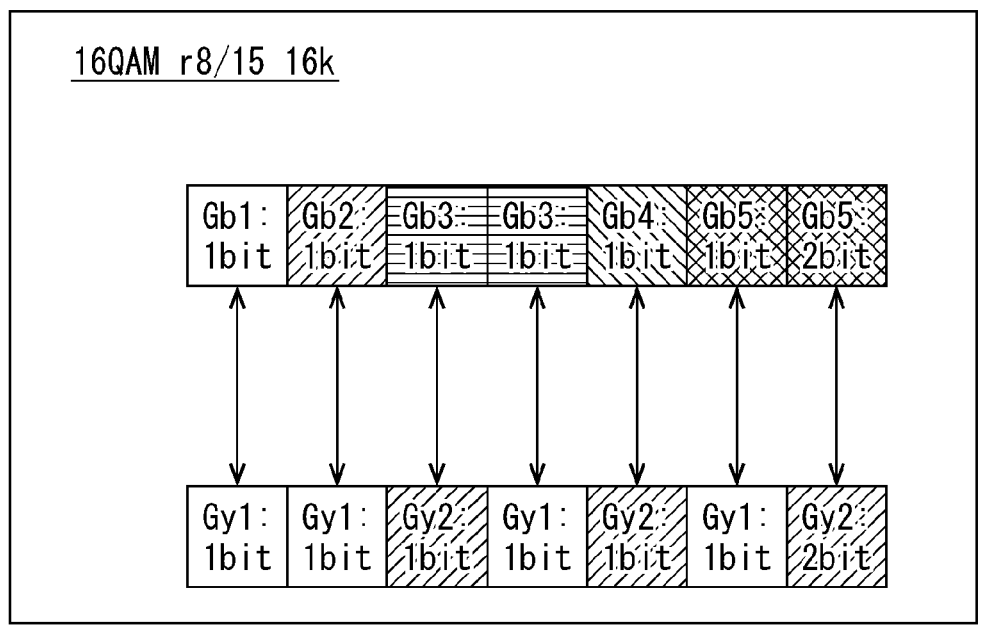
FIG. 53 is a diagram illustrating an allocation rule when an LDPC code having a code length of 16200 and an encoding rate of 8/15 is modulated by 16QAM and a multiple b is 2.

FIGS. 52 to 54 are diagrams illustrating the new interchange methods.

In the new interchange methods, the interchanging unit 32 of the demultiplexer 25 performs interchanging of the sign bits of the mb bits according to the previously determined allocation rule.

The allocation rule is a rule to allocate the sign bits of the LDPC code to the symbol bits. In the allocation rule, a group set to be a combination of a sign bit group of the sign bits and a symbol bit group of symbol bits to allocate the sign bits of the sign bit group, the sign bit group of the group set, the sign bit of each symbol bit group, and bit numbers (hereinafter, also referred to as group bit numbers) of the sign bits are defined.

Here, an error probability difference exists in the sign bits and an error probability difference exists in the symbol bits, as described above. The sign bit group is a group to separate the sign bits according to the error probability and the symbol bit group is a group to separate the symbol bits according to the error probability.

FIG. 52 illustrates the sign bit group and the symbol bit group when the LDPC code is a mobile LDPC code having the code length N of 16200 bits and the encoding rate of 8/15, the modulation method is the 16QAM (therefore, m=4), and the multiple b is 2.

In this case, the sign bits of the 4×2 (=mb) bits that are read from the memory 31 can be separated into 5 sign bit groups Gb1, Gb2, Gb3, Gb4, and Gb5, according to the differences of the error probabilities, as illustrated by A of FIG. 52.

Here, a sign bit group Gb#i is a group in which the error probability of the sign bits belonging to the sign bit group Gb#i is high (small), as a suffix thereof #i is small.

Hereinafter, a (#i+1)-th bit from a most significant bit of the sign bits of the mb bits read from the memory 31 in the row direction is represented as a bit b#i and a (#i+1)-th bit from a most significant bit of symbol bits of mb bits of b consecutive symbols is represented as a bit y#i.

In A of FIG. 52, a sign bit b0 belongs to the sign bit group Gb1, a sign bit b1 belongs to the sign bit group Gb2, sign bits b2 and b3 belong to the sign bit group Gb3, a sign bit b4 belongs to the sign bit group Gb4, and sign bits b5, b6, and b7 belong to the sign bit group Gb5, respectively.

When the modulation method is the 16QAM and the multiple b is 2, the symbol bits of the 4×2 (mb) bits can be separated into two symbol bit groups Gy1 and Gy2, according to the differences of the error probabilities, as illustrated by B of FIG. 52.

Here, the symbol bit group Gy#i is a group in which the error probability of the symbol bits belonging to the symbol bit group Gy#i is high, as a suffix #i thereof is small, similar to the sign bit group.

In B of FIG. 52, symbol bits y0, y1, y4, and y5 belong to the symbol bit group Gy1 and symbol bits y2, y3, y6, and y7 belong to the symbol bit group Gy2, respectively.

FIG. 53 illustrates an allocation rule when the LDPC code is a mobile LDPC code having the code length N of 16200 bits and the encoding rate of 8/15, the modulation method is the 16QAM, and the multiple b is 2.

In the allocation rule of FIG. 53, a combination of the sign bit group Gb1 and the symbol bit group Gy1 is defined as one group set. In addition, a group bit number of the group set is defined to one bit.

Hereinafter, the group set and the group bit number thereof are collectively referred to as group set information. For example, a group set of the sign bit group Gb1 and the symbol bit group Gy1, and one bit to be the group bit number of the group set are described as group set information (Gb1, Gy1, 1).

In the allocation rule of FIG. 53, in addition to the group set information (Gb1, Gy1, 1), the group set information (Gb2, Gy1, 1), (Gb3, Gy2, 1), (Gb3, Gy1, 1), (Gb4, Gy2, 1), (Gb5, Gy1, 1), and (Gb5, Gy2, 2) are defined.

For example, the group set information (Gb1, Gy1, 1) means that one bit of the sign bits belonging to the sign bit group Gb1 is allocated to one bit of the symbol bits belonging to the symbol bit group Gy1.

Therefore, in the allocation rule of FIG. 53, allocation of one bit of the sign bits of the sign bit group Gb1 having the best error probability to one bit of the symbol bits of the symbol bit group Gy1 having the best error probability by the group set information (Gb1, Gy1, 1), allocation of one bit of the sign bits of the sign bit group Gb2 having the second best error probability to one bit of the symbol bits of the symbol bit group Gy1 having the best error probability by the group set information (Gb2, Gy1, 1), allocation of one bit of the sign bits of the sign bit group Gb3 having the third best error probability to one bit of the symbol bits of the symbol bit group Gy2 having the second best error probability by the group set information (Gb3, Gy2, 1), allocation of one bit of the sign bits of the sign bit group Gb3 having the third best error probability to one bit of the symbol bits of the symbol bit group Gy1 having the best error probability by the group set information (Gb3, Gy1, 1), allocation of one bit of the sign bits of the sign bit group Gb4 having the fourth best error probability to one bit of the symbol bits of the symbol bit group Gy2 having the second best error probability by the group set information (Gb4, Gy2, 1), allocation of one bit of the sign bits of the sign bit group Gb5 having the fifth best error probability to one bit of the symbol bits of the symbol bit group Gy1 having the best error probability by the group set information (Gb5, Gy1, 1), and allocation of two bits of the sign bits of the sign bit group Gb5 having the fifth best error probability to two bits of the symbol bits of the symbol bit group Gy2 having the second best error probability by the group set information (Gb5, Gy2, 2) are defined.

As described above, the sign bit group is a group to separate the sign bits according to the error probabilities and the symbol bit group is a group to group the symbol bits according to the error probabilities. Therefore, it can be said that the allocation rule defines combinations of the error probabilities of the sign bits and the error probabilities of the symbol bits to allocate the sign bits.

As such, the allocation rule that defines the combinations of the error probabilities of the sign bits and the error probabilities of the symbol bits to allocate the sign bits is determined to improve resistance to the error (resistance to the noise), by the simulation measuring a BER.

Even when allocation destinations of sign bits of a certain sign bit group are changed in the bits of the same symbol bit group, the resistance to the error is not (mostly) influenced.

Therefore, in order to improve the resistance to the error, group set information to minimize a Bit Error Rate (BER), that is, a combination (group set) of a sign bit group of sign bits and a symbol bit group of symbol bits to allocate the sign bits of the sign bit group and bit numbers (group bit numbers) of the sign bits and the symbol bits of the sign bit group and the symbol bit group of the group set may be defined as an allocation rule and interchanging of the sign bits may be performed such that the sign bits are allocated to the symbol bits, according to the allocation rule.

However, it is necessary to previously determine a specific allocation method of allocating a certain sign bit to a certain symbol bit according to the allocation rule, between the transmitting device 11 and the receiving device 12 (FIG. 7).

FIG. 54 illustrates an example of interchanging of the sign bits according to the allocation rule of FIG. 53.

That is, A of FIG. 54 illustrates a first example of interchanging of the sign bits according to the allocation rule of FIG. 53, when the LDPC code is a mobile LDPC code having the code length N of 16200 bits and the encoding rate of 8/15, the modulation method is the 16QAM, and the multiple b is 2.

When the LDPC code is the mobile LDPC code having the code length N of 16200 bits and the encoding rate of 8/15, the modulation method is the 16QAM, and the multiple b is 2, in the demultiplexer 25, the sign bits written to the memory 31 in which a column direction×a row direction are (16200/(4×2))×(4×2) bits are read in a unit of 4×2 (=mb) bits in the row direction and are supplied to the interchanging unit 32 (FIGS. 18 and 19).

The interchanging unit 32 interchanges the sign bits b0 to b7 of the 4×2 (=mb) bits, such that the sign bits b0 to b7 of the 4×2 (=mb) bits read from the memory 31 are allocated to the symbol bits y0 to y7 of the 4×2 (=mb) bits of the 2 (=b) symbols, as illustrated in A of FIG. 54, according to the allocation rule of FIG. 53.

That is, the interchanging unit 32 performs interchanging to allocate the sign bits b0, b1, b2, b3, b4, b5, b6, and b7 to the symbol bits y0, y4, y3, y1, y2, y5, y6, and y7, respectively.

B of FIG. 54 illustrates a second example of interchanging of the sign bits according to the allocation rule of FIG. 53, when the LDPC code is a mobile LDPC code having the code length N of 16200 bits and the encoding rate of 8/15, the modulation method is the 16QAM, and the multiple b is 2.

According to B of FIG. 54, the interchanging unit 32 performs interchanging to allocate the sign bits b0, b1, b2, b3, b4, b5, b6, and b7 to the symbol bits y0, y1, y3, y4, y2, y5, y7, and y6, respectively, with respect to the sign bits b0 to b7 of the 4×2 (=mb) bits read from the memory 31, according to the allocation rule of FIG. 53, respectively.

Here, both the allocation methods of allocating the sign bit b#i to the symbol bit y#i, which are illustrated in A of FIG. 54 and B of FIG. 54, follow the allocation rule of FIG. 53 (observe the allocation rule).

FIG. 55 illustrates the sign bit group and the symbol bit group when the LDPC code is a mobile LDPC code having the code length N of 16200 bits and the encoding rate of 7/15, the modulation method is the 64QAM, and the multiple b is 2.

In this case, the sign bits of the 6×2 (=mb) bits that are read from the memory 31 can be separated into 7 sign bit groups Gb1, Gb2, Gb3, Gb4, Gb5, Gb6, and Gb7, according to the differences of the error probabilities, as illustrated by A of FIG. 55.

In A of FIG. 55, a sign bit b0 belongs to the sign bit group Gb1, a sign bit b1 belongs to the sign bit group Gb2, a sign bit b2 belongs to the sign bit group Gb3, a sign bit b3 belongs to the sign bit group Gb4, a sign bit b4 belongs to the sign bit group Gb5, a sign bit b5 belongs to the sign bit group Gb6, and sign bit b6 to b11 belong to the sign bit group Gb7.

When the modulation method is the 64QAM and the multiple b is 2, the symbol bits of the 6×2 (mb) bits can be separated into three symbol bit groups Gy1, Gy2, and Gy3, according to the differences of the error probabilities, as illustrated by B of FIG. 55.

In B of FIG. 55, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3, respectively.

Figure 56:
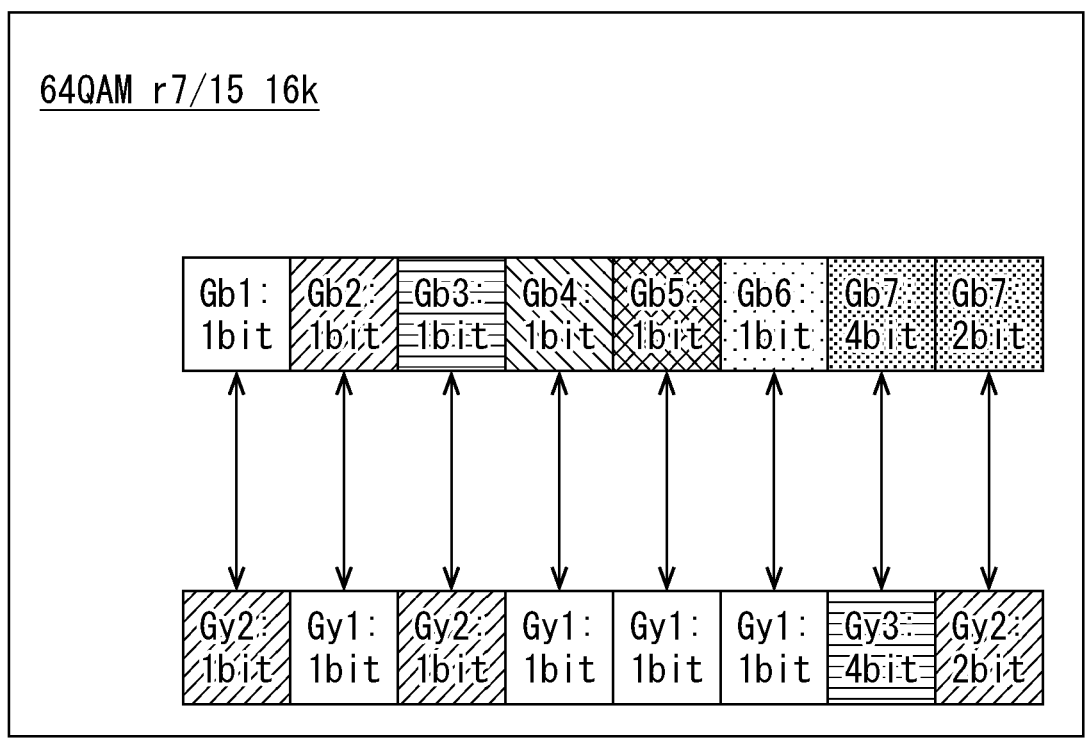
FIG. 56 is a diagram illustrating an allocation rule when an LDPC code having a code length of 16200 and an encoding rate of 7/15 is modulated by 64QAM and a multiple b is 2.

FIG. 56 illustrates an allocation rule when the LDPC code is a mobile LDPC code having the code length N of 16200 bits and the encoding rate of 7/15, the modulation method is the 64QAM, and the multiple b is 2.

In the allocation rule of FIG. 56, group set information (Gb1, Gy2, 1), (Gb2, Gy1, 1), (Gb3, Gy2, 1), (Gb4, Gy1, 1), (Gb5, Gy1, 1), (Gb6, Gy1, 1), (Gb7, Gy3, 4), and (Gb7, Gy2, 2) are defined.

That is, in the allocation rule of FIG. 56, allocation of one bit of the sign bits of the sign bit group Gb1 having the best error probability to one bit of the symbol bits of the symbol bit group Gy2 having the second best error probability by the group set information (Gb1, Gy2, 1), allocation of one bit of the sign bits of the sign bit group Gb2 having the second best error probability to one bit of the symbol bits of the symbol bit group Gy1 having the best error probability by the group set information (Gb2, Gy1, 1), allocation of one bit of the sign bits of the sign bit group Gb3 having the third best error probability to one bit of the symbol bits of the symbol bit group Gy2 having the second best error probability by the group set information (Gb3, Gy2, 1), allocation of one bit of the sign bits of the sign bit group Gb4 having the fourth best error probability to one bit of the symbol bits of the symbol bit group Gy1 having the best error probability by the group set information (Gb4, Gy1, 1), allocation of one bit of the sign bits of the sign bit group Gb5 having the fifth best error probability to one bit of the symbol bits of the symbol bit group Gy1 having the best error probability by the group set information (Gb5, Gy1, 1), allocation of one bit of the sign bits of the sign bit group Gb6 having the sixth best error probability to one bit of the symbol bits of the symbol bit group Gy1 having the best error probability by the group set information (Gb6, Gy1, 1), allocation of four bits of the sign bits of the sign bit group Gb7 having the seventh best error probability to four bits of the symbol bits of the symbol bit group Gy3 having the third best error probability by the group set information (Gb7, Gy3, 4), and allocation of two bits of the sign bits of the sign bit group Gb7 having the seventh best error probability to two bits of the symbol bits of the symbol bit group Gy2 having the second best error probability by the group set information (Gb7, Gy2, 2) are defined.

Figure 57:
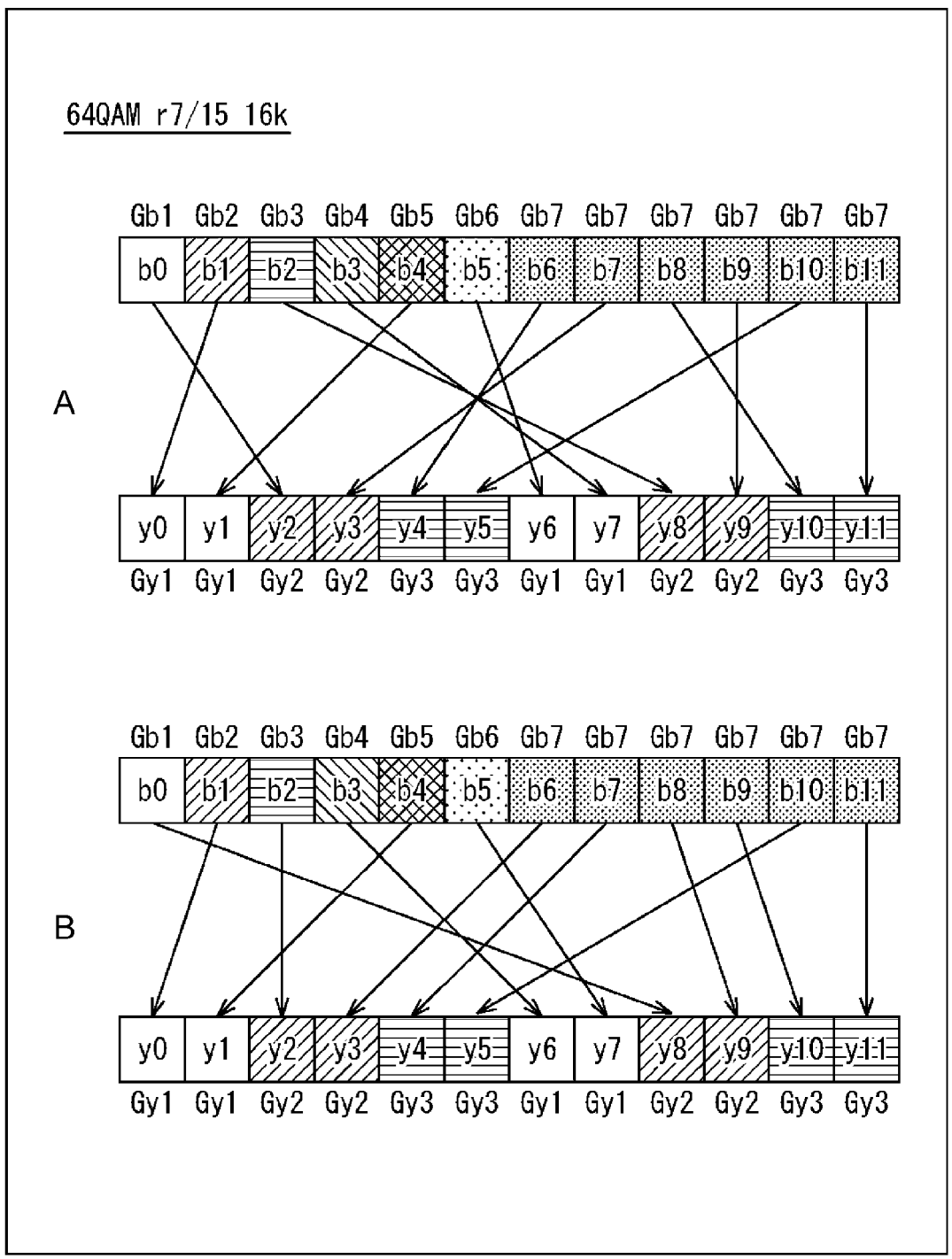
FIG. 57 is a diagram illustrating interchanging of sign bits according to an allocation rule, when an LDPC code having a code length of 16200 and an encoding rate of 7/15 is modulated by 64QAM and a multiple b is 2.

FIG. 57 illustrates an example of interchanging of the sign bits according to the allocation rule of FIG. 56.

That is, A of FIG. 57 illustrates a first example of interchanging of the sign bits according to the allocation rule of FIG. 56, when the LDPC code is a mobile LDPC code having the code length N of 16200 bits and the encoding rate of 7/15, the modulation method is the 64QAM, and the multiple b is 2.

When the LDPC code is the mobile LDPC code having the code length N of 16200 bits and the encoding rate of 7/15, the modulation method is the 64QAM, and the multiple b is 2, in the demultiplexer 25, the sign bits written to the memory 31 in which a column direction×a row direction are (16200/(6×2))×(6×2) bits are read in a unit of 6×2 (=mb) bits in the row direction and are supplied to the interchanging unit 32 (FIGS. 18 and 19).

The interchanging unit 32 interchanges the sign bits b0 to b11 of the 6×2 (=mb) bits, such that the sign bits b0 to b11 of the 6×2 (=mb) bits read from the memory 31 are allocated to the symbol bits y0 to y11 of the 6×2 (=mb) bits of the 2 (=b) symbols, as illustrated by A of FIG. 57, according to the allocation rule of FIG. 56.

That is, the interchanging unit 32 performs interchanging to allocate the sign bits b0, b1, b2, b3, b4, b5, b6, b7, b8, b9, b10, and b11 to the symbol bits y2, y0, y8, y7, y1, y6, y4, y3, y10, y9, y5, and y11, respectively.

B of FIG. 57 illustrates a second example of interchanging of the sign bits according to the allocation rule of FIG. 56, when the LDPC code is a mobile LDPC code having the code length N of 16200 bits and the encoding rate of 7/15, the modulation method is the 64QAM, and the multiple b is 2.

According to B of FIG. 57, the interchanging unit 32 performs interchanging to allocate the sign bits b0, b1, b2, b3, b4, b5, b6, b7, b8, b9, b10, and b11 to the symbol bits y8, y0, y2, y6, y1, y7, y3, y4, y9, y10, y5, and y11, respectively, with respect to the sign bits b0 to b11 of the 6×2 (=mb) bits read from the memory 31, respectively, according to the allocation rule of FIG. 56.

FIG. 58 illustrates the sign bit group and the symbol bit group when the LDPC code is a mobile LDPC code having the code length N of 16200 bits and the encoding rate of 8/15, the modulation method is the 64QAM, and the multiple b is 2.

In this case, the sign bits of the 6×2 (=mb) bits that are read from the memory 31 can be separated into 6 sign bit groups Gb1, Gb2, Gb3, Gb4, Gb5, and Gb6, according to the differences of the error probabilities, as illustrated by A of FIG. 58.

In A of FIG. 58, a sign bit b0 belongs to the sign bit group Gb1, a sign bit b1 belongs to the sign bit group Gb2, a sign bit b2 belongs to the sign bit group Gb3, sign bits b3 to b5 belong to the sign bit group Gb4, a sign bit b6 belongs to the sign bit group Gb5, and sign bits b7 to b11 belong to the sign bit group Gb6.

When the modulation method is the 64QAM and the multiple b is 2, the symbol bits of the 6×2 (mb) bits can be separated into three symbol bit groups Gy1, Gy2, and Gy3, according to the differences of the error probabilities, as illustrated by B of FIG. 58.

In B of FIG. 58, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 59:
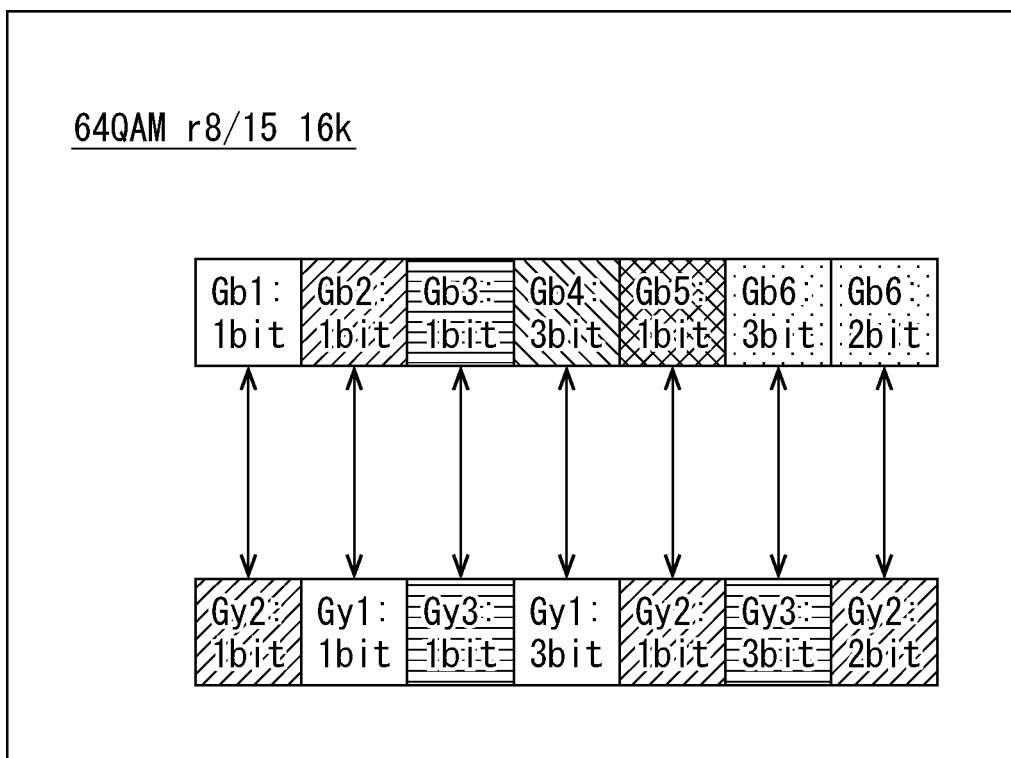
FIG. 59 is a diagram illustrating an allocation rule when an LDPC code having a code length of 16200 and an encoding rate of 8/15 is modulated by 64QAM and a multiple b is 2.

FIG. 59 illustrates an allocation rule when the LDPC code is a mobile LDPC code having the code length N of 16200 bits and the encoding rate of 8/15, the modulation method is the 64QAM, and the multiple b is 2.

In the allocation rule of FIG. 59, group set information (Gb1, Gy2, 1), (Gb2, Gy1, 1), (Gb3, Gy3, 1), (Gb4, Gy1, 3), (Gb5, Gy2, 1), (Gb6, Gy3, 3), and (Gb6, Gy2, 2) are defined.

That is, in the allocation rule of FIG. 59, allocation of one bit of the sign bits of the sign bit group Gb1 having the best error probability to one bit of the symbol bits of the symbol bit group Gy2 having the second best error probability by the group set information (Gb1, Gy2, 1), allocation of one bit of the sign bits of the sign bit group Gb2 having the second best error probability to one bit of the symbol bits of the symbol bit group Gy1 having the best error probability by the group set information (Gb2, Gy1, 1), allocation of one bit of the sign bits of the sign bit group Gb3 having the third best error probability to one bit of the symbol bits of the symbol bit group Gy3 having the third best error probability by the group set information (Gb3, Gy3, 1), allocation of three bits of the sign bits of the sign bit group Gb4 having the fourth best error probability to three bits of the symbol bits of the symbol bit group Gy1 having the best error probability by the group set information (Gb4, Gy1, 3), allocation of one bit of the sign bits of the sign bit group Gb5 having the fifth best error probability to one bit of the symbol bits of the symbol bit group Gy2 having the second best error probability by the group set information (Gb5, Gy2, 1), allocation of three bits of the sign bits of the sign bit group Gb6 having the sixth best error probability to three bits of the symbol bits of the symbol bit group Gy3 having the third best error probability by the group set information (Gb6, Gy3, 3), and allocation of two bits of the sign bits of the sign bit group Gb6 having the sixth best error probability to two bits of the symbol bits of the symbol bit group Gy2 having the second best error probability by the group set information (Gb6, Gy2, 2) are defined.

Figure 60:
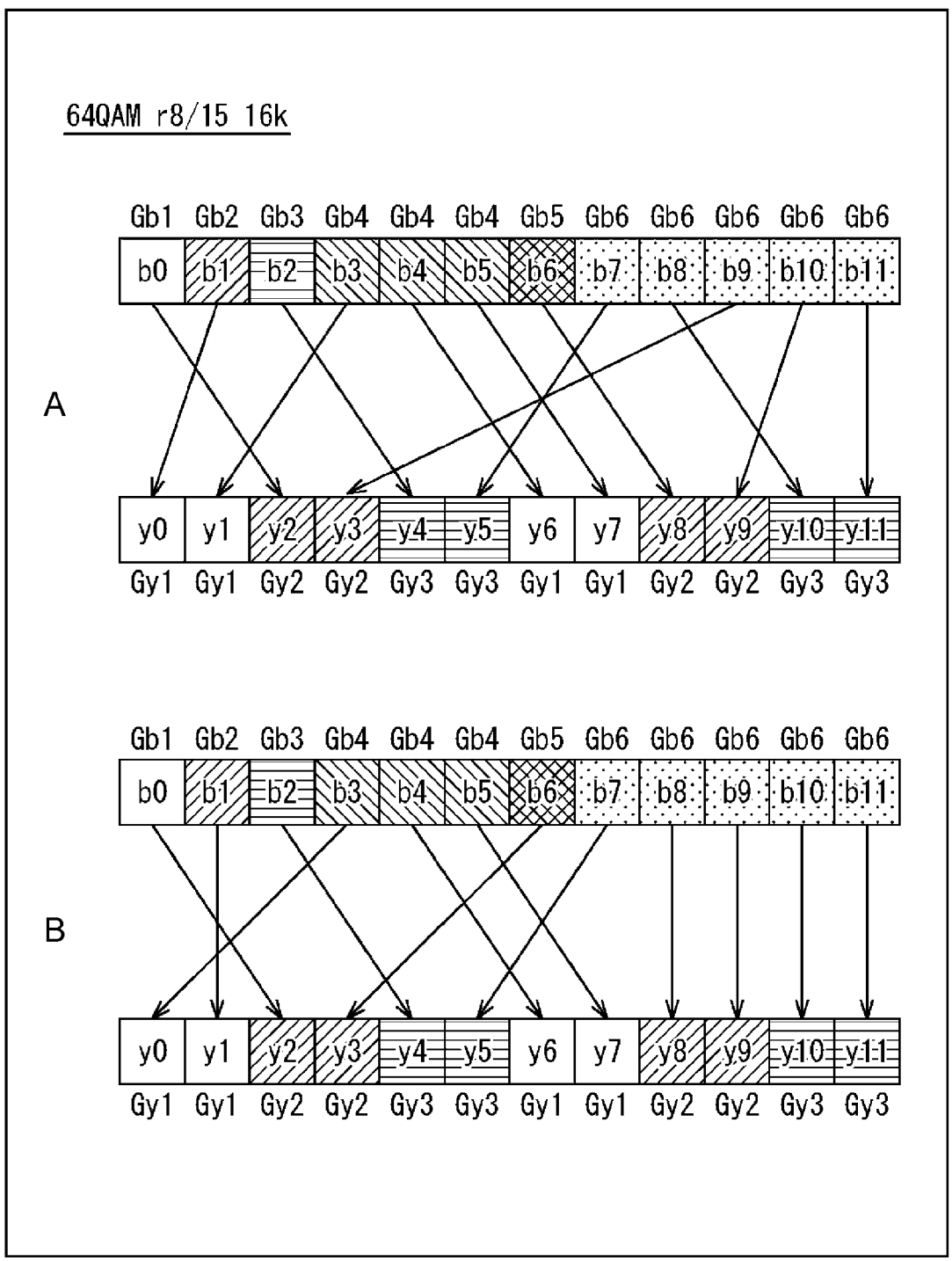
FIG. 60 is a diagram illustrating interchanging of sign bits according to an allocation rule, when an LDPC code having a code length of 16200 and an encoding rate of 8/15 is modulated by 64QAM and a multiple b is 2.

FIG. 60 illustrates an example of interchanging of the sign bits according to the allocation rule of FIG. 59.

That is, A of FIG. 60 illustrates a first example of interchanging of the sign bits according to the allocation rule of FIG. 59, when the LDPC code is a mobile LDPC code having the code length N of 16200 bits and the encoding rate of 8/15, the modulation method is the 64QAM, and the multiple b is 2.

When the LDPC code is the mobile LDPC code having the code length N of 16200 bits and the encoding rate of 8/15, the modulation method is the 64QAM, and the multiple b is 2, in the demultiplexer 25, the sign bits written to the memory 31 in which a column direction×a row direction are (16200/(6×2))× (6×2) bits are read in a unit of 6×2 (=mb) bits in the row direction and are supplied to the interchanging unit 32 (FIGS. 18 and 19).

The interchanging unit 32 interchanges the sign bits b0 to b11 of the 6×2 (=mb) bits, such that the sign bits b0 to b11 of the 6×2 (=mb) bits read from the memory 31 are allocated to the symbol bits y0 to y11 of the 6×2 (=mb) bits of the 2 (=b) symbols, as illustrated by A of FIG. 60, according to the allocation rule of FIG. 59.

That is, the interchanging unit 32 performs interchanging to allocate the sign bits b0, b1, b2, b3, b4, b5, b6, b7, b8, b9, b10, and b11 to the symbol bits y2, y0, y4, y1, y6, y7, y8, y5, y10, y3, y9, and y11, respectively.

B of FIG. 60 illustrates a second example of interchanging of the sign bits according to the allocation rule of FIG. 59, when the LDPC code is a mobile LDPC code having the code length N of 16200 bits and the encoding rate of 8/15, the modulation method is the 64QAM, and the multiple b is 2.

According to B of FIG. 60, the interchanging unit 32 performs interchanging to allocate the sign bits b0, b1, b2, b3, b4, b5, b6, b7, b8, b9, b10, and b11 to the symbol bits y2, y1, y4, y0, y6, y7, y3, y5, y8, y9, y10, and y11, respectively, with respect to the sign bits b0 to b11 of the 6×2 (=mb) bits read from the memory 31, according to the allocation rule of FIG. 59.

FIG. 61 illustrates the sign bit group and the symbol bit group when the LDPC code is a mobile LDPC code having the code length N of 16200 bits and the encoding rate of 7/15, the modulation method is the 256QAM, and the multiple b is 1.

In this case, the sign bits of the 8×1 (=mb) bits that are read from the memory 31 can be separated into 5 sign bit groups Gb1, Gb2, Gb3, Gb4, and Gb5, according to the differences of the error probabilities, as illustrated by A of FIG. 61.

In A of FIG. 61, a sign bit b0 belongs to the sign bit group Gb1, a sign bit b1 belongs to the sign bit group Gb2, a sign bit b2 belongs to the sign bit group Gb3, a sign bit b3 belongs to the sign bit group Gb4, and sign bits b4 to b7 belong to the sign bit group Gb5.

When the modulation method is the 256QAM and the multiple b is 1, the symbol bits of the 8×1 (mb) bits can be separated into four symbol bit groups Gy1, Gy2, Gy3, and Gy4, according to the differences of the error probabilities, as illustrated by B of FIG. 61.

In B of FIG. 61, symbol bits y0 and y1 belong to the symbol bit group Gy1, symbol bits y2 and y3 belong to the symbol bit group Gy2, symbol bits y4 and y5 belong to the symbol bit group Gy3, and symbol bits y6 and y7 belong to the symbol bit group Gy4.

Figure 62:
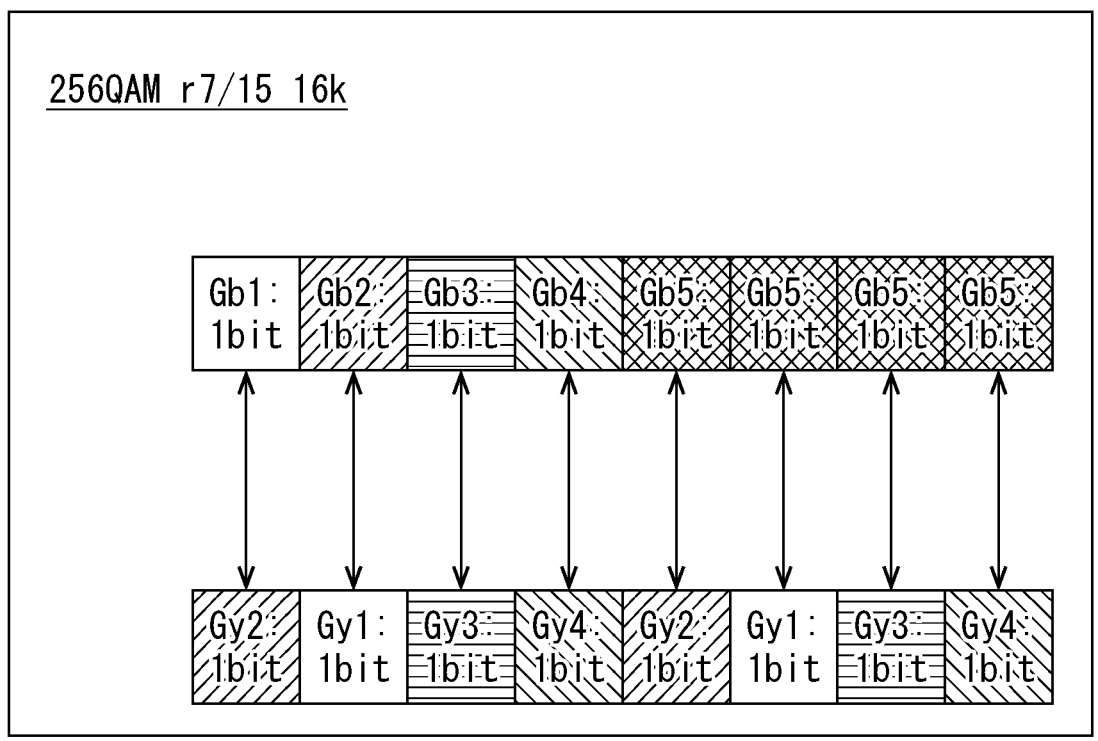
FIG. 62 is a diagram illustrating an allocation rule when an LDPC code having a code length of 16200 and an encoding rate of 7/15 is modulated by 256QAM and a multiple b is 1.

FIG. 62 illustrates an allocation rule when the LDPC code is a mobile LDPC code having the code length N of 16200 bits and the encoding rate of 7/15, the modulation method is the 256QAM, and the multiple b is 1.

In the allocation rule of FIG. 62, group set information (Gb1, Gy2, 1), (Gb2, Gy1, 1), (Gb3, Gy3, 1), (Gb4, Gy4, 1), (Gb5, Gy2, 1), (Gb5, Gy1, 1), (Gb5, Gy3, 1), and (Gb5, Gy4, 1) are defined.

That is, in the allocation rule of FIG. 62, allocation of one bit of the sign bits of the sign bit group Gb1 having the best error probability to one bit of the symbol bits of the symbol bit group Gy2 having the second best error probability by the group set information (Gb1, Gy2, 1), allocation of one bit of the sign bits of the sign bit group Gb2 having the second best error probability to one bit of the symbol bits of the symbol bit group Gy1 having the best error probability by the group set information (Gb2, Gy1, 1), allocation of one bit of the sign bits of the sign bit group Gb3 having the third best error probability to one bit of the symbol bits of the symbol bit group Gy3 having the third best error probability by the group set information (Gb3, Gy3, 1), allocation of one bit of the sign bits of the sign bit group Gb4 having the fourth best error probability to one bit of the symbol bits of the symbol bit group Gy4 having the fourth best error probability by the group set information (Gb4, Gy4, 1), allocation of one bit of the sign bits of the sign bit group Gb5 having the fifth best error probability to one bit of the symbol bits of the symbol bit group Gy2 having the second best error probability by the group set information (Gb5, Gy2, 1), allocation of one bit of the sign bits of the sign bit group Gb5 having the fifth best error probability to one bit of the symbol bits of the symbol bit group Gy1 having the best error probability by the group set information (Gb5, Gy1, 1), allocation of one bit of the sign bits of the sign bit group Gb5 having the fifth best error probability to one bit of the symbol bits of the symbol bit group Gy3 having the third best error probability by the group set information (Gb5, Gy3, 1), and allocation of one bit of the sign bits of the sign bit group Gb5 having the fifth best error probability to one bit of the symbol bits of the symbol bit group Gy4 having the fourth best error probability by the group set information (Gb5, Gy4, 1) are defined.

FIG. 63 illustrates an example of interchanging of the sign bits according to the allocation rule of FIG. 62.

That is, A of FIG. 63 illustrates a first example of interchanging of the sign bits according to the allocation rule of FIG. 62, when the LDPC code is a mobile LDPC code having the code length N of 16200 bits and the encoding rate of 7/15, the modulation method is the 256QAM, and the multiple b is 1.

When the LDPC code is the mobile LDPC code having the code length N of 16200 bits and the encoding rate of 7/15, the modulation method is the 256QAM, and the multiple b is 1, in the demultiplexer 25, the sign bits written to the memory 31 in which a column direction×a row direction are (16200/(8×1))× (8×1) bits are read in a unit of 8×1 (=mb) bits in the row direction and are supplied to the interchanging unit 32 (FIGS. 18 and 19).

The interchanging unit 32 interchanges the sign bits b0 to b7 of the 8×1 (=mb) bits, such that the sign bits b0 to b7 of the 8×1 (=mb) bits read from the memory 31 are allocated to the symbol bits y0 to y7 of the 8×1 (=mb) bits of one (=b) symbol, as illustrated by A of FIG. 63, according to the allocation rule of FIG. 62.

That is, the interchanging unit 32 performs interchanging to allocate the sign bits b0, b1, b2, b3, b4, b5, b6, and b7 to the symbol bits y2, y1, y4, y7, y3, y0, y5, and y6, respectively.

B of FIG. 63 illustrates a second example of interchanging of the sign bits according to the allocation rule of FIG. 62, when the LDPC code is a mobile LDPC code having the code length N of 16200 bits and the encoding rate of 7/15, the modulation method is the 256QAM, and the multiple b is 1.

According to B of FIG. 63, the interchanging unit 32 performs interchanging to allocate the sign bits b0, b1, b2, b3, b4, b5, b6, and b7 to the symbol bits y2, y0, y4, y6, y1, y3, y5, and y7, respectively, with respect to the sign bits b0 to b7 of the 8×1 (=mb) bits read from the memory 31, according to the allocation rule of FIG. 62.

According to the simulation performed by the inventors, it is confirmed that, when the interchange processing of the new interchange method is executed, the BER is improved as compared with when the interchange processing is not executed. Therefore, according to the interchange processing of the new interchange method, resistance to the error can be improved.

In this embodiment, for the convenience of description, in the demultiplexer 25, the interchanging unit 32 executes the interchange processing with respect to the sign bits read from the memory 31. However, the interchange processing can be executed by controlling writing or reading of the sign bits with respect to the memory 31.

That is, the interchange processing can be executed by controlling addresses to read the sign bits (read addresses), such that reading of the sign bits from the memory 31 is performed in order of the sign bits after interchanging.

[Configuration Example of Receiving Device 12]

Figure 64:
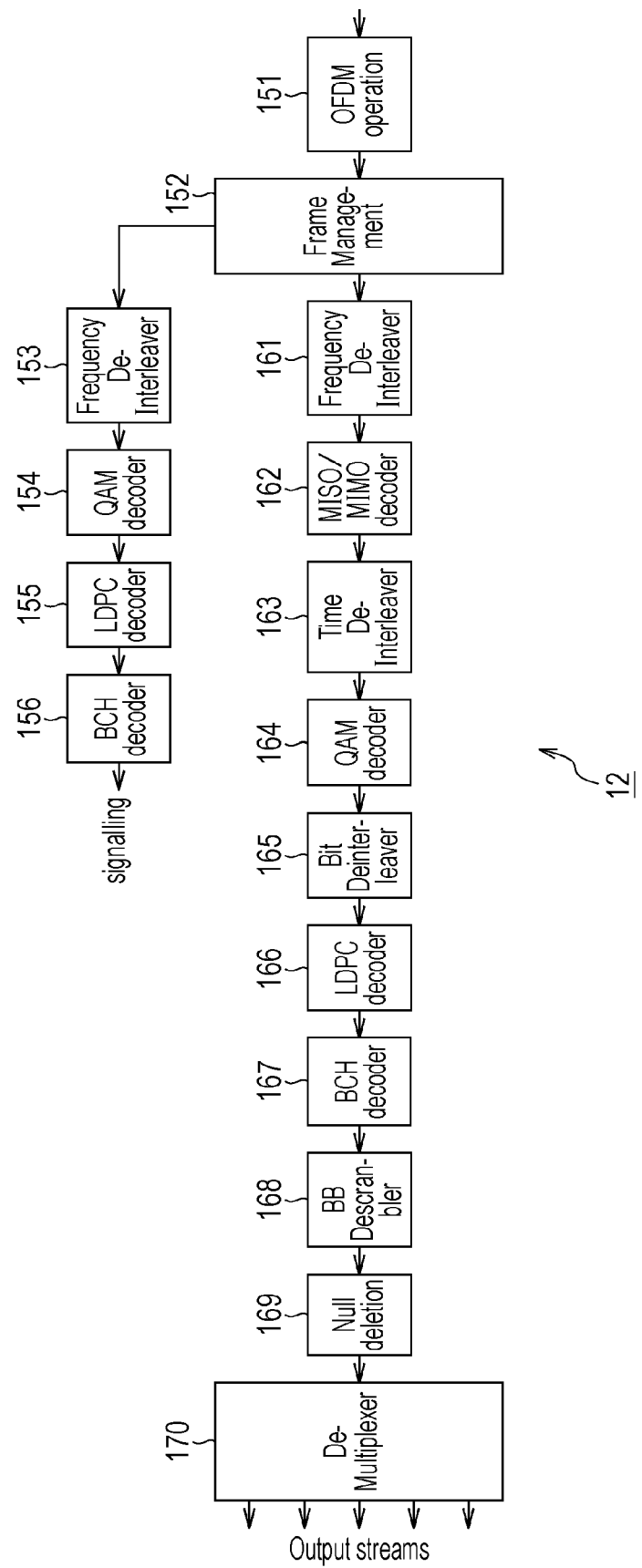
FIG. 64 is a block diagram illustrating a configuration example of a receiving device 12.

FIG. 64 is a block diagram illustrating a configuration example of the receiving device 12 of FIG. 7.

An OFDM operation 151 receives an OFDM signal from the transmitting device 11 (FIG. 7) and executes signal processing of the OFDM signal. Data (symbol) that is obtained by executing the signal processing by the OFDM operation 151 is supplied to a frame management unit 152.

The frame management unit 152 executes processing (frame interpretation) of a frame configured by the symbol supplied from the OFDM operation 151 and supplies a symbol of target data obtained as a result thereof and a symbol of control data to frequency deinterleavers 161 and 153, respectively.

The frequency deinterleaver 153 performs frequency deinterleave in units of symbols with respect to the symbol supplied from the frame management unit 152 and supplies the symbol to a QAM decoder 154.

The QAM decoder 154 demaps (performs signal point arrangement decoding) the symbol (symbol arranged on a signal point) supplied from the frequency deinterleaver 153, performs orthogonal demodulation, and supplies data (LDPC code) obtained as a result thereof to a LDPC decoder 155.

The LDPC decoder 155 performs LDPC decoding of the LDPC code supplied from the QAM decoder 154 and supplies LDPC target data (in this case, a BCH code) obtained as a result thereof to a BCH decoder 156.

The BCH decoder 156 performs BCH decoding of the LDPC target data supplied from the LDPC decoder 155 and outputs control data (signaling) obtained as a result thereof.

Meanwhile, the frequency deinterleaver 161 performs frequency deinterleave in units of symbols with respect to the symbol supplied from the frame management unit 152 and supplies the symbol to a MISO/MIMO decoder 162.

The MISO/MIMO decoder 162 performs spatiotemporal decoding of the data (symbol) supplied from the frequency deinterleaver 161 and supplies the data to a time deinterleaver 163.

The time deinterleaver 163 performs time deinterleave in units of symbols with respect to the data (symbol) supplied from the MISO/MIMO decoder 162 and supplies the data to a QAM decoder 164.

The QAM decoder 164 demaps (performs signal point arrangement decoding) the symbol (symbol arranged on a signal point) supplied from the time deinterleaver 163, performs orthogonal demodulation, and supplies data (symbol) obtained as a result thereof to a bit deinterleaver 165.

The bit deinterleaver 165 performs bit deinterleave of the data (symbol) supplied from the QAM decoder 164 and supplies an LDPC code obtained as a result thereof to an LDPC decoder 166.

The LDPC decoder 166 performs LDPC decoding of the LDPC code supplied from the bit deinterleaver 165 and supplies LDPC target data (in this case, a BCH code) obtained as a result thereof to a BCH decoder 167.

The BCH decoder 167 performs BCH decoding of the LDPC target data supplied from the LDPC decoder 155 and supplies data obtained as a result thereof to a BB descrambler 168.

The BB descrambler 168 executes energy reverse diffusion processing with respect to the data supplied from the BCH decoder 167 and supplies data obtained as a result thereof to a null deletion unit 169.

The null deletion unit 169 deletes null inserted by the padder 112 of FIG. 8, from the data supplied from the BB descrambler 168, and supplies the data to a demultiplexer 170.

The demultiplexer 170 individually separates one or more streams (target data) multiplexed with the data supplied from the null deletion unit 169 and outputs the streams as output streams.

Figure 65:
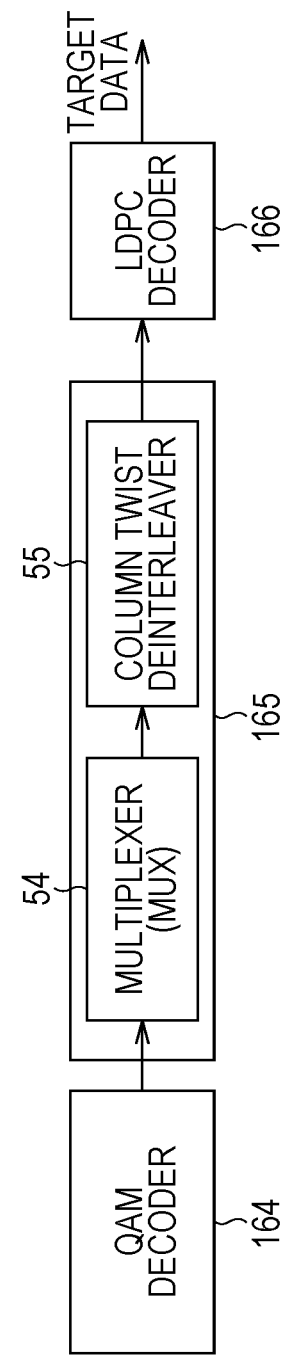
FIG. 65 is a block diagram illustrating a configuration example of a bit deinterleaver 165.

FIG. 65 is a block diagram illustrating a configuration example of the bit deinterleaver 165 of FIG. 64.

The bit deinterleaver 165 includes a multiplexer (MUX) 54 and a column twist deinterleaver 55 and performs (bit) deinterleave of symbol bits of the symbol supplied from the QAM decoder 164 (FIG. 64).

That is, the multiplexer 54 executes reverse interchange processing (reverse processing of the interchange processing) corresponding to the interchange processing executed by the demultiplexer 25 of FIG. 9, that is, reverse interchange processing for returning positions of the sign bits (symbol bits) of the LDPC codes interchanged by the interchange processing to original positions, with respect to the symbol bits of the symbol supplied from the QAM decoder 164, and supplies an LDPC code obtained as a result thereof to the column twist deinterleaver 55.

The column twist deinterleaver 55 performs the column twist deinterleave (reverse processing of the column twist interleave) corresponding to the column twist interleave as the rearrangement processing executed by the column twist interleaver 24 of FIG. 9, with respect to the LDPC code supplied from the multiplexer 54, that is, the column twist deinterleave as the reverse rearrangement processing for returning the arrangement of the sign bits of the LDPC codes of which the arrangement changed by the column twist interleave as the rearrangement processing to the original arrangement.

Specifically, the column twist deinterleaver 55 writes the sign bits of the LDPC code to a memory for deinterleave having the same configuration as the memory 31 illustrated in FIG. 24 and the like, reads the sign bits, and performs the column twist deinterleave.

However, in the column twist deinterleaver 55, writing of the sign bits is performed in a row direction of the memory for the deinterleave, using read addresses when the sign bits are read from the memory 31 as write addresses. In addition, reading of the sign bits is performed in a column direction of the memory for the deinterleave, using write addresses when the sign bits are written to the memory 31 as read addresses.

The LDPC code that is obtained as a result of the column twist deinterleave is supplied from the column twist deinterleaver 55 to the LDPC decoder 166.

Here, in the LDPC code that is supplied from the QAM decoder 164 to the bit deinterleaver 165, the parity interleave, the column twist interleave, and the interchange processing are executed sequentially. However, in the bit deinterleaver 165, only the reverse interchange processing corresponding to the interchange processing and the column twist deinterleave corresponding to the column twist interleave are performed. Therefore, the parity deinterleave (reverse processing of the parity interleave) corresponding to the parity interleave, that is, the parity deinterleave for returning the arrangement of the sign bits of the LDPC code of which the arrangement changed by the parity interleave to the original arrangement is not performed.

Therefore, the LDPC code in which the reverse interchange processing and the column twist deinterleave are performed and the parity deinterleave is not performed is supplied from (the column twist deinterleaver 55 of) the bit deinterleaver 165 to the LDPC decoder 166.

The LDPC decoder 166 performs the LDPC decoding of the LDPC code supplied from the bit deinterleaver 165, using a transformation parity check matrix obtained by performing at least column replacement corresponding to the parity interleave with respect to the parity check matrix H used by the LDPC encoder 115 of FIG. 8 to perform the LDPC encoding, and outputs data obtained as a result thereof as a decoding result of LDPC target data.

Figure 66:
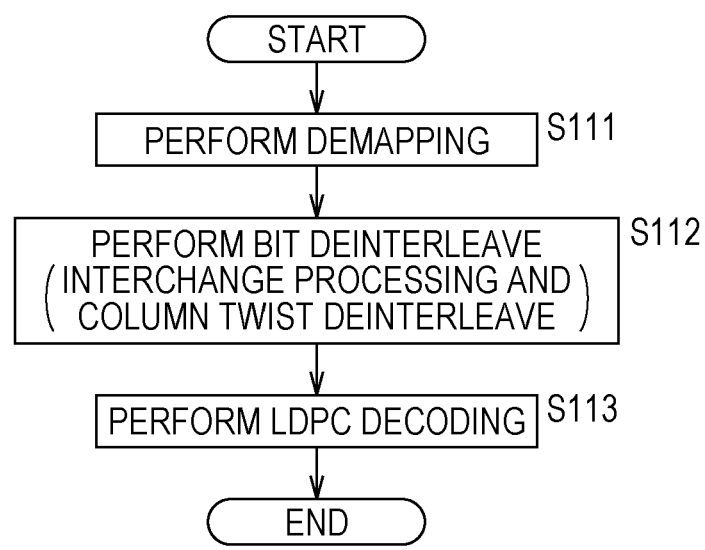
FIG. 66 is a flowchart illustrating processing executed by a QAM decoder 164, the bit deinterleaver 165, and an LDPC decoder 166.

FIG. 66 is a flowchart illustrating processing that is executed by the QAM decoder 164, the bit deinterleaver 165, and the LDPC decoder 166 of FIG. 65.

In step S111, the QAM decoder 164 demaps the symbol (symbol mapped to a signal point) supplied from the time deinterleaver 163, performs orthogonal demodulation, and supplies the symbol to the bit deinterleaver 165, and the processing proceeds to step S112.

In step S112, the bit deinterleaver 165 performs deinterleave (bit deinterleave) of the symbol bits of the symbol supplied from the QAM decoder 164 and the processing proceeds to step S113.

That is, in step S112, in the bit deinterleaver 165, the multiplexer 54 executes reverse interchange processing with respect to the symbol bits of the symbol supplied from the QAM decoder 164 and supplies sign bits of an LDPC code obtained as a result thereof to the column twist deinterleaver 55.

The column twist deinterleaver 55 performs the column twist deinterleave with respect to the LDPC code supplied from the multiplexer 54 and supplies an LDPC code obtained as a result thereof to the LDPC decoder 166.

In step S113, the LDPC decoder 166 performs the LDPC decoding of the LDPC code supplied from the column twist deinterleaver 55, using a transformation parity check matrix obtained by performing at least column replacement corresponding to the parity interleave with respect to the parity check matrix H used by the LDPC encoder 115 of FIG. 8 to perform the LDPC encoding, and outputs data obtained as a result thereof as a decoding result of LDPC target data to the BCH decoder 167.

In FIG. 65, for the convenience of description, the multiplexer 54 that executes the reverse interchange processing and the column twist deinterleaver 55 that performs the column twist deinterleave are individually configured, similar to the case of FIG. 9. However, the multiplexer 54 and the column twist deinterleaver 55 can be integrally configured.

In the bit interleaver 116 of FIG. 9, when the column twist interleave is not performed, it is not necessary to provide the column twist deinterleaver 55 in the bit deinterleaver 165 of FIG. 65.

Next, the LDPC decoding that is performed by the LDPC decoder 166 of FIG. 64 will be further described.

In the LDPC decoder 166 of FIG. 64, as described above, the LDPC decoding of the LDPC code from the column twist deinterleaver 55, in which the reverse interchange processing and the column twist deinterleave are performed and the parity deinterleave is not performed, is performed using a transformation parity check matrix obtained by performing at least column replacement corresponding to the parity interleave with respect to the parity check matrix H used by the LDPC encoder 115 of FIG. 8 to perform the LDPC encoding.

Here, LDPC decoding that can suppress an operation frequency in a sufficiently realizable range while suppressing a circuit scale, by performing the LDPC decoding using the transformation parity check matrix, is previously suggested (for example, refer to Japanese Patent No. 4224777).

Therefore, first, the previously suggested LDPC decoding using the transformation parity check matrix will be described with reference to FIGS. 67 to 70.

Figure 67:
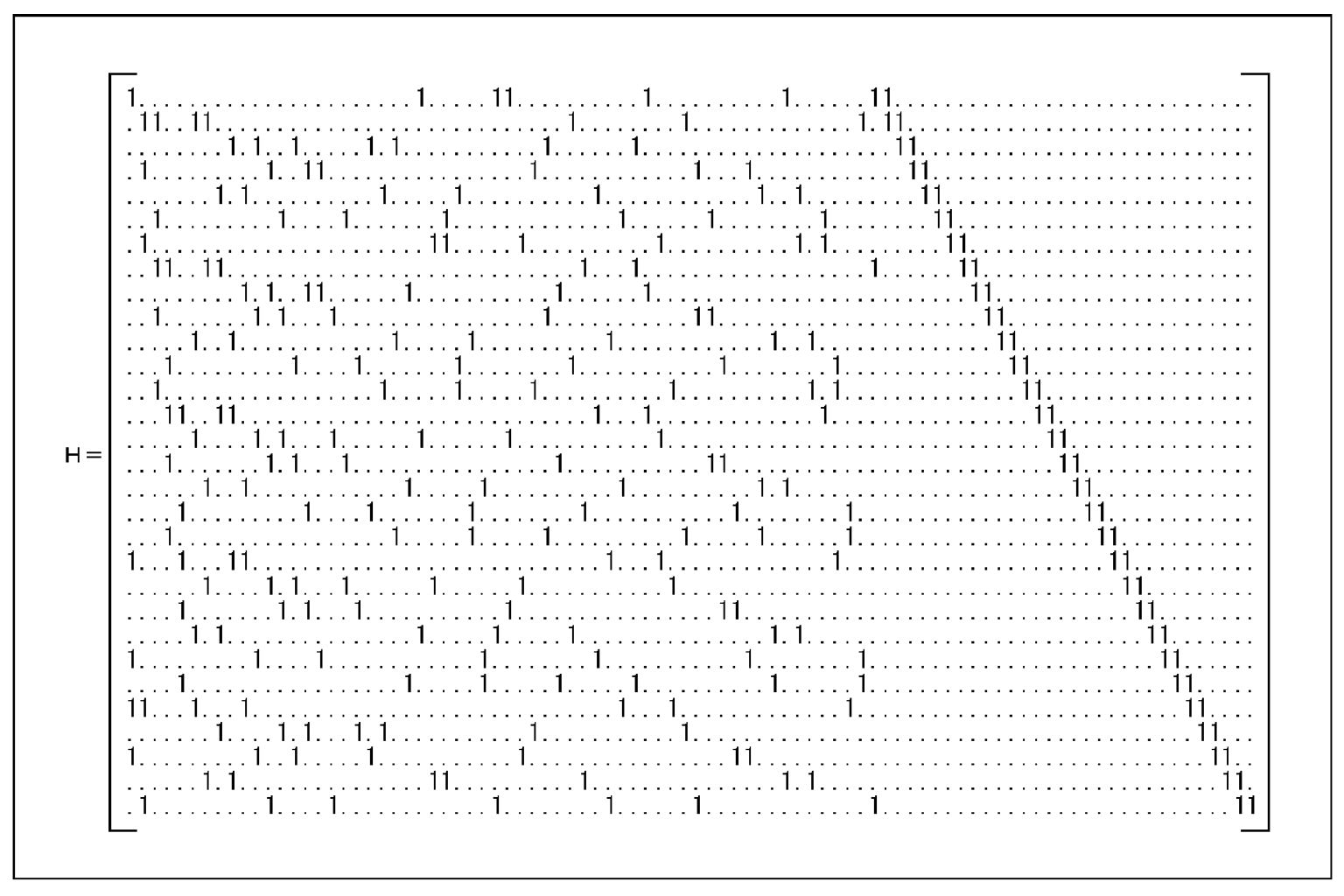

FIG. 67 illustrates an example of a parity check matrix H of an LDPC code in which a code length N is 90 and an encoding rate is 2/3.

In FIG. 67 (and FIGS. 68 and 69 to be described later), 0 is represented by a period (.).

In the parity check matrix H of FIG. 67, the parity matrix becomes a staircase structure.

Figure 68:
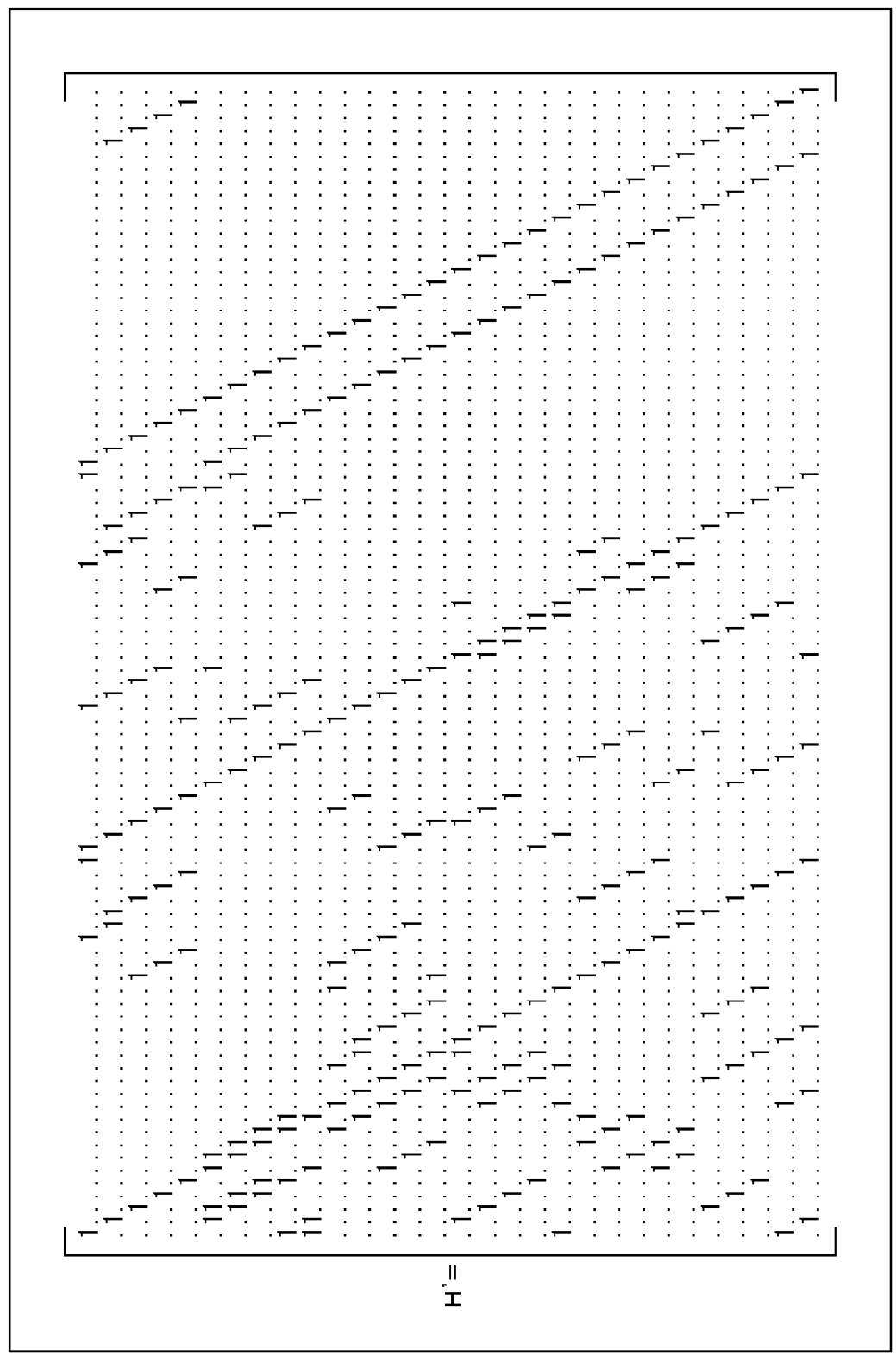
FIG. 68 is a diagram illustrating a matrix (transformation parity check matrix) obtained by executing row replacement and column replacement with respect to a parity check matrix.

FIG. 68 illustrates a parity check matrix H' that is obtained by executing row replacement of an expression (11) and column replacement of an expression (12) with respect to the parity check matrix H of FIG. 67.

Row Replacement: $(6s+t+1)$-th row→$(5t+s+1)$-th row  (11)

Column Replacement: $(6x+y+61)$-th column→$(5y+x+61)$-th column  (12)

In the expressions (11) and (12), s, t, x, and y are integers in ranges of $0 \leq s < 5$, $0 \leq t < 6$, $0 \leq x < 5$, and $0 \leq t < 6$, respectively.

According to the row replacement of the expression (11), replacement is performed such that the 1st, 7th, 13rd, 19th, and 25th rows having remainders of 1 when being divided by 6 are replaced with the 1st, 2nd, 3rd, 4th, and 5th rows, respectively, and the 2nd, 8th, 14th, 20th, and 26th rows having remainders of 2 when being divided by 6 are replaced with the 6th, 7th, 8th, 9th, and 10th rows, respectively.

According to the column replacement of the expression (12), replacement is performed such that the 61st, 67th, 73rd, 79th, and 85th columns having remainders of 1 when being divided by 6 are replaced with the 61st, 62nd, 63rd, 64th, and 65th columns, respectively, and the 62nd, 68th, 74th, 80th, and 86th columns having remainders of 2 when being divided by 6 are replaced with the 66th, 67th, 68th, 69th, and 70th columns, respectively, with respect to the 61st and following columns (parity matrix).

In this way, a matrix that is obtained by performing the replacements of the rows and the columns with respect to the parity check matrix H of FIG. 67 is a parity check matrix H' of FIG. 68.

Here, even when the row replacement of the parity check matrix H is performed, the arrangement of the sign bits of the LDPC code is not influenced.

The column replacement of the expression (12) corresponds to parity interleave to interleave the $(K+qx+y+1)$-th sign bit into the position of the $(K+Py+x+1)$-th sign bit, when the information length K is set to 60, the column number P of the unit of the cyclic structure is set to 5, and the divisor q ($=M/P$) of the parity length M (in this case, 30) is set to 6.

If the parity check matrix (hereinafter, appropriately referred to as a transformation parity check matrix) H' of FIG. 68 is multiplied with a result obtained by performing the same replacement as the expression (12) with respect to the LDPC code of the parity check matrix (hereinafter, appropriately referred to as an original parity check matrix) H of FIG. 67, a zero vector is output. That is, if a row vector obtained by performing the column replacement of the expression (12) with respect to a row vector c as the LDPC code (one code word) of the original parity check matrix H is represented as c', $Hc^T$ becomes the zero vector from the property of the parity check matrix. Therefore, $H'c'^T$ naturally becomes the zero vector, too.

Thereby, the transformation parity check matrix H' of FIG. 68 becomes a parity check matrix of an LDPC code c' that is obtained by performing the column replacement of the expression (12) with respect to the LDPC code c of the original parity check matrix H.

Therefore, the column replacement of the expression (12) is performed with respect to the LDPC code c of the original parity check matrix H, the LDPC code c' after the column replacement is decoded (LDPC decoding) using the transformation parity check matrix H' of FIG. 68, reverse replacement of the column replacement of the expression (12) is performed with respect to a decoding result, and the same decoding result as the case in which the LDPC code of the original parity check matrix H is decoded using the parity check matrix H can be obtained.

Figure 69:
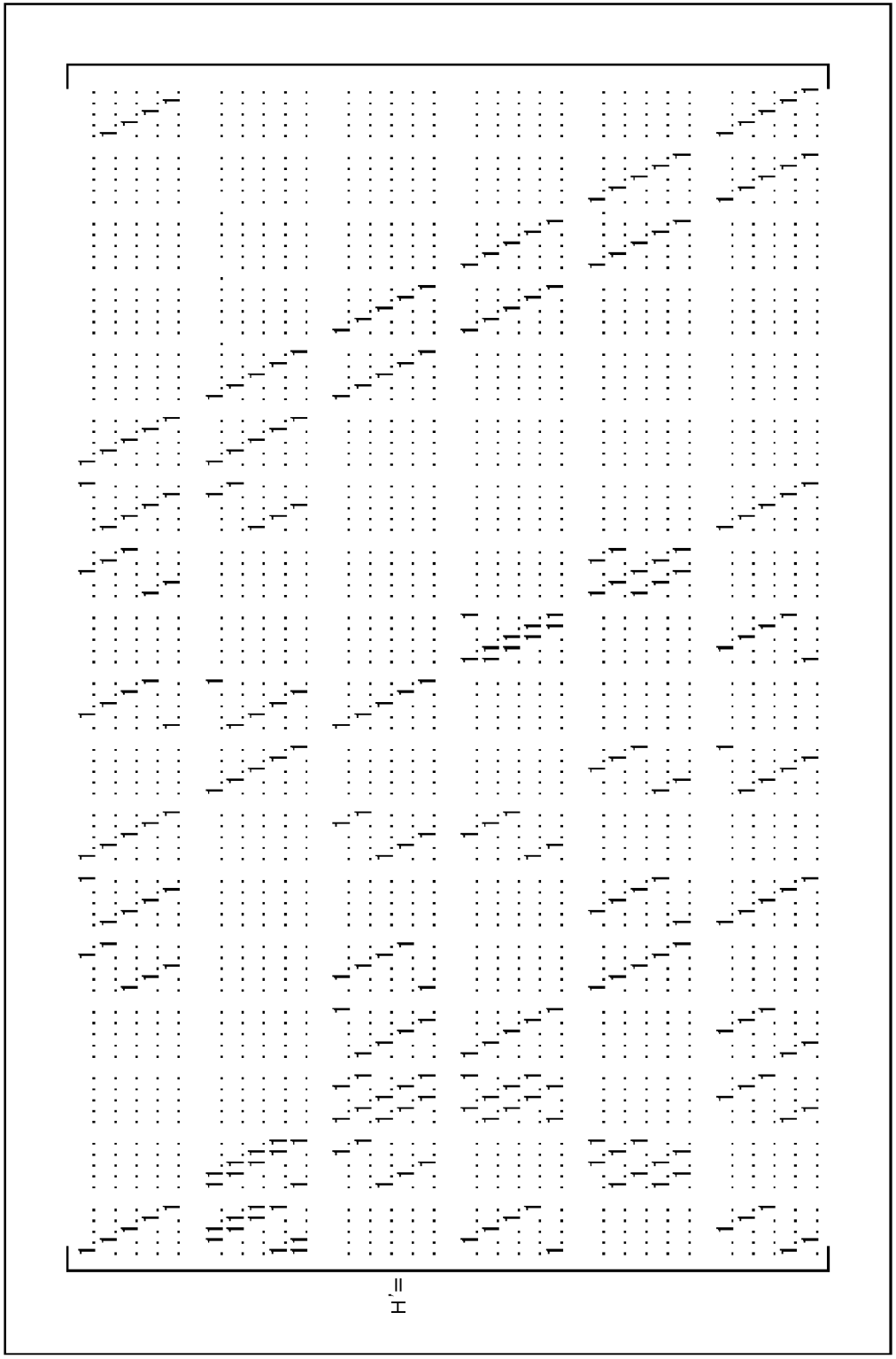
FIG. 69 is a diagram illustrating a transformation parity check matrix divided in a 5×5 unit.

FIG. 69 illustrates the transformation parity check matrix H' of FIG. 68 with being spaced in units of 5×5 matrixes.

In FIG. 69, the transformation parity check matrix H' is represented by a combination of a 5×5 unit matrix, a matrix (hereinafter, appropriately referred to as a quasi unit matrix) obtained by setting one or more 1 of the unit matrix to zero, a matrix (hereinafter, appropriately referred to as a shift matrix) obtained by cyclically shifting the unit matrix or the quasi unit matrix, a sum (hereinafter, appropriately referred to as a sum matrix) of two or more matrixes of the unit matrix, the quasi unit matrix, and the shift matrix, and a 5×5 zero matrix.

The transformation parity check matrix H' of FIG. 69 can be configured using the 5×5 unit matrix, the quasi unit matrix, the shift matrix, the sum matrix, and the zero matrix. Therefore, the 5×5 matrixes that constitute the transformation parity check matrix H' are appropriately referred to as constitutive matrixes hereinafter.

When the LDPC code of the parity check matrix represented by the P×P constitutive matrixes is decoded, an architecture in which P check node operations and variable node operations are simultaneously performed can be used.

Figure 70:
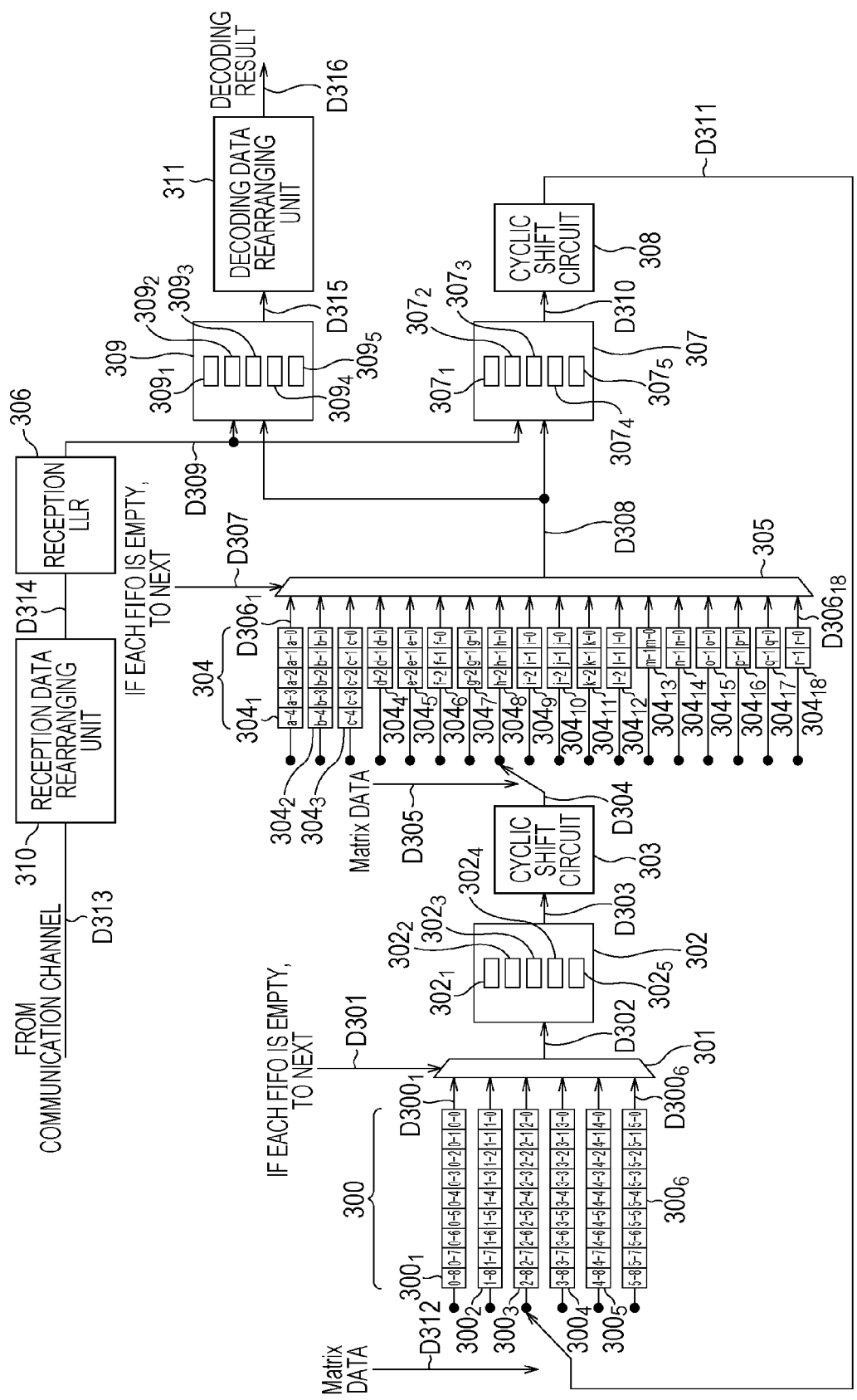
FIG. 70 is a block diagram illustrating a configuration example of a decoding device that collectively performs P node operations.

FIG. 70 is a block diagram illustrating a configuration example of a decoding device that performs the decoding.

That is, FIG. 70 illustrates the configuration example of the decoding device that performs decoding of the LDPC code, using the transformation parity check matrix H' of FIG. 69 obtained by performing at least the column replacement of the expression (12) with respect to the original parity check matrix H of FIG. 67.

The decoding device of FIG. 70 consists of an edge data storing memory 300 that consists of 6 FIFOs $300_1$ to $300_6$, a selector 301 that selects the FIFOs $300_1$ to $300_6$, a check node calculating unit 302, two cyclic shift circuits 303 and 308, an edge data storing memory 304 that consists of 18 FIFOs $304_1$ to $304_{18}$, a selector 305 that selects the FIFOs $304_1$ to $304_{18}$, a reception data memory 306 that stores reception data, a variable node calculating unit 307, a decoding word calculating unit 309, a reception data rearranging unit 310, and a decoding data rearranging unit 311.

First, a method of storing data in the edge data storing memories 300 and 304 will be described.

The edge data storing memory 300 consists of the 6 FIFOs $300_1$ to $300_6$ of which the number is a number obtained by dividing a row number 30 of the transformation parity check matrix H' of FIG. 69 by a row number 5 of the constitutive matrix. The FIFO $300_y$ (y=1, 2, . . . , and 6) consists of a plurality of steps of storage regions. In the storage region of each step, messages corresponding to five edges of which the number is a row number and a column number of the constitutive matrix can be simultaneously read and written. The number of steps of the storage regions of the FIFO $300_y$ becomes 9 to be a maximum number of the number (Hamming weight) of 1 of a row direction of the transformation parity check matrix of FIG. 69.

In the FIFO $300_1$, data corresponding to positions of 1 (messages $v_i$ from variable nodes) in the first to fifth rows of the transformation parity check matrix H' of FIG. 69 is stored in a form filling each row in a horizontal direction (a form in which 0 is ignored). That is, if a j-th row and an i-th column are represented as (j, i), data corresponding to positions of 1 of a 5×5 unit matrix of (1, 1) to (5, 5) of the transformation parity check matrix H' is stored in the storage region of the first step of the FIFO $300_1$. In the storage region of the second step, data corresponding to positions of 1 of a shift matrix (shift matrix obtained by cyclically shifting the 5×5 unit matrix by 3 in a rightward direction) of (1, 21) to (5, 25) of the transformation parity check matrix H' is stored. Similar to the above case, in the storage regions of the third to eighth steps, data is stored in association with the transformation parity check matrix H'. In addition, in the storage region of the ninth step, data corresponding to positions of 1 of a shift matrix (shift matrix obtained by replacing 1 of the first row of the 5×5 unit matrix with 0 and cyclically shifting the unit matrix to the left side by 1) of (1, 86) to (5, 90) of the transformation parity check matrix H' is stored.

In the FIFO $300_2$, data corresponding to positions of 1 in the sixth to tenth rows of the transformation parity check matrix H' of FIG. 69 is stored. That is, in the storage region of the first step of the FIFO $300_2$, data corresponding to positions of 1 of the first shift matrix constituting a sum matrix (summatrix to be a sum of the first shift matrix obtained by cyclically shifting the 5×5 unit matrix to the right side by 1 and the second shift matrix obtained by cyclically shifting the 5×5 unit matrix to the right side by 2) of (6, 1) to (10, 5) of the transformation parity check matrix H' is stored. In addition, in the storage region of the second step, data corresponding to positions of 1 of the second shift matrix constituting the sum matrix of (6, 1) to (10, 5) of the transformation parity check matrix H' is stored.

That is, with respect to a constitutive matrix of which the weight is two or more, when the constitutive matrix is represented by a sum of a plurality of matrixes of a P×P unit matrix of which the weight is 1, a quasi unit matrix in which one or more elements of 1 in the unit matrix become 0, or a shift matrix obtained by cyclically shifting the unit matrix or the quasi unit matrix, data corresponding to the positions of 1 in the unit matrix of the weight of 1, the quasi unit matrix, or the shift matrix (messages corresponding to edges belonging to the unit matrix, the quasi unit matrix, or the shift matrix) is stored at the same address (the same FIFO among the FIFOs $300_1$ to $300_6$).

Subsequently, in the storage regions of the third to ninth steps, data is stored in association with the transformation parity check matrix H', similar to the above case.

In the FIFOs $300_3$ to $300_6$, data is stored in association with the transformation parity check matrix H', similar to the above case.

The edge data storing memory 304 consists of 18 FIFOs $304_1$ to $304_{18}$ of which the number is a number obtained by dividing a column number 90 of the transformation parity check matrix H' by 5 to be a column number of a constitutive matrix. The FIFO $304_x$ (x=1, 2, . . . , and 18) consists of a plurality of steps of storage regions. In the storage region of each step, messages corresponding to five edges of which the number is a row number and a column number of the transformed constitutive matrix H' can be simultaneously read and written.

In the FIFO $304_1$, data corresponding to positions of 1 in the first to fifth columns of the transformation parity check matrix H' of FIG. 69 (messages $u_j$ from check nodes) is stored in a form filling each column in a vertical direction (a form in which 0 is ignored). That is, data corresponding to positions of 1 of a 5×5 unit matrix of (1, 1) to (5, 5) of the transformation parity check matrix H' is stored in the storage region of the first step of the FIFO $304_1$. In the storage region of the second step, data corresponding to positions of 1 of the first shift matrix constituting a sum matrix of (6, 1) to (10, 5) of the transformation parity check matrix H' (sum matrix to be a sum of the first shift matrix obtained by cyclically shifting the 5×5 unit matrix to the right side by 1 and the second shift matrix obtained by cyclically shifting the 5×5 unit matrix to the right side by 2) is stored. In addition, in the storage region of the third step, data corresponding to positions of 1 of the second shift matrix constituting the sum matrix of (6, 1) to (10, 5) of the transformation parity check matrix H' is stored.

That is, with respect to a constitutive matrix of which the weight is two or more, when the constitutive matrix is represented by a sum of a plurality of matrixes of a P×P unit matrix of which the weight is 1, a quasi unit matrix in which one or more elements of 1 in the unit matrix become 0, or a shift matrix obtained by cyclically shifting the unit matrix or the quasi unit matrix, data corresponding to the positions of 1 in the unit matrix of the weight of 1 (messages corresponding to edges belonging to the unit matrix, the quasi unit matrix, or the shift matrix), the quasi unit matrix, or the shift matrix is stored at the same address (the same FIFO among the FIFOs $304_1$ to $304_{18}$).

Subsequently, in the storage regions of the fourth and fifth steps, data is stored in association with the transformation parity check matrix H', similar to the above case. The number of steps of the storage regions of the FIFO $304_1$ becomes 5 to be a maximum number of the number of 1 of a row direction in the first to fifth columns of the transformation parity check matrix H' (Hamming weight).

In the FIFOs $304_2$ and $304_3$, data is stored in association with the transformation parity check matrix H', similar to the above case, and each length (the number of steps) is 5. In the FIFOs $304_4$ to $304_{12}$, data is stored in association with the transformation parity check matrix H ', similar to the above case, and each length is 3. In the FIFOs $304_{13}$ to $304_{18}$, data is stored in association with the transformation parity check matrix H', similar to the above case, and each length is 2.

Next, an operation of the decoding device of FIG. 70 will be described.

The edge data storing memory 300 consists of the 6 FIFOs $300_1$ to $300_6$. According to information (matrix data) D312 on which row of the transformation parity check matrix five messages D311 supplied from a cyclic shift circuit 308 of a previous step belong to, the FIFO storing data is selected from the FIFOs $300_1$ to $300_6$ and the five messages D311 are collectively stored sequentially in the selected FIFO. When the data is read, the edge data storing memory 300 sequentially reads the five messages $D300_1$ from the FIFO $300_1$ and supplies the messages to the selector 301 of a next step. After reading of the messages from the FIFO $300_1$ ends, the edge data storing memory 300 reads the messages sequentially from the FIFOs $300_2$ to $300_6$ and supplies the messages to the selector 301.

The selector 301 selects the five messages from the FIFO from which data is currently read, among the FIFOs $300_1$ to $300_6$, according to a select signal D301, and supplies the selected messages as messages D302 to the check node calculating unit 302.

The check node calculating unit 302 consists of five check node calculators $302_1$ to $302_5$. The check node calculating unit 302 performs a check node operation according to the expression (7), using the messages D302 ($D302_1$ to $D302_5$) (messages $v_i$ of the expression 7) supplied through the selector 301, and supplies five messages D303 ($D303_1$ to $D303_5$) (messages $u_j$ of the expression (7)) obtained as a result of the check node operation to a cyclic shift circuit 303.

The cyclic shift circuit 303 cyclically shifts the five messages $D303_1$ to $D303_5$ acquired by the check node calculating unit 302, on the basis of information (matrix data) D305 on how many unit matrixes becoming the origin in the transformation parity check matrix H' are cyclically shifted to obtain the corresponding edges, and supplies a result thereof as messages D304 to the edge data storing memory 304.

The edge data storing memory 304 consists of 18 FIFOs $304_1$ to $304_{18}$ and selects a FIFO storing data from among the FIFOs $304_1$ to $304_{18}$ according to the information D305 on which row of the transformation parity check matrix H' the five messages D304 supplied from the cyclic shift circuit 303 of the previous step belong to and collectively stores the five messages D304 sequentially in the selected FIFO. In addition, when data is read, the edge data storing memory 304 sequentially reads five messages $D306_1$ from the FIFO $304_1$ and supplies the read messages to the selector 305 of the next step. After reading of data from the FIFO $304_1$ ends, the edge data storing memory 304 sequentially reads messages from the FIFOs $304_2$ to $304_{18}$ and supplies the read messages to the selector 305.

The selector 305 selects five messages from the FIFO from which the data is currently read, among the FIFOs $304_1$ to $304_{18}$, according to the a select signal D307, and supplies the selected messages as messages D308 to the variable node calculating unit 307 and the decoding word calculating unit 309.

Meanwhile, the reception data rearranging unit 310 rearranges the LDPC code D313 received through the communication channel 13 by performing the column replacement of the expression (12) and supplies the LDPC code as reception data D314 to the reception data memory 306. The reception data memory 306 calculates a reception Log Likelihood Ratio (LLR) from the reception data D314 supplied from the reception data rearranging unit 310, stores the reception LLR, collects five reception LLRs, and supplies the reception LLRs as reception values D309 to the variable node calculating unit 307 and the decoding word calculating unit 309.

The variable node calculating unit 307 consists of five variable node calculators $307_1$ to $307_5$. The variable node calculating unit 307 performs the variable node operation according to the expression (1), using the messages D308 ($D308_1$ to $D308_5$) (messages $u_j$ of the expression (1)) supplied through the selector 305 and the five reception values D309 (reception values $u_{0i}$ of the expression (1)) supplied from the reception data memory 306, and supplies messages D310 ($D310_1$ to $D310_5$) (message $v_i$ of the expression (1)) obtained as an operation result to the cyclic shift circuit 308.

The cyclic shift circuit 308 cyclically shifts the messages $D310_1$ to $D310_5$ calculated by the variable node calculating unit 307, on the basis of information on how many unit matrixes becoming the origin in the transformation parity check matrix H' are cyclically shifted to obtain the corresponding edges, and supplies a result thereof as messages D311 to the edge data storing memory 300.

By circulating the above operation in one cycle, decoding of the LDPC code can be performed once. After decoding the LDPC code by the predetermined number of times, the decoding device of FIG. 70 acquires a final decoding result and outputs the final decoding result, in the decoding word calculating unit 309 and the decoding data rearranging unit 311.

That is, the decoding word calculating unit 309 consists of five decoding word calculators $309_1$ to $309_5$. The decoding word calculating unit 309 calculates a decoding result (decoding word), on the basis of the expression (5), as a final step of multiple decoding, using the five messages D308 ($D308_1$ to $D308_5$) (messages $u_j$ of the expression 5) output by the selector 305 and the five reception values D309 (reception values $u_{0i}$ of the expression (5)) supplied from the reception data memory 306, and supplies decoding data D315 obtained as a result thereof to the decoding data rearranging unit 311.

The decoding data rearranging unit 311 performs the reverse replacement of the column replacement of the expression (12) with respect to the decoding data D315 supplied from the decoding word calculating unit 309, rearranges the order thereof, and outputs the decoding data as a final decoding result D316.

As described above, one of the row replacement and the column replacement or both the row replacement and the column replacement are performed with respect to the parity check matrix (original parity check matrix), the parity check matrix is transformed into a combination of a P×P unit matrix, a quasi unit matrix in which one or more elements of 1 in the unit matrix become 0, a shift matrix obtained by cyclically shifting the unit matrix or the quasi unit matrix, a sum matrix to be a sum of a plurality of matrixes of the unit matrix, the quasi unit matrix, or the shift matrix, and a P×P zero matrix, that is, a parity check matrix (transformation parity check matrix) that can be represented by a combination of constitutive matrixes, and an architecture in which P check node operations and variable node operations can be simultaneously performed in the decoding of the LDPC code can be adopted. Thereby, an operation frequency is suppressed in a realizable range by simultaneously performing the P node operations and multiple repetition decoding can be performed.

The LDPC decoder 166 that constitutes the receiving device 12 of FIG. 64 performs the LDPC decoding by simultaneously performing P check node operations and variable node operations, similar to the decoding device of FIG. 70.

That is, for the simplification of description, if the parity check matrix of the LDPC code output by the LDPC encoder 115 constituting the transmitting device 11 of FIG. 8 is regarded as the parity check matrix H illustrated in FIG. 67 in which the parity matrix becomes a staircase structure, in the parity interleaver 23 of the transmitting device 11, the parity interleave to interleave the (K+qx+y+1)-th sign bit into the position of the (K+Py+x+1)-th sign bit is performed in a state in which the information length K is set to 60, the column number P of the unit of the cyclic structure is set to 5, and the divisor q (=M/P) of the parity length M is set to 6.

Because the parity interleave corresponds to the column replacement of the expression (12) as described above, it is not necessary to perform the column replacement of the expression (12) in the LDPC decoder 166.

For this reason, in the receiving device 12 of FIG. 64, as described above, the LDPC code in which the parity deinterleave is not performed, that is, the LDPC code in a state in which the column replacement of the expression (12) is performed is supplied from the column twist deinterleaver 55 to the LDPC decoder 166. In the LDPC decoder 166, the same processing as the decoding device of FIG. 70, except that the column replacement of the expression (12) is not performed, is executed.

Figure 71:
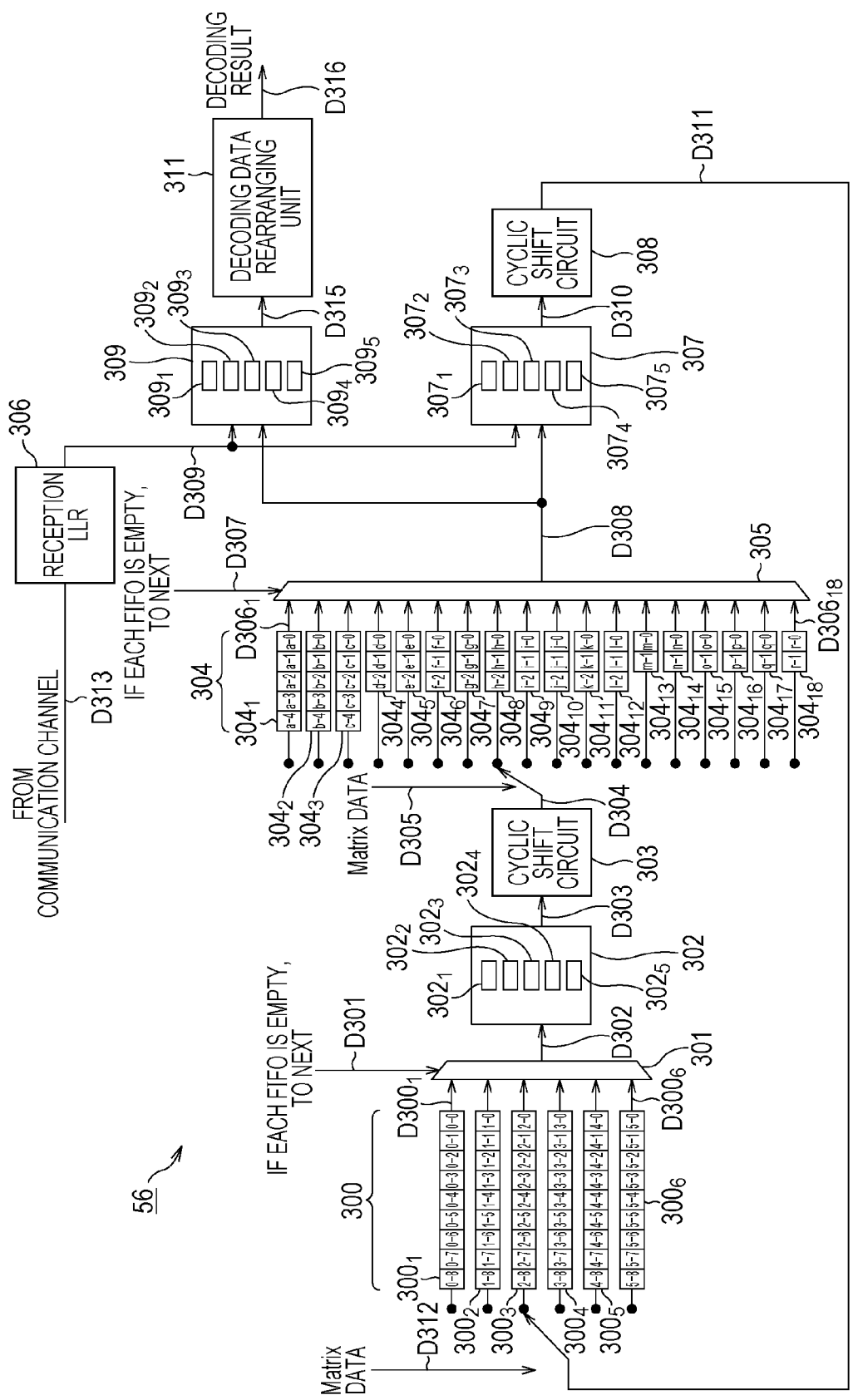
FIG. 71 is a block diagram illustrating a configuration example of the LDPC decoder 166.

That is, FIG. 71 illustrates a configuration example of the LDPC decoder 166 of FIG. 64.

In FIG. 71, the LDPC decoder 166 has the same configuration as the decoding device of FIG. 70, except that the reception data rearranging unit 310 of FIG. 70 is not provided, and executes the same processing as the decoding device of FIG. 70, except that the column replacement of the expression (12) is not performed, and thus, description thereof is omitted.

As described above, because the LDPC decoder 166 can be configured without providing the reception data rearranging unit 310, a scale can be reduced as compared with the decoding device of FIG. 70.

In FIGS. 67 to 71, for the simplification of description, the code length N of the LDPC code is set to 90, the information length K is set to 60, the column number (the row number and the column number of the constitutive matrix) P of the unit of the cyclic structure is set to 5, and the divisor q (=M/P) of the parity length M is set to 6. However, the code length N, the information length K, the column number P of the unit of the cyclic structure, and the divisor q (=M/P) are not limited to the above values.

That is, in the transmitting device 11 of FIG. 8, the LDPC encoder 115 outputs the LDPC code in which the code length N is set to 64800 or 16200 and the like, the information length K is set to N−Pq (=N−M), the column number P of the unit of the cyclic structure is set to 360, and the divisor q is set to M/P. However, the LDPC decoder 166 of FIG. 71 can be applied to the case in which P check node operation and variable node operations are simultaneously performed with respect to the LDPC code and the LDPC decoding is performed.

Figure 72:
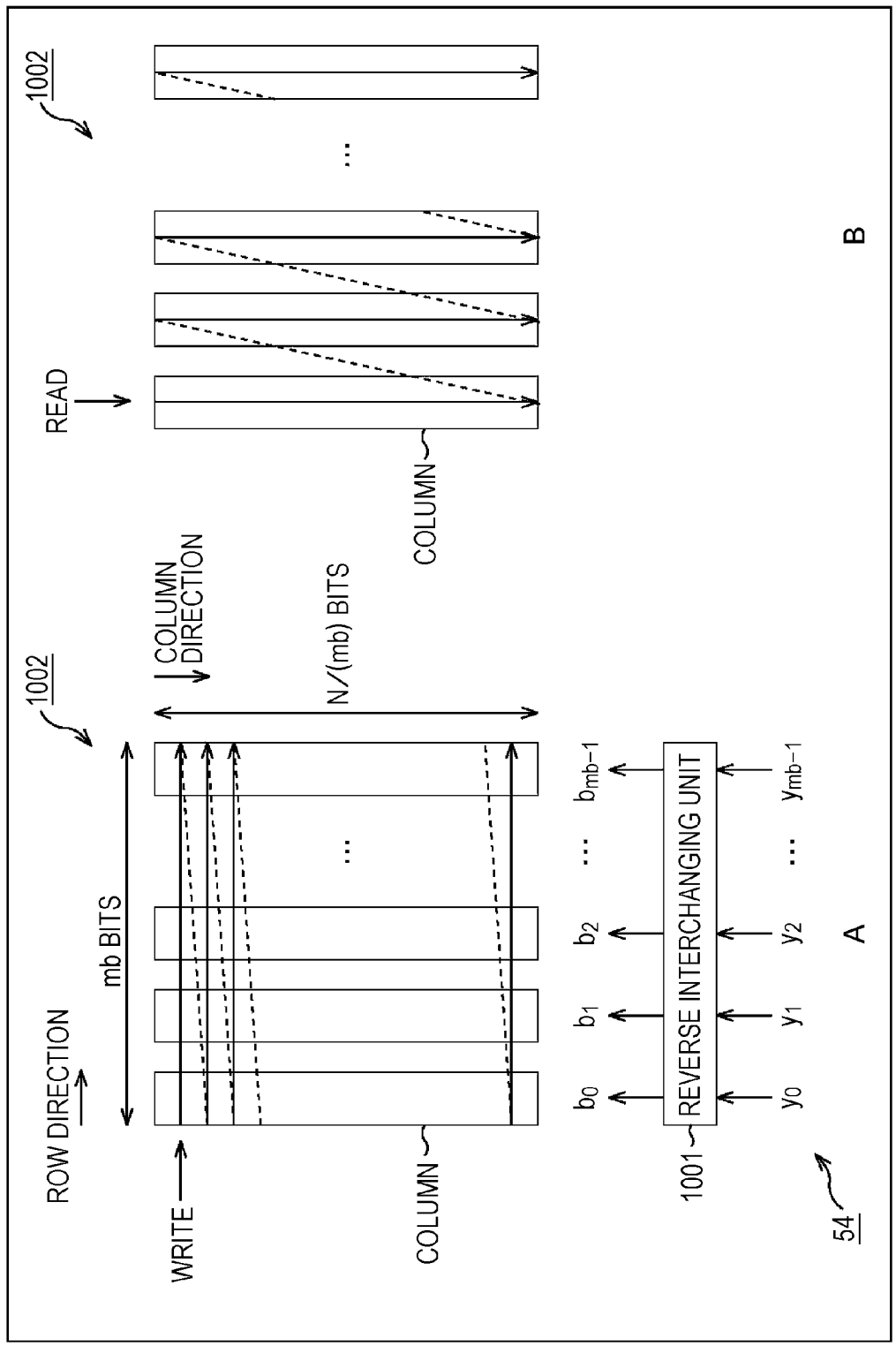
FIG. 72 is a diagram illustrating processing of a multiplexer 54 constituting the bit deinterleaver 165.

FIG. 72 is a diagram illustrating processing of the multiplexer 54 constituting the bit deinterleaver 165 of FIG. 65.

That is, A of FIG. 72 illustrates a functional configuration example of the multiplexer 54.

The multiplexer 54 consists of a reverse interchanging unit 1001 and a memory 1002.

The multiplexer 54 executes performs reverse interchange processing (reverse processing of the interchange processing) corresponding to the interchange processing executed by the demultiplexer 25 of the transmitting device 11, that is, reverse interchange processing to return the positions of the sign bits (symbol bits) of an LDPC code interchanged by the interchange processing to the original positions, with respect to symbol bits of the symbol supplied from the QAM decoder 164 of the previous step, and supplies an LDPC code obtained as a result thereof to the column twist deinterleaver 55 of the next step.

That is, in the multiplexer 54, symbol bits $y_0, y_1, \ldots,$ and $y_{mb-1}$ of mb bits of b symbols are supplied to the reverse interchanging unit 1001 in a unit of the b (consecutive) symbols.

The reverse interchanging unit 1001 performs reverse interchanging for returning the arrangement of the symbol bits $y_0$ to $y_{mb-1}$ of the mb bits to an arrangement of sign bits $b_0, b_1, \ldots,$ and $b_{mb-1}$ of original mb bits (arrangement of the sign bits $b_0$ to $b_{mb-1}$ before interchanging is performed in the interchanging unit 32 constituting the demultiplexer 25 of the side of the transmitting device 11) and outputs the sign bits $b_0$ to $b_{mb-1}$ of the mb bits obtained as a result thereof.

The memory 1002 has a storage capacity to store the mb bits in a row (horizontal) direction and store N/(mb) bits in a column (vertical) direction, similar to the memory 31 constituting the demultiplexer 25 of the side of the transmitting device 11. That is, the memory 1002 consists of mb columns that store the N/(mb) bits.

However, in the memory 1002, writing of the sign bits of the LDPC code output by the reverse interchanging unit 1001 is performed in a direction in which reading of the sign bits from the memory 31 of the demultiplexer 25 of the transmitting device 11 is performed and reading of the sign bits written to the memory 1002 is performed in a direction in which writing of the sign bits to the memory 31 is performed.

That is, in the multiplexer 54 of the receiving device 12, as illustrated by A of FIG. 72, writing of the sign bits of the LDPC code output by the reverse interchanging unit 1001 in the row direction in a unit of the mb bits is sequentially performed toward the lower rows from the first row of the memory 1002.

If writing of the sign bits corresponding to one code length ends, the multiplexer 54 reads the sign bits from the memory 1002 in the column direction and supplies the sign bits to the column twist deinterleaver 55 of a following step.

Here, B of FIG. 72 is a diagram illustrating reading of the sign bits from the memory 1002.

In the multiplexer 54, reading of the sign bits of the LDPC code in the downward direction from the upper side of the columns constituting the memory 1002 (column direction) is performed toward the columns of the rightward direction from the left side.

Figure 73:
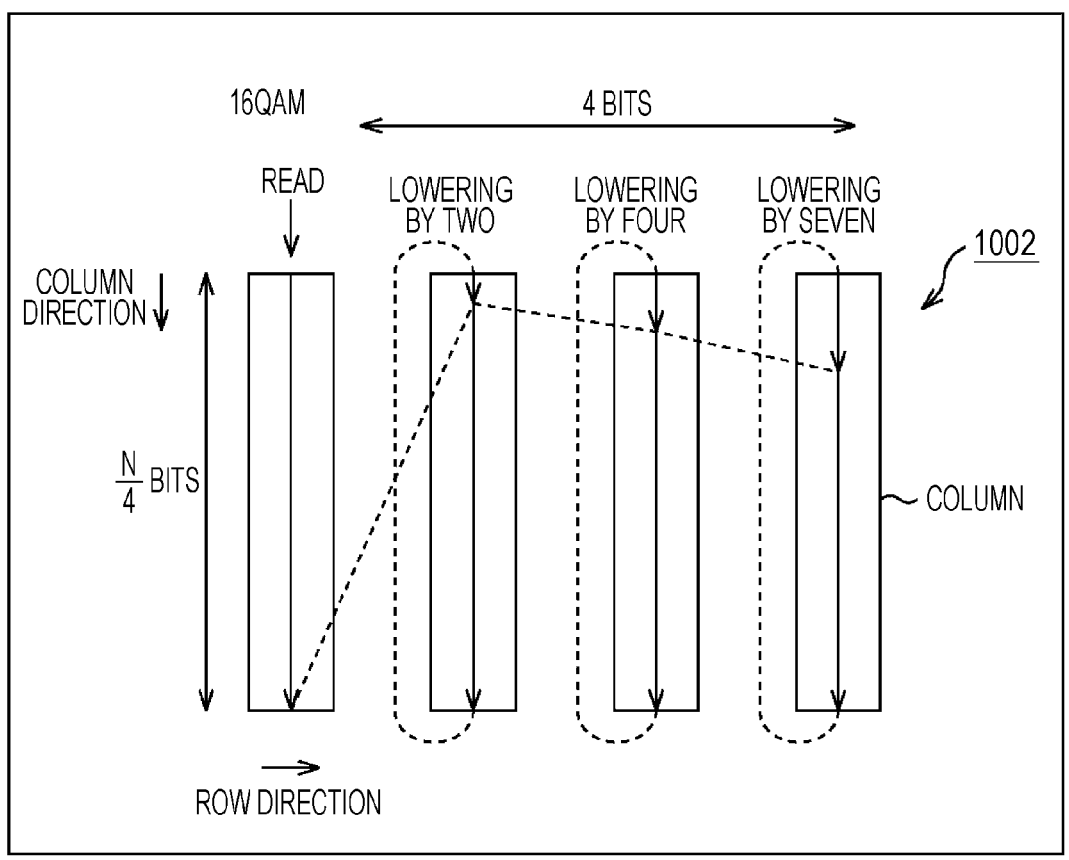
FIG. 73 is a diagram illustrating processing of a column twist deinterleaver 55.

FIG. 73 is a diagram illustrating processing of the column twist deinterleaver 55 constituting the bit deinterleaver 165 of FIG. 65.

That is, FIG. 73 illustrates a configuration example of the memory 1002 of the multiplexer 54.

The memory 1002 consists of a storage capacity to store the mb bits in the column (vertical) direction and store the N/(mb) bits in the row (horizontal) direction and includes mb columns.

The column twist deinterleaver 55 writes the sign bits of the LDPC code to the memory 1002 in the row direction, controls a read start position when the sign bits are read in the column direction, and performs the column twist deinterleave.

That is, in the column twist deinterleaver 55, a read start position to start reading of the sign bits is appropriately changed with respect to each of the plurality of columns and the reverse rearrangement processing for returning the arrangement of the sign bits rearranged by the column twist interleave to the original arrangement is executed.

Here, FIG. 73 illustrates a configuration example of the memory 1002 when the modulation method is the 16QAM and the multiple b is 1, which is described in FIG. 24. Therefore, a bit number m of one symbol is 4 bits and the memory 1002 consists of four (=mb) columns.

Instead of the multiplexer 54, the column twist deinterleaver 55 sequentially performs writing of the sign bits of the LDPC code output by the interchanging unit 1001 in the row direction, toward the lower rows from the first row of the memory 1002.

If writing of the sign bits corresponding to one code length ends, the column twist deinterleaver 55 performs reading of the sign bits in the downward direction from the upper side of the memory 1002 (column direction), toward the columns of the rightward direction from the left side.

However, the column twist deinterleaver 55 performs reading of the sign bits from the memory 1002, using the write start position to write the sign bits by the column twist interleaver 24 of the side of the transmitting device 11 as the read start position of the sign bits.

That is, if an address of a position of a head (top) of each column is set to 0 and an address of each position of the column direction is represented by an integer of ascending order, when the modulation method is the 16QAM and the multiple b is 1, in the column twist deinterleaver 55, a read start position is set as a position of which an address is 0, with respect the leftmost column. With respect the second column (from the left side), a read start position is set as a position of which an address is 2. With respect the third column, a read start position is set as a position of which an address is 4. With respect the fourth column, a read start position is set as a position of which an address is 7.

With respect to the columns in which the read start positions are the positions other than the position of which the address is 0, after reading of the sign bits is performed to the lowermost position, the position returns to the head (position of which the address is 0), and reading to the position immediately before the read start position is performed. Then, reading from a next (right) column is performed.

By performing the column twist deinterleave described above, the arrangement of the sign bits rearranged by the column twist interleave returns to the original arrangement.

Figure 74:
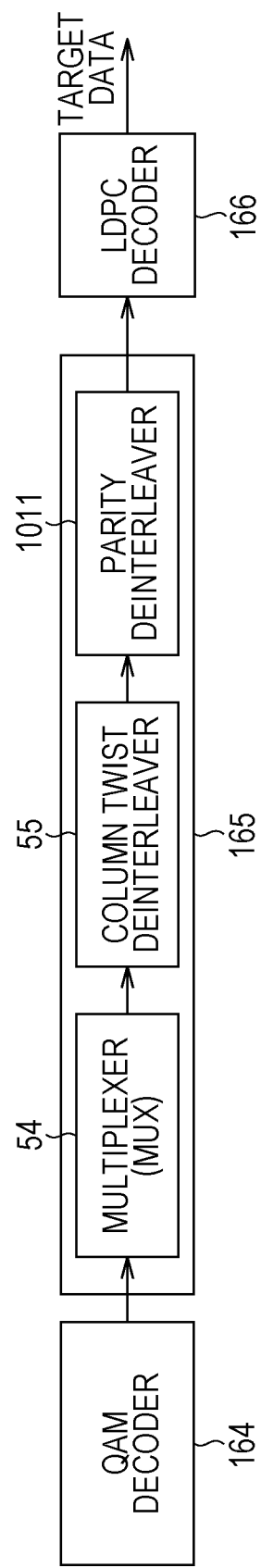
FIG. 74 is a block diagram illustrating another configuration example of the bit deinterleaver 165.

FIG. 74 is a block diagram illustrating another configuration example of the bit deinterleaver 165 of FIG. 64.

In the drawing, portions that correspond to the portions of FIG. 65 are denoted with the same reference numerals and description thereof is appropriately omitted hereinafter.

That is, the bit deinterleaver 165 of FIG. 74 has the same configuration as the case of FIG. 65, except that a parity deinterleaver 1011 is newly provided.

In FIG. 74, the bit deinterleaver 165 consists of a multiplexer (MUX) 54, a column twist deinterleaver 55, and a parity deinterleaver 1011 and performs bit deinterleave of sign bits of the LDPC code supplied from the QAM decoder 164.

That is, the multiplexer 54 executes the reverse interchange processing (reverse processing of the interchange processing) corresponding to the interchange processing executed by the demultiplexer 25 of the transmitting device 11, with respect to the LDPC code supplied from the QAM decoder 164, that is, the reverse interchange processing for returning the positions of the sign bits interchanged by the interchange processing to the original positions and supplies an LDPC code obtained as a result thereof to the column twist deinterleaver 55.

The column twist deinterleaver 55 performs the column twist deinterleave corresponding to the column twist interleave as the rearranging processing executed by the column twist interleaver 24 of the transmitting device 11, with respect to the LDPC code supplied from the multiplexer 54.

The LDPC code that is obtained as a result of the column twist deinterleave is supplied from the column twist deinterleaver 55 to the parity deinterleaver 1011.

The parity deinterleaver 1011 performs the parity deinterleave (reverse processing of the parity interleave) corresponding to the parity interleave performed by the parity interleaver 23 of the transmitting device 11, with respect to the sign bits after the column twist deinterleave in the column twist deinterleaver 55, that is, the parity deinterleave to return the arrangement of the sign bits of the LDPC code of which the arrangement changed by the parity interleave to the original arrangement.

The LDPC code that is obtained as a result of the parity deinterleave is supplied from the parity deinterleaver 1011 to the LDPC decoder 166.

Therefore, in the bit deinterleaver 165 of FIG. 74, the LDPC code in which the reverse interchange processing, the column twist deinterleave, and the parity deinterleave are performed, that is, the LDPC code that is obtained by the LDPC encoding according to the parity check matrix H is supplied to the LDPC decoder 166.

The LDPC decoder 166 performs LDPC decoding of the LDPC code supplied from the bit deinterleaver 165 using the parity check matrix H itself used by the LDPC encoder 115 of the transmitting device 11 to perform the LDPC encoding, or a transformation parity check matrix obtained by performing at least the column replacement corresponding to the parity interleave with respect to the parity check matrix H, and outputs data obtained as a result thereof as a decoding result of the LDPC target data.

Here, in FIG. 74, the LDPC code that is obtained by the LDPC encoding according to the parity check matrix H is supplied from (the parity deinterleaver 1011 of) the bit deinterleaver 165 to the LDPC decoder 166. For this reason, when the LDPC decoding of the LDPC code is performed using the parity check matrix H used by the LDPC encoder 115 of the transmitting device 11 to perform the LDPC encoding, the LDPC decoder 166 can be configured using a decoding device performing the LDPC decoding according to a full serial decoding method to sequentially perform operations of messages (a check node message and a variable node message) for each node or a decoding device performing the LDPC decoding according to a full parallel decoding method to simultaneously (in parallel) perform operations of messages for all nodes.

In addition, in the LDPC decoder 166, when the LDPC decoding of the LDPC code is performed using the transformation parity check matrix obtained by performing at least the column replacement corresponding to the parity interleave with respect to the parity check matrix H used by the LDPC encoder 115 of the transmitting device 11 to perform the LDPC encoding, the LDPC decoder 166 can be configured using a decoding device (FIG. 70) that is a decoding device of an architecture simultaneously performing P (or divisor of P other than 1) check node operations and variable node operations and has the reception data rearranging unit 310 to perform the same column replacement as the column replacement to obtain the transformation parity check matrix with respect to the LDPC code and rearrange the sign bits of the LDPC code.

In FIG. 74, for the convenience of description, the multiplexer 54 executing the reverse interchange processing, the column twist deinterleaver 55 performing the column twist deinterleave, and the parity deinterleaver 1011 performing the parity deinterleave are individually configured. However, two or more elements of the multiplexer 54, the column twist deinterleaver 55, and the parity deinterleaver 1011 can be integrally configured, similar to the parity interleaver 23, the column twist interleaver 24, and the demultiplexer 25 of the transmitting device 11.

[Configuration Example of Reception System]

Figure 75:
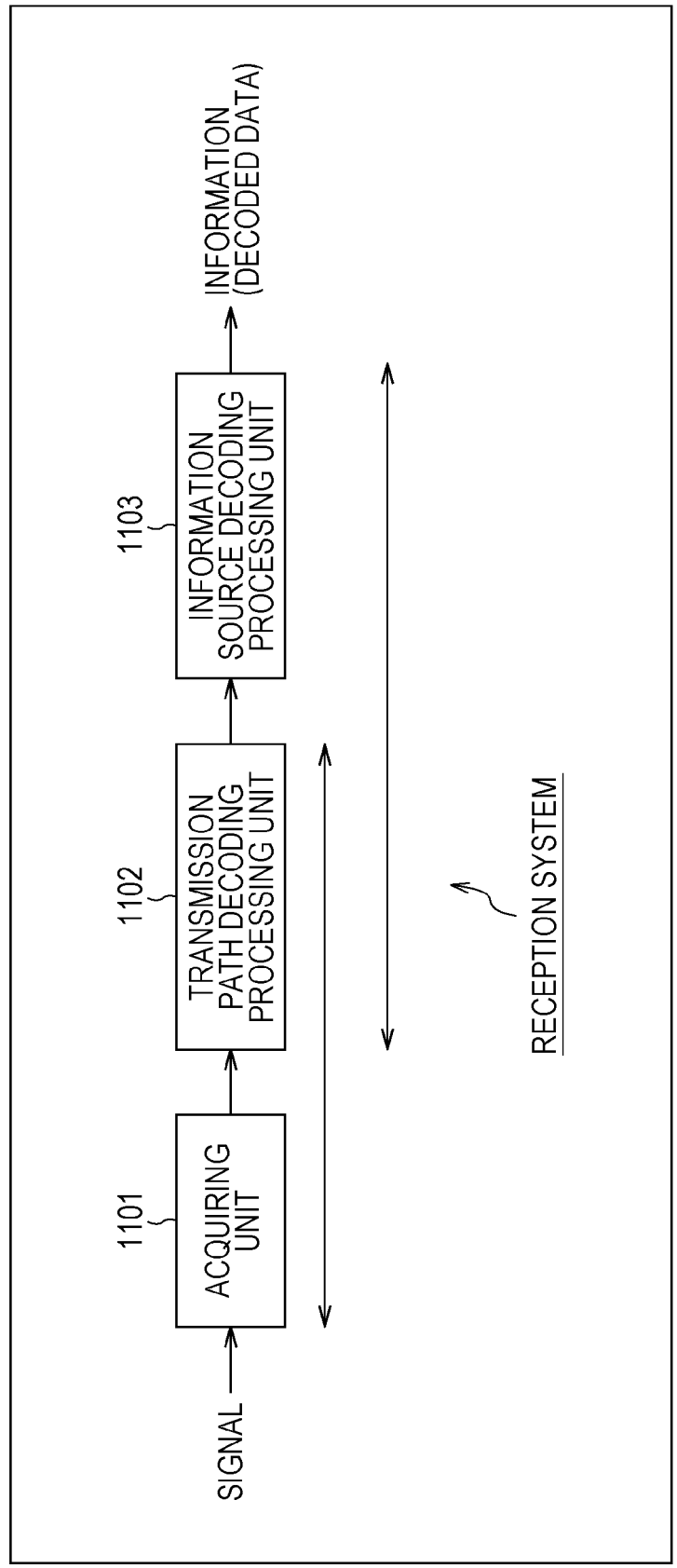
FIG. 75 is a block diagram illustrating a first configuration example of a reception system to which the receiving device 12 can be applied.

FIG. 75 is a block diagram illustrating a first configuration example of a reception system to which the receiving device 12 can be applied.

In FIG. 75, the reception system consists of an acquiring unit 1101, a transmission path decoding processing unit 1102, and an information source decoding processing unit 1103.

The acquiring unit 1101 acquires a signal including an LDPC code obtained by performing at least LDPC encoding with respect to LDPC target data such as image data or sound data of a program, through a transmission path (communication channel) not illustrated, such as terrestrial digital broadcasting, satellite digital broadcasting, a CATV network, the Internet, or other networks, and supplies the signal to the transmission path decoding processing unit 1102.

Here, when the signal acquired by the acquiring unit 1101 is broadcasted from a broadcasting station through a ground wave, a satellite wave, or a Cable Television (CATV) network and the like, the acquiring unit 1101 is configured using a tuner and a Set Top Box (STB). In addition, when the signal acquired by the acquiring unit 1101 is transmitted from a web server by multicasting like an Internet Protocol Television (IPTV), the acquiring unit 1101 is configured using a network Interface (I/F) such as a Network Interface Card (NIC).

The transmission path decoding processing unit 1102 corresponds to the receiving device 12. The transmission path decoding processing unit 1102 executes transmission path decoding processing including at least processing for correcting error generated in a transmission path, with respect to the signal acquired by the acquiring unit 1101 through the transmission path, and supplies a signal obtained as a result thereof to the information source decoding processing unit 1103.

That is, the signal that is acquired by the acquiring unit 1101 through the transmission path is a signal that is obtained by performing at least error correction encoding to correct the error generated in the transmission path. The transmission path decoding processing unit 1102 executes transmission path decoding processing such as error correction processing with respect to the signal.

Here, as the error correction encoding, for example, LDPC encoding or BCH encoding and the like exists. Here, as the error correction encoding, at least the LDPC encoding is performed.

In addition, the transmission path decoding processing may include demodulation of a modulation signal and the like.

The information source decoding processing unit 1103 executes information source decoding processing including at least processing for extending compressed information to original information, with respect to the signal on which the transmission path decoding processing is executed.

That is, compression encoding that compresses information may be performed with respect to the signal acquired by the acquiring unit 1101 through the transmission path to decrease a data amount of an image or a sound corresponding to information. In this case, the information source decoding processing unit 1103 executes the information source decoding processing such as the processing for extending the compressed information to the original information (extension processing), with respect to the signal on which the transmission path decoding processing is executed.

When the compression encoding is not performed with respect to the signal acquired by the acquiring unit 1101 through the transmission path, the processing for extending the compressed information to the original information is not executed in the information source decoding processing unit 1103.

Here, as the extension processing, for example, MPEG decoding and the like exists. In the transmission path decoding processing, in addition to the extension processing, descramble and the like may be included.

In the reception system that is configured as described above, in the acquiring unit 1101, a signal in which the compression encoding such as the MPEG encoding and the error correction encoding such as the LDPC encoding are performed with respect to data such as an image or a sound is acquired through the transmission path and is supplied to the transmission path decoding processing unit 1102.

In the transmission path decoding processing unit 1102, the same processing and the like as the processing executed by the receiving device 12 is executed as the transmission path decoding processing with respect to the signal supplied from the acquiring unit 1101 and a signal obtained as a result thereof is supplied to the information source decoding processing unit 1103.

In the information source decoding processing unit 1103, the information source decoding processing such as the MPEG decoding is executed with respect to the signal supplied from the transmission path decoding processing unit 1102 and an image or a sound obtained as a result thereof is output.

The reception system of FIG. 75 described above can be applied to a television tuner and the like to receive television broadcasting corresponding to digital broadcasting.

Each of the acquiring unit 1101, the transmission path decoding processing unit 1102, and the information source decoding processing unit 1103 can be configured as one independent device (hardware (Integrated Circuit (IC) and the like) or software module).

With respect to the acquiring unit 1101, the transmission path decoding processing unit 1102, and the information source decoding processing unit 1103, each of a set of the acquiring unit 1101 and the transmission path decoding processing unit 1102, a set of the transmission path decoding processing unit 1102 and the information source decoding processing unit 1103, and a set of the acquiring unit 1101, the transmission path decoding processing unit 1102, and the information source decoding processing unit 1103 can be configured as one independent device.

Figure 76:
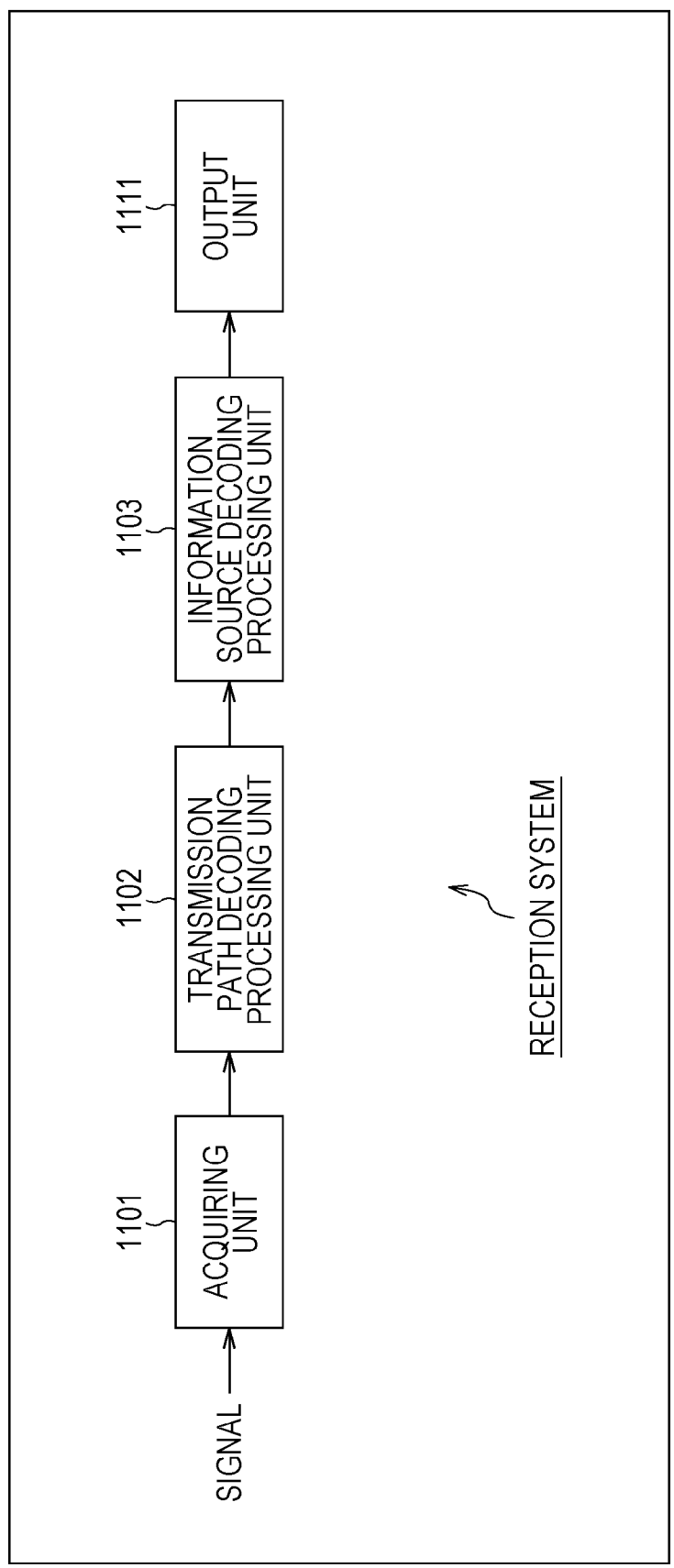
FIG. 76 is a block diagram illustrating a second configuration example of a reception system to which the receiving device 12 can be applied.

FIG. 76 is a block diagram illustrating a second configuration example of the reception system to which the receiving device 12 can be applied.

In the drawing, portions that correspond to the case of FIG. 75 are denoted with the same reference numerals and description thereof is appropriately omitted hereinafter.

The reception system of FIG. 76 is common to the case of FIG. 75 in that the acquiring unit 1101, the transmission path decoding processing unit 1102, and the information source decoding processing unit 1103 are provided and is different from the case of FIG. 75 in that an output unit 1111 is newly provided.

The output unit 1111 is a display device to display an image or a speaker to output a sound or the like and outputs an image or a sound corresponding to a signal output from the information source decoding processing unit 1103. That is, the output unit 1111 displays the image or outputs the sound.

The reception system of FIG. 76 described above can be applied to a television receiver (TV) receiving television broadcasting corresponding to digital broadcasting or a radio receiver receiving radio broadcasting.

When the compression encoding is not performed with respect to the signal acquired in the acquiring unit 1101, the signal that is output by the transmission path decoding processing unit 1102 is supplied to the output unit 1111.

Figure 77:
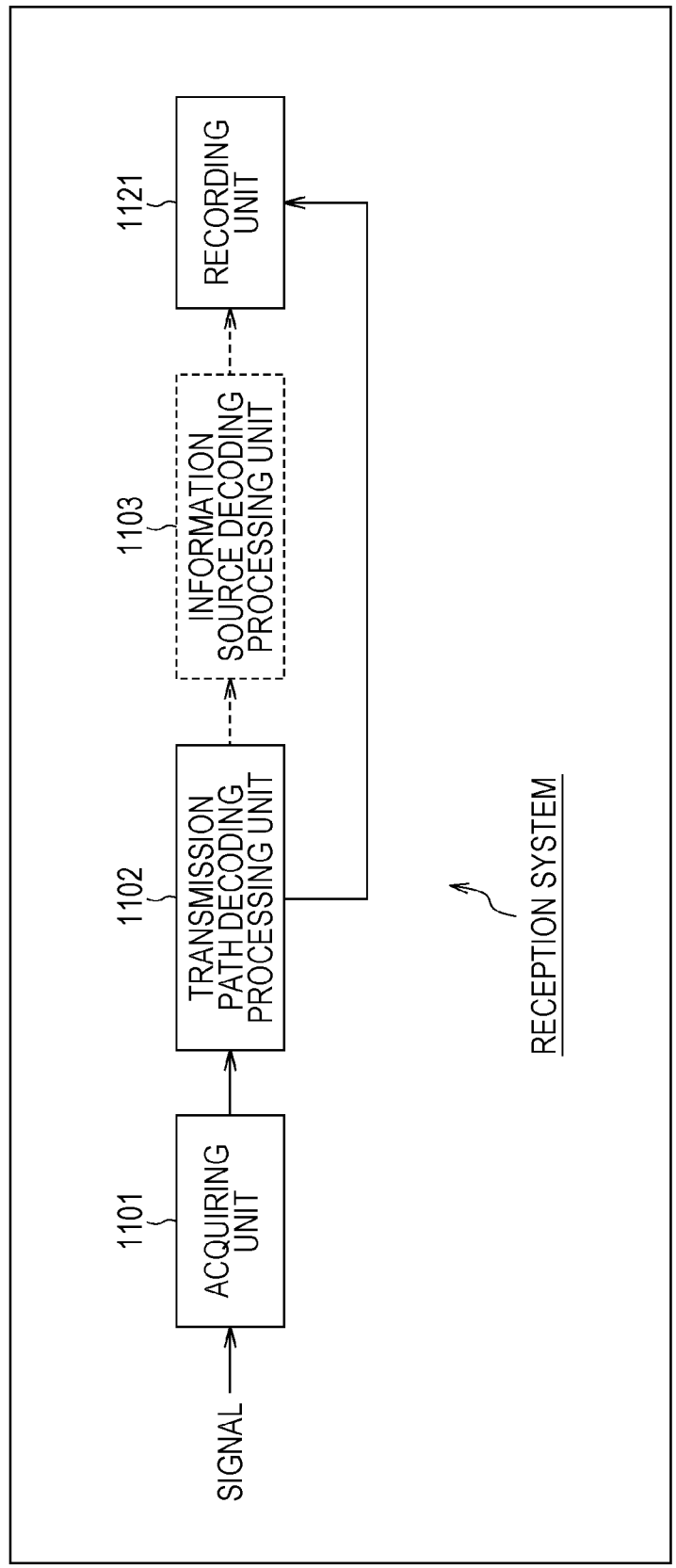
FIG. 77 is a block diagram illustrating a third configuration example of a reception system to which the receiving device 12 can be applied.

FIG. 77 is a block diagram illustrating a third configuration example of the reception system to which the receiving device 12 can be applied.

In the drawing, portions that correspond to the case of FIG. 75 are denoted with the same reference numerals and description thereof is appropriately omitted hereinafter.

The reception system of FIG. 77 is common to the case of FIG. 75 in that the acquiring unit 1101 and the transmission path decoding processing unit 1102 are provided.

However, the reception system of FIG. 77 is different from the case of FIG. 75 in that the information source decoding processing unit 1103 is not provided and a recording unit 1121 is newly provided.

The recording unit 1121 records (stores) a signal (for example, TS packets of TS of MPEG) output by the transmission path decoding processing unit 1102 on recording (storage) media such as an optical disk, a hard disk (magnetic disk), and a flash memory.

The reception system of FIG. 77 described above can be applied to a recorder and the like that records television broadcasting.

In FIG. 77, the reception system is configured by providing the information source decoding processing unit 1103 and can record a signal obtained by executing the information source decoding processing by the information source decoding processing unit 1103, that is, an image or a sound obtained by decoding, by the recording unit 1121.

[Embodiment of Computer]

Next, the series of processing described above can be executed by hardware or can be executed by software. In the case in which the series of processing is executed by the software, a program configuring the software is installed in a general-purpose computer and the like.

Figure 78:
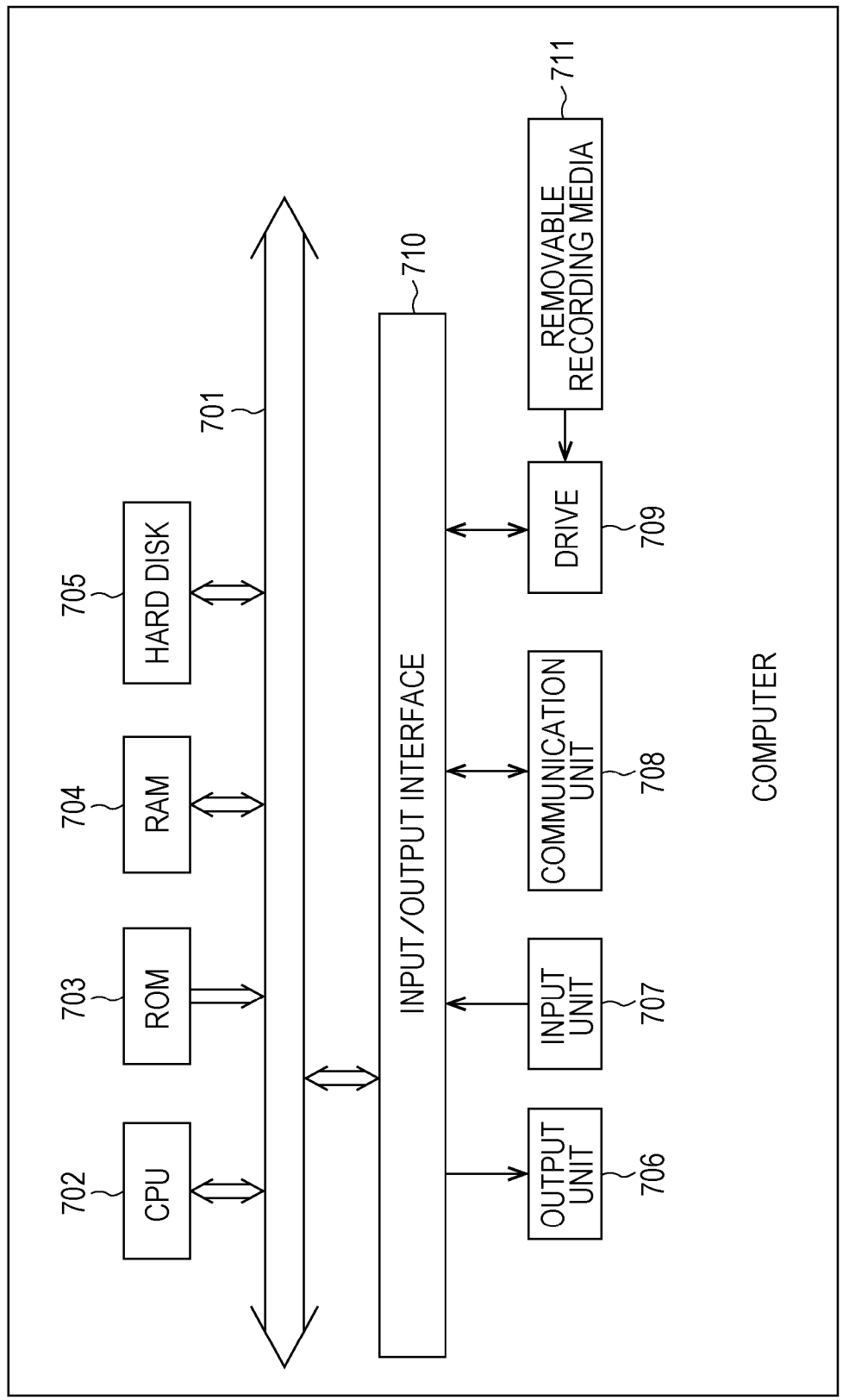
FIG. 78 is a block diagram illustrating a configuration example of an embodiment of a computer to which the present technique is applied.

Therefore, FIG. 78 illustrates a configuration example of an embodiment of the computer in which a program executing the series of processing described above is installed.

The program can be previously recorded on a hard disk 705 and a ROM 703 corresponding to recording media embedded in the computer.

Alternatively, the program can be temporarily or permanently stored (recorded) on removable recording media 711 such as a flexible disk, a Compact Disc Read Only Memory (CD-ROM), a Magneto Optical (MO) disk, a Digital Versatile Disc (DVD), a magnetic disk, and a semiconductor memory. The removable recording media 711 can be provided as so-called package software.

The program is installed from the removable recording media 711 to the computer. In addition, the program can be transmitted from a download site to the computer by wireless through an artificial satellite for digital satellite broadcasting or can be transmitted to the computer by wire through a network such as a Local Area Network (LAN) or the Internet. The computer can receive the program transmitted as described above by a communication unit 708 and install the program in the embedded hard disk 705.

The computer includes a Central Processing Unit (CPU) 702 embedded therein. An input/output interface 710 is connected to the CPU 702 through a bus 701. If a user operates an input unit 707 configured using a keyboard, a mouse, and a microphone or the like and a command is input through the input/output interface 710, the CPU 702 executes the program stored in the Read Only Memory (ROM) 703, according to the command. Alternatively, the CPU 702 loads the program stored in the hard disk 705, the program transmitted from a satellite or a network, received by the communication unit 708, and installed in the hard disk 705, or the program read from the removable recording media 711 mounted to a drive 709 and installed in the hard disk 705 to a Random Access Memory (RAM) 704 and executes the program. Thereby, the CPU 702 executes the processing according to the flowcharts described above or the processing executed by the configurations of the block diagrams described above. In addition, the CPU 702 outputs a processing result from the output unit 706 configured using a Liquid Crystal Display (LCD) or a speaker and the like, transmits the processing result from the communication unit 708, or records the processing result on the hard disk 705, through the input/output interface 710 and the like, according to necessity.

In the present specification, it is not necessary to process the processing steps describing the program for causing the computer to execute the various processing in time series according to the order described as the flowcharts and processing executed in parallel or individually (for example, parallel processing or processing by an object) is also included.

The program may be processed by one computer or may be processed by a plurality of computers in a distributed processing manner. The program may be transmitted to a remote computer and may be executed.

Embodiments of the present technique are not limited to the embodiments described above and various changes can be made without departing from the scope of the present technique.

In other words, (the parity check matrix initial value table of) an LDPC code and the like adopted in the digital broadcasting exclusively used for the mobile terminal or the like may be used for the digital broadcasting exclusively used for the fixed terminal or the like.

The present technique can take the following configurations.

[1]

A data processing device including:

an encoding unit that performs LDPC encoding in which a code length is 16200 bits and an encoding rate is 8/15, on the basis of a parity check matrix of an LDPC code; and an interchanging unit that interchanges sign bits of the LDPC code encoded by the encoding unit with symbol bits of a symbol corresponding to any one of 16 signal points determined by 16QAM, wherein the LDPC code encoded by the encoding unit includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464, and when sign bits of 8 bits stored in 8 storage units having storage capacities of 16200/8 bits and read from the respective storage units one bit at a time are allocated to two consecutive symbols, the interchanging unit sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y0, y4, y3, y1, y2, y5, y6, and y7, respectively.

[2]

A data processing device including:

an encoding unit that performs LDPC encoding in which a code length is 16200 bits and an encoding rate is 7/15, on the basis of a parity check matrix of an LDPC code; and an interchanging unit that interchanges sign bits of the LDPC code encoded by the encoding unit with symbol bits of a symbol corresponding to any one of 64 signal points determined by 64QAM, wherein the LDPC code encoded by the encoding unit includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 15 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and when sign bits of 12 bits stored in 12 storage units having storage capacities of 16200/12 bits and read from the respective storage units one bit at a time are allocated to two consecutive symbols, the interchanging unit sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y8, y7, y1, y6, y4, y3, y10, y9, y5, and y11, respectively.

[3]

A data processing device including:

an encoding unit that performs LDPC encoding in which a code length is 16200 bits and an encoding rate is 8/15, on the basis of a parity check matrix of an LDPC code; and an interchanging unit that interchanges sign bits of the LDPC code encoded by the encoding unit with symbol bits of a symbol corresponding to any one of 64 signal points determined by 64QAM, wherein the LDPC code encoded by the encoding unit includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415

2180 7389 7543
2121 6838 7054
1948 3109 5046
272 1015 7464, and when sign bits of 12 bits stored in 12 storage units having storage capacities of 16200/12 bits and read from the respective storage units one bit at a time are allocated to two consecutive symbols, the interchanging unit sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y4, y1, y6, y7, y8, y5, y10, y3, y9, and y11, respectively.

[4]

A data processing method including:

an encoding step of performing LDPC encoding in which a code length is 16200 bits and an encoding rate is 8/15, on the basis of a parity check matrix of an LDPC code; and an interchanging step of interchanging sign bits of the LDPC code encoded by the encoding step with symbol bits of a symbol corresponding to any one of 16 signal points determined by 16QAM, wherein the LDPC code encoded by the encoding step includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464, and when sign bits of 8 bits stored in 8 storage units having storage capacities of 16200/8 bits and read from the respective storage units one bit at a time are allocated to two consecutive symbols, the interchanging step sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y0, y4, y3, y1, y2, y5, y6, and y7, respectively.

[5]

A data processing method including:

an encoding step of performing LDPC encoding in which a code length is 16200 bits and an encoding rate is 7/15, on the basis of a parity check matrix of an LDPC code; and an interchanging step of interchanging sign bits of the LDPC code encoded by the encoding step with symbol bits of a symbol corresponding to any one of 64 signal points determined by 64QAM, wherein the LDPC code encoded by the encoding step includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and when sign bits of 12 bits stored in 12 storage units having storage capacities of 16200/12 bits and read from the respective storage units one bit at a time are allocated to two consecutive symbols, the interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y8, y7, y1, y6, y4, y3, y10, y9, y5, and y11, respectively.

[6]
A data processing method including:
an encoding step of performing LDPC encoding in which a code length is 16200 bits and an encoding rate is 8/15, on the basis of a parity check matrix of an LDPC code; and
an interchanging step of interchanging sign bits of the LDPC code encoded by the encoding step with symbol bits of a symbol corresponding to any one of 64 signal points determined by 64QAM,
wherein the LDPC code encoded by the encoding step includes information bits and parity bits,
the parity check matrix includes an information matrix portion corresponding to the information bits and a parity matrix portion corresponding to the parity bits,
the information matrix portion is represented by a parity check matrix initial value table,
the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464, and when sign bits of 12 bits stored in 12 storage units having storage capacities of 16200/12 bits and read from the respective storage units one bit at a time are allocated to two consecutive symbols, the interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y4, y1, y6, y7, y8, y5, y10, y3, y9, and y11, respectively.

[7]
A data processing device including:
a reverse interchanging unit that interchanges symbol bits of a symbol corresponding to any one of 16 signal points determined by 16QAM with sign bits of an LDPC code in which a code length is 16200 bits and an encoding rate is 8/15; and
a decoding unit that decodes the LDPC code interchanged by the reverse interchanging unit, on the basis of a parity check matrix of the LDPC code,
wherein, when sign bits of 8 bits stored in 8 storage units having storage capacities of 16200/8 bits and read from the respective storage units one bit at a time are allocated to two consecutive symbols, the reverse interchanging unit sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits y0, y4, y3, y1, y2, y5, y6, and y7 with bits b0, b1, b2, b3, b4, b5, b6, and b7, respectively,
the LDPC code includes information bits and parity bits,
the parity check matrix includes an information matrix portion corresponding to the information bits and a parity matrix portion corresponding to the parity bits,
the information matrix portion is represented by a parity check matrix initial value table, and
the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

[8]
A data processing device including:
a reverse interchanging unit that interchanges symbol bits of a symbol corresponding to any one of 64 signal points determined by 64QAM with sign bits of an LDPC code in which a code length is 16200 bits and an encoding rate is 7/15; and
a decoding unit that decodes the LDPC code interchanged by the reverse interchanging unit, on the basis of a parity check matrix of the LDPC code,
wherein, when sign bits of 12 bits stored in 12 storage units having storage capacities of 16200/12 bits and read from the respective storage units one bit at a time are allocated to two consecutive symbols, the reverse interchanging unit sets a (#i+1)-th bit from a most significant bit of the sign bits of the 12 bits as a bit b#i and a (#i+1)-th bit from a most significant

83 bit of symbol bits of 12 bits of the two symbols as a bit y#i and interchanges bits y2, y0, y8, y7, y1, y6, y4, y3, y10, y9, y5, and y11 with bits b0, b1, b2, b3, b4, b5, b6, b7, b8, b9, b10, and b11, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

[9]

A data processing device including:

a reverse interchanging unit that interchanges symbol bits of a symbol corresponding to any one of 64 signal points determined by 64QAM with sign bits of an LDPC code in which a code length is 16200 bits and an encoding rate is 8/15; and a decoding unit that decodes the LDPC code interchanged by the reverse interchanging unit, on the basis of a parity check matrix of the LDPC code, wherein, when sign bits of 12 bits stored in 12 storage units having storage capacities of 16200/12 bits and read from the respective storage units one bit at a time are allocated to two consecutive symbols, the reverse interchanging unit sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y4, y1, y6, y7, y8, y5, y10, y3, y9, and y11 with bits b0, b1, b2, b3, b4, b5, b6, b7, b8, b9, b10, and b11, respectively, the LDPC code includes information bits and parity bits, the parity check matrix includes an information matrix portion corresponding to the information bits and a parity matrix portion corresponding to the parity bits,

84 the information matrix portion is represented by a parity check matrix initial value table, and the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

[10]

A data processing method including:

a reverse interchanging step of interchanging symbol bits of a symbol corresponding to any one of 16 signal points determined by 16QAM with sign bits of an LDPC code in which a code length is 16200 bits and an encoding rate is 8/15; and a decoding step of decoding the LDPC code interchanged by the reverse interchanging step, on the basis of a parity check matrix of the LDPC code, wherein, when sign bits of 8 bits stored in 8 storage units having storage capacities of 16200/8 bits and read from the respective storage units one bit at a time are allocated to two consecutive symbols, the reverse interchanging step sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits y0, y4, y3, y1, y2, y5, y6, and y7 with bits b0, b1, b2, b3, b4, b5, b6, and b7, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553

5145 6018 7148 7507

3198 4858 6983 7033

3170 5126 5625 6901

2839 6093 7071 7450

11 3735 5413

2497 5400 7238

2067 5172 5714

1889 7173 7329

1795 2773 3499

2695 2944 6735

3221 4625 5897

1690 6122 6816

5013 6839 7358

1601 6849 7415

2180 7389 7543

2121 6838 7054

1948 3109 5046

272 1015 7464

[11]

A data processing method including:

a reverse interchanging step of interchanging symbol bits of a symbol corresponding to any one of 64 signal points determined by 64QAM with sign bits of an LDPC code in which a code length is 16200 bits and an encoding rate is 7/15; and a decoding step of decoding the LDPC code interchanged by the reverse interchanging step, on the basis of a parity check matrix of the LDPC code, wherein, when sign bits of 12 bits stored in 12 storage units having storage capacities of 16200/12 bits and read from the respective storage units one bit at a time are allocated to two consecutive symbols, the reverse interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y8, y7, y1, y6, y4, y3, y10, y9, y5, and y11 with bits b0, b1, b2, b3, b4, b5, b6, b7, b8, b9, b10, and b11, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623

56 1955 3000 8242

1809 4094 7991 8489

2220 6455 7849 8548

1006 2576 3247 6976

2177 6048 7795 8295

1413 2595 7446 8594

2101 3714 7541 8531

10 5961 7484

3144 4636 5282

5708 5875 8390

3322 5223 7975

197 4653 8283

598 5393 8624

906 7249 7542

1223 2148 8195

976 2001 5005.

[12]

A data processing method including:

a reverse interchanging step of interchanging symbol bits of a symbol corresponding to any one of 64 signal points determined by 64QAM with sign bits of an LDPC code in which a code length is 16200 bits and an encoding rate is 8/15; and a decoding step of decoding the LDPC code interchanged by the reverse interchanging step, on the basis of a parity check matrix of the LDPC code, wherein, when sign bits of 12 bits stored in 12 storage units having storage capacities of 16200/12 bits and read from the respective storage units one bit at a time are allocated to two consecutive symbols, the reverse interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y4, y1, y6, y7, y8, y5, y10, y3, y9, and y11 with bits b0, b1, b2, b3, b4, b5, b6, b7, b8, b9, b10, and b11, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553

5145 6018 7148 7507

3198 4858 6983 7033

3170 5126 5625 6901

2839 6093 7071 7450

11 3735 5413

2497 5400 7238

2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464

[13]

A data processing device including:

an encoding unit that performs LDPC encoding in which a code length is 16200 bits and an encoding rate is 7/15, on the basis of a parity check matrix of an LDPC code; and an interchanging unit that interchanges sign bits of the LDPC code with symbol bits of a symbol corresponding to any one of 256 signal points determined by 256QAM, wherein the LDPC code includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 25 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 30 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and when sign bits of 8 bits stored in 8 storage units having storage capacities of 16200/8 bits and read from the respective storage units one bit at a time are allocated to one symbol, the interchanging unit sets a (#i+1)-th bit from a most significant bit of the sign bits of the 8 bits as a bit b#i and a (#i+1)-th bit from a most significant bit of symbol bits of 8 bits of one symbol as a bit y#i and interchanges bits b0, b1, b2, b3, b4, b5, b6, and b7 with bits y2, y1, y4, y7, y3, y0, y5, and y6, respectively.

[14]

A data processing method including:

an encoding step of performing LDPC encoding in which a code length is 16200 bits and an encoding rate is 7/15, on the basis of a parity check matrix of an LDPC code; and an interchanging step of interchanging sign bits of the LDPC code with symbol bits of a symbol corresponding to any one of 256 signal points determined by 256QAM, wherein the LDPC code includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and when sign bits of 8 bits stored in 8 storage units having storage capacities of 16200/8 bits and read from the respective storage units one bit at a time are allocated to two consecutive symbols, the interchanging step sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y2, y1, y4, y7, y3, y0, y5, and y6, respectively.

[15]

A data processing device including:

a reverse interchanging unit that interchanges symbol bits of a symbol corresponding to any one of 256 signal points determined by 256QAM with sign bits of an LDPC code in which a code length is 16200 bits and an encoding rate is 7/15; and a decoding unit that decodes the LDPC code interchanged by the reverse interchanging unit, on the basis of a parity check matrix of the LDPC code, wherein, when sign bits of 8 bits stored in 8 storage units having storage capacities of 16200/8 bits and read from the respective storage units one bit at a time are allocated to one symbol, the reverse interchanging unit sets a (#i+1)-th bit from a most significant bit of the sign bits of the 8 bits as a bit b#i and a (#i+1)-th bit from a most significant bit of symbol bits of 8 bits of one symbol as a bit y#i and interchanges bits b0, b1, b2, b3, b4, b5, b6, and b7 with bits y2, y1, y4, y7, y3, y0, y5, and y6, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
 56 1955 3000 8242
 1809 4094 7991 8489
 2220 6455 7849 8548
 1006 2576 3247 6976
 2177 6048 7795 8295
 1413 2595 7446 8594
 2101 3714 7541 8531
 10 5961 7484
 3144 4636 5282
 5708 5875 8390
 3322 5223 7975
 197 4653 8283
 598 5393 8624
 906 7249 7542
 1223 2148 8195
 976 2001 5005.

[16] A data processing method including:

a reverse interchanging step of interchanging symbol bits of a symbol corresponding to any one of 256 signal points determined by 256QAM with sign bits of an LDPC code in which a code length is 16200 bits and an encoding rate is 7/15; and a decoding step of decoding the LDPC code interchanged by the reverse interchanging step, on the basis of a parity check matrix of the LDPC code, wherein, when sign bits of 8 bits stored in 8 storage units having storage capacities of 16200/8 bits and read from the respective storage units one bit at a time are allocated to one symbol, the reverse interchanging step sets a (#i+1)-th bit from a most significant bit of the sign bits of the 8 bits as a bit b#i and a (#i+1)-th bit from a most significant bit of symbol bits of 8 bits of one symbol as a bit y#i and interchanges bits b0, b1, b2, b3, b4, b5, b6, and b7 with bits y2, y1, y4, y7, y3, y0, y5, and y6, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
 56 1955 3000 8242
 1809 4094 7991 8489
 2220 6455 7849 8548
 1006 2576 3247 6976
 2177 6048 7795 8295
 1413 2595 7446 8594
 2101 3714 7541 8531
 10 5961 7484
 3144 4636 5282
 5708 5875 8390
 3322 5223 7975
 197 4653 8283
 598 5393 8624
 906 7249 7542
 1223 2148 8195
 976 2001 5005.

REFERENCE SIGNS LIST

11 Transmitting device
12 Receiving device
23 Parity interleaver
24 Column twist interleaver
25 Demultiplexer
31 Memory
32 Interchanging unit
54 Multiplexer
55 Column twist interleaver
111 Mode adaptation/multiplexer
112 Padder
113 BB scrambler
114 BCH encoder
115 LDPC encoder
116 Bit interleaver
117 QAM encoder
118 Time interleaver
119 MISO/MIMO encoder
120 Frequency interleaver
121 BCH encoder
122 LDPC encoder
123 QAM encoder 124 Frequency interleaver
131 Frame builder & resource allocation
132 OFDM generation
151 OFDM operation
152 Frame management
153 Frequency deinterleaver
154 QAM decoder
155 LDPC decoder
156 BCH decoder
161 Frequency deinterleaver
162 MISO/MIMO decoder
163 Time deinterleaver
164 QAM decoder
165 Bit deinterleaver
166 LDPC decoder
167 BCH decoder
168 BB descrambler
169 Null deletion
170 Demultiplexer
300 Edge data storing memory
301 Selector
302 Check node calculating unit
303 Cyclic shift circuit
304 Brach data storing memory
305 Selector
306 Reception data memory
307 Variable node calculating unit
308 Cyclic shift circuit
309 Decoding word calculating unit
310 Reception data rearranging unit
311 Decoding data rearranging unit
601 Encoding processing unit
602 Storage unit
611 Encoding rate setting unit
612 Initial value table reading unit
613 Parity check matrix generating unit
614 Information bit reading unit
615 Encoding parity operation unit
616 Control unit
701 Bus
702 CPU
703 ROM
704 RAM
705 Hard disk
706 Output unit
707 Input unit
708 Communication unit
709 Drive
710 Input/output interface
711 Removable recording media
708 Reverse interchanging unit
1002 Memory
1011 Parity deinterleaver
1101 Acquiring unit
1101 Transmission path decoding processing unit
1103 Information source decoding processing unit
1111 Output unit
1121 Recording unit

The invention claimed is:

1. A data processing device comprising:
an encoding unit that performs LDPC encoding in which a code length is 16200 bits and an encoding rate is 8/15, on the basis of a parity check matrix of an LDPC code; and
an interchanging unit that interchanges sign bits of the LDPC code encoded by the encoding unit with symbol bits of a symbol corresponding to any one of 16 signal points determined by 16QAM,
wherein the LDPC code encoded by the encoding unit includes information bits and parity bits,
the parity check matrix includes an information matrix portion corresponding to the information bits and a parity matrix portion corresponding to the parity bits,
the information matrix portion is represented by a parity check matrix initial value table,
the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464, and when sign bits of 8 bits stored in 8 storage units having storage capacities of 16200/8 bits and read from the respective storage units one bit at a time are allocated to two consecutive symbols, the interchanging unit sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y0, y4, y3, y1, y2, y5, y6, and y7, respectively.

2. A data processing device comprising:
an encoding unit that performs LDPC encoding in which a code length is 16200 bits and an encoding rate is 7/15, on the basis of a parity check matrix of an LDPC code; and
an interchanging unit that interchanges sign bits of the LDPC code encoded by the encoding unit with symbol bits of a symbol corresponding to any one of 64 signal points determined by 64QAM,
wherein the LDPC code encoded by the encoding unit includes information bits and parity bits,
the parity check matrix includes an information matrix portion corresponding to the information bits and a parity matrix portion corresponding to the parity bits,
the information matrix portion is represented by a parity check matrix initial value table, the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and when sign bits of 12 bits stored in 12 storage units having storage capacities of 16200/12 bits and read from the respective storage units one bit at a time are allocated to two consecutive symbols, the interchanging unit sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y8, y7, y1, y6, y4, y3, y10, y9, y5, and y11, respectively.

3. A data processing device comprising:

an encoding unit that performs LDPC encoding in which a code length is 16200 bits and an encoding rate is 8/15, on the basis of a parity check matrix of an LDPC code; and an interchanging unit that interchanges sign bits of the LDPC code encoded by the encoding unit with symbol bits of a symbol corresponding to any one of 64 signal points determined by 64QAM, wherein the LDPC code encoded by the encoding unit includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464, and when sign bits of 12 bits stored in 12 storage units having storage capacities of 16200/12 bits and read from the respective storage units one bit at a time are allocated to two consecutive symbols, the interchanging unit sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y4, y1, y6, y7, y8, y5, y10, y3, y9, and y11, respectively.

4. A data processing method comprising:

an encoding step of performing LDPC encoding in which a code length is 16200 bits and an encoding rate is 8/15, on the basis of a parity check matrix of an LDPC code; and an interchanging step of interchanging sign bits of the LDPC code encoded by the encoding step with symbol bits of a symbol corresponding to any one of 16 signal points determined by 16QAM, wherein the LDPC code encoded by the encoding step includes information bits and parity bits, the parity check matrix includes an information matrix portion corresponding to the information bits and a parity matrix portion corresponding to the parity bits, the information matrix portion is represented by a parity check matrix initial value table, the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464, and
when sign bits of 8 bits stored in 8 storage units having storage capacities of 16200/8 bits and read from the respective storage units one bit at a time are allocated to two consecutive symbols, the interchanging step sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y0, y4, y3, y1, y2, y5, y6, and y7, respectively.

5. A data processing method comprising:
an encoding step of performing LDPC encoding in which a code length is 16200 bits and an encoding rate is 7/15, on the basis of a parity check matrix of an LDPC code; and
an interchanging step of interchanging sign bits of the LDPC code encoded by the encoding step with symbol bits of a symbol corresponding to any one of 64 signal points determined by 64QAM,
wherein the LDPC code encoded by the encoding step includes information bits and parity bits,
the parity check matrix includes an information matrix portion corresponding to the information bits and a parity matrix portion corresponding to the parity bits,
the information matrix portion is represented by a parity check matrix initial value table,
the parity check matrix initial value table is a table that represents positions of elements of 1 of the information matrix portion for every 360 columns and is configured as follows:
3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and
when sign bits of 12 bits stored in 12 storage units having storage capacities of 16200/12 bits and read from the respective storage units one bit at a time are allocated to two consecutive symbols, the interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y8, y7, y1, y6, y4, y3, y10, y9, y5, and y11, respectively.

6. A data processing method comprising:
an encoding step of performing LDPC encoding in which a code length is 16200 bits and an encoding rate is 8/15, on the basis of a parity check matrix of an LDPC code; and
an interchanging step of interchanging sign bits of the LDPC code encoded by the encoding step with symbol bits of a symbol corresponding to any one of 64 signal points determined by 64QAM,
wherein the LDPC code encoded by the encoding step includes information bits and parity bits,
the parity check matrix includes an information matrix portion corresponding to the information bits and a parity matrix portion corresponding to the parity bits,
the information matrix portion is represented by a parity check matrix initial value table,
the parity check matrix initial value table is a table that represents positions of elements of 1 of the information matrix portion for every 360 columns and is configured as follows:
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543

2121 6838 7054
1948 3109 5046
272 1015 7464, and
when sign bits of 12 bits stored in 12 storage units having storage capacities of 16200/12 bits and read from the respective storage units one bit at a time are allocated to two consecutive symbols, the interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits b0, b1, b2, b3, b4, b5, b6, b7, b8, b9, b10, and b11 with bits y2, y0, y4, y1, y6, y7, y8, y5, y10, y3, y9, and y11, respectively.

7. A data processing device comprising:
a reverse interchanging unit that interchanges symbol bits of a symbol corresponding to any one of 16 signal points determined by 16QAM with sign bits of an LDPC code in which a code length is 16200 bits and an encoding rate is 8/15; and
a decoding unit that decodes the LDPC code interchanged by the reverse interchanging unit, on the basis of a parity check matrix of the LDPC code,
wherein, when sign bits of 8 bits stored in 8 storage units having storage capacities of 16200/8 bits and read from the respective storage units one bit at a time are allocated to two consecutive symbols, the reverse interchanging unit sets a (#i+1)-th from a most significant bit of the sign bits of the 8 bits as a bit b#i and a (#i+1)-th bit from a most significant bit of symbol bits of 8 bits of the two symbols as a bit y#i and interchanges bits y0, y4, y3, y1, y2, y5, y6, and y7 with bits b0, b1, b2, b3, b4, b5, b6, and b7, respectively,
the LDPC code includes information bits and parity bits,
the parity check matrix includes an information matrix portion corresponding to the information bits and a parity matrix portion corresponding to the parity bits,
the information matrix portion is represented by a parity check matrix initial value table, and
the parity check matrix initial value table is a table that represents positions of elements of 1 of the information matrix portion for every 360 columns and is configured as follows:
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816

5013 6839 7358
1601 6849 7415
2180 7389 7543
2121 6838 7054
1948 3109 5046
272 1015 7464.

8. A data processing device comprising:
a reverse interchanging unit that interchanges symbol bits of a symbol corresponding to any one of 64 signal points determined by 64QAM with sign bits of an LDPC code in which a code length is 16200 bits and an encoding rate is 7/15; and
a decoding unit that decodes the LDPC code interchanged by the reverse interchanging unit, on the basis of a parity check matrix of the LDPC code,
wherein, when sign bits of 12 bits stored in 12 storage units having storage capacities of 16200/12 bits and read from the respective storage units one bit at a time are allocated to two consecutive symbols, the reverse interchanging unit sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y8, y7, y1, y6, y4, y3, y10, y9, y5, and y11 with bits b0, b1, b2, b3, b4, b5, b6, b7, b8, b9, b10, and b11, respectively,
the LDPC code includes information bits and parity bits,
the parity check matrix includes an information matrix portion corresponding to the information bits and a parity matrix portion corresponding to the parity bits,
the information matrix portion is represented by a parity check matrix initial value table, and
the parity check matrix initial value table is a table that represents positions of elements of 1 of the information matrix portion for every 360 columns and is configured as follows:
3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

9. A data processing device comprising:
a reverse interchanging unit that interchanges symbol bits of a symbol corresponding to any one of 64 signal points determined by 64QAM with sign bits of an LDPC code in which a code length is 16200 bits and an encoding rate is 8/15; and a decoding unit that decodes the LDPC code interchanged by the reverse interchanging unit, on the basis of a parity check matrix of the LDPC code, wherein, when sign bits of 12 bits stored in 12 storage units having storage capacities of 16200/12 bits and read from the respective storage units one bit at a time are allocated to two consecutive symbols, the reverse interchanging unit sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y4, y1, y6, y7, y8, y5, y10, y3, y9, and y11 with bits b0, b1, b2, b3, b4, b5, b6, b7, b8, b9, b10, and b11, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

10. A data processing method comprising:

a reverse interchanging step of interchanging symbol bits of a symbol corresponding to any one of 16 signal points determined by 16QAM with sign bits of an LDPC code in which a code length is 16200 bits and an encoding rate is 8/15; and a decoding step of decoding the LDPC code interchanged by the reverse interchanging step, on the basis of a parity check matrix of the LDPC code, wherein, when sign bits of 8 bits stored in 8 storage units having storage capacities of 16200/8 bits and read from the respective storage units one bit at a time are allocated to two consecutive symbols, the reverse interchanging step sets a (#i+1)-th bit from a most significant bit of the sign bits of the 8 bits as a bit b#i and a (#i+1)-th bit from a most significant bit of symbol bits of 8 bits of the two symbols as a bit y#i and interchanges bits y0, y4, y3, y1, y2, y5, y6, and y7 with bits b0, b1, b2, b3, b4, b5, b6, and b7, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

11. A data processing method comprising:

a reverse interchanging step of interchanging symbol bits of a symbol corresponding to any one of 64 signal points determined by 64QAM with sign bits of an LDPC code in which a code length is 16200 bits and an encoding rate is 7/15; and a decoding step of decoding the LDPC code interchanged by the reverse interchanging step, on the basis of a parity check matrix of the LDPC code, wherein, when sign bits of 12 bits stored in 12 storage units having storage capacities of 16200/12 bits and read from the respective storage units one bit at a time are allocated to two consecutive symbols, the reverse interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y8, y7, y1, y6, y4, y3, y10, y9, y5, and y11 with bits b0, b1, b2, b3, b4, b5, b6, b7, b8, b9, b10, and b11, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

12. A data processing method comprising:

a reverse interchanging step of interchanging symbol bits of a symbol corresponding to any one of 64 signal points determined by 64QAM with sign bits of an LDPC code in which a code length is 16200 bits and an encoding rate is 8/15; and a decoding step of decoding the LDPC code interchanged by the reverse interchanging step, on the basis of a parity check matrix of the LDPC code, wherein, when sign bits of 12 bits stored in 12 storage units having storage capacities of 16200/12 bits and read from the respective storage units one bit at a time are allocated to two consecutive symbols, the reverse interchanging step sets a (#i+1)-th bit from a most significant bit of the sign bits of the 12 bits as a bit b#i and a (#i+1)-th bit from a most significant bit of symbol bits of 12 bits of the two symbols as a bit y#i and interchanges bits y2, y0, y4, y1, y6, y7, y8, y5, y10, y3, y9, and y11 with bits b0, b1, b2, b3, b4, b5, b6, b7, b8, b9, b10, and b11, respectively, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table that represents positions of elements of 1 of the information matrix portion for every 360 columns and is configured as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

* * * * *